United States Patent
Cha et al.

(10) Patent No.: US 10,547,008 B2
(45) Date of Patent: Jan. 28, 2020

(54) ORGANIC LIGHT EMITTING DEVICE

(71) Applicant: LG CHEM, LTD., Seoul (KR)

(72) Inventors: Yongbum Cha, Daejeon (KR); Sung Kil Hong, Daejeon (KR); Seong So Kim, Daejeon (KR); Jemin Ryu, Daejeon (KR)

(73) Assignee: LG CHEM, LTD., Seoul (KR)

( * ) Notice: Subject to any disclaimer, the term of this patent is extended or adjusted under 35 U.S.C. 154(b) by 185 days.

(21) Appl. No.: 15/559,609

(22) PCT Filed: Jun. 10, 2016

(86) PCT No.: PCT/KR2016/006164
§ 371 (c)(1),
(2) Date: Sep. 19, 2017

(87) PCT Pub. No.: WO2016/204453
PCT Pub. Date: Dec. 22, 2016

(65) Prior Publication Data
US 2018/0069180 A1 Mar. 8, 2018

(30) Foreign Application Priority Data
Jun. 19, 2015 (KR) .................. 10-2015-0087410

(51) Int. Cl.
*H01L 51/00* (2006.01)
*H01L 51/50* (2006.01)
*C09K 11/06* (2006.01)
*C09K 11/02* (2006.01)

(52) U.S. Cl.
CPC ........ *H01L 51/0061* (2013.01); *C09K 11/025* (2013.01); *C09K 11/06* (2013.01); *H01L 51/0052* (2013.01); *H01L 51/0058* (2013.01); *H01L 51/0072* (2013.01); *C09K 2211/1007* (2013.01); *C09K 2211/1011* (2013.01); *C09K 2211/1014* (2013.01); *H01L 51/0073* (2013.01); *H01L 51/5012* (2013.01); *H01L 51/5056* (2013.01); *H01L 51/5072* (2013.01); *H01L 51/5092* (2013.01); *H01L 51/5096* (2013.01); *H01L 2251/552* (2013.01)

(58) Field of Classification Search
CPC H01L 51/006; H01L 51/0061; H01L 51/0072
See application file for complete search history.

(56) References Cited

U.S. PATENT DOCUMENTS

| 9,972,784 B2 | 5/2018 | Shin et al. |
| 2002/0172420 A1 | 11/2002 | Nicolas |
| 2008/0008907 A1* | 1/2008 | Cho ............... C07D 221/20 428/704 |
| 2011/0278549 A1 | 11/2011 | Kim et al. |

(Continued)

FOREIGN PATENT DOCUMENTS

| CN | 101172954 A | 5/2008 |
| CN | 104024372 A | 9/2014 |

(Continued)

OTHER PUBLICATIONS

SciFinder Search (May 17, 2019).*

*Primary Examiner* — Vu A Nguyen
(74) *Attorney, Agent, or Firm* — Dentons US LLP

(57) ABSTRACT

The present specification provides an organic light emitting device.

19 Claims, 1 Drawing Sheet

(56) References Cited

U.S. PATENT DOCUMENTS

| | | | |
|---|---|---|---|
| 2012/0056165 A1* | 3/2012 | Kawamura | ............ C09K 11/06 257/40 |
| 2014/0048792 A1 | 2/2014 | Chun et al. | |
| 2014/0110694 A1* | 4/2014 | Shin | .................... H01L 51/0072 257/40 |
| 2015/0263291 A1 | 9/2015 | Jung et al. | |

FOREIGN PATENT DOCUMENTS

| | | |
|---|---|---|
| EP | 2311826 A2 | 4/2011 |
| EP | 1794260 B1 | 11/2011 |
| EP | 2719741 A2 | 4/2014 |
| EP | 1791926 B1 | 8/2016 |
| KR | 2003-0012890 A | 2/2003 |
| KR | 10-2006-0051612 A | 5/2006 |
| KR | 10-2011-0094271 A | 8/2011 |
| KR | 10-2012-0083243 A | 7/2012 |
| KR | 10-2012-0138673 A | 12/2012 |
| KR | 10-2013-0037186 A | 4/2013 |
| KR | 10-2015-0037605 A | 4/2015 |
| WO | 2006-033564 A1 | 3/2006 |
| WO | 2011-059271 A2 | 5/2011 |
| WO | 2012-173369 A2 | 12/2012 |

\* cited by examiner

[Figure 1]
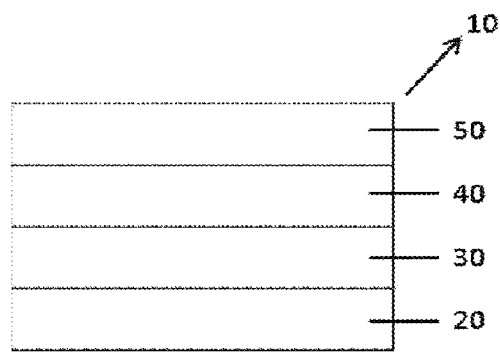
[Figure 2]
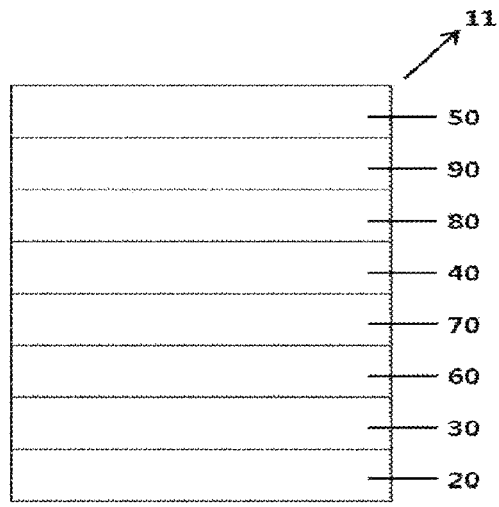

ORGANIC LIGHT EMITTING DEVICE

TECHNICAL FIELD

This application is a National Stage Entry of International Application No. PCT/KR2016/006164 filed on Jun. 10, 2016, and claims the benefit of Korean Application No. 10-2015-0087410 filed on Jun. 19, 2015, all of which are hereby incorporated by reference in their entirety for all purposes as if fully set forth herein.

The present specification relates to an organic light emitting device.

BACKGROUND ART

In general, an organic light emitting phenomenon refers to a phenomenon in which electric energy is converted into light energy by using an organic material. An organic light emitting device using the organic light emitting phenomenon usually has a structure comprising a positive electrode, a negative electrode, and an organic material layer interposed therebetween. Here, the organic material layer may have in many cases a multi-layered structure composed of different materials in order to improve the efficiency and stability of an organic light emitting device, and for example, may be composed of a hole injection layer, a hole transporting layer, a light emitting layer, an electron transporting layer, an electron injection layer, and the like. In the structure of the organic light emitting device, if a voltage is applied between two electrodes, holes are injected from a positive electrode into the organic material layer and electrons are injected from a negative electrode into the organic material layer, and when the injected holes and electrons meet each other, an exciton is formed, and light is emitted when the exciton falls down again to a ground state.

There is a continuous need for developing a new material for the aforementioned organic light emitting device.

DETAILED DESCRIPTION OF THE INVENTION

Technical Problem

The present specification provides an organic light emitting device.

Technical Solution

An exemplary embodiment of the present specification provides an organic light emitting device comprising: a positive electrode; a negative electrode disposed to face the positive electrode; a light emitting layer disposed between the positive electrode and the negative electrode; a first organic material layer disposed between the positive electrode and the light emitting layer; and a second organic material layer disposed between the negative electrode and the light emitting layer, in which the first organic material layer comprises a compound represented by the following Chemical Formula 1 and the second organic material layer comprises a compound represented by the following Chemical Formula 2.

[Chemical Formula 1]

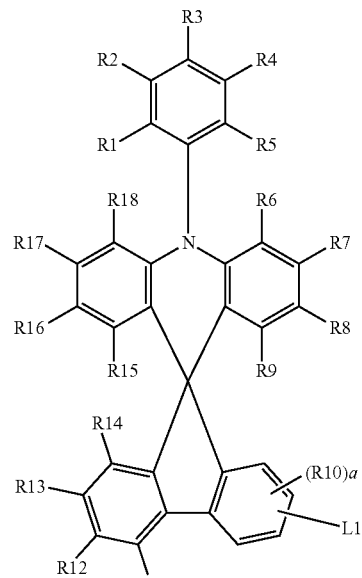

[Chemical Formula 2]

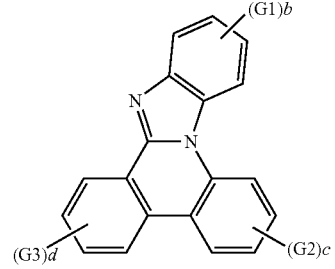

In Chemical Formulae 1 and 2,

L1 is a direct bond; or a substituted or unsubstituted arylene group,

Ar1 and Ar2 are the same as or different from each other, and are each independently a substituted or unsubstituted aryl group; or a substituted or unsubstituted heteroaryl group, R1 to R18 are the same as or different from each other, and are each independently hydrogen; deuterium; a nitrile group; a nitro group; a hydroxy group; a carbonyl group; an ester group; an imide group; an amide group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted amine group; a substituted or unsubstituted arylphosphine group; a substituted or unsubstituted phosphine oxide group; a substituted or unsubstituted aryl group; or a substituted or unsubstituted heteroaryl group, or R1 and R18 may be linked to each other to form a ring, a is an integer from 1 to 3, and when a is 2 or more, two or more R10's are the same as or different from each other, at least one of G1 to G3 is represented by the following Chemical Formula 2A and the others are the same as or different from each other, and are each independently hydrogen; deuterium; a nitrile group; a nitro group; a hydroxy group; a carbonyl group; an ester group; an imide group; an amide group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted amine group; a substituted or unsubstituted arylphosphine group; a substituted or unsubstituted phosphine oxide group; a substituted or unsubstituted aryl group; or a substituted or unsubstituted heteroaryl group, or adjacent groups may be linked to each other to form a substituted or unsubstituted ring, b to d are each an integer from 1 to 4, when b to d are each 2 or more, two or more structures in the parenthesis are the same as or different from each other,

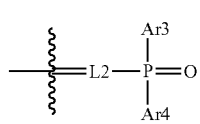

[Chemical Formula 2A]

in Chemical Formula 2A,

L2 is a direct bond; or a substituted or unsubstituted arylene group; or a substituted or unsubstituted heteroarylene group, Ar3 and Ar4 are the same as or different from each other, and are each independently a substituted or unsubstituted aryl group; a substituted or unsubstituted heteroaryl group, and

is a moiety linked to Chemical Formula 2.

Advantageous Effects

An organic light emitting device according to an exemplary embodiment of the present specification may improve service life characteristics and/or efficiency characteristics of the device.

According to an exemplary embodiment of the present specification, when the compound represented by Chemical Formula 1 and the compound of Chemical Formula 2, which comprises a phosphine oxide having excellent capability in terms of electron transport and/or electron injection, are used as an electron injection layer and/or an electron transporting layer disposed between the negative electrode and the light emitting layer, the organic light emitting device has: (A) excellent hole injection characteristics; (B) high hole mobility; (C) excellent electron stopping power; (D) a stable thin film state; and/or (E) excellent heat resistance, and thus exhibits low voltage, high efficiency, and long service life characteristics.

BRIEF DESCRIPTION OF DRAWINGS

FIG. 1 illustrates an organic light emitting device 10 according to an exemplary embodiment of the present specification.

FIG. 2 illustrates an organic light emitting device 11 according to another exemplary embodiment of the present specification.

BEST MODE

Hereinafter, the present specification will be described in more detail.

Examples of the substituents in the present specification will be described below, but are not limited thereto.

The term "substitution" means that a hydrogen atom bonded to a carbon atom of a compound is changed into another substituent, and a position to be substituted is not limited as long as the position is a position at which the hydrogen atom is substituted, that is, a position at which the substituent may be substituted, and when two or more are substituted, the two or more substituents may be the same as or different from each other.

In the present specification, the term "substituted or unsubstituted" means being substituted with one or two or more substituents selected from the group consisting of deuterium; a halogen group; a nitrile group; a nitro group; an imide group; an amide group; a carbonyl group; an ester group; a hydroxy group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted amine group; a substituted or unsubstituted arylphosphine group; a substituted or unsubstituted phosphine oxide group; a substituted or unsubstituted aryl group; and a substituted or unsubstituted heterocyclic group or being substituted with a substituent to which two or more substituents are linked among the substituents exemplified above, or having no substituent. For example, "the substituent to which two or more substituents are linked" may be a biphenyl group. That is, the biphenyl group may also be an aryl group, and may be interpreted as a substituent to which two phenyl groups are linked.

In the present specification,

means a moiety bonded to another substituent or a bonding portion.

In the present specification, a halogen group may be fluorine, chlorine, bromine, or iodine.

In the present specification, the number of carbon atoms of an imide group is not particularly limited, but is preferably 1 to 30. Specifically, the imide group may be a compound having the following structures, but is not limited thereto.

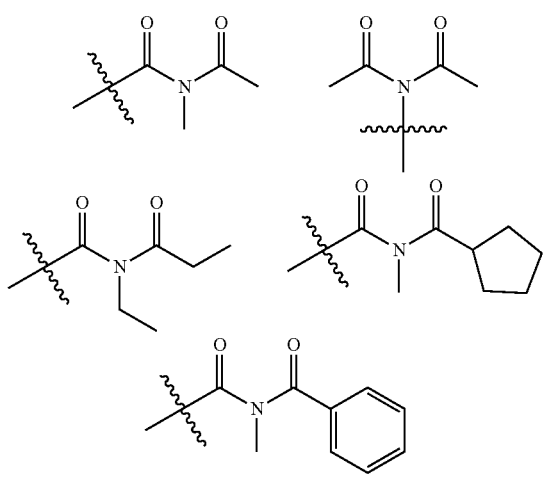

In the present specification, for an amide group, the nitrogen of the amide group may be substituted with hydrogen; a straight, branched, or cyclic alkyl group having 1 to 30 carbon atoms; or an aryl group having 6 to 30 carbon atoms. Specifically, the amide group may be a compound having the following structural formulae, but is not limited thereto.

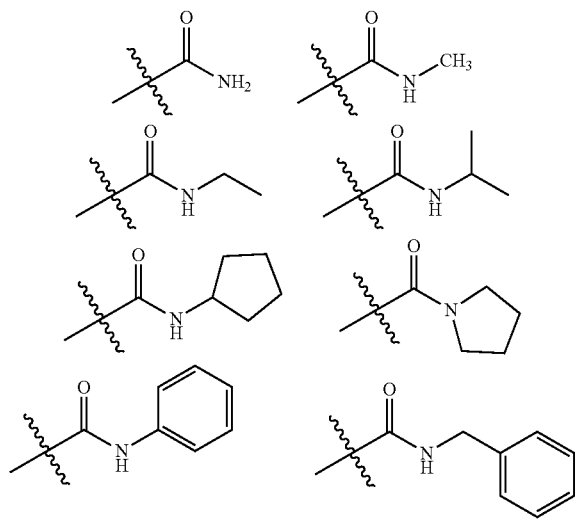

In the present specification, the number of carbon atoms of a carbonyl group is not particularly limited, but is preferably 1 to 30. Specifically, the carbonyl group may be a compound having the following structures, but is not limited thereto.

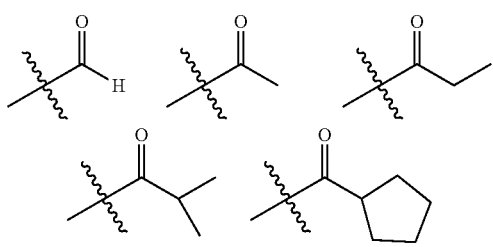

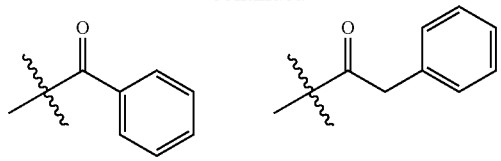

In the present specification, for an ester group, the oxygen of the ester group may be substituted with a straight, branched, or cyclic alkyl group having 1 to 25 carbon atoms; or an aryl group having 6 to 30 carbon atoms. Specifically, the ester group may be a compound having the following structural formulae, but is not limited thereto.

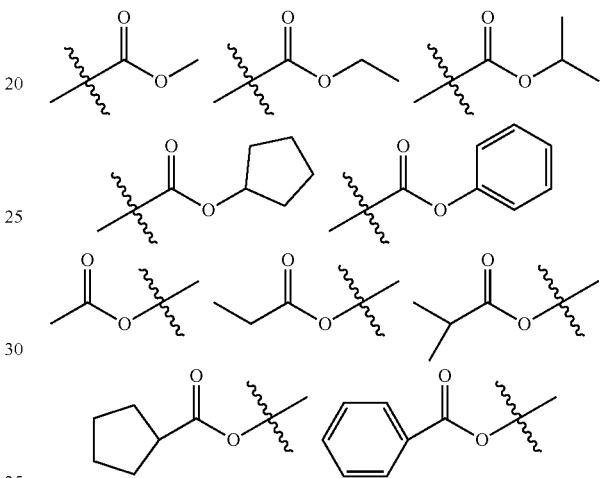

In the present specification, the alkyl group may be straight or branched, and the number of carbon atoms thereof is not particularly limited, but is preferably 1 to 30. Specific examples thereof include methyl, ethyl, propyl, n-propyl, isopropyl, butyl, n-butyl, isobutyl, tert-butyl, sec-butyl, 1-methyl-butyl, 1-ethyl-butyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cyclohexylmethyl, octyl, n-octyl, tert-octyl, 1-methylheptyl, 2-ethylhexyl, 2-propylpentyl, n-nonyl, 2,2-dimethylheptyl, 1-ethyl-propyl, 1,1-dimethyl-propyl, isohexyl, 2-methylpentyl, 4-methylhexyl, 5-methylhexyl, and the like, but are not limited thereto.

In the present specification, a cycloalkyl group is not particularly limited, but has preferably 3 to 30 carbon atoms, and specific examples thereof include cyclopropyl, cyclobutyl, cyclopentyl, 3-methylcyclopentyl, 2,3-dimethylcyclopentyl, cyclohexyl, 3-methylcyclohexyl, 4-methylcyclohexyl, 2,3-dimethylcyclohexyl, 3,4,5-trimethylcyclohexyl, 4-tert-butylcyclohexyl, cycloheptyl, cyclooctyl, and the like, but are not limited thereto.

In the present specification, the alkoxy group may be straight, branched, or cyclic. The number of carbon atoms of the alkoxy group is not particularly limited, but is preferably 1 to 30. Specific examples thereof include methoxy, ethoxy, n-propoxy, isopropoxy, i-propyloxy, n-butoxy, isobutoxy, tert-butoxy, sec-butoxy, n-pentyloxy, neopentyloxy, isopentyloxy, n-hexyloxy, 3,3-dimethylbutyloxy, 2-ethylbutyloxy, n-octyloxy, n-nonyloxy, n-decyloxy, benzyloxy, p-methylbenzyloxy, and the like, but are not limited thereto.

In the present specification, an amine group may be selected from the group consisting of —NH$_2$; an alkylamine group; an N-arylalkylamine group; an arylamine group; an N-arylheteroarylamine group; an N-alkylheteroarylamine group; and a heteroarylamine group, and the number of carbon atoms thereof is not particularly limited, but is preferably 1 to 30. Specific examples of the amine group include a methylamine group, a dimethylamine group, an ethylamine group, a diethylamine group, a phenylamine group, a naphthylamine group, a biphenylamine group, an anthracenylamine group, a 9-methyl-anthracenylamine group, a diphenylamine group, an N-phenylnaphthylamine group, a ditolylamine group, an N-phenyltolylamine group, a triphenylamine group, and the like, but are not limited thereto.

In the present specification, an N-alkylarylamine group means an amine group in which an alkyl group and an aryl group are substituted with N of the amine group.

In the present specification, an N-arylheteroarylamine group means an amine group in which an aryl group and a heteroaryl group are substituted with N of the amine group.

In the present specification, an N-alkylheteroarylamine group means an amine group in which an alkyl group and a heteroarylamine group are substituted with N of the amine group.

In the present specification, the alkyl group in the alkylamine group, the N-arylalkylamine group, the alkylthioxy group, the alkylsulfoxy group, and the N-alkylheteroarylamine group is the same as the above-described examples of the alkyl group. Specifically, examples of the alkylthioxy group include a methylthioxy group, an ethylthioxy group, a tert-butylthioxy group, a hexylthioxy group, an octylthioxy group, and the like, and examples of the alkylsulfoxy group include mesyl, an ethylsulfoxy group, a propylsulfoxy group, a butylsulfoxy group, and the like, but the examples are not limited thereto.

In the present specification, the alkenyl group may be straight or branched, and the number of carbon atoms thereof is not particularly limited, but is preferably 2 to 30. Specific examples thereof include vinyl, 1-propenyl, isopropenyl, 1-butenyl, 2-butenyl, 3-butenyl, 1-pentenyl, 2-pentenyl, 3-pentenyl, 3-methyl-1-butenyl, 1,3-butadienyl, allyl, 1-phenylvinyl-1-yl, 2-phenylvinyl-1-yl, 2,2-diphenylvinyl-1-yl, 2-phenyl-2-(naphthyl-1-yl)vinyl-1-yl, 2,2-bis(diphenyl-1-yl)vinyl-1-yl, a stilbenyl group, a styrenyl group, and the like, but are not limited thereto.

In the present specification, specific examples of a silyl group include a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group, and the like, but are not limited thereto.

In the present specification, a germanium group may be represented by a chemical formula of —SiR$_a$R$_c$R$_c$, and R$_a$, R$_b$ and R$_c$ are the same as or different from each other, and may be each independently hydrogen; a substituted or unsubstituted alkyl group; or a substituted or unsubstituted aryl group. Specific examples of the germanium group include a trimethylgermanium group, a triethylgermanium group, a t-butyldimethylgermanium group, and the like, but are not limited thereto.

In the present specification, a boron group may be —BR$_{100}$R$_{101}$, and R$_{100}$ and R$_{101}$ are the same as or different from each other, and may be each independently selected from the group consisting of hydrogen; deuterium; halogen; a nitrile group; a substituted or unsubstituted monocyclic or polycyclic cycloalkyl group having 3 to 30 carbon atoms; a substituted or unsubstituted straight or branched alkyl group having 1 to 30 carbon atoms; a substituted or unsubstituted monocyclic or polycyclic aryl group having 6 to 30 carbon atoms; and a substituted or unsubstituted monocyclic or polycyclic heteroaryl group having 2 to 30 carbon atoms.

In the present specification, specific examples of a phosphine oxide group include a diphenylphosphine oxide group, dinaphthylphosphine oxide, and the like, but are not limited thereto.

In the present specification, an aryl group is not particularly limited, but has preferably 6 to 30 carbon atoms, and the aryl group may be monocyclic or polycyclic.

When the aryl group is a monocyclic aryl group, the number of carbon atoms thereof is not particularly limited, but is preferably 6 to 30. Specific examples of the monocyclic aryl group include a phenyl group, a biphenyl group, a terphenyl group, and the like, but are not limited thereto.

When the aryl group is a polycyclic aryl group, the number of carbon atoms thereof is not particularly limited, but is preferably 10 to 30. Specific examples of the polycyclic aryl group include a naphthyl group, an anthracenyl group, a phenanthryl group, a pyrenyl group, a perylenyl group, a chrysenyl group, a fluorenyl group, and the like, but are not limited thereto.

In the present specification, the fluorenyl group may be substituted, and adjacent substituents may be bonded to each other to form a ring.

When the fluorenyl group is substituted, the substituent may be,

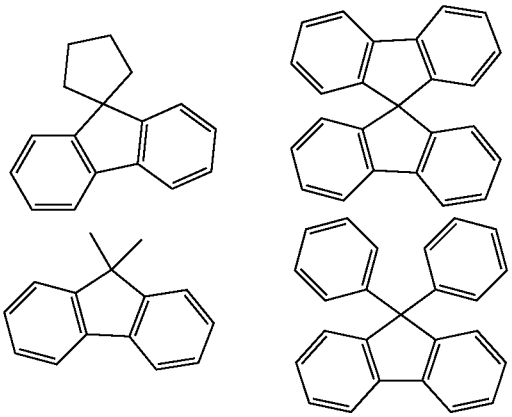

and the like. However, the substituent is not limited thereto.

In the present specification, the "adjacent" group may mean a substituent substituted with an atom directly linked to an atom in which the corresponding substituent is substituted, a substituent disposed sterically closest to the corresponding substituent, or another substituent substituted with an atom in which the corresponding substituent is substituted. For example, two substituents substituted at the ortho position in a benzene ring and two substituents substituted with the same carbon in an aliphatic ring may be interpreted as groups which are "adjacent" to each other.

In the present specification, the aryl group in the aryloxy group, the arylthioxy group, the arylsulfoxy group, the N-arylalkylamine group, the N-arylheteroarylamine group, and the arylphosphine group is the same as the above-described examples of the aryl group. Specifically, examples of the aryloxy group include a phenoxy group, a p-tolyloxy group, an m-tolyloxy group, a 3,5-dimethyl-phenoxy group, a 2,4,6-trimethylphenoxy group, a p-tert-butylphenoxy group, a 3-biphenyloxy group, a 4-biphenyloxy group, a 1-naphthyloxy group, a 2-naphthyloxy group, a 4-methyl-1-naphthyloxy group, a 5-methyl-2-naphthyloxy group, a 1-anthryloxy group, a 2-anthryloxy group, a 9-anthryloxy group, a 1-phenanthryloxy group, a 3-phenanthryloxy group, a 9-phenanthryloxy group, and the like, examples of the arylthioxy group include a phenylthioxy group, a 2-methylphenylthioxy group, a 4-tert-butylphenylthioxy group, and the like, and examples of the arylsulfoxy group include a benzenesulfoxy group, a p-toluenesulfoxy group, and the like, but the examples are not limited thereto.

In the present specification, examples of an arylamine group include a substituted or unsubstituted monoarylamine group, a substituted or unsubstituted diarylamine group, or a substituted or unsubstituted triarylamine group. The aryl group in the arylamine group may be a monocyclic aryl group or a polycyclic aryl group. The arylamine group including two or more aryl groups may include a monocyclic aryl group, a polycyclic aryl group, or both a monocyclic aryl group and a polycyclic aryl group. For example, the aryl group in the arylamine group may be selected from the above-described examples of the aryl group.

In the present specification, a heteroaryl group includes one or more atoms other than carbon, that is, one or more heteroatoms, and specifically, the heteroatom may include one or more atoms selected from the group consisting of O, N, Se, and S, and the like. The number of carbon atoms thereof is not particularly limited, but is preferably 2 to 30, and the heteroaryl group may be monocyclic or polycyclic. Examples of a heterocyclic group include a thiophene group, a furanyl group, a pyrrole group, an imidazolyl group, a thiazolyl group, an oxazolyl group, an oxadiazolyl group, a pyridyl group, a bipyridyl group, a pyrimidyl group, a triazinyl group, a triazolyl group, an acridyl group, a pyridazinyl group, a pyrazinyl group, a qinolinyl group, a quinazolinyl group, a quinoxalinyl group, a phthalazinyl group, a pyridopyrimidyl group, a pyridopyrazinyl group, a pyrazinopyrazinyl group, an isoquinolinyl group, an indolyl group, a carbazolyl group, a benzoxazolyl group, a benzimidazolyl group, a benzothiazolyl group, a benzocarbazolyl group, a benzothiophene group, a dibenzothiophene group, a benzofuranyl group, a phenanthrolinyl group (phenanthroline), a thiazolyl group, an isoxazolyl group, an oxadiazolyl group, a thiadiazolyl group, a benzothiazolyl group, a phenothiazinyl group, a dibenzofuranyl group, and the like, but are not limited thereto.

In the present specification, examples of a heteroarylamine group include a substituted or unsubstituted monoheteroarylamine group, a substituted or unsubstituted diheteroarylamine group, or a substituted or unsubstituted triheteroarylamine group. The heteroarylamine group including two or more heteroaryl groups may include a monocyclic heteroaryl group, a polycyclic heteroaryl group, or both a monocyclic heteroaryl group and a polycyclic heteroaryl group. For example, the heteroaryl group in the heteroarylamine group may be selected from the above-described examples of the heteroaryl group.

In the present specification, examples of the heteroaryl group in the N-arylheteroarylamine group and the N-alkylheteroarylamine group are the same as the above-described examples of the heteroaryl group.

In the present specification, a heterocyclic group may be monocyclic or polycyclic, may be an aromatic ring, an aliphatic ring, or a fused ring of the aromatic ring and the aliphatic ring, and may be selected from the examples of the heteroaryl group.

In the present specification, an arylene group means a group having two bonding positions in an aryl group, that is, a divalent group. The above-described description on the aryl group may be applied to the arylene group, except for a divalent arylene group.

In the present specification, a heteroarylene group means a group having two bonding positions in a heteroaryl group, that is, a divalent group. The above-described description on the heteroaryl group may be applied to the heteroarylene group, except for a divalent heteroarylene group.

In the present specification, in a substituted or unsubstituted ring formed by bonding adjacent groups, the "ring" means a substituted or unsubstituted hydrocarbon ring; or a substituted or unsubstituted hetero ring.

In the present specification, a hydrocarbon ring may be an aromatic ring, an aliphatic ring, or a fused ring of the aromatic ring and the aliphatic ring, and may be selected from the examples of the cycloalkyl group or the aryl group, except for the hydrocarbon ring which is not monovalent.

In the present specification, an aromatic ring may be monocyclic or polycyclic, and may be selected from the examples of the aryl group, except for the aromatic ring which is not monovalent.

In the present specification, a hetero ring includes one or more atoms other than carbon, that is, one or more heteroatoms, and specifically, the heteroatom may include one or more atoms selected from the group consisting of O, N, Se, and S and the like. The hetero ring may be monocyclic or polycyclic, may be an aromatic ring, an aliphatic ring or a fused ring of the aromatic ring and the aliphatic ring, and may be selected from the examples of the heteroaryl group, except for the hetero ring which is not monovalent.

According to an exemplary embodiment of the present specification, Chemical Formula 1 may be represented by the following Chemical Formula 1-1.

[Chemical Formula 1-1]

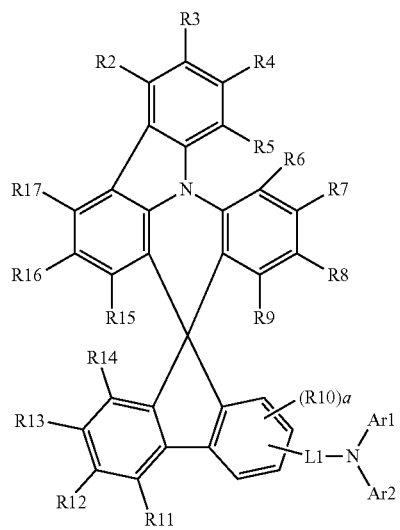

In Chemical Formula 1-1, the definitions of L1, Ar1, Ar2, R2 to R17 and a are the same as those in Chemical Formula 1.

According to an exemplary embodiment of the present specification, Chemical Formula 1 may be represented by any one of the following Chemical Formulae 1-2 to 1-4.

[Chemical Formula 1-2]

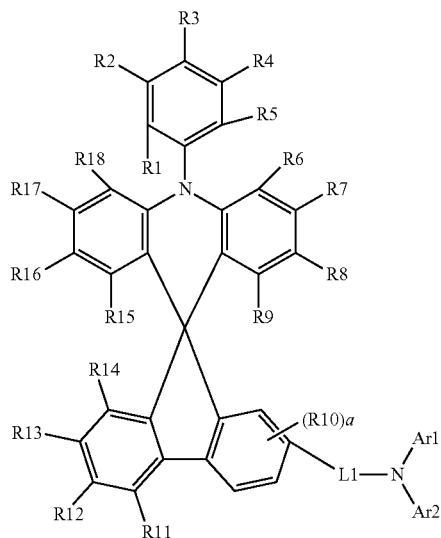

[Chemical Formula 1-3]

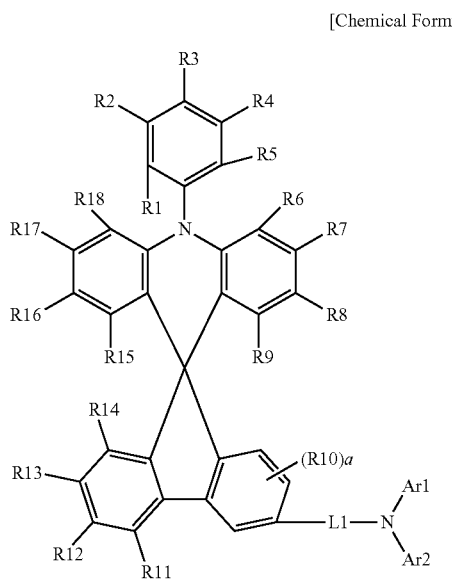

[Chemical Formula 1-4]

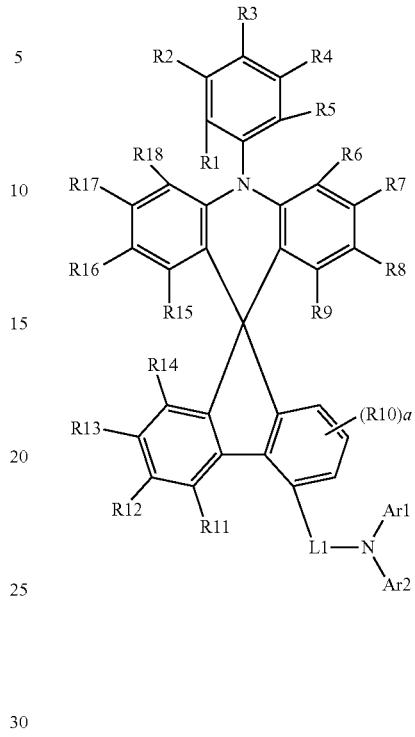

In Chemical Formulae 1-2 to 1-4, the definitions of L1, Ar1, Ar2, R1 to R18 and a are the same as those in Chemical Formula 1.

According to an exemplary embodiment of the present specification, Chemical Formula 1-1 may be represented by any one of the following Chemical Formulae 1-5 to 1-7.

[Chemical Formula 1-5]

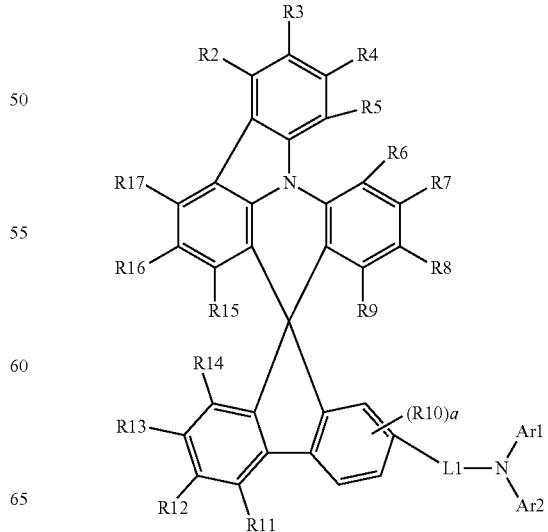

[Chemical Formula 1-6]

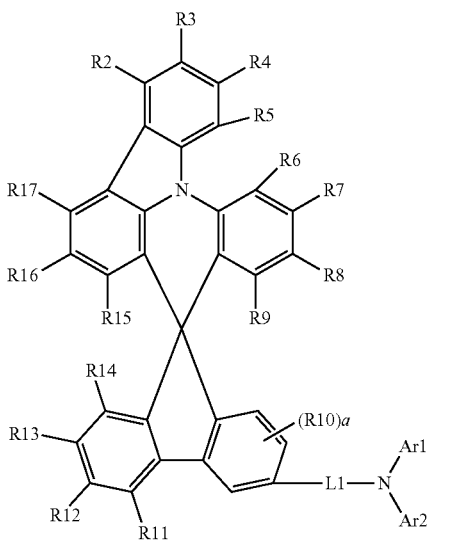

[Chemical Formula 1-7]

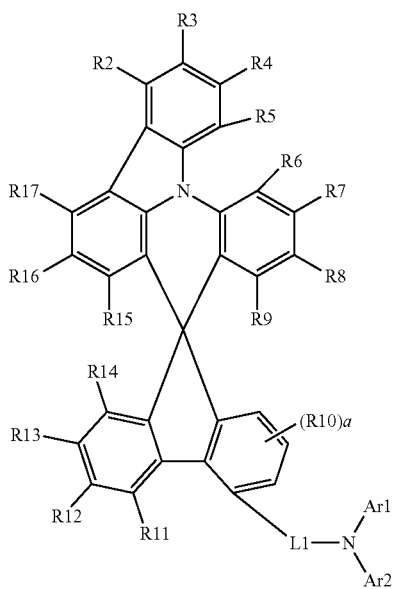

In Chemical Formulae 1-5 to 1-7, the definitions of L1, Ar1, Ar2, R2 to R17, and a are the same as those in Chemical Formula 1.

According to an exemplary embodiment of the present specification, in Chemical Formula 1, L1 is a direct bond; or a substituted or unsubstituted monocyclic or polycyclic arylene group having 6 to 30 carbon atoms.

According to an exemplary embodiment of the present specification, in Chemical Formula 1, L1 is a direct bond; or a substituted or unsubstituted monocyclic or polycyclic arylene group having 6 to 20 carbon atoms.

According to an exemplary embodiment of the present specification, in Chemical Formula 1, L1 is a direct bond; a substituted or unsubstituted phenylene group; or a substituted or unsubstituted biphenylylene group.

According to an exemplary embodiment of the present specification, in Chemical Formula 1, L1 is a direct bond; a phenylene group; or a biphenylylene group.

According to an exemplary embodiment of the present specification, in Chemical Formula 1, Ar1 and Ar2 are the same as or different from each other, and are each independently a substituted or unsubstituted monocyclic or polycyclic aryl group having 6 to 30 carbon atoms; or a substituted or unsubstituted monocyclic or polycyclic heteroaryl group having 2 to 30 carbon atoms.

According to an exemplary embodiment of the present specification, in Chemical Formula 1, Ar1 and Ar2 are the same as or different from each other, and are each independently a substituted or unsubstituted monocyclic or polycyclic aryl group having 6 to 20 carbon atoms; or a substituted or unsubstituted monocyclic or polycyclic heteroaryl group having 2 to 20 carbon atoms.

According to an exemplary embodiment of the present specification, in Chemical Formula 1, Ar1 and Ar2 are the same as or different from each other, and are each independently a substituted or unsubstituted phenyl group; a substituted or unsubstituted biphenyl group; a substituted or unsubstituted naphthyl group; a substituted or unsubstituted fluorenyl group; a substituted or unsubstituted phenanthrenyl group; a substituted or unsubstituted terphenyl group; a substituted or unsubstituted dibenzothiophene group; a substituted or unsubstituted dibenzofuranyl group; or a substituted or unsubstituted carbazolyl group.

According to an exemplary embodiment of the present specification, Ar1 and Ar2 are the same as or different from each other, and are each independently a phenyl group which is unsubstituted or substituted with an aryl group or a heteroaryl group; a biphenyl group which is unsubstituted or substituted with an aryl group; a naphthyl group; a fluorenyl group which is unsubstituted or substituted with an alkyl group or an aryl group; a phenanthrenyl group; a terphenyl group; a dibenzothiophene group; a dibenzofuranyl group; or a carbazolyl group which is unsubstituted or substituted with an aryl group.

According to an exemplary embodiment of the present specification, Ar1 and Ar2 are the same as or different from each other, and are each independently a phenyl group which is unsubstituted or substituted with a phenyl group, a carbazolyl group, a dibenzofuranyl group, or a dibenzothiophene group; a biphenyl group which is unsubstituted or substituted with a phenyl group; a naphthyl group; a fluorenyl group which is unsubstituted or substituted with a methyl group or a phenyl group; a phenanthrenyl group; a terphenyl group; a dibenzothiophene group; a dibenzofuranyl group; or a carbazolyl group which is unsubstituted or substituted with a phenyl group.

According to an exemplary embodiment of the present specification, Chemical Formula 2 is represented by any one of the following Chemical Formulae 2-1 to 2-3.

[ChemicalFormula 2-1]

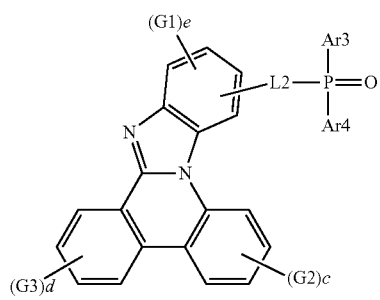

[Chemical Formula 2-2]

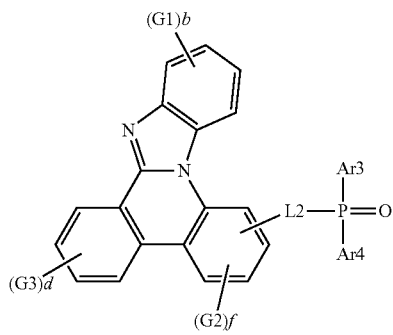

[Chemical Formula 2-3]

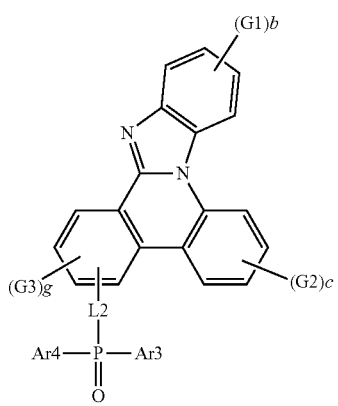

In Chemical Formulae 2-1 to 2-3, the definitions of G1 to G3, b, c and d are the same as those in Chemical Formula 2, the definitions of L2, Ar3, and Ar4 are the same as those in Chemical Formula 2A, e, f, and g are each an integer from 1 to 3, and when e, f, and g are each 2 or more, two or more structures in the parenthesis are the same as or different from each other.

According to an exemplary embodiment of the present specification, Chemical Formula 2 is represented by any one of the following Chemical Formulae 2-4 to 2-8.

[Chemical Formula 2-4]

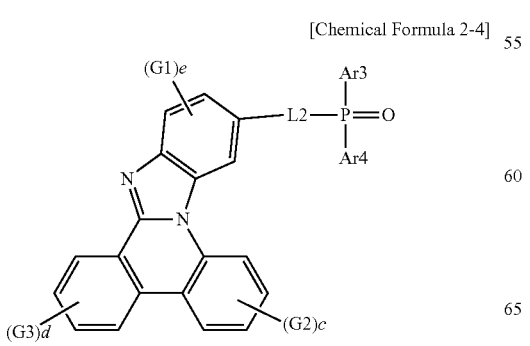

[Chemical Formula 2-5]

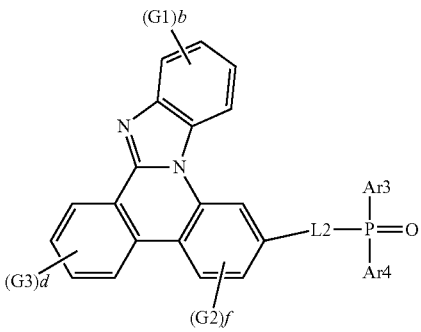

[Chemical Formula 2-6]

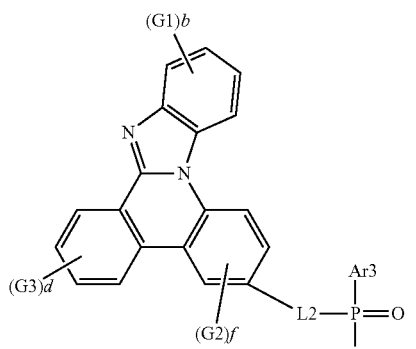

[Chemical Formula 2-7]

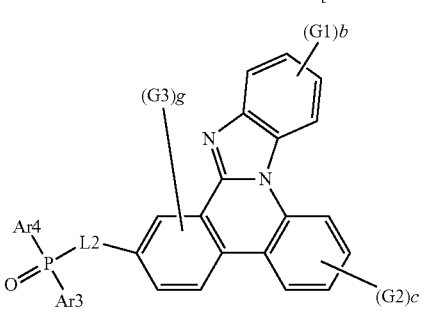

[Chemical Formula 2-8]

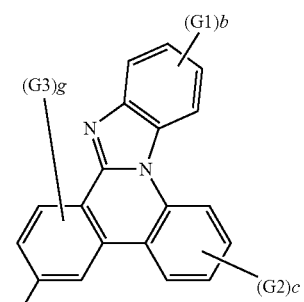

In Chemical Formulae 2-4 to 2-8, the definitions of G1 to G3, b, c and d are the same as those in Chemical Formula 2, the definitions of L2, Ar3, and Ar4 are the same as those in Chemical Formula 2A, e, f, and g are each an integer from 1 to 3, and when e, f and g are each 2 or more, two or more structures in the parenthesis are the same as or different from each other.

According to an exemplary embodiment of the present specification, in Chemical Formula 2, at least one of G1 to G3 is represented by Chemical Formula 2A, and the others are hydrogen.

According to an exemplary embodiment of the present specification, in Chemical Formula 2A, L2 is a direct bond; a substituted or unsubstituted monocyclic or polycyclic arylene group having 6 to 30 carbon atoms; or a substituted or unsubstituted monocyclic or polycyclic heteroarylene group having 2 to 30 carbon atoms.

According to an exemplary embodiment of the present specification, in Chemical Formula 2A, L2 is a direct bond; a substituted or unsubstituted monocyclic or polycyclic arylene group having 6 to 20 carbon atoms; or a substituted or unsubstituted monocyclic or polycyclic heteroarylene group having 2 to 20 carbon atoms.

According to an exemplary embodiment of the present invention, in Chemical Formula 2A, L2 is a direct bond; a substituted or unsubstituted phenylene group; a substituted or unsubstituted naphthylene group; a substituted or unsubstituted phenanthrenylene group; a substituted or unsubstituted fluorenylne group; a substituted or unsubstituted spirobifluorenylene group; a substituted or unsubstituted pyridylene group; or a substituted or unsubstituted pyrimidylene group.

According to an exemplary embodiment of the present invention, in Chemical Formula 2A, L2 is a direct bond; a substituted or unsubstituted phenylene group; a substituted or unsubstituted naphthylene group; a substituted or unsubstituted phenanthrenylene group; a fluorenylne group which is unsubstituted or substituted with an alkyl group or an aryl group; a substituted or unsubstituted spirobifluorenylene group; a substituted or unsubstituted pyridylene group; or a substituted or unsubstituted pyrimidylene group.

According to an exemplary embodiment of the present specification, in Chemical Formula 2A, L2 is a direct bond; a phenylene group; a naphthylene group; a phenanthrenylene group; a fluorenylene group which is substituted with a methyl group or a phenyl group; a spirobifluorenylene group; a pyridylene group; or a pyrimidylene group.

According to an exemplary embodiment of the present specification, in Chemical Formula 2A, Ar3 and Ar4 are the same as or different from each other, and are each independently a substituted or unsubstituted aryl group.

According to an exemplary embodiment of the present specification, in Chemical Formula 2A, Ar3 and Ar4 are the same as or different from each other, and are each independently a substituted or unsubstituted monocyclic or polycyclic aryl group having 6 to 30 carbon atoms.

According to an exemplary embodiment of the present specification, in Chemical Formula 2A, Ar3 and Ar4 are the same as or different from each other, and are each independently a substituted or unsubstituted monocyclic or polycyclic aryl group having 6 to 20 carbon atoms.

According to an exemplary embodiment of the present specification, in Chemical Formula 2A, Ar3 and Ar4 are the same as or different from each other, and are each independently a substituted or unsubstituted phenyl group.

According to an exemplary embodiment of the present specification, in Chemical Formula 2A, Ar3 and Ar4 are a phenyl group.

According to an exemplary embodiment of the present specification, Chemical Formula 1 is represented by any one of the following structural formulae.

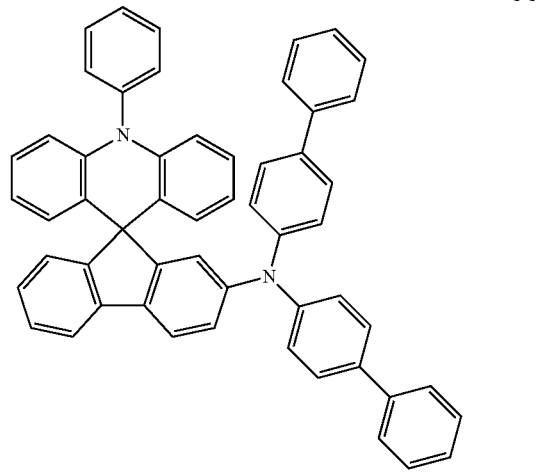

1-1

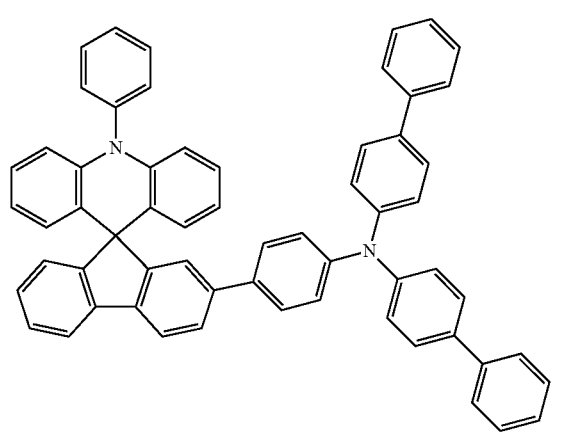

1-2

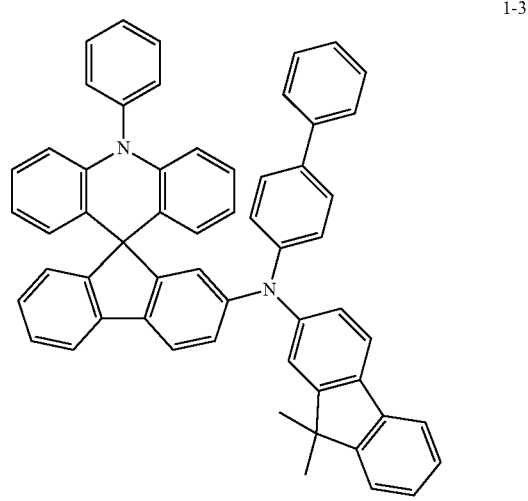

1-3

1-4
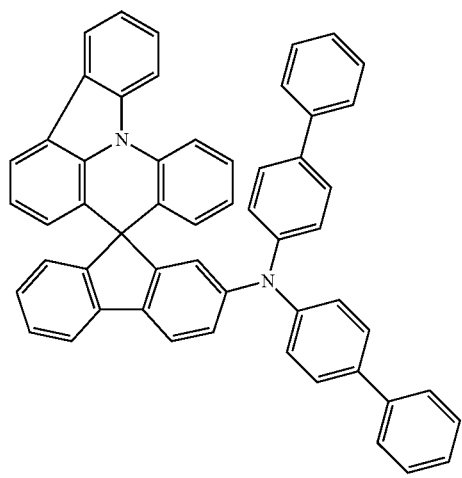
1-5
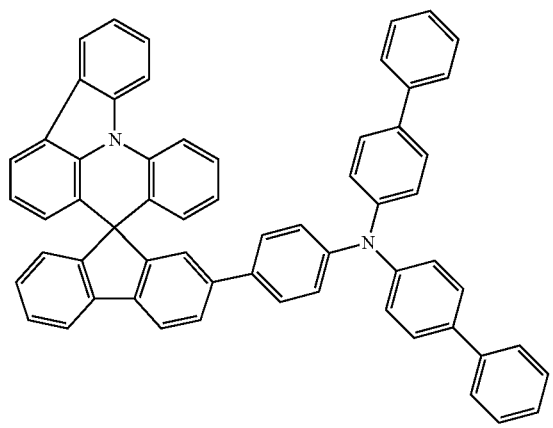
1-6
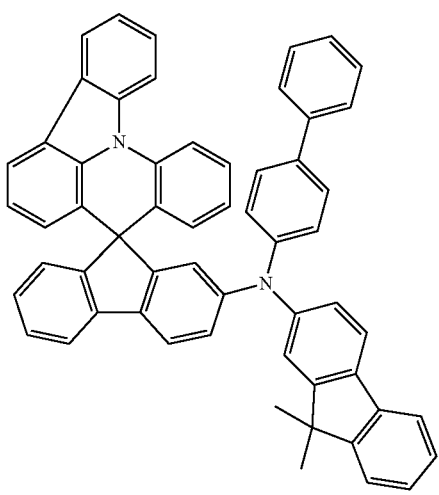
1-7
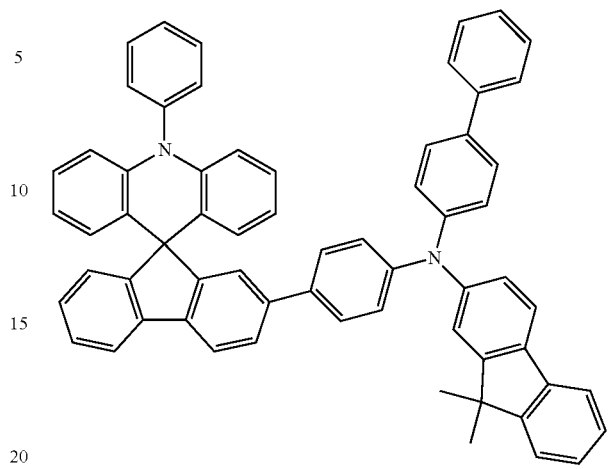
1-8
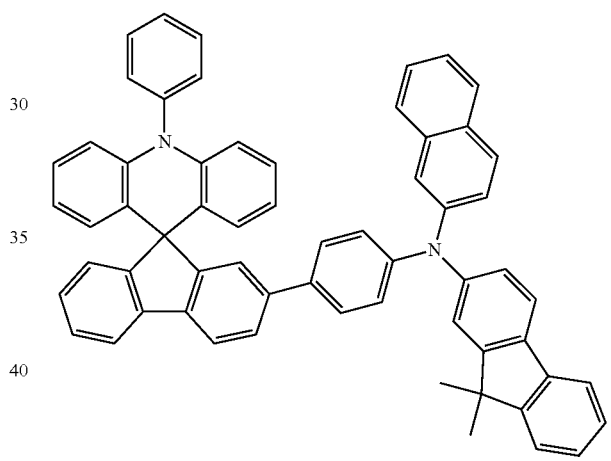
1-9
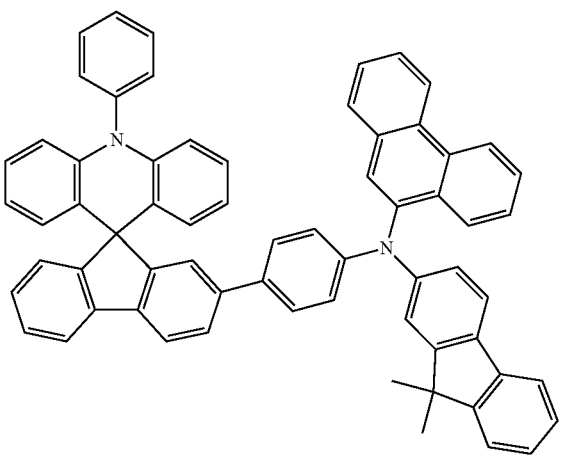

1-10
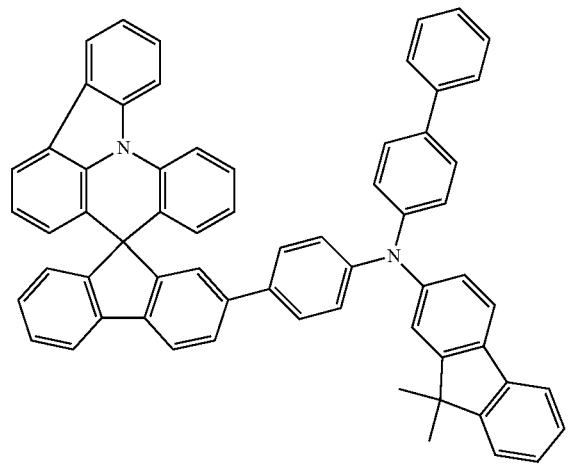
1-14
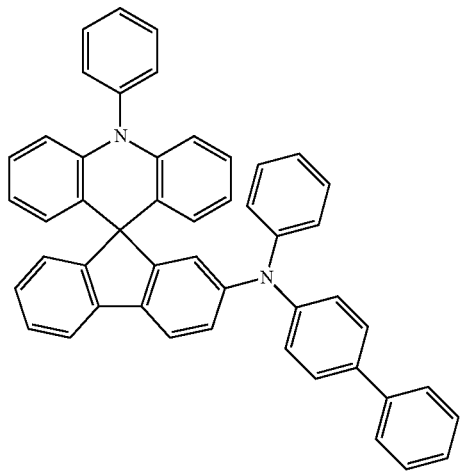
1-12
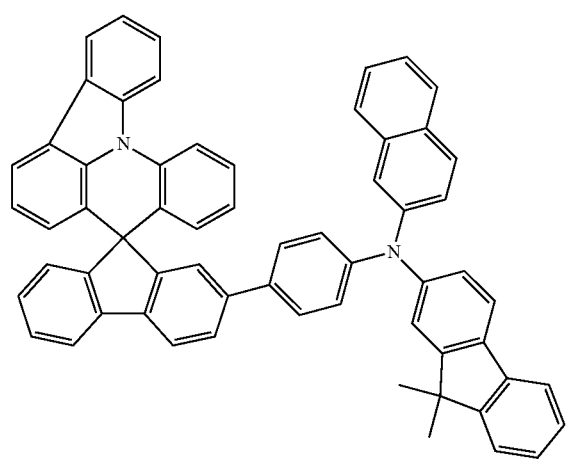
1-15
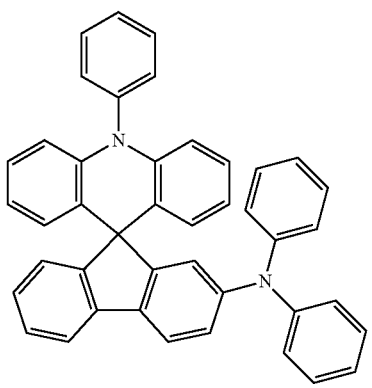
1-13
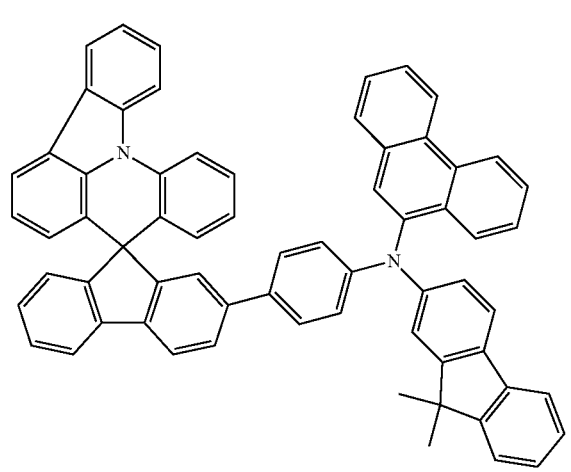
1-16
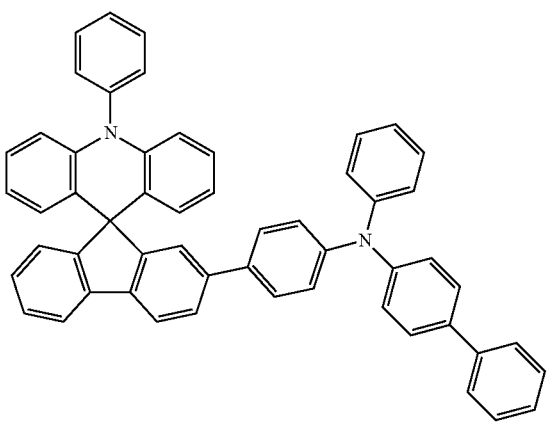

1-17
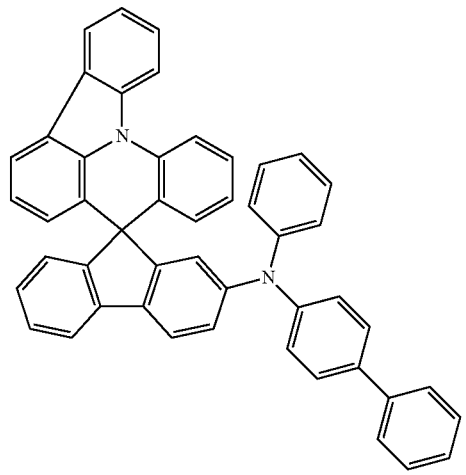
1-18
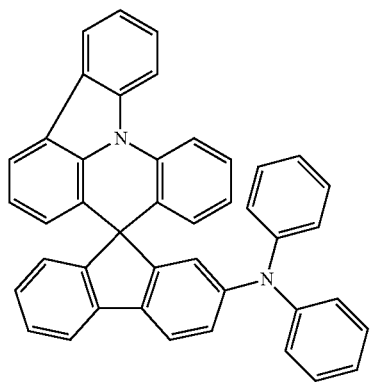
1-19
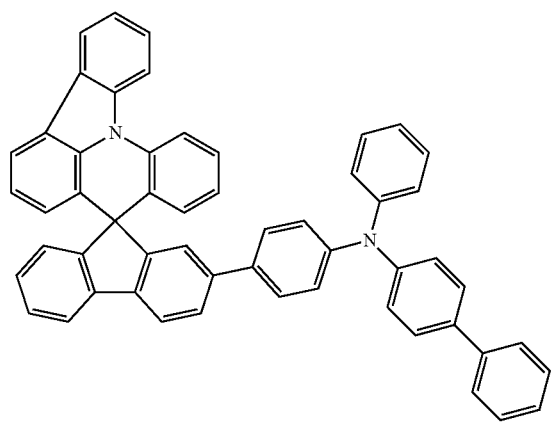
1-20
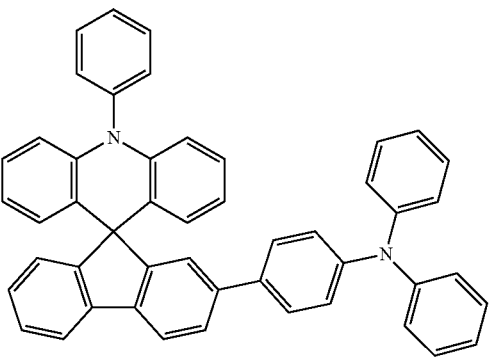
1-21
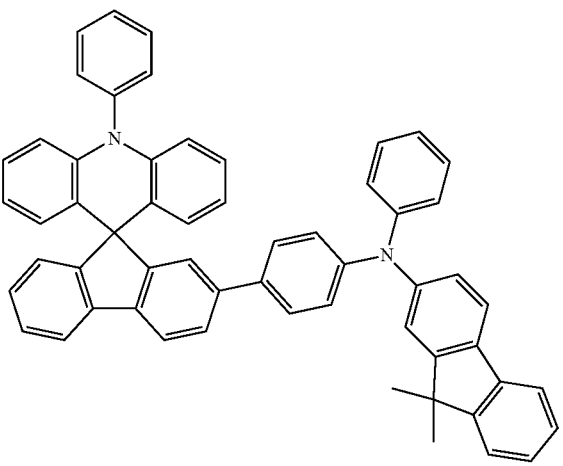
1-22
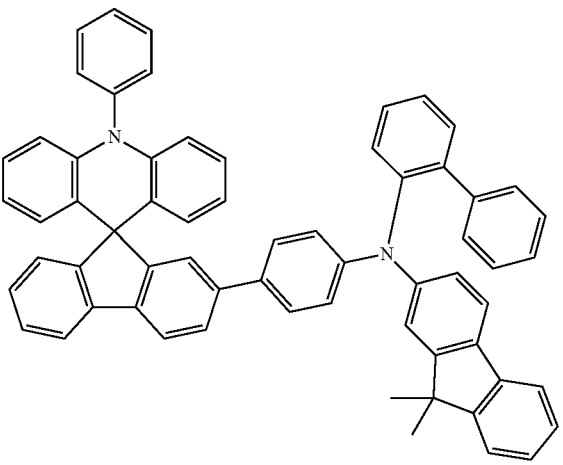

1-23
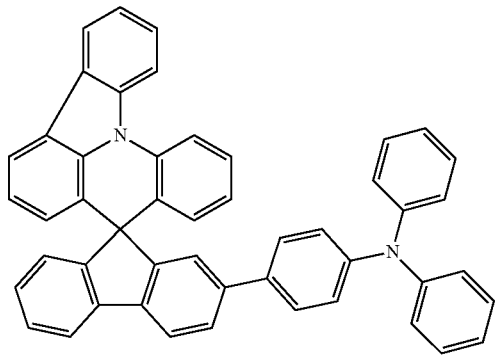
1-24
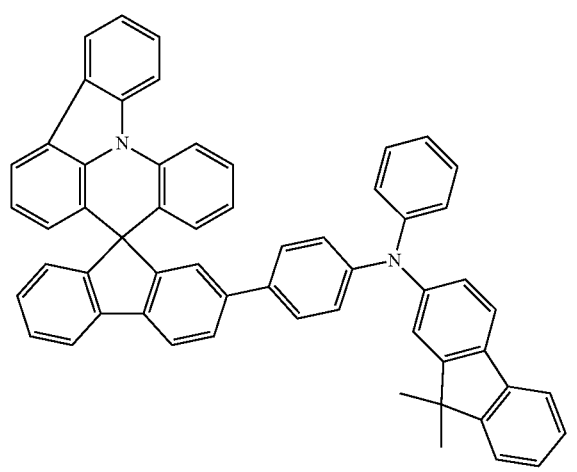
1-25
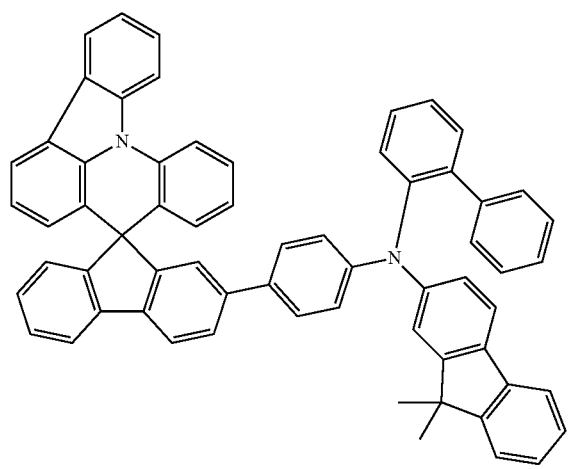
1-26
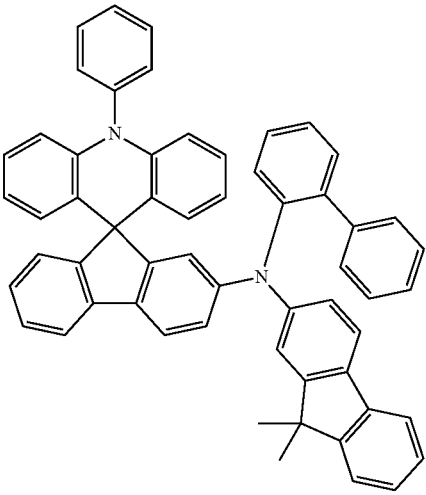
1-27
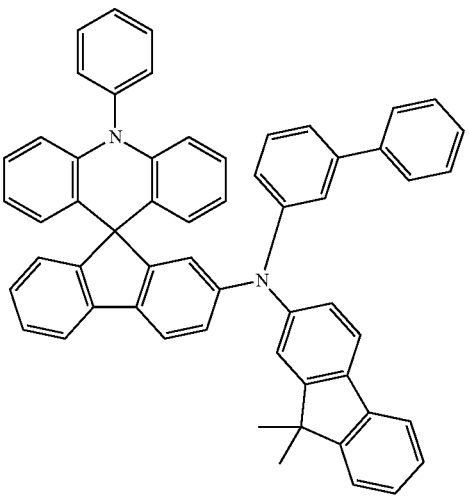
1-28
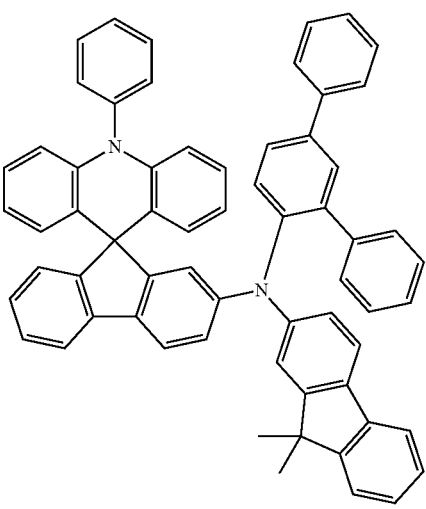

1-29
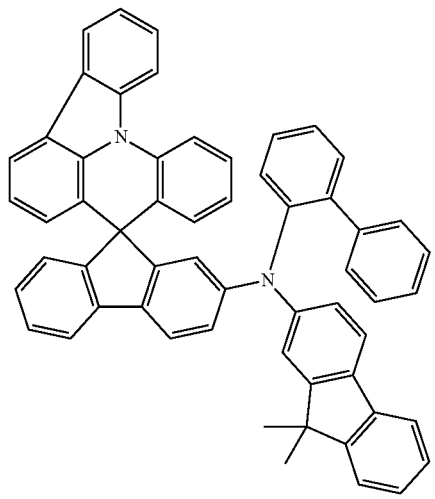
1-32
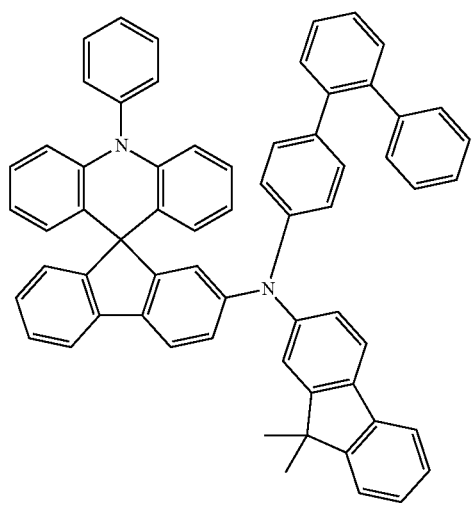
1-30
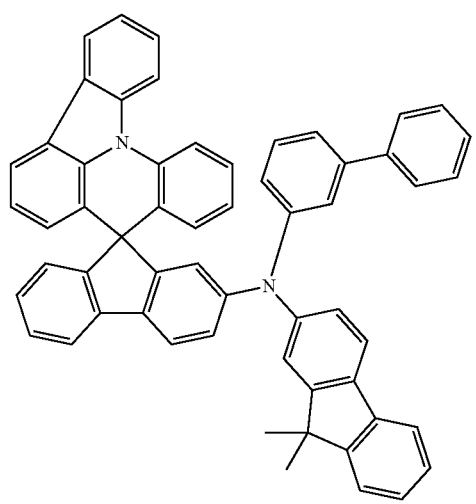
1-33
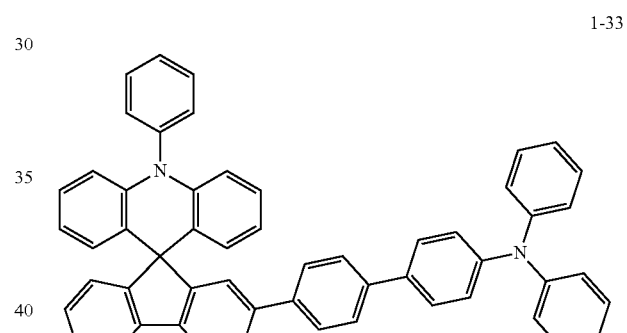
1-31
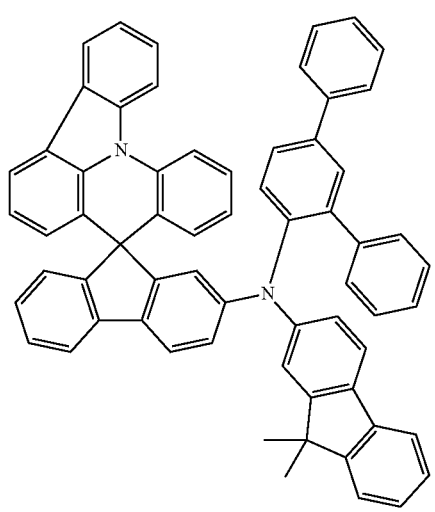
1-34
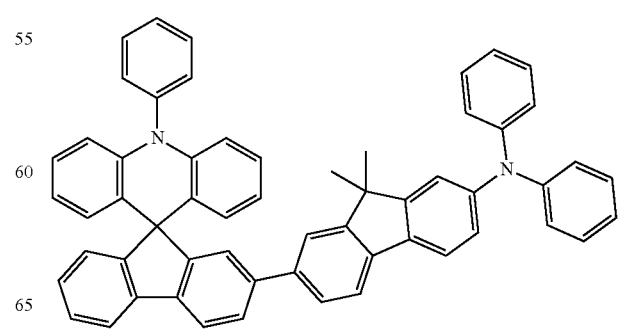

1-35
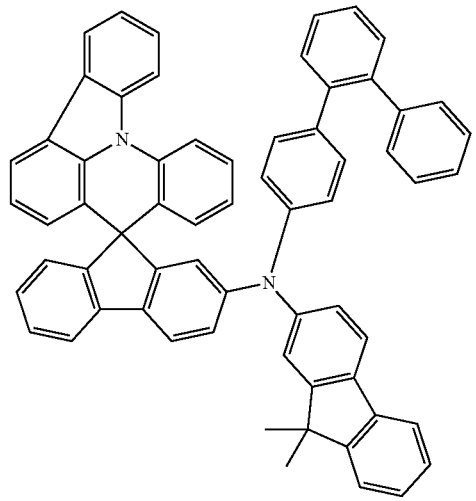
1-36
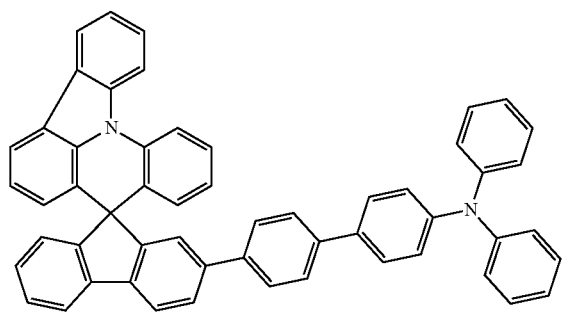
1-37
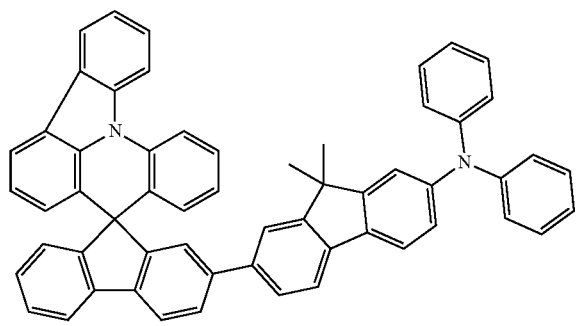
1-38
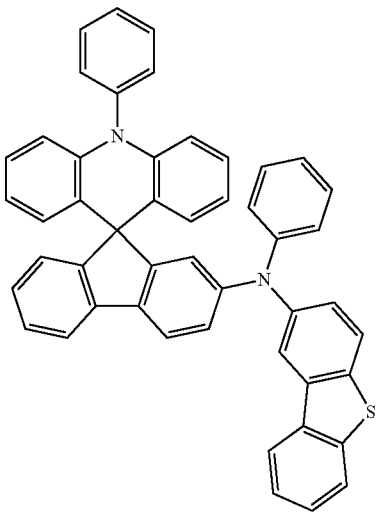
1-39
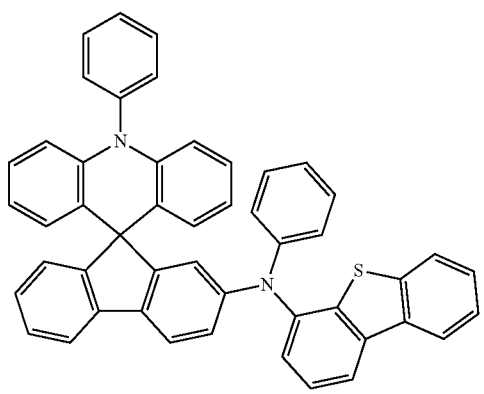
1-40
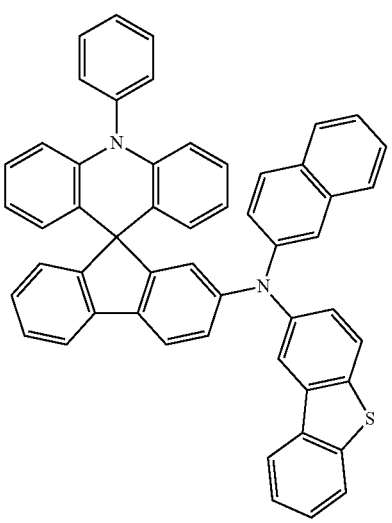

1-41
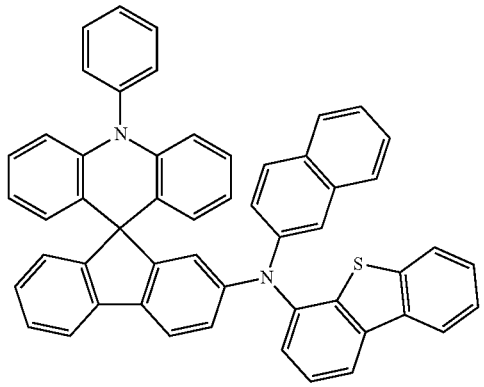
1-42
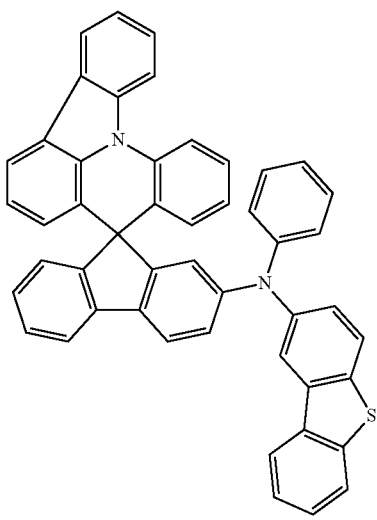
1-43
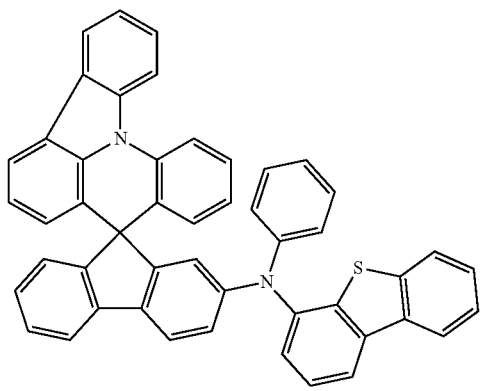
1-44
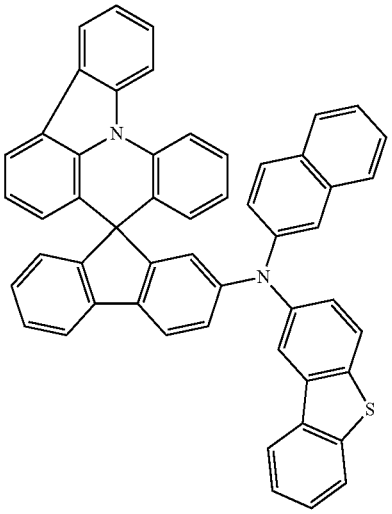
1-45
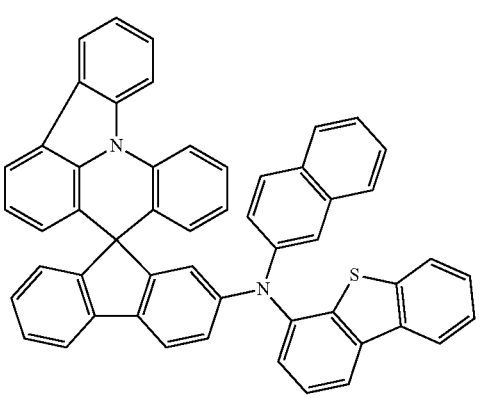
1-46
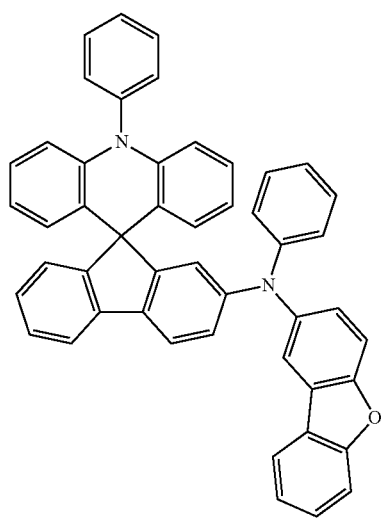

-continued
1-47
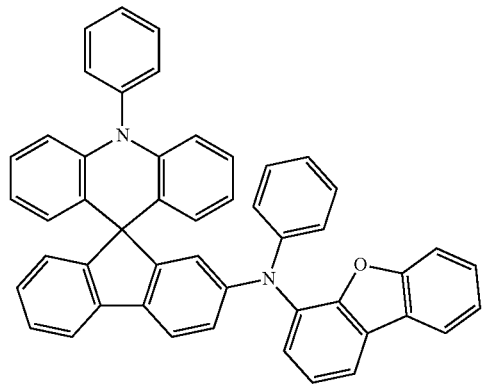
1-48
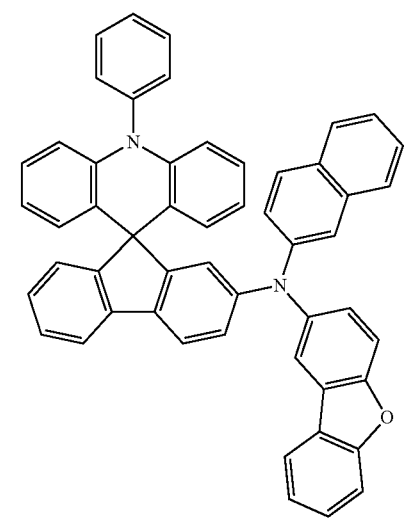
1-49
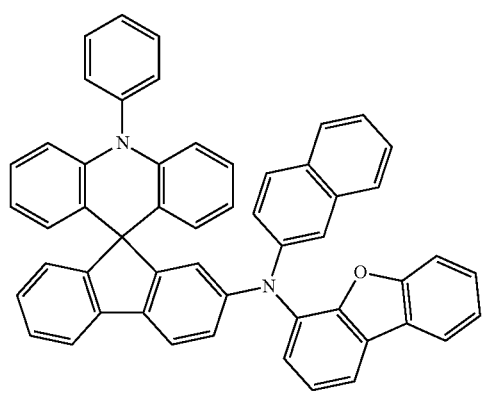
-continued
1-50
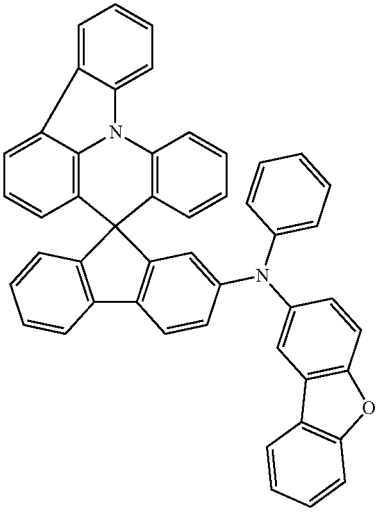
1-51
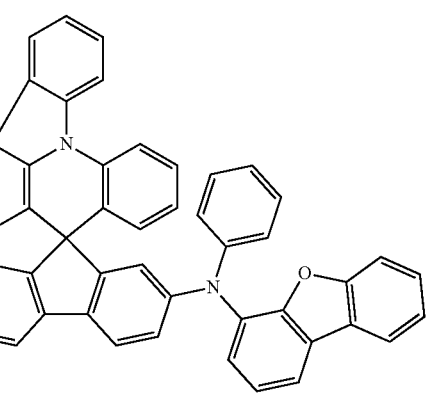
1-52
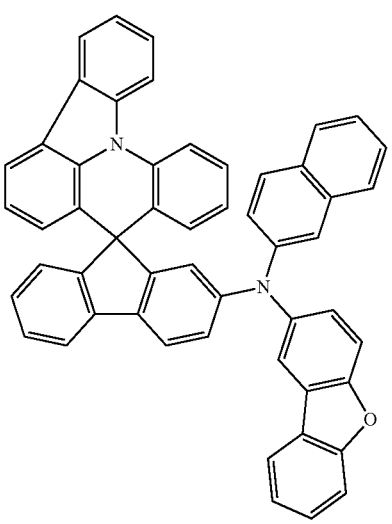

1-53
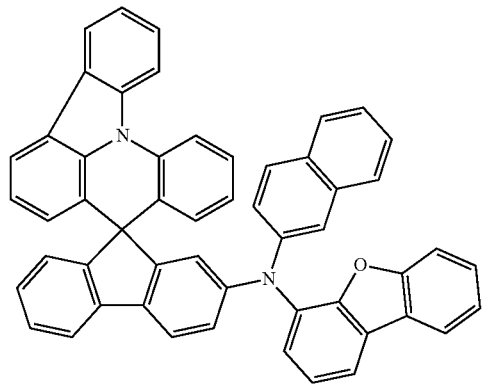
1-56
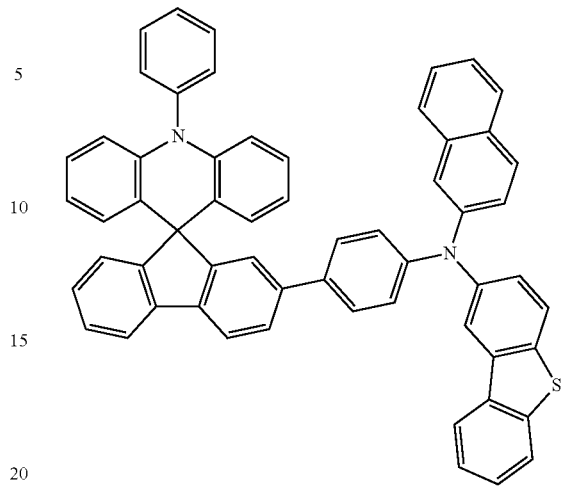
1-54
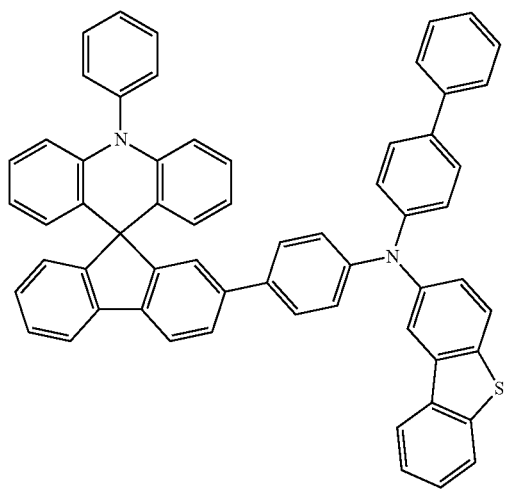
1-57
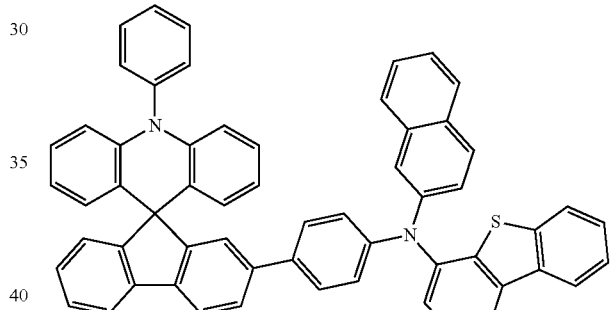
1-55
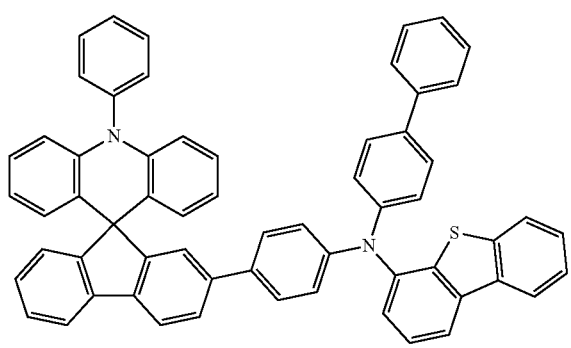
1-58
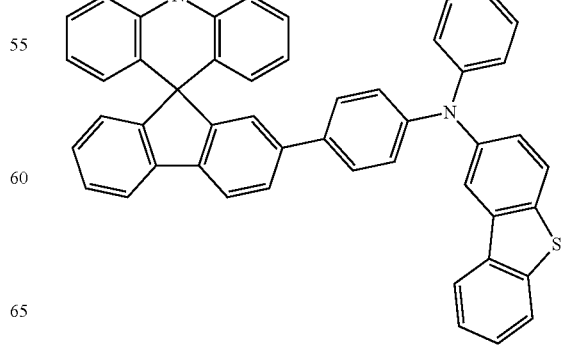

1-59
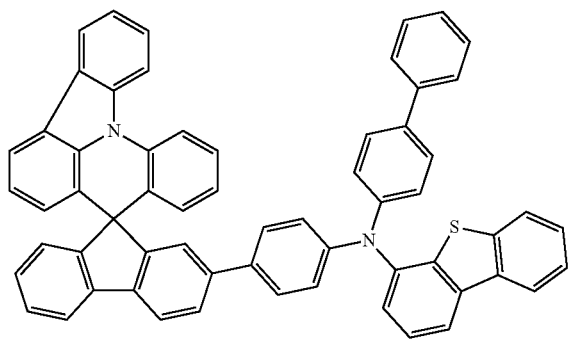
1-62
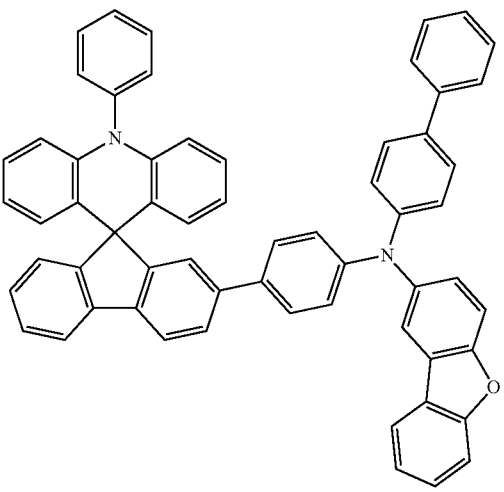
1-60
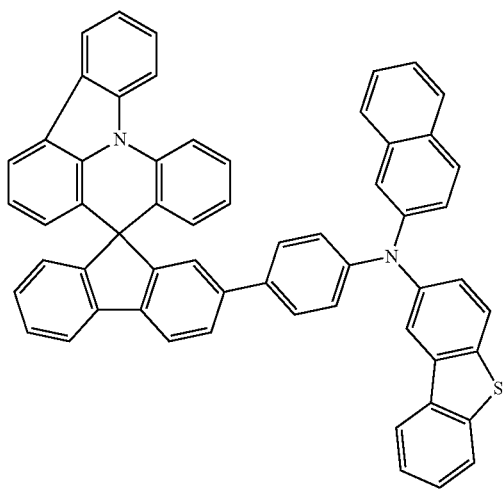
1-63
1-61
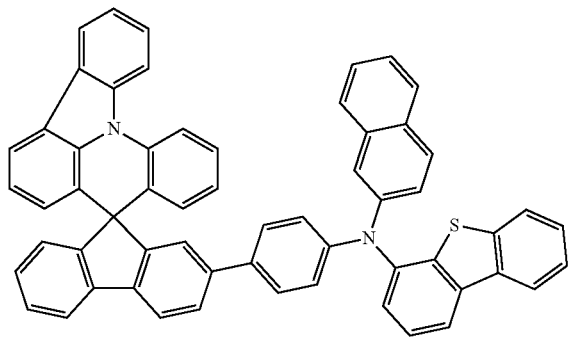
1-64
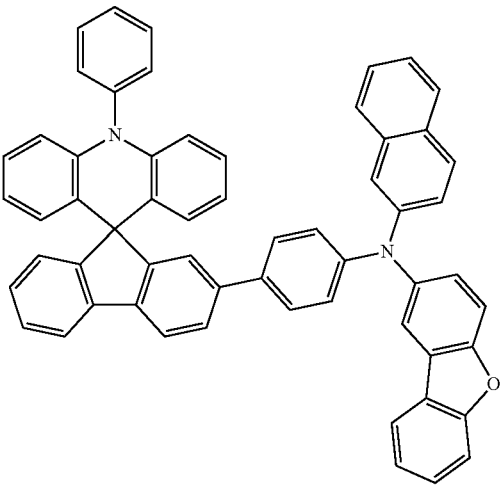

-continued
1-65
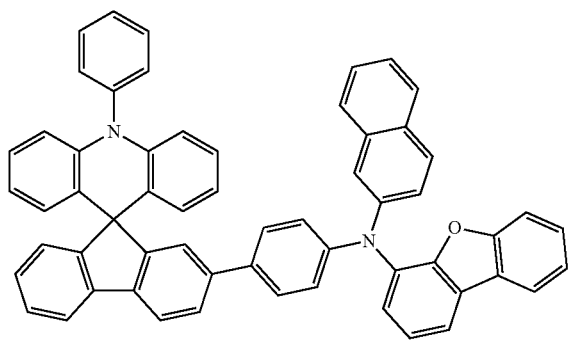
1-66
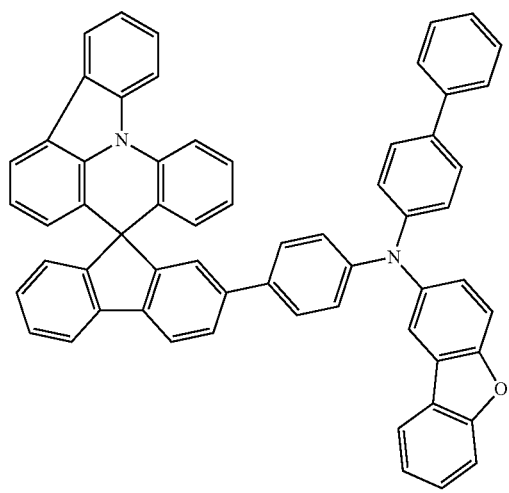
1-67
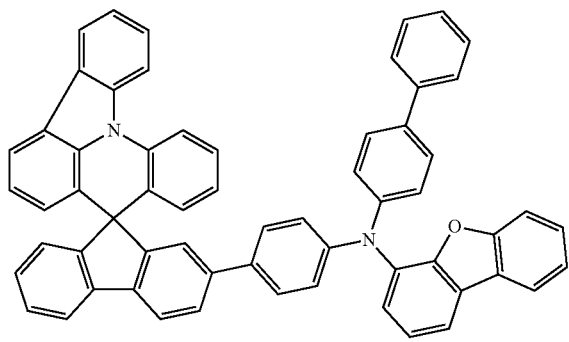
-continued
1-68
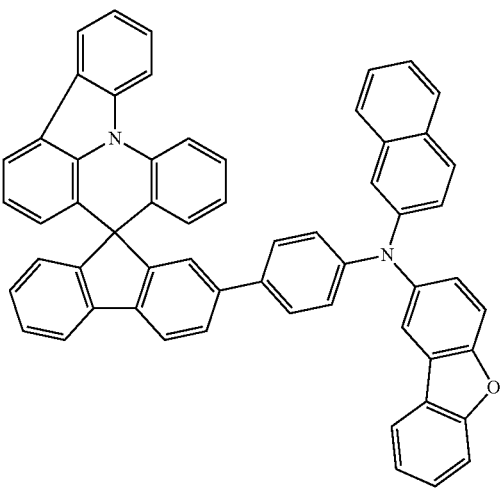
1-69
1-70
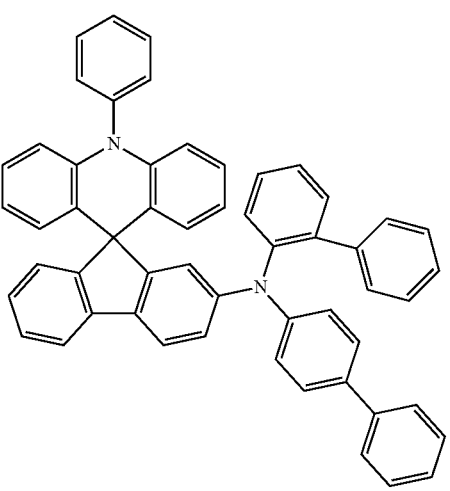

1-71
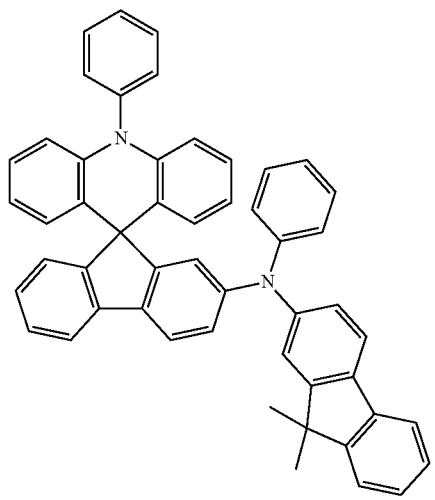
1-72
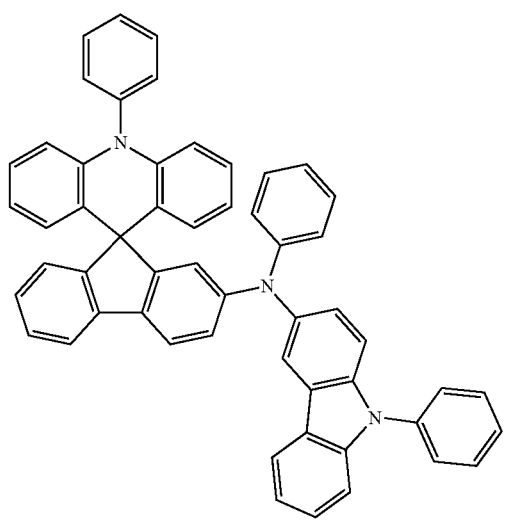
1-73
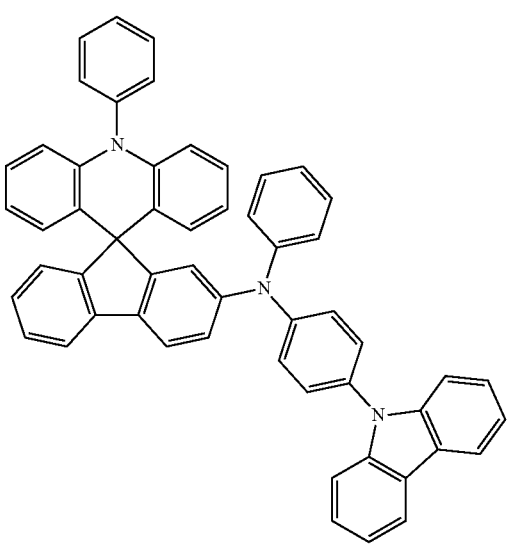
1-74
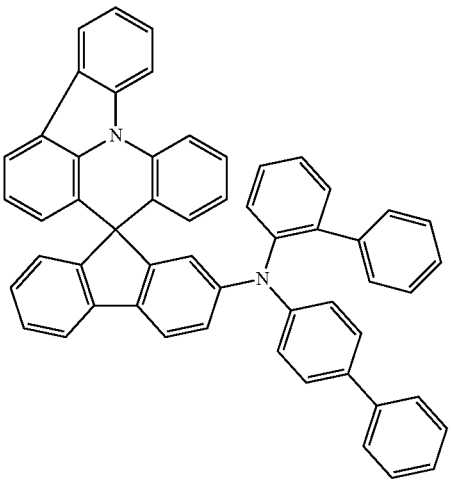
1-75
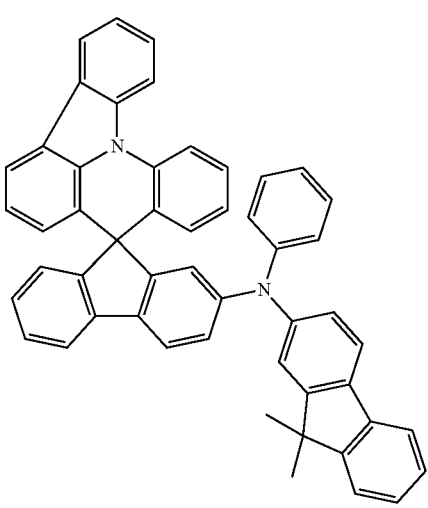
1-76
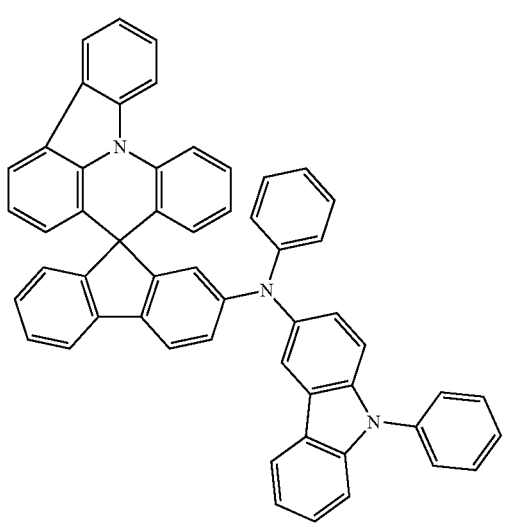

1-77
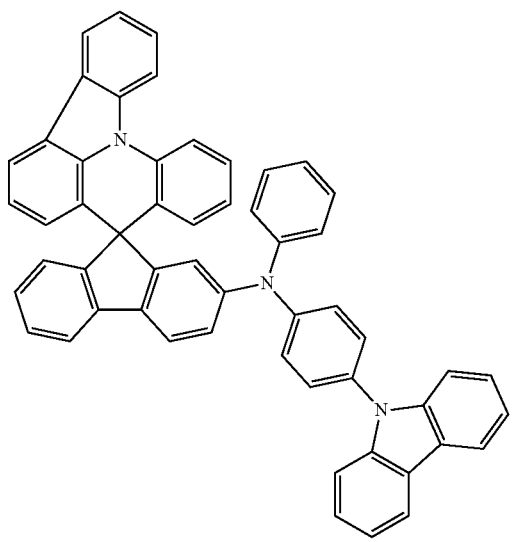
1-78
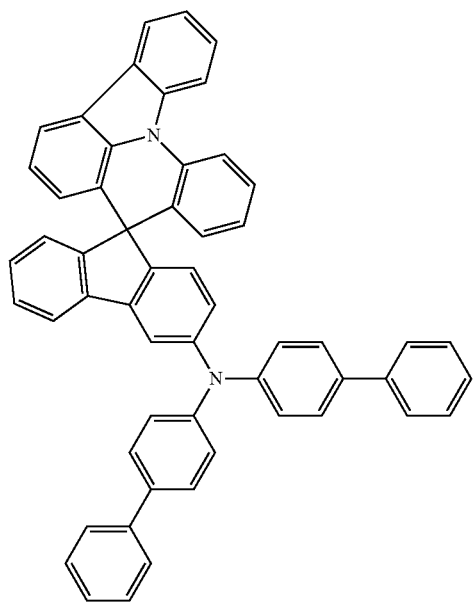
1-79
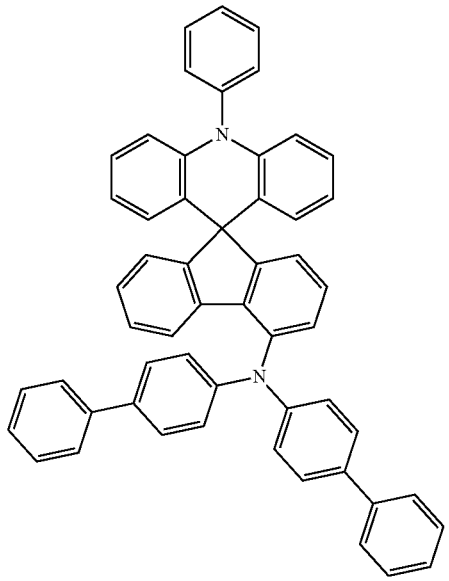
1-80
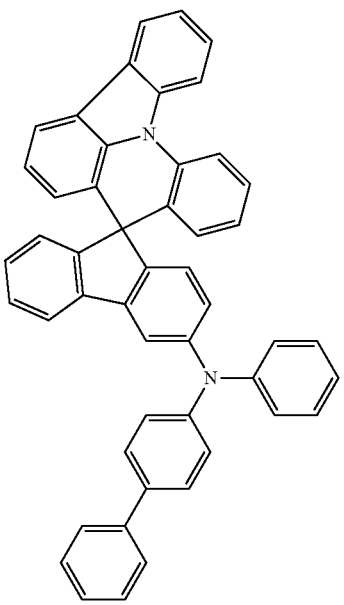

1-81
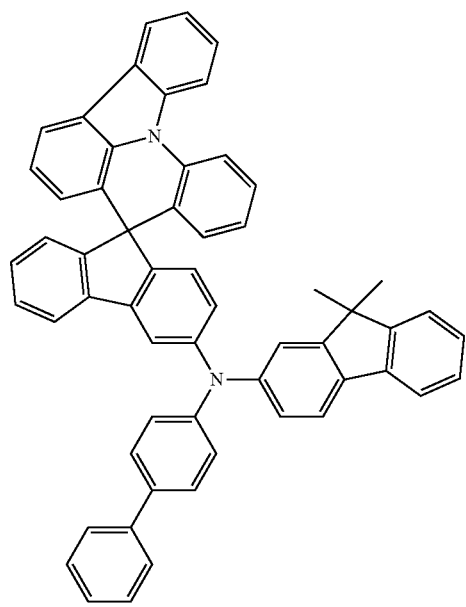
1-83
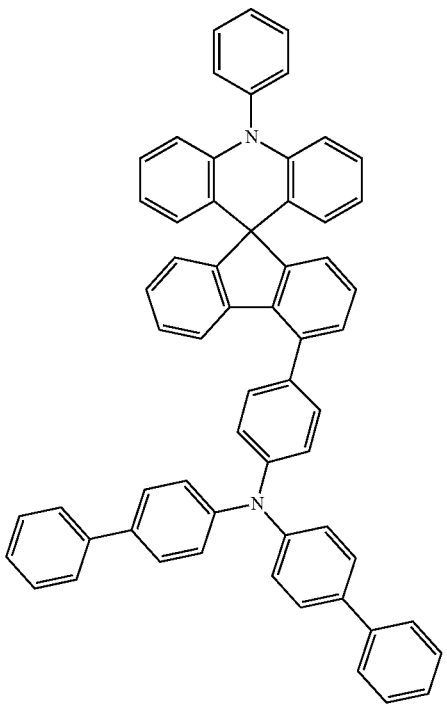
1-82
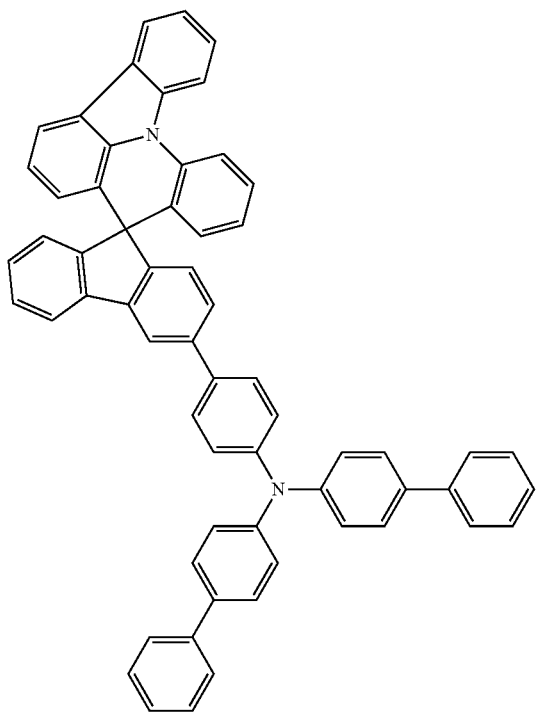
1-84
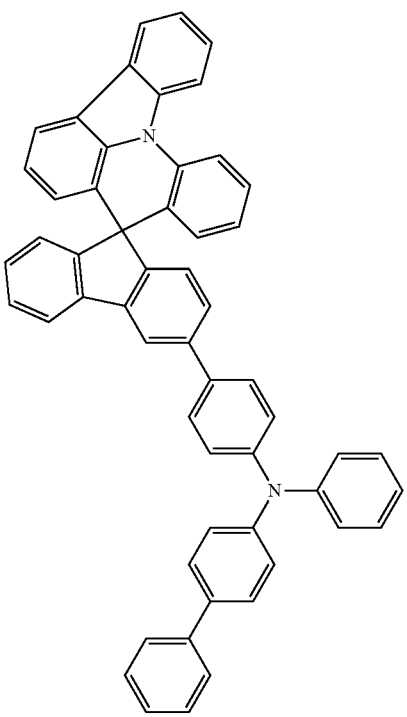

1-85
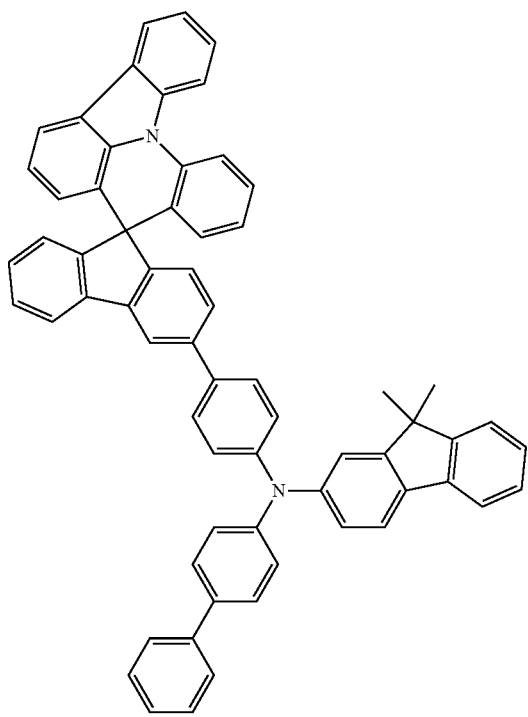
1-87
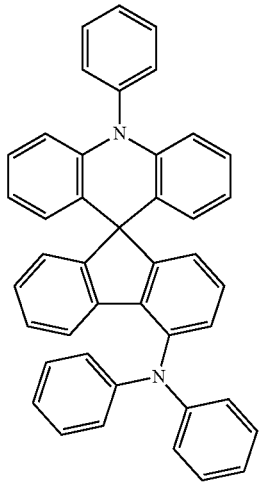
1-86
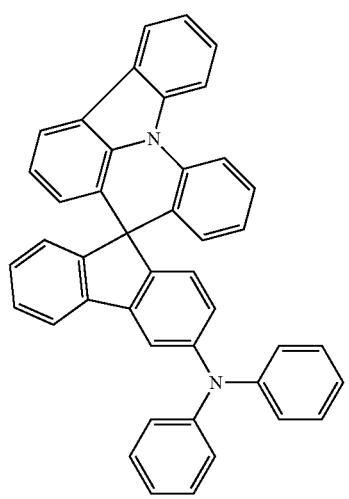
1-88
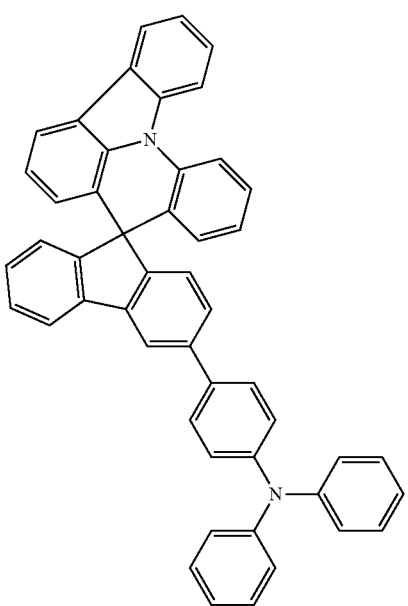

1-89
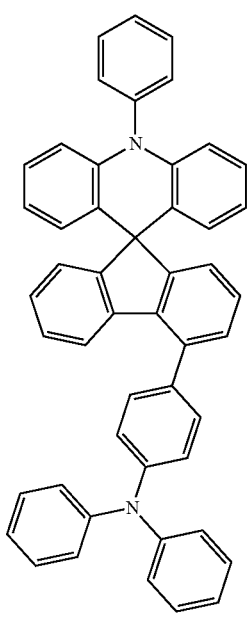
1-90
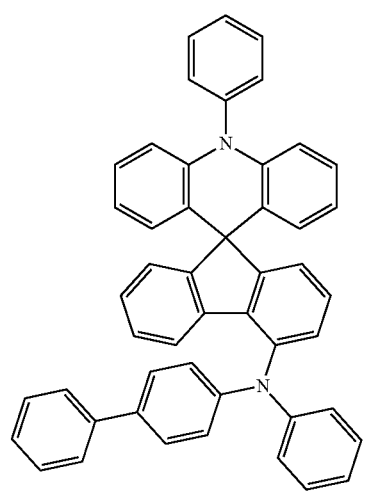
1-91
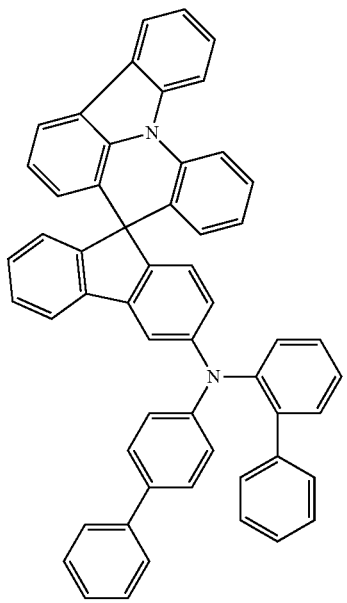
1-92
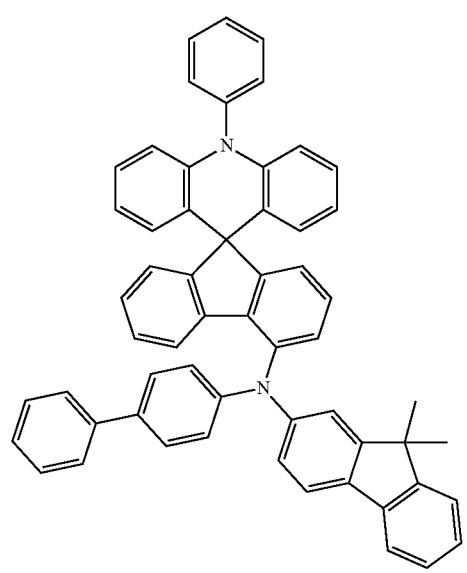
1-93
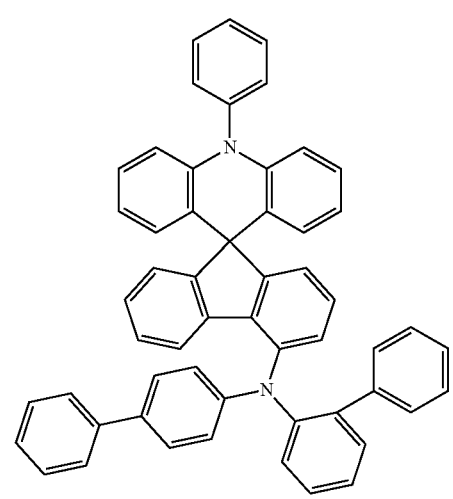

1-94
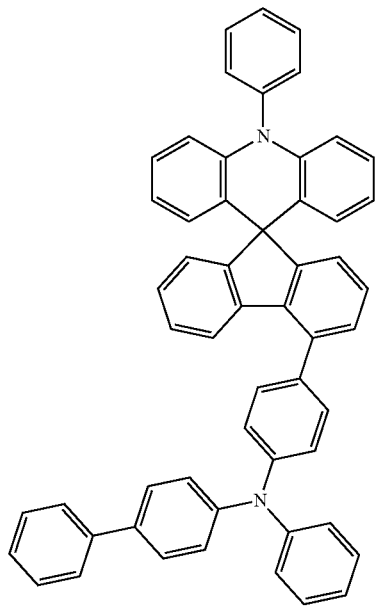
1-95
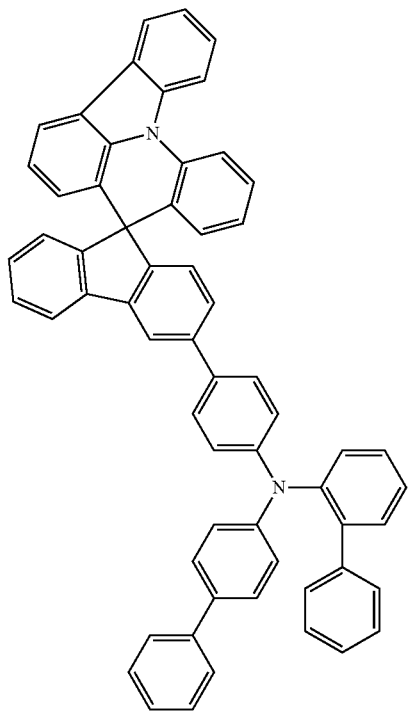
1-96
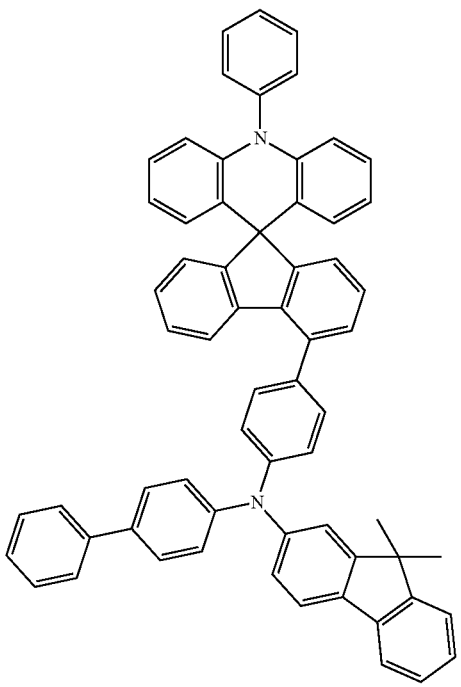
1-97
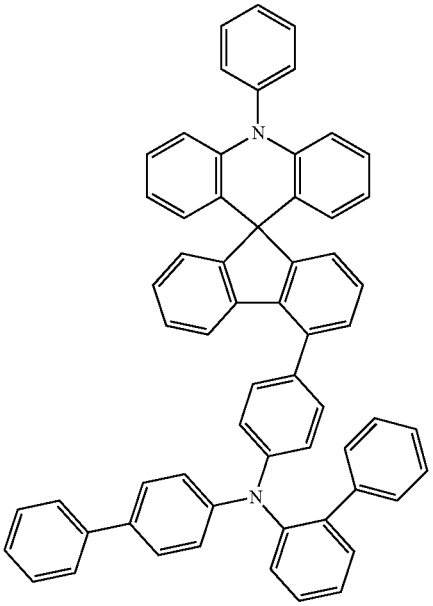

1-98
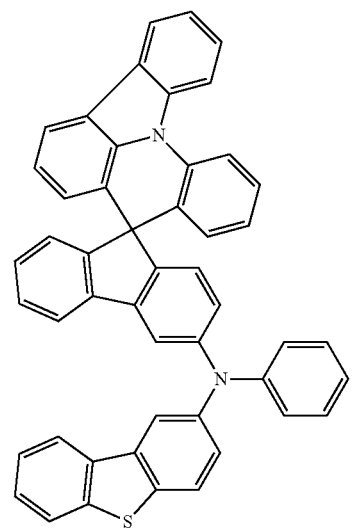
1-99
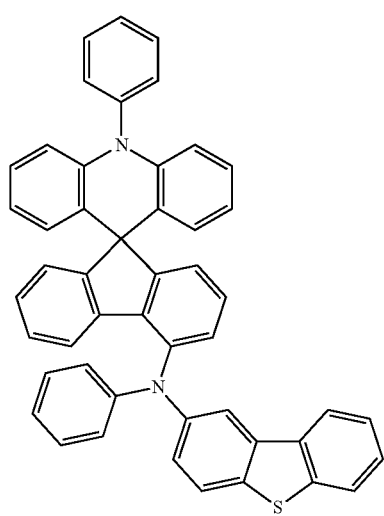
1-100
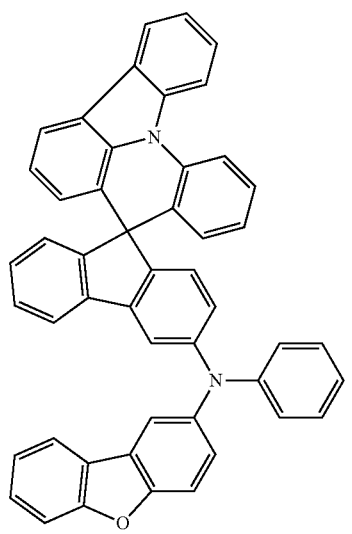
1-101
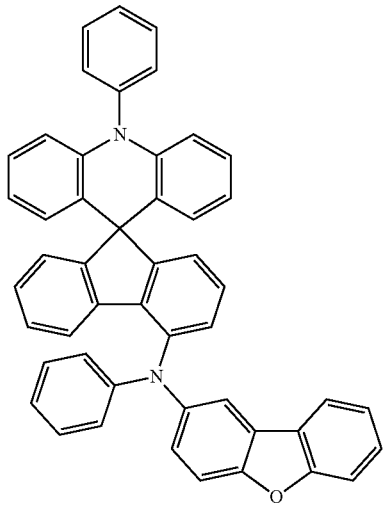
1-102
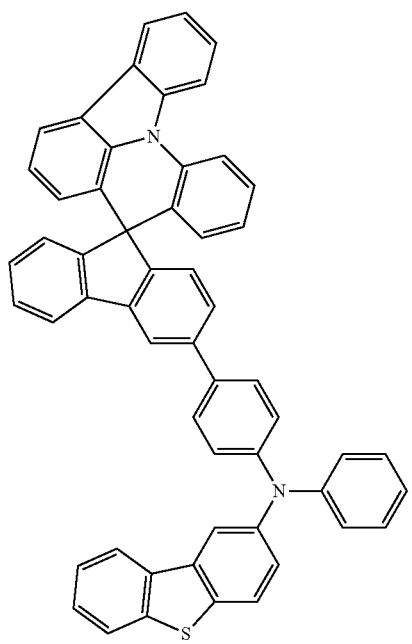

-continued
1-103
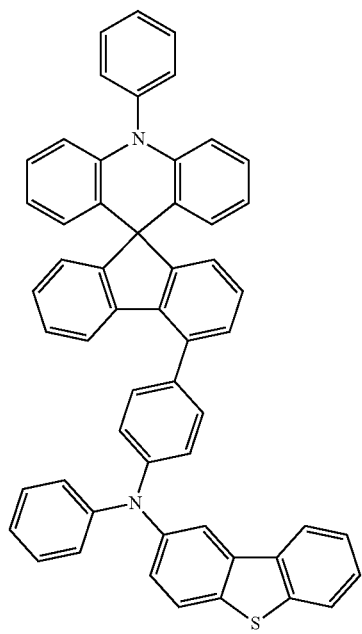
1-104
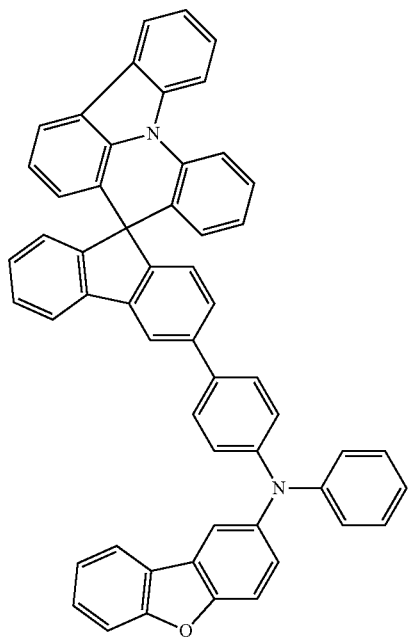
-continued
1-105
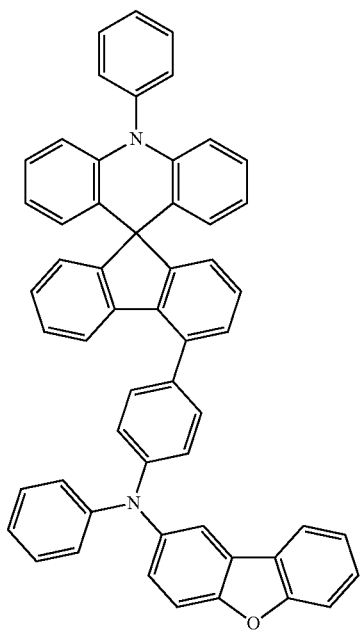
1-106
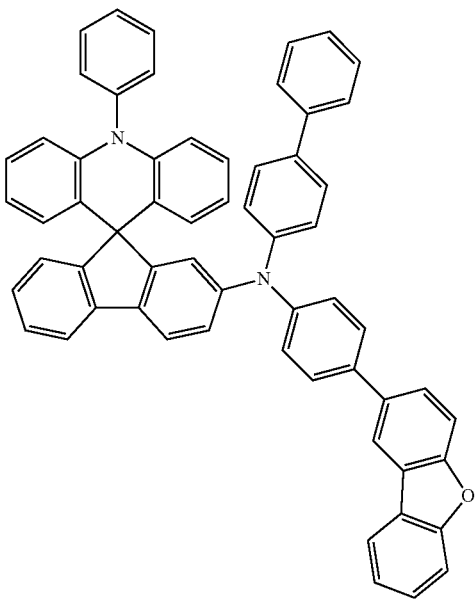

1-107
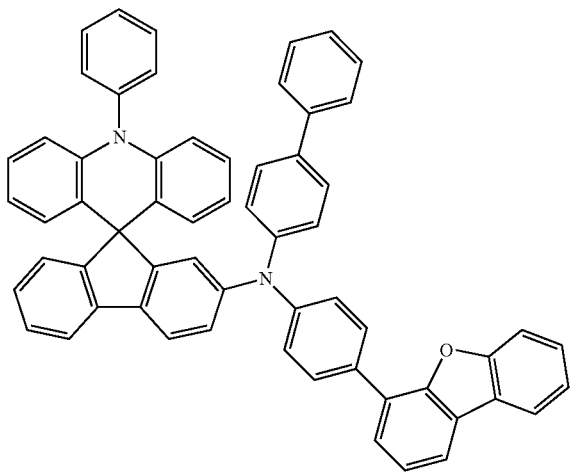
1-108
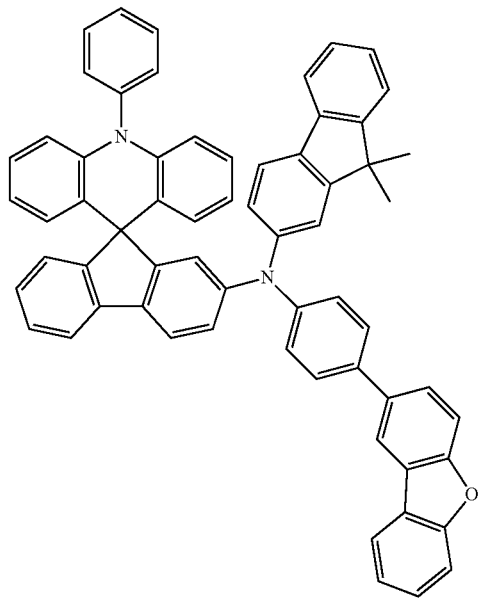
1-109
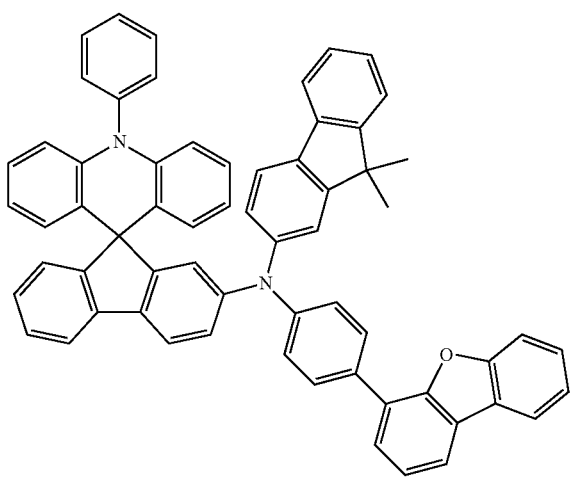
1-110
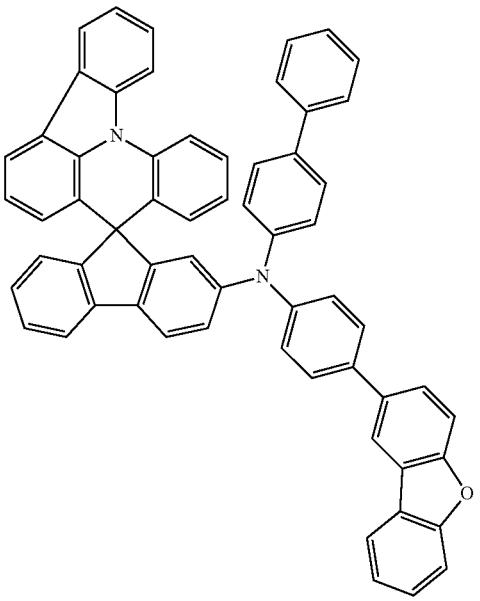
1-111
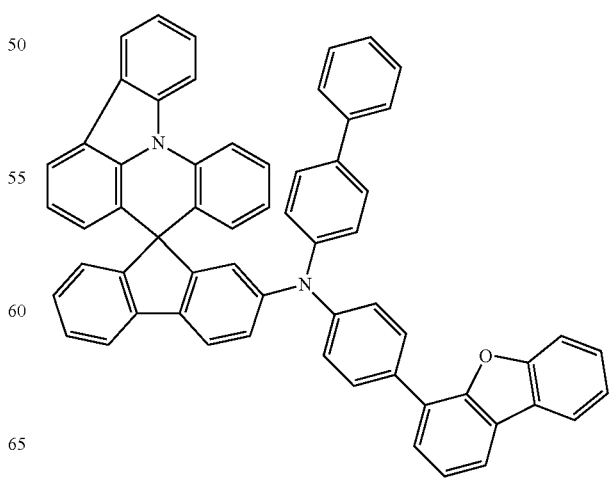

1-112
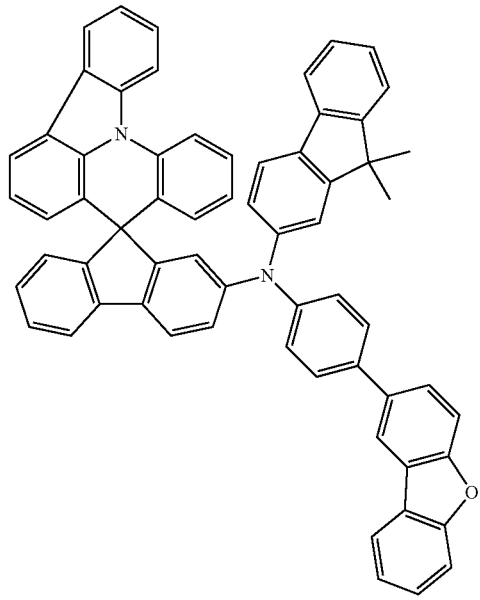
1-114
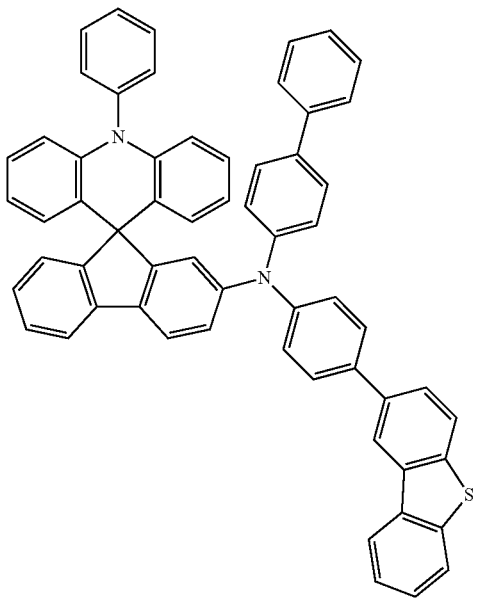
1-113
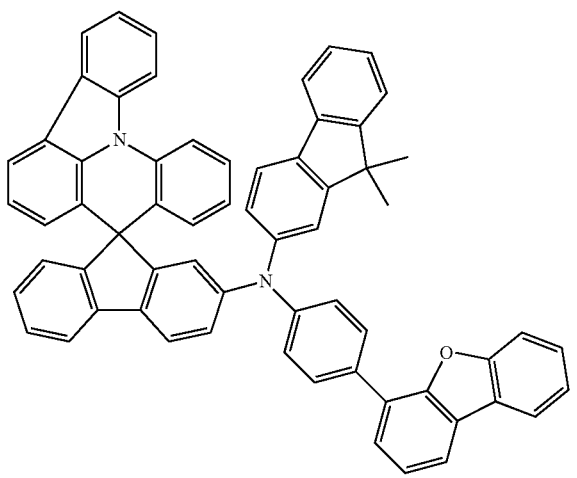
1-115
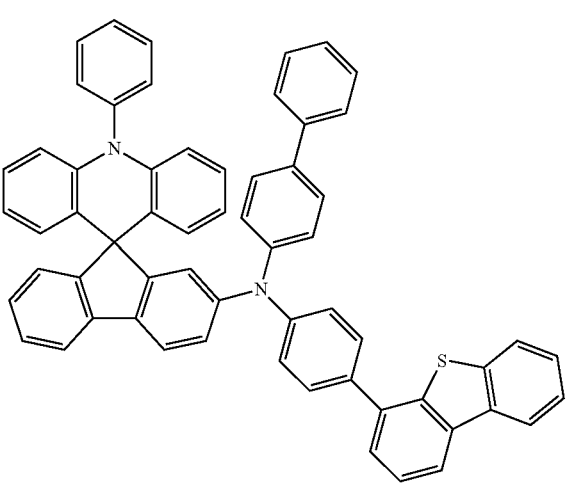

1-116
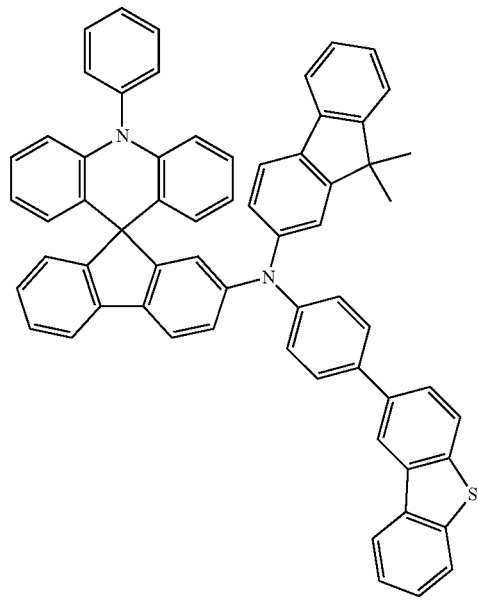
1-118
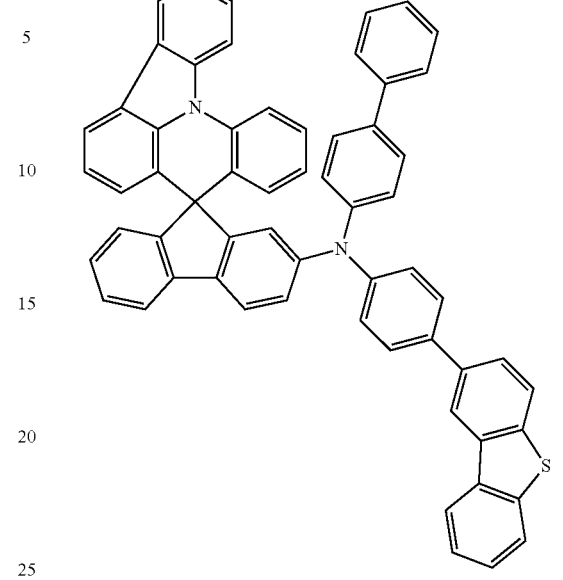
1-117
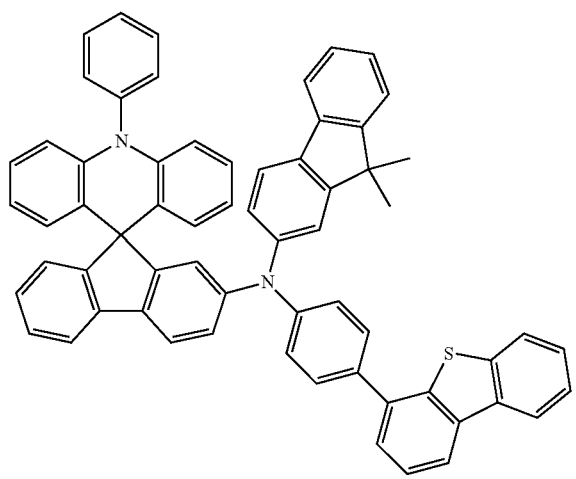
1-119
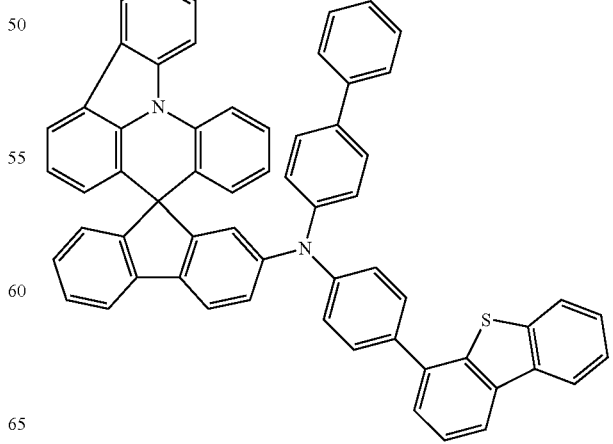

1-120
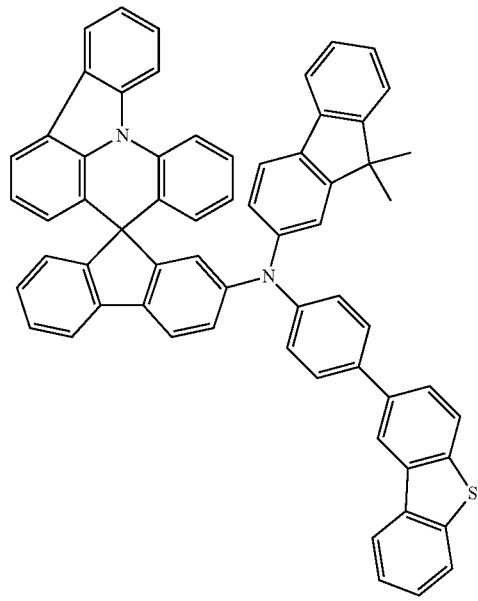
1-122
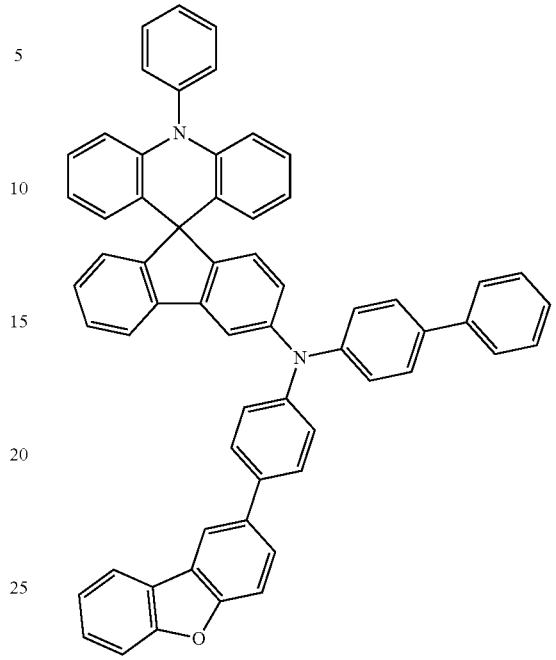
1-121
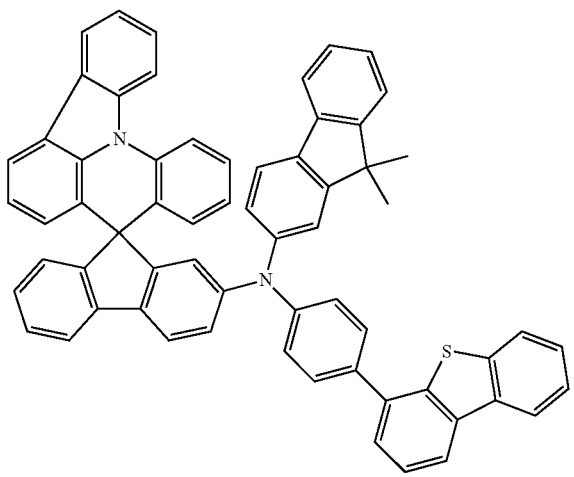
1-123
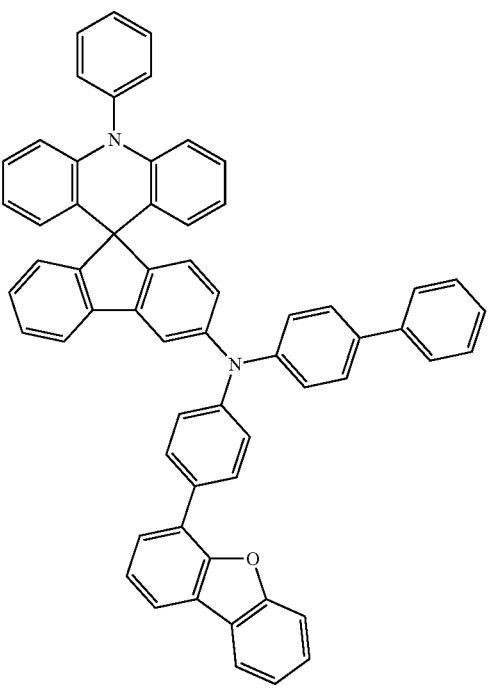

1-124
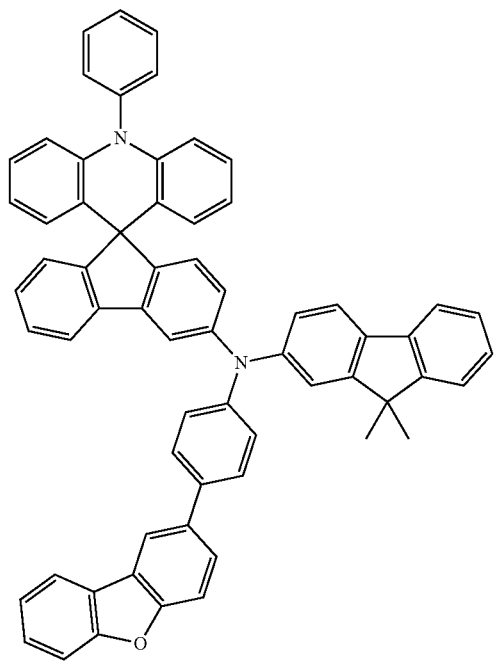
1-125
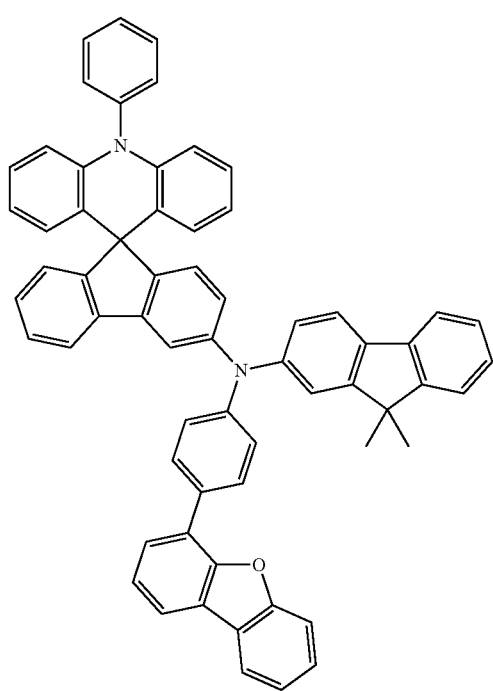
1-126
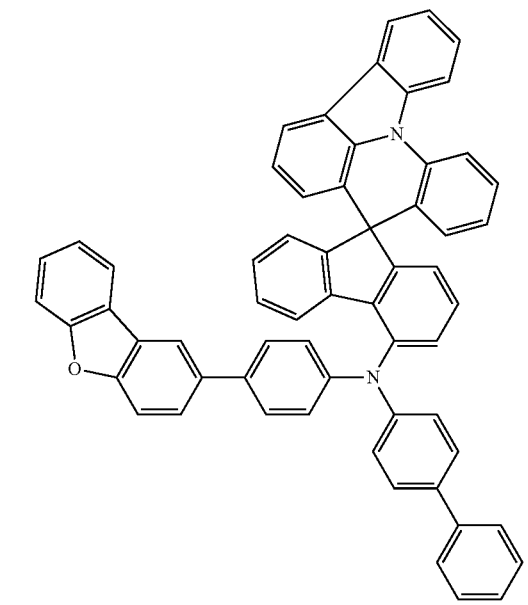
1-127
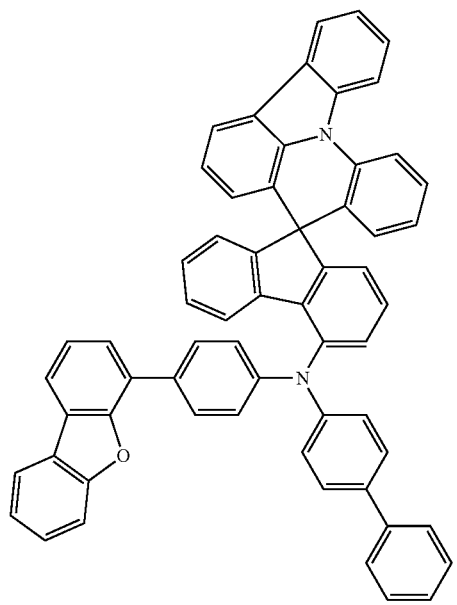

1-128
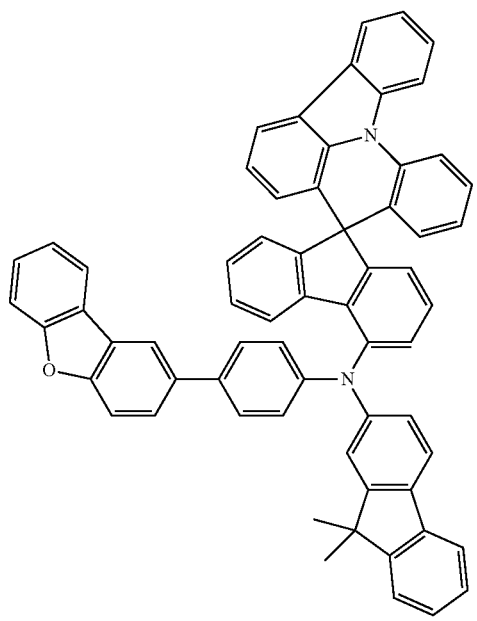
1-130
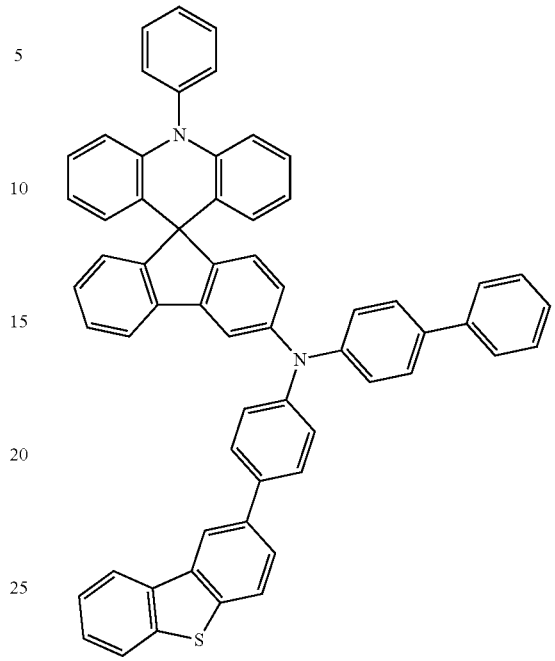
1-129
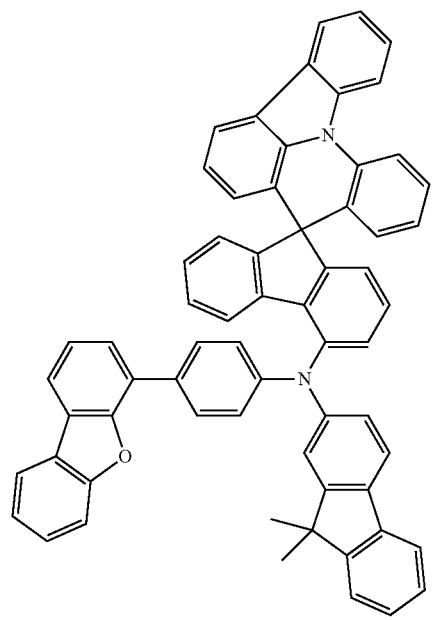
1-131
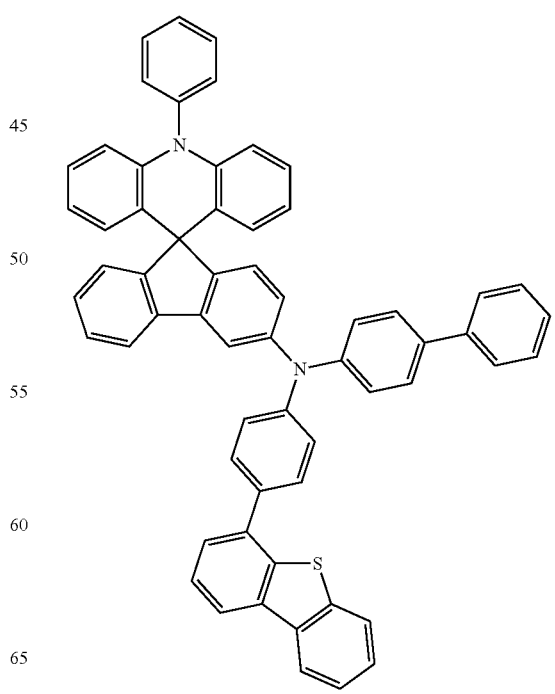

1-132
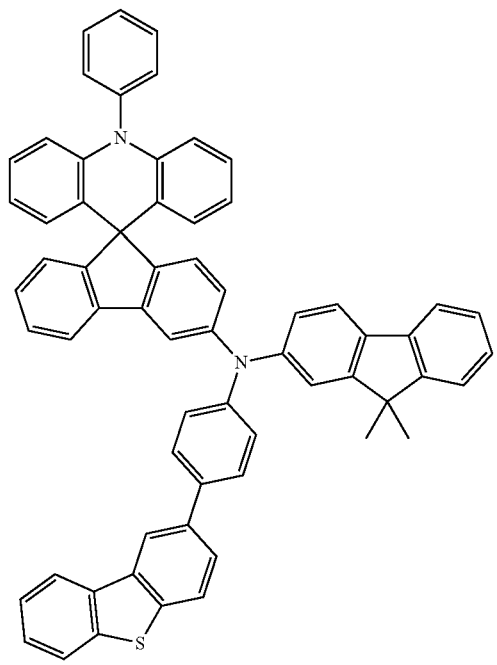
1-134
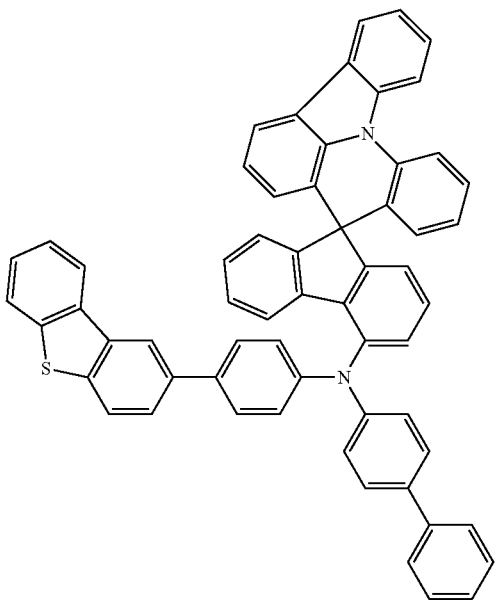
1-133
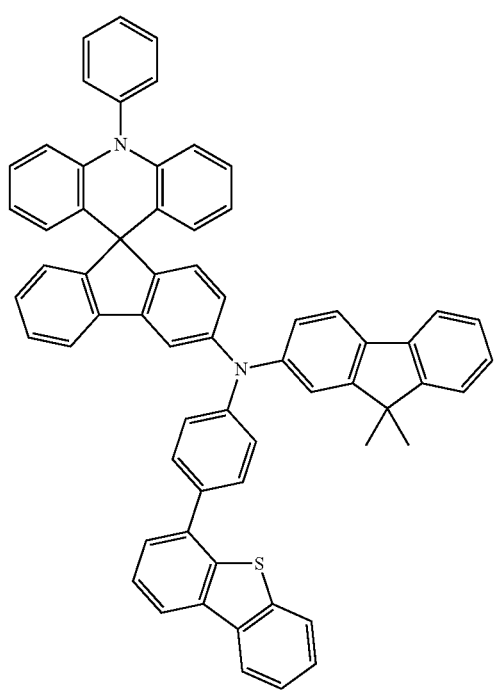
1-135
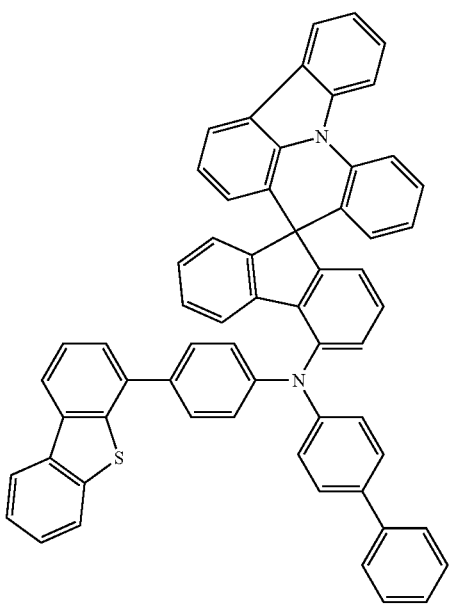

1-136
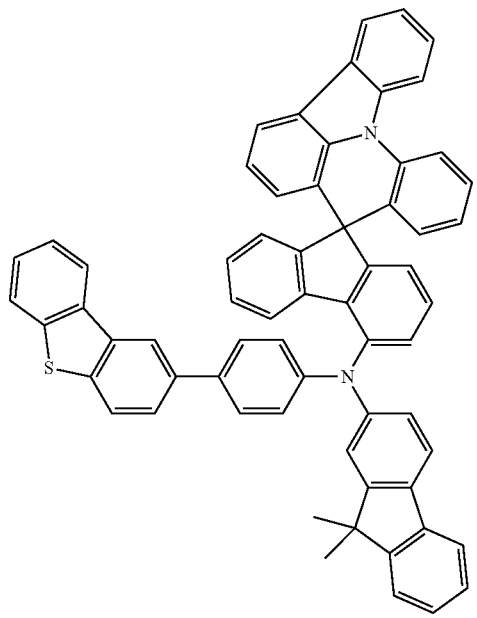
1-137
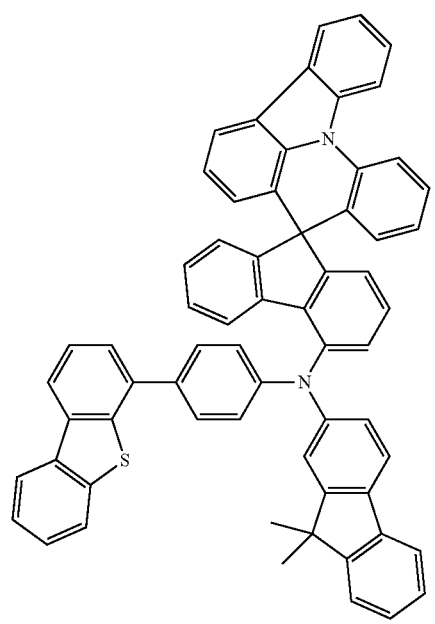
1-138
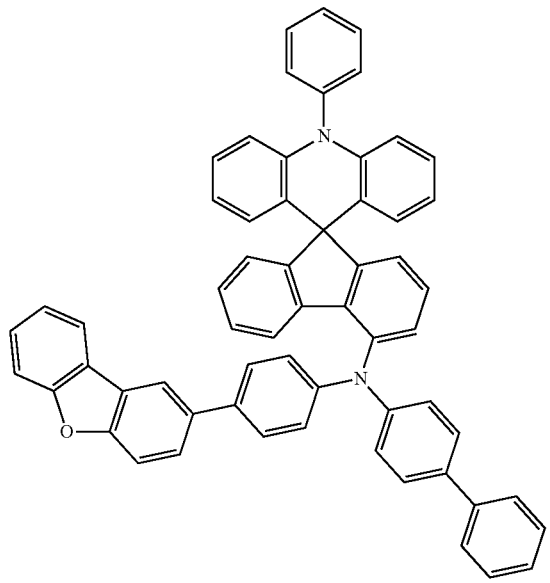
1-139
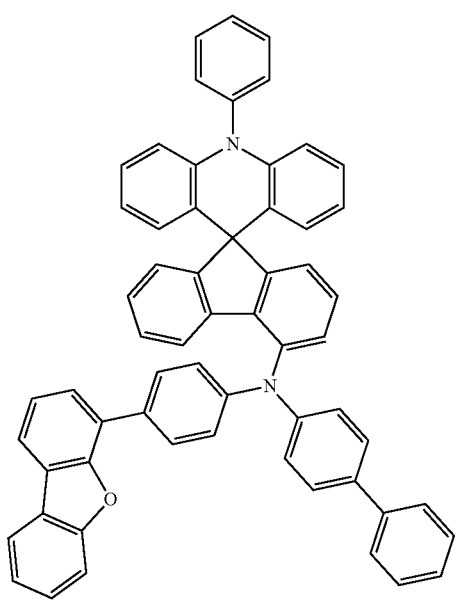

1-140
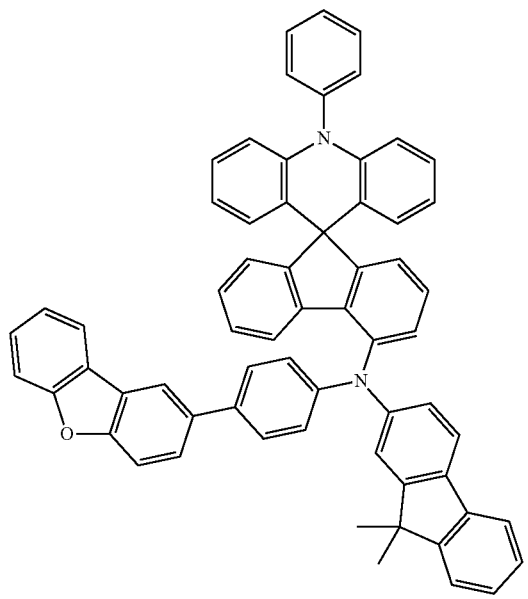
1-142
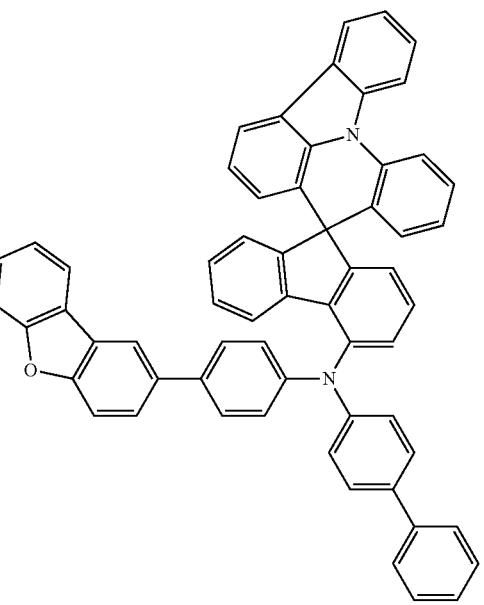
1-141
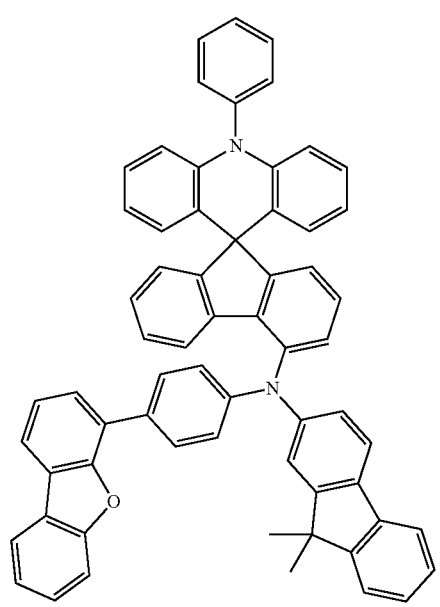
1-143
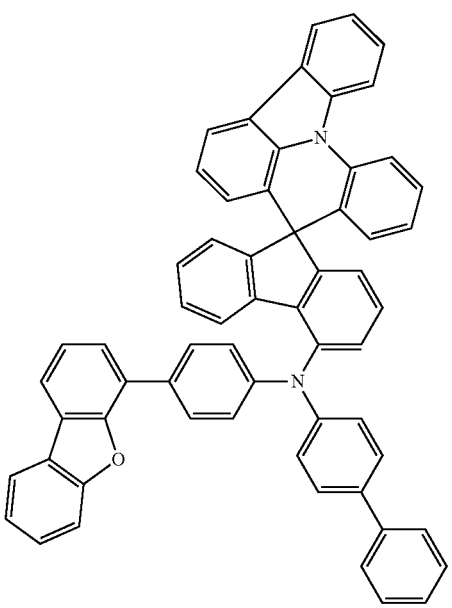

1-144
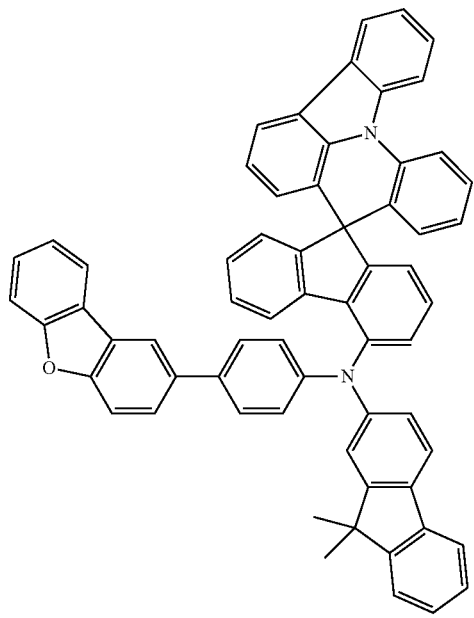
1-145
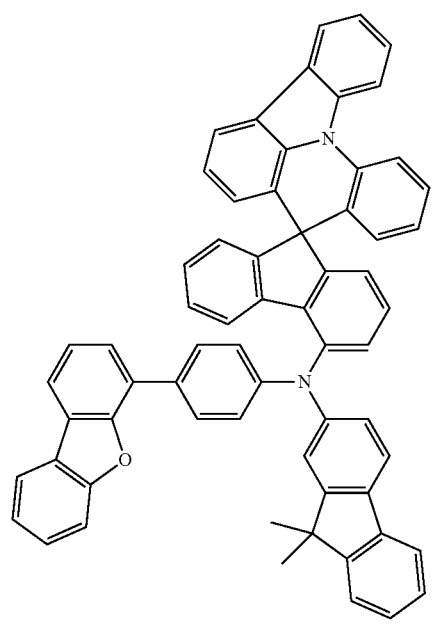
1-146
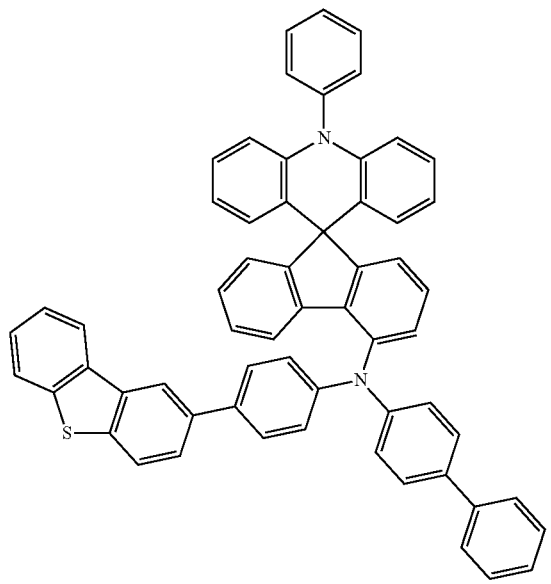
1-147
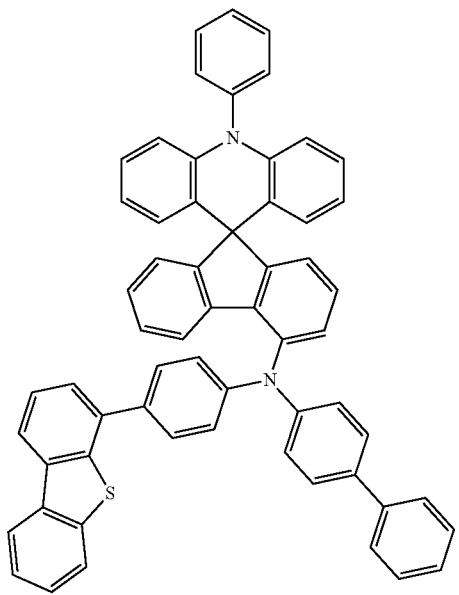

-continued
1-148
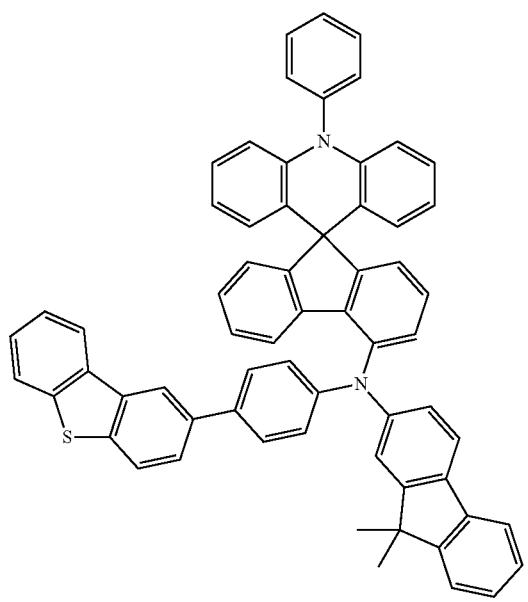
1-149
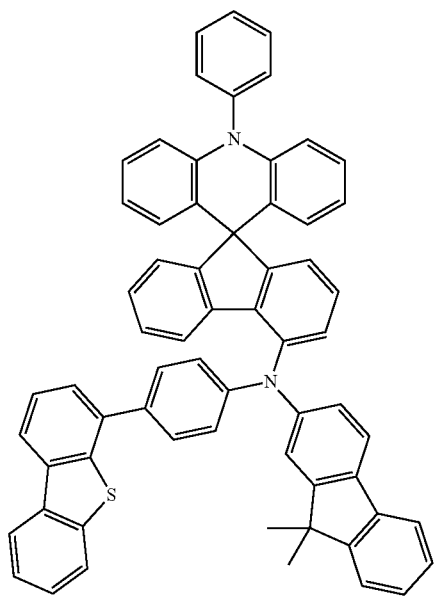
-continued
1-150
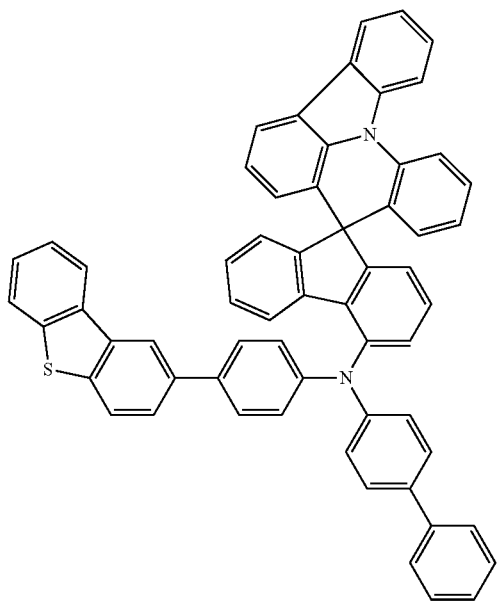
1-151
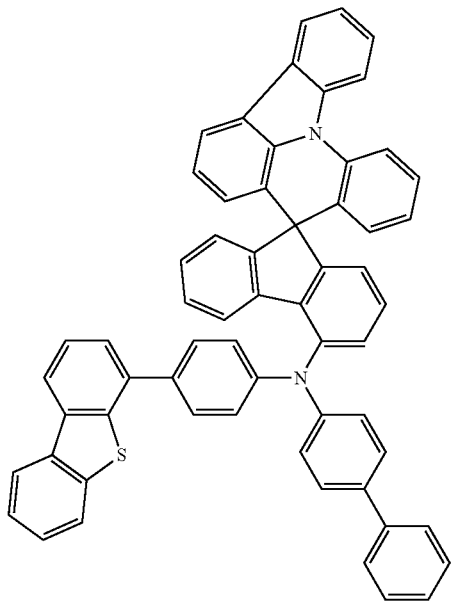

-continued
1-152
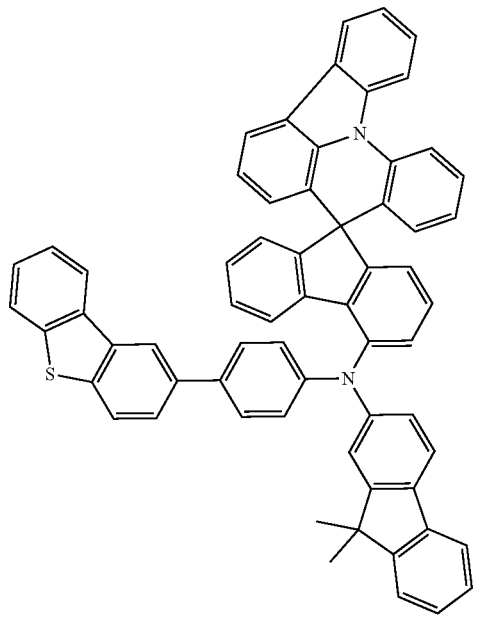
1-153
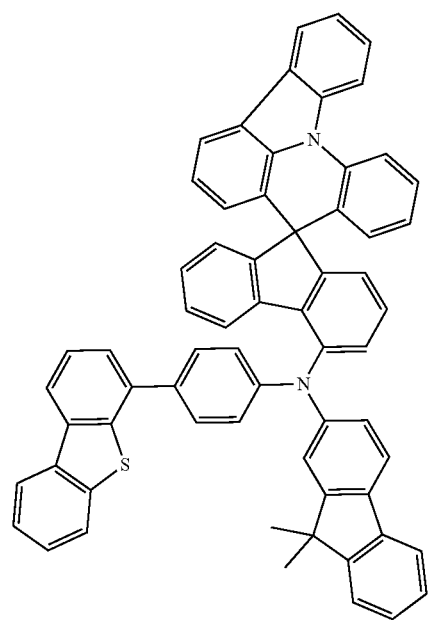
-continued
1-154
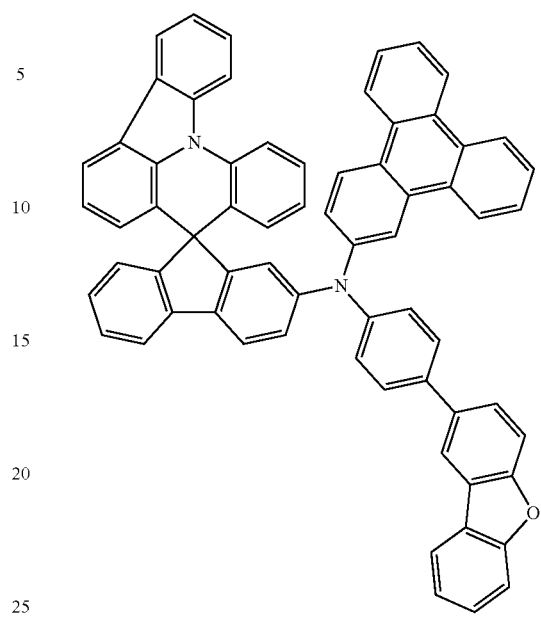
1-155
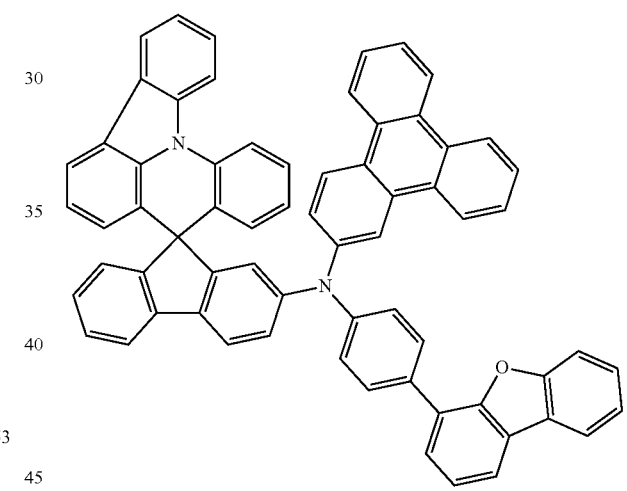
1-156

1-157
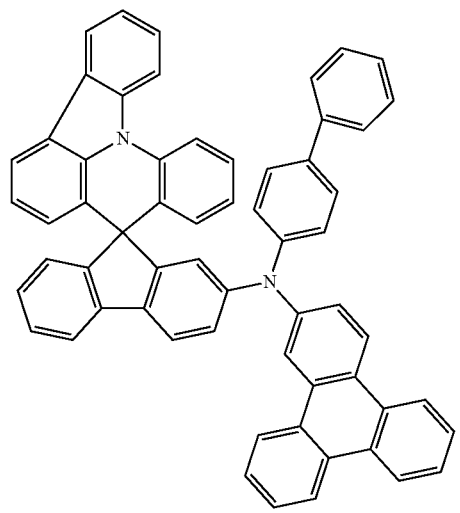
1-159
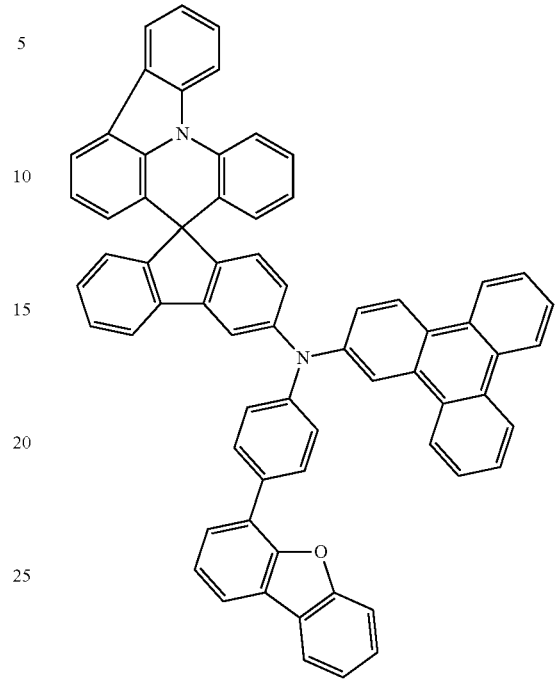
1-158
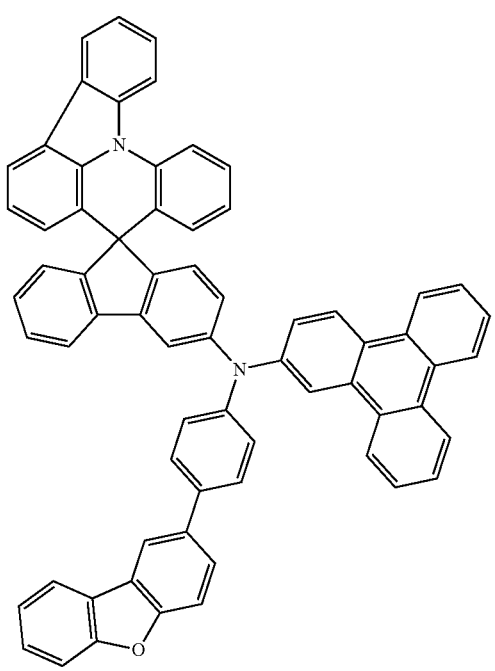
1-160
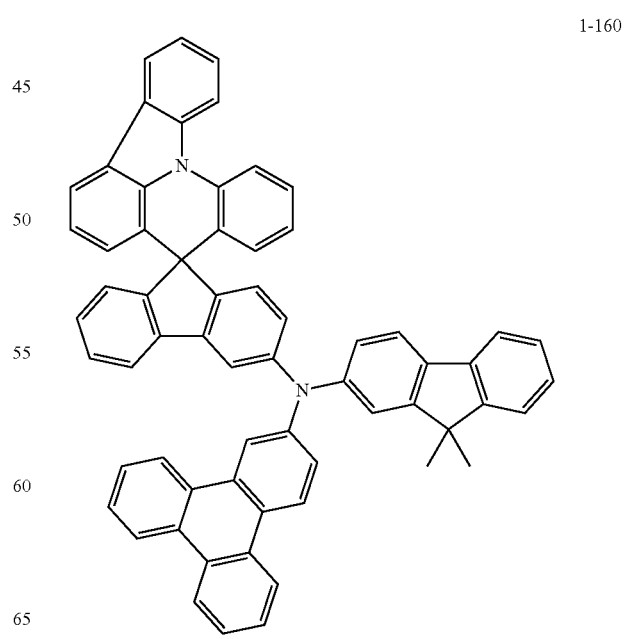

1-161
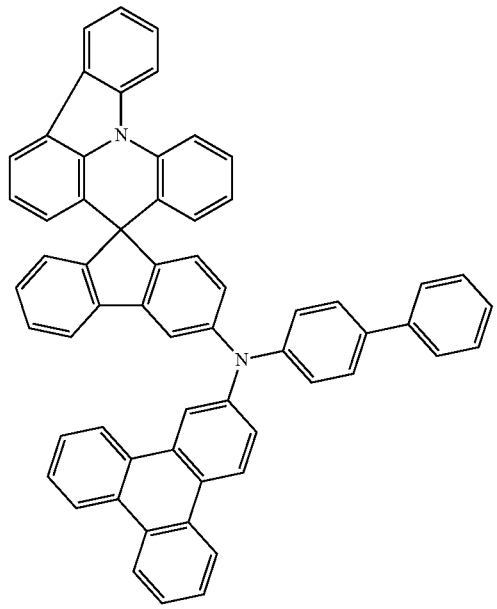
1-163
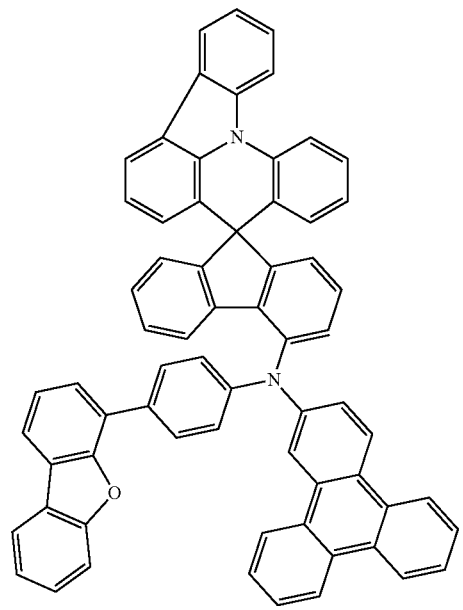
1-162
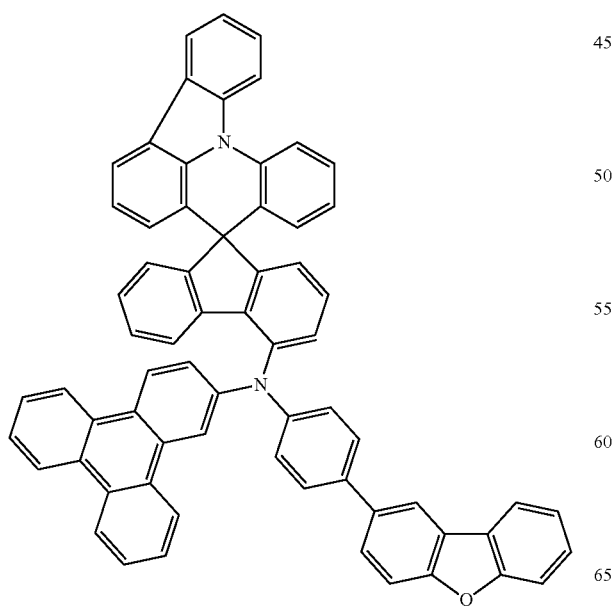
1-164
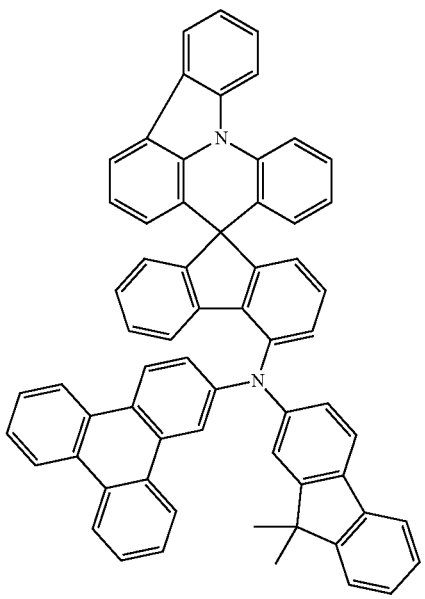

-continued
1-165
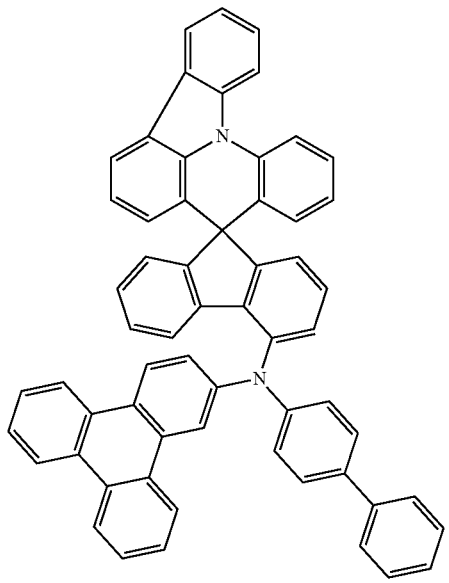
1-166
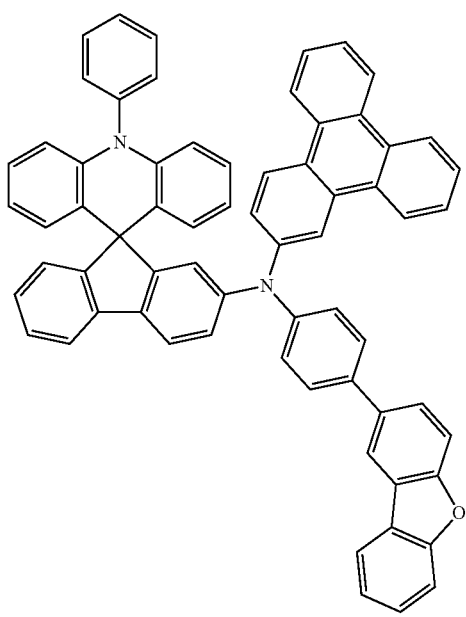
1-167
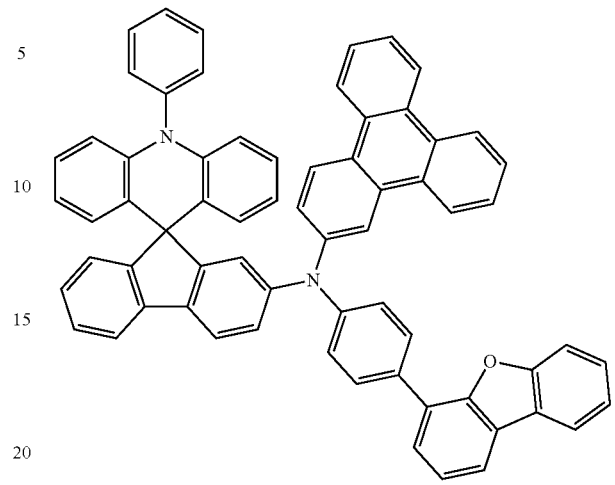
1-168
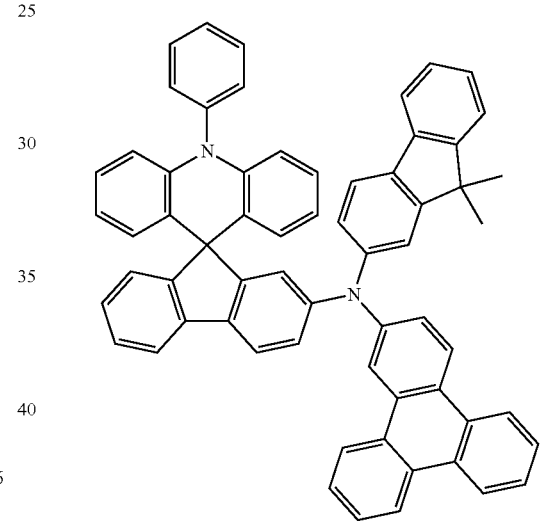
1-169

1-170
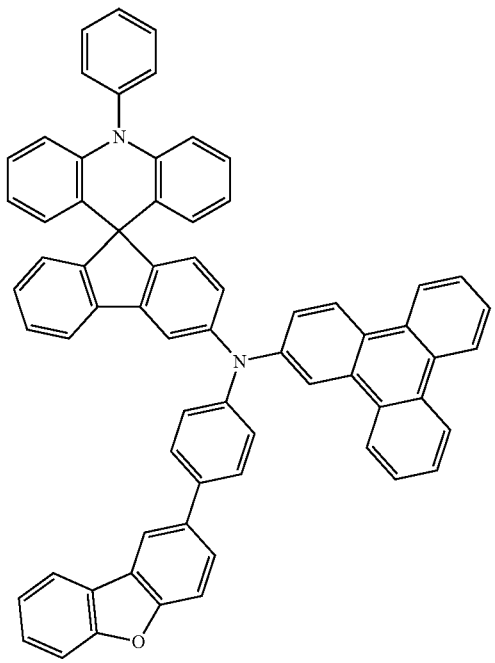
1-171
1-172
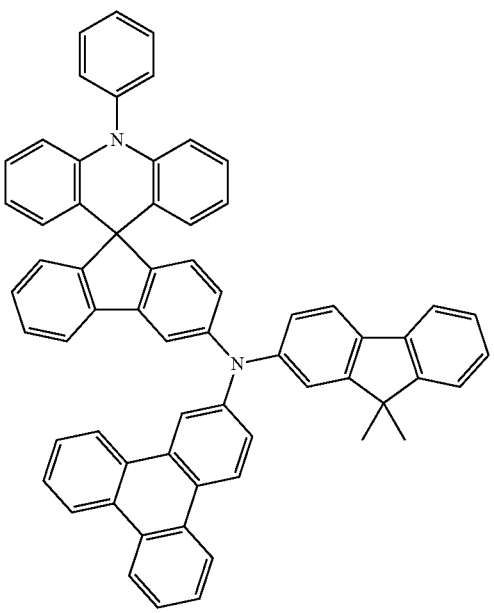
1-173
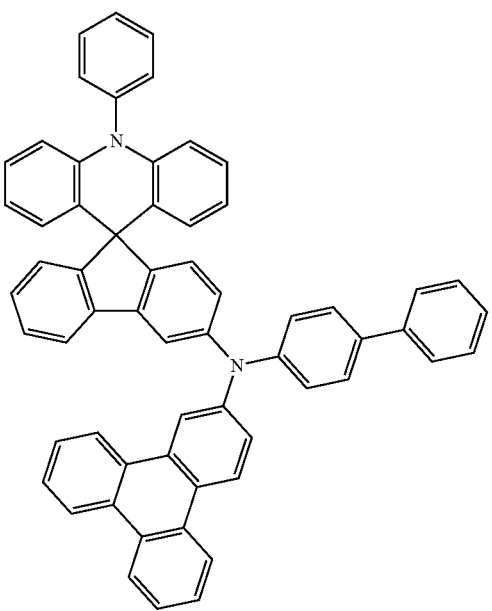

1-174
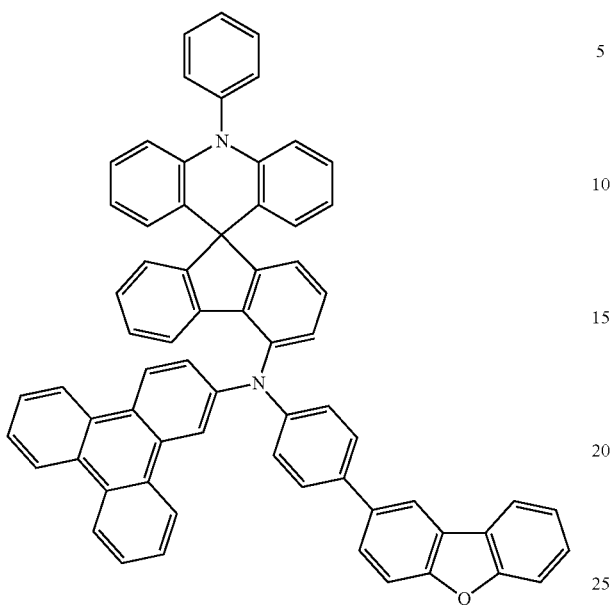
1-176
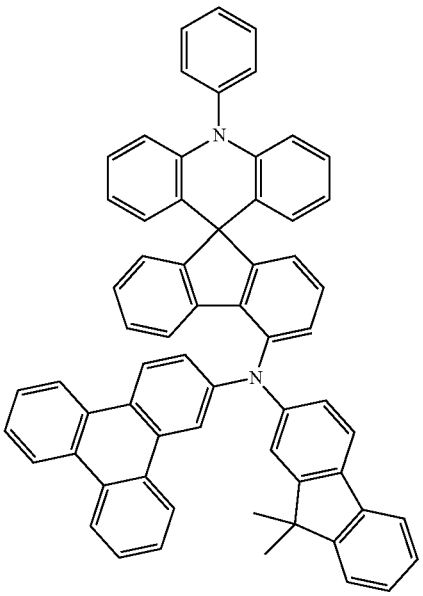
1-175
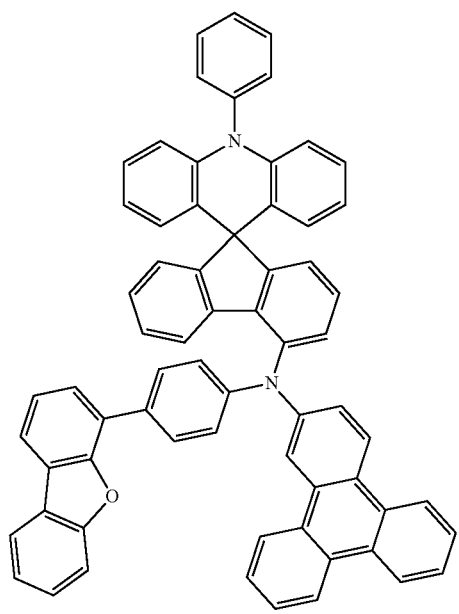
1-177
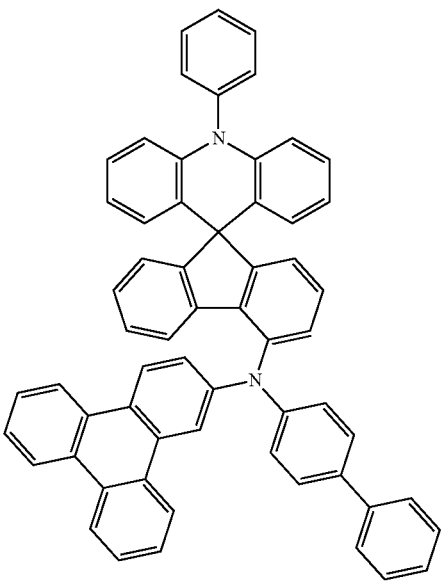

1-178
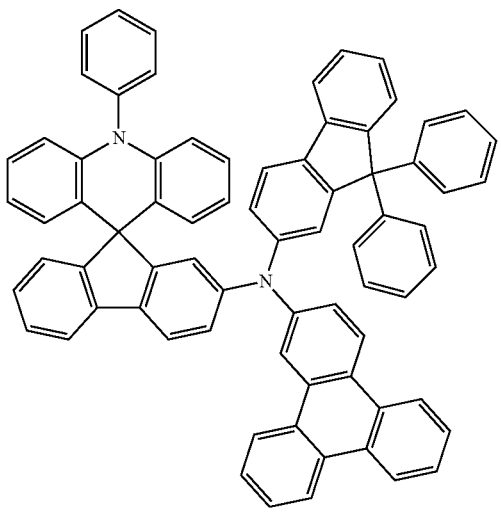
1-179
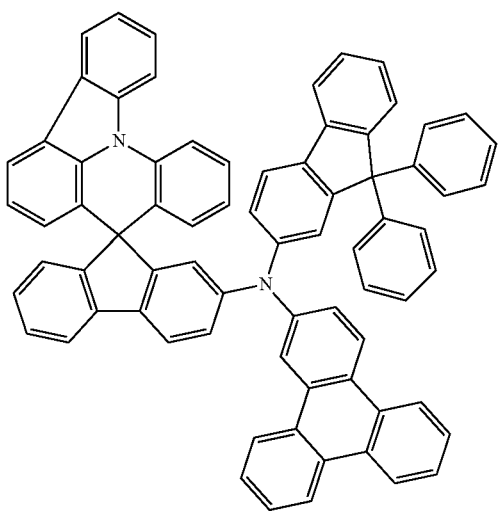
1-180
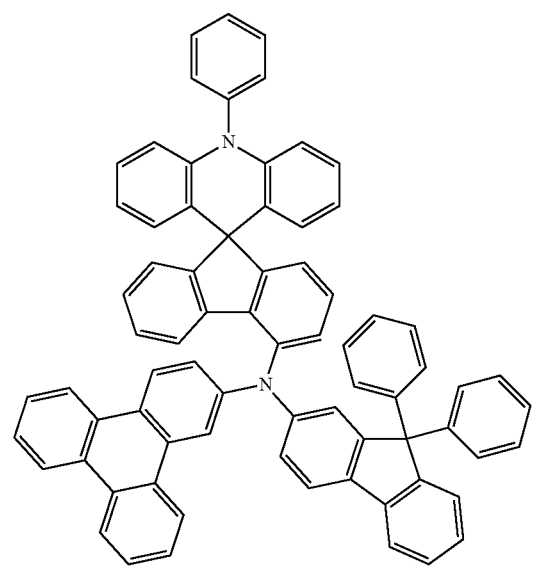
1-181
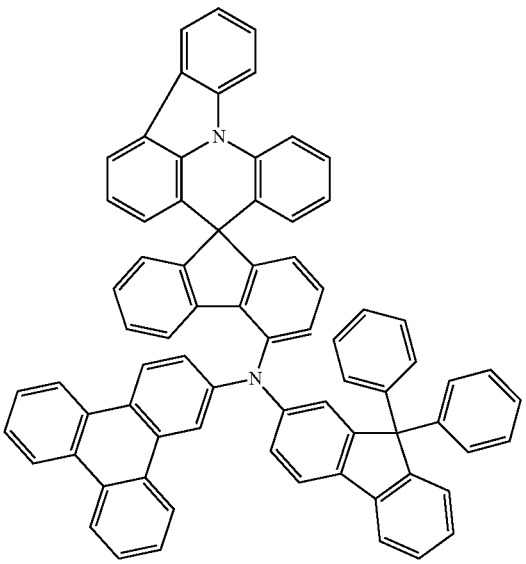
According to an exemplary embodiment of the present specification, Chemical Formula 2 is represented by any one of the following structural formulae.
2-1
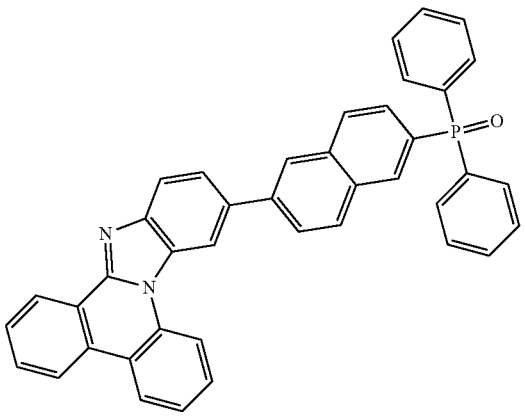
2-2
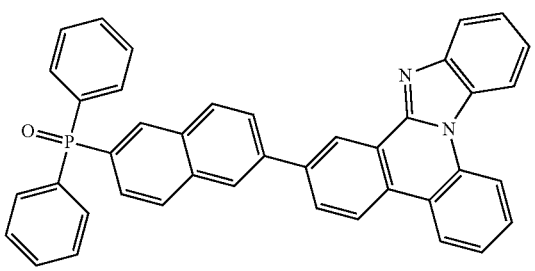

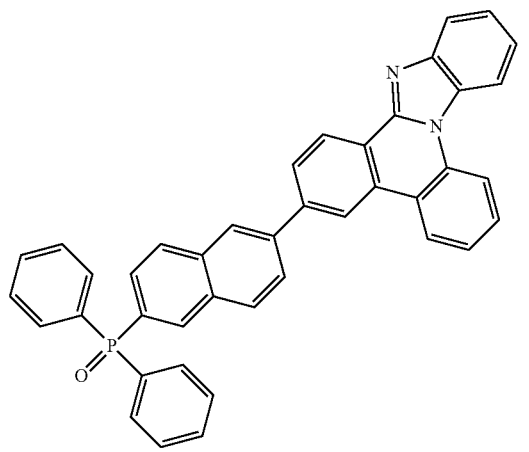
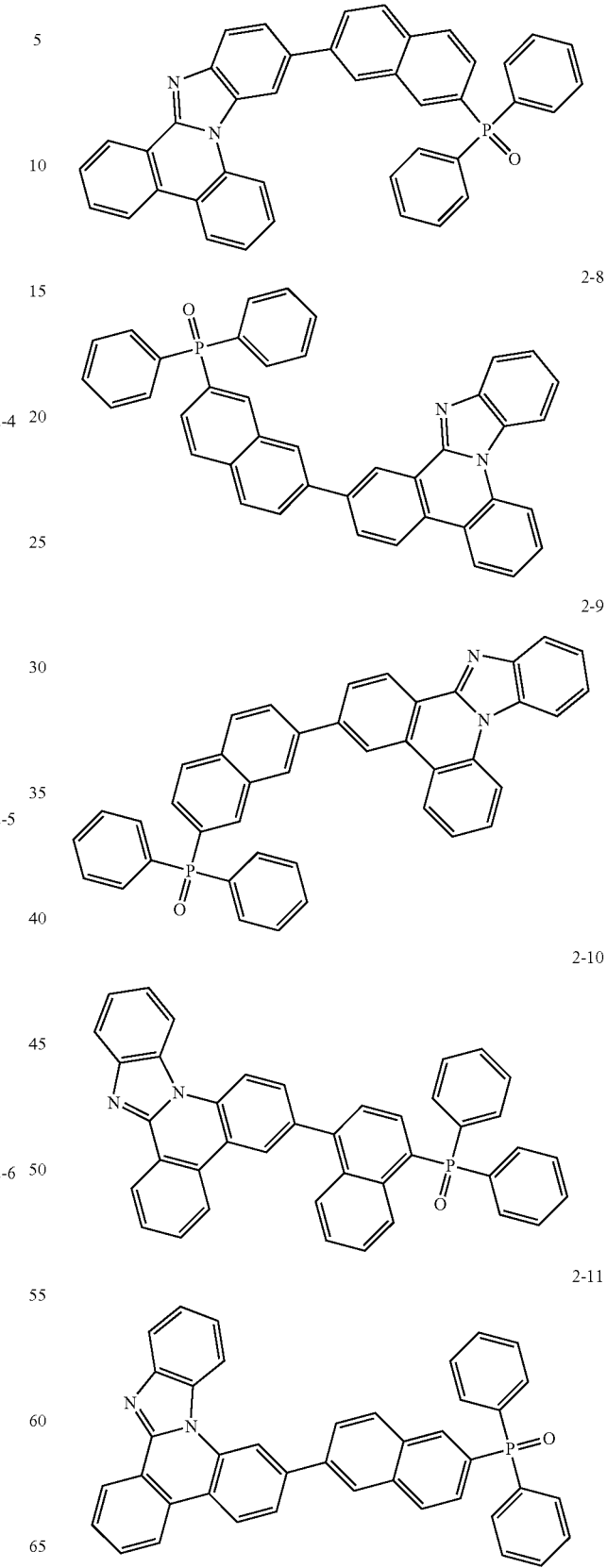

2-12
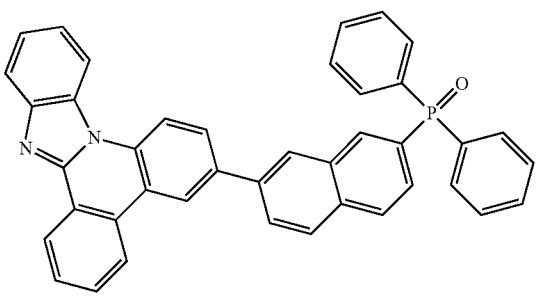
2-13
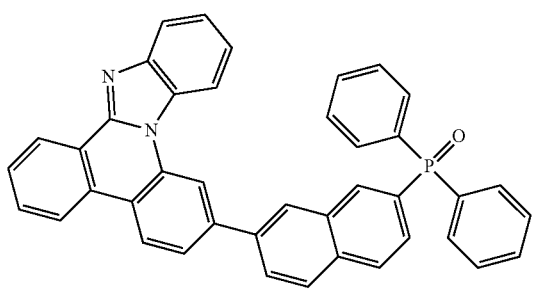
2-14
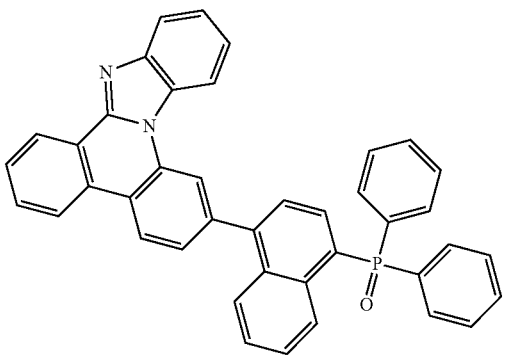
2-15
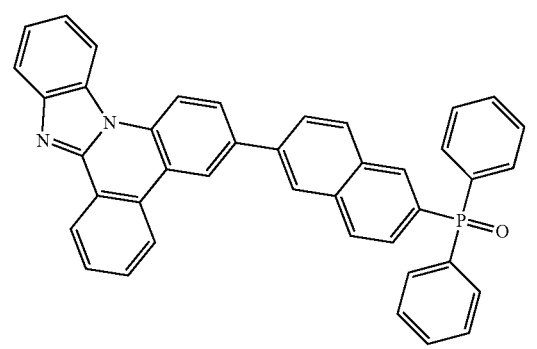
2-16
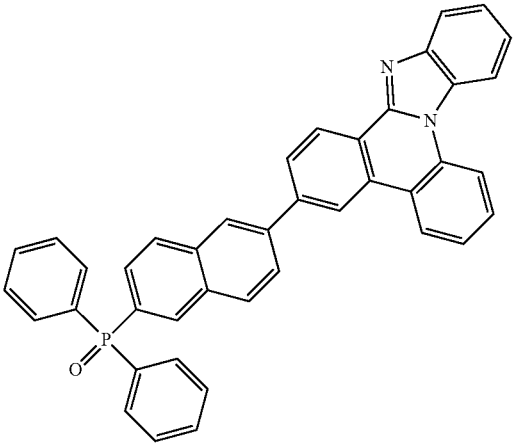
2-17
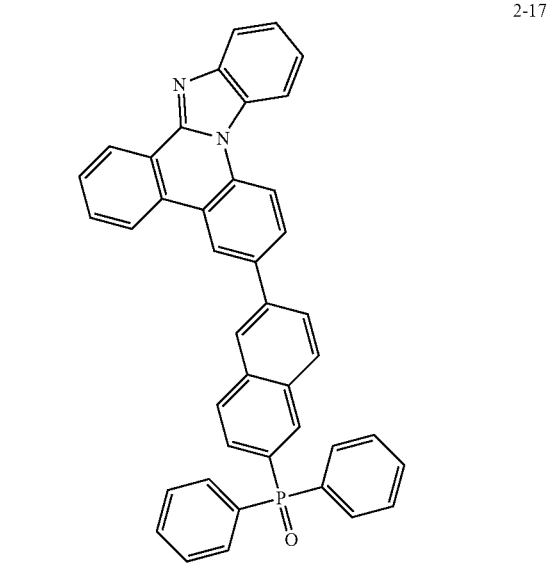
2-18
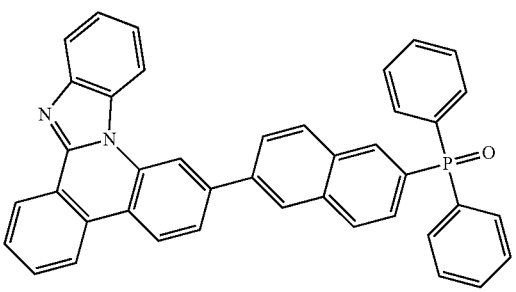

2-19
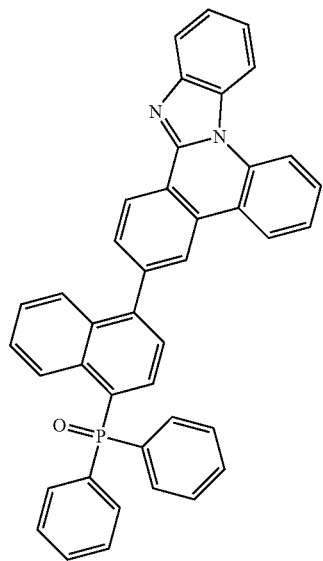
2-20
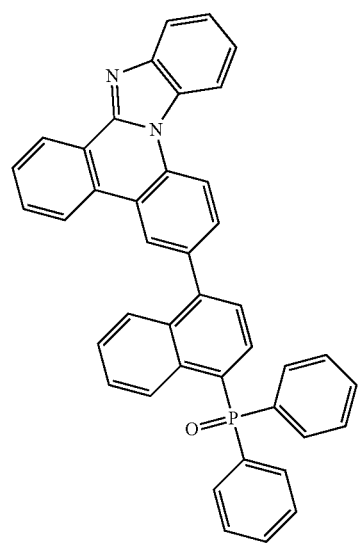
2-21
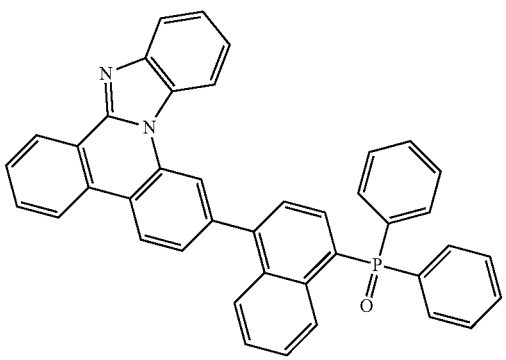
2-22
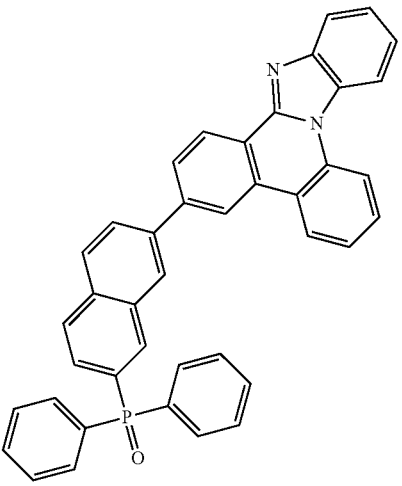
2-23
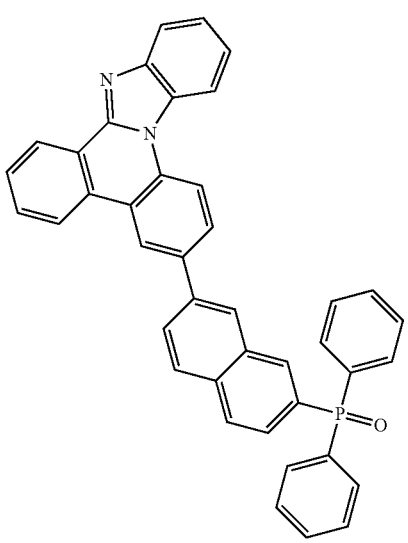
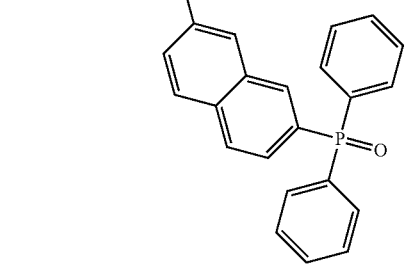
2-24
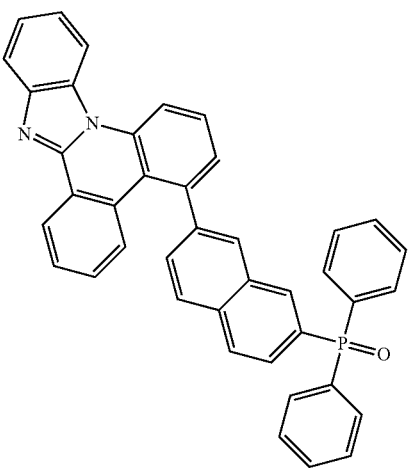

2-25
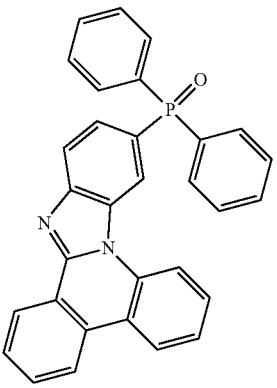
2-26
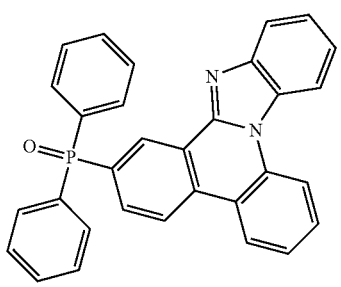
2-27
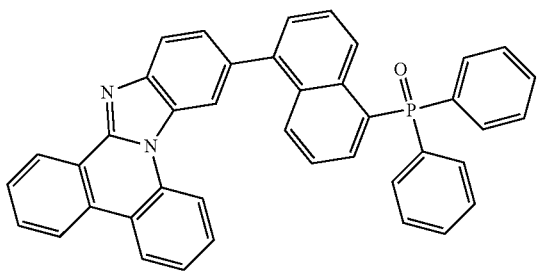
2-28
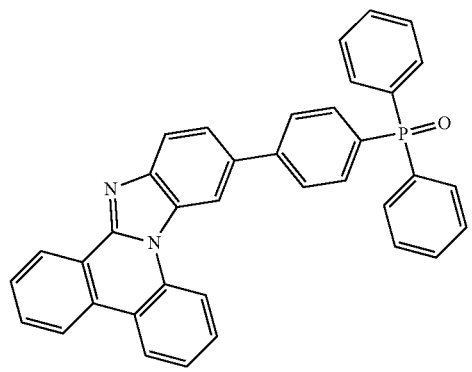
2-29
2-30
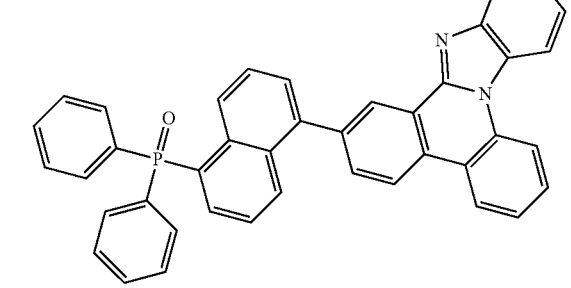
2-31
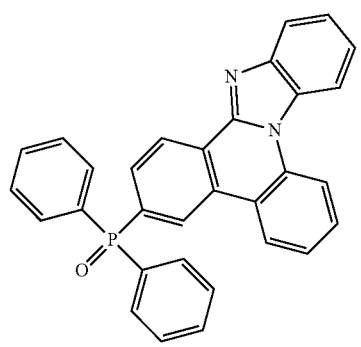
2-32
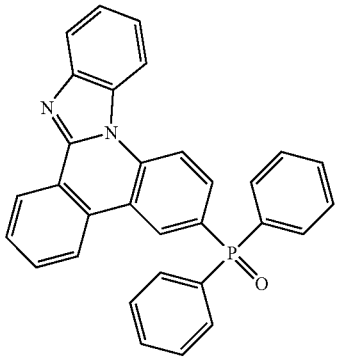
2-33
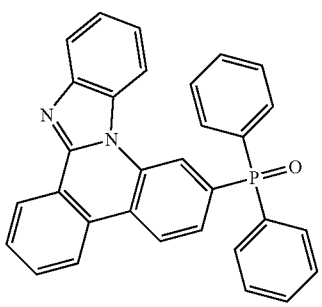

101
-continued
2-34
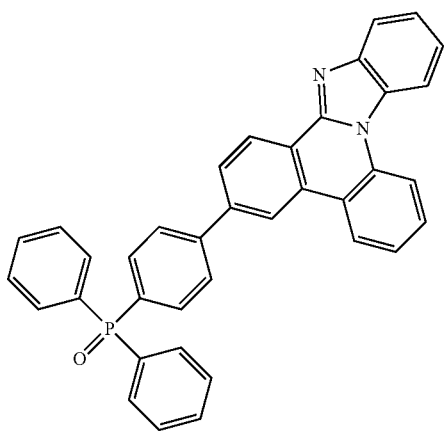
2-35
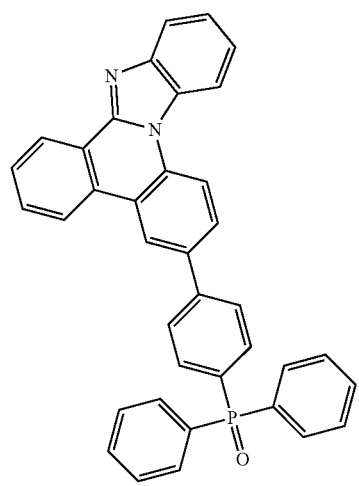
2-36
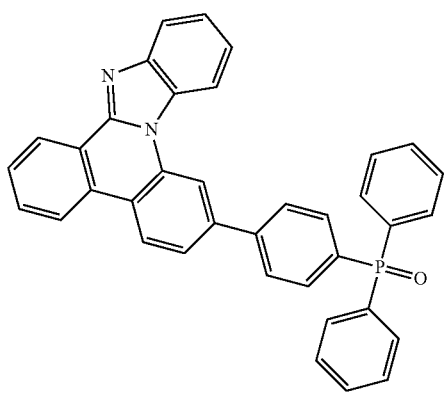
102
-continued
2-37
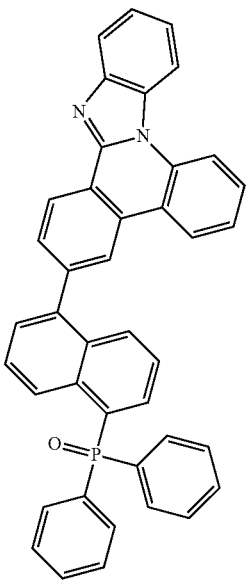
2-38
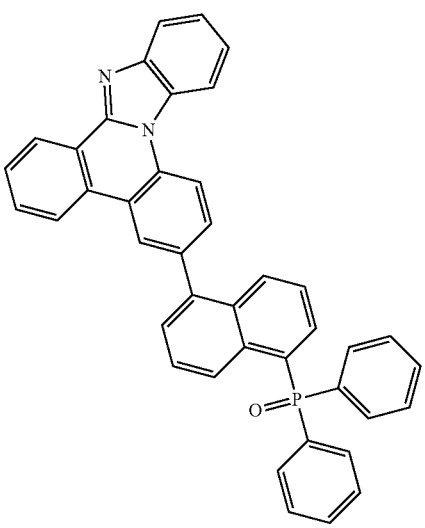
2-39
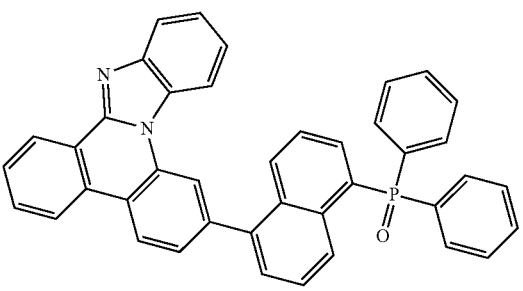

2-40
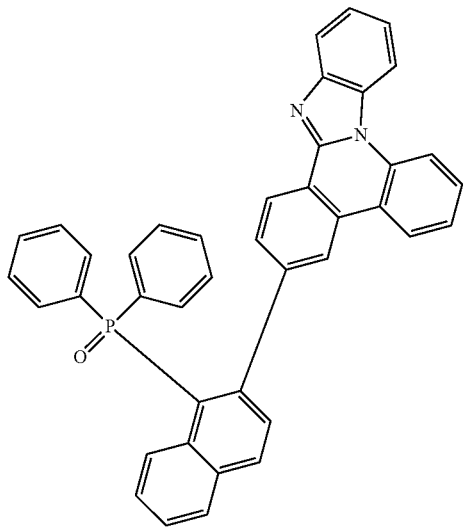
2-41
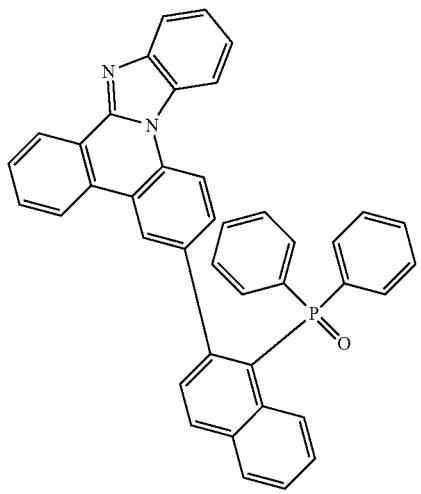
2-42
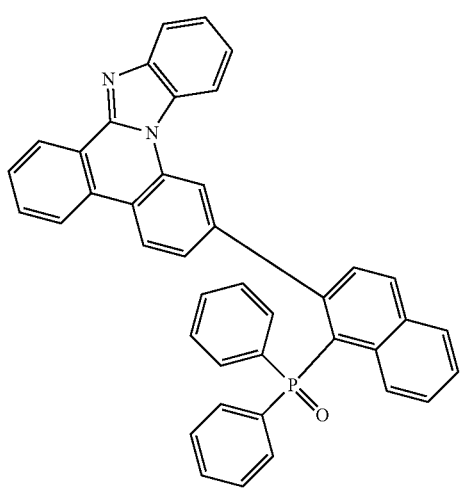
2-43
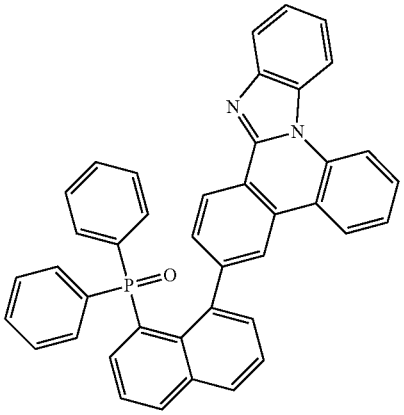
2-44
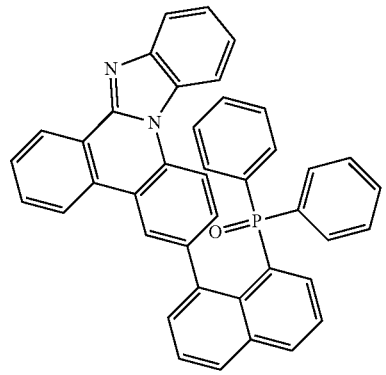
2-45
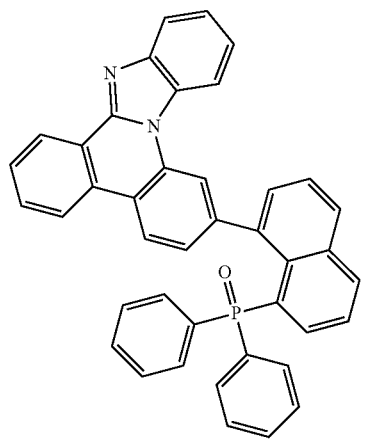
2-46
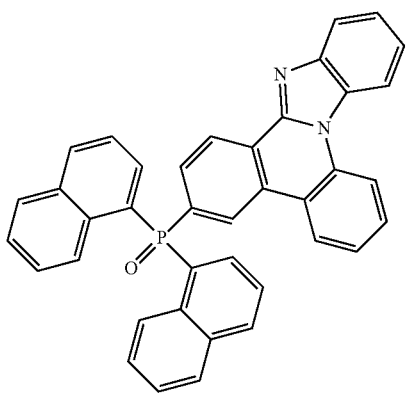

105
-continued
2-47
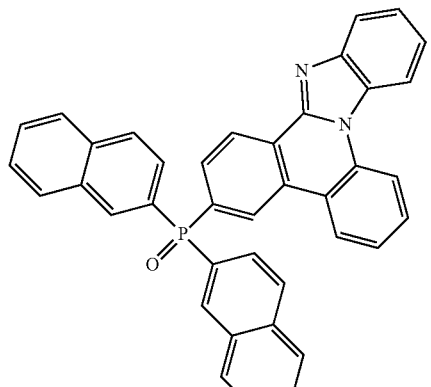
2-48
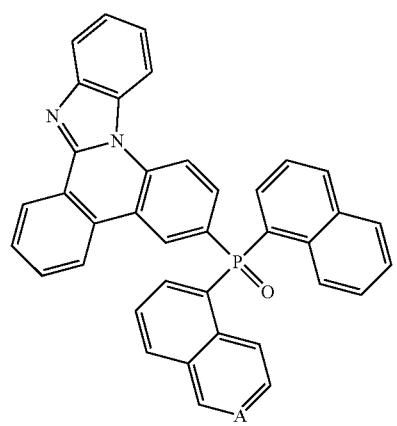
2-49
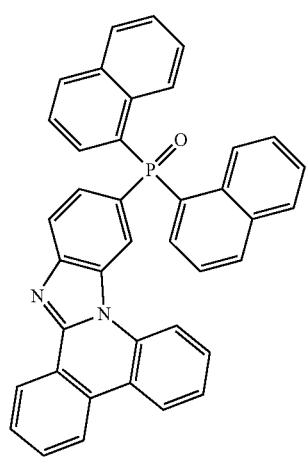
106
-continued
2-50
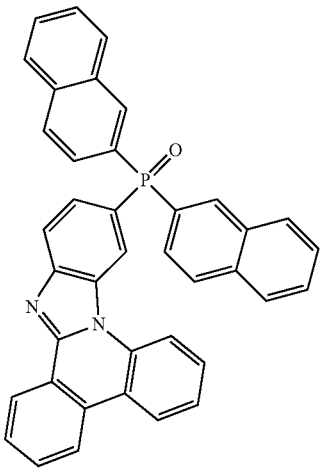
2-51
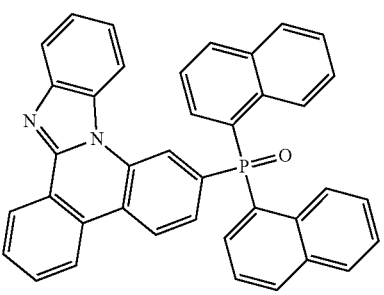
2-52
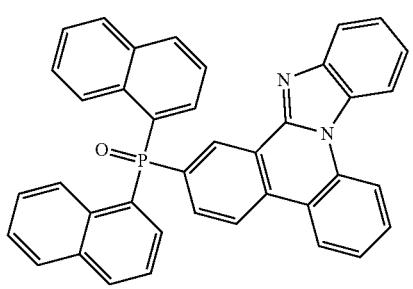
2-53
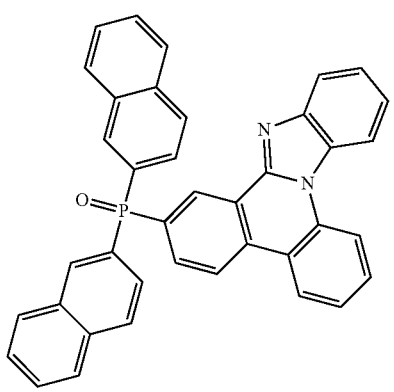

2-54
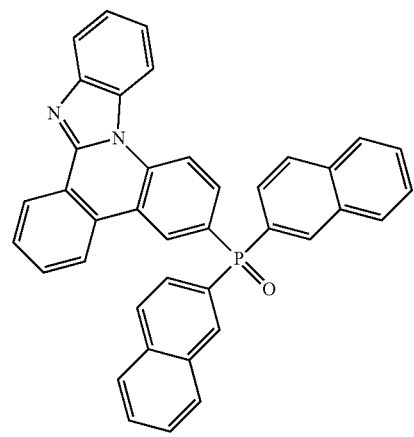
2-55
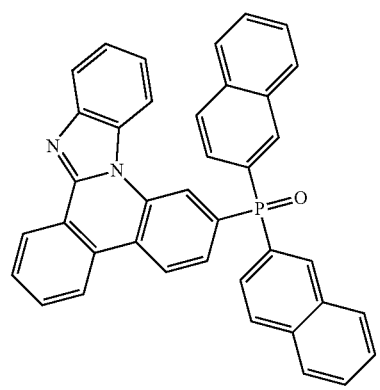
2-56
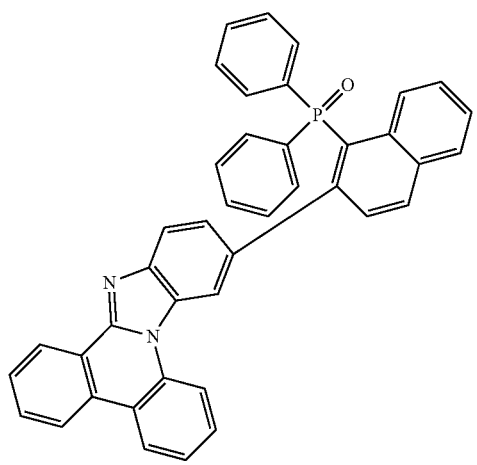
2-57
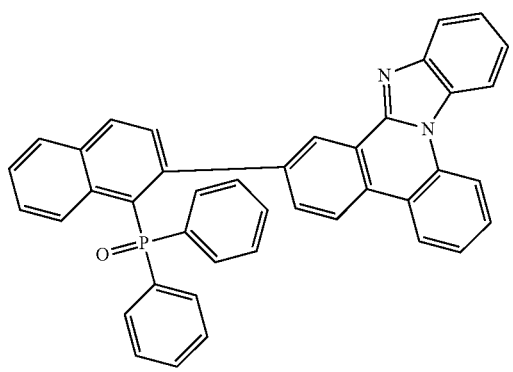
2-58
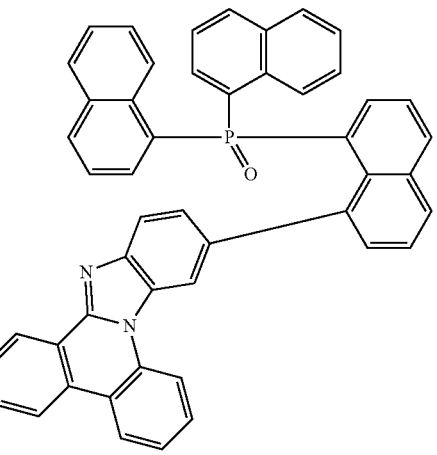
2-59
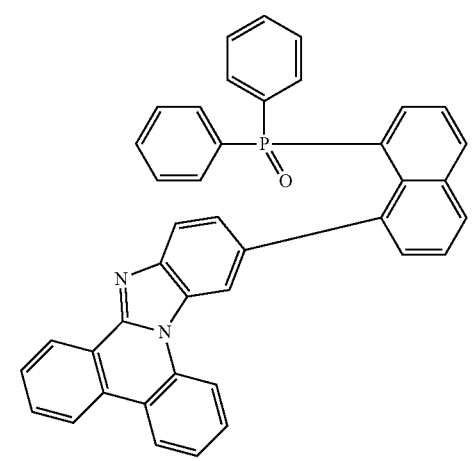
2-60
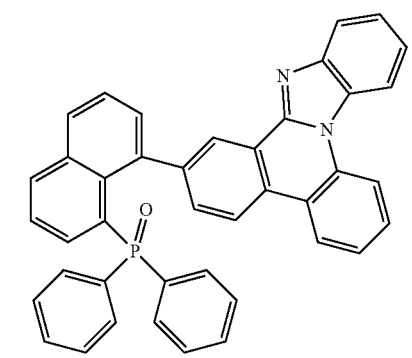

-continued
2-61
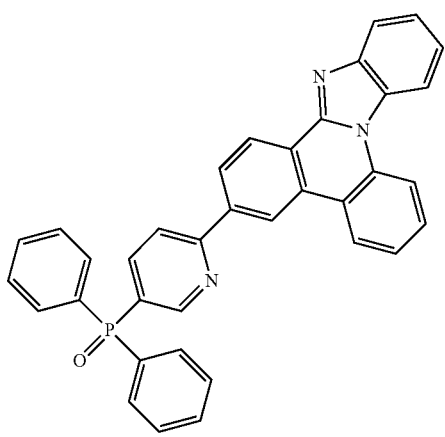
2-62
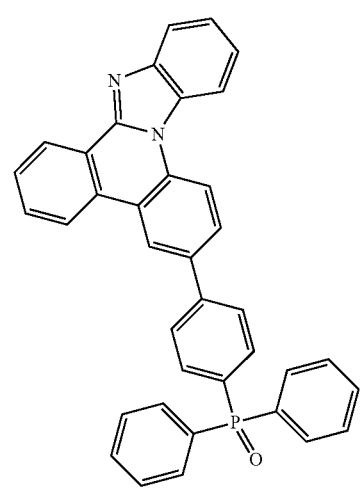
2-63
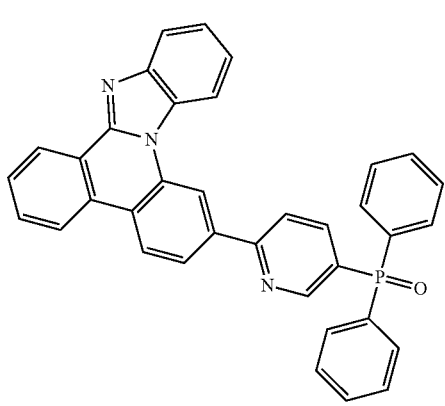
2-64
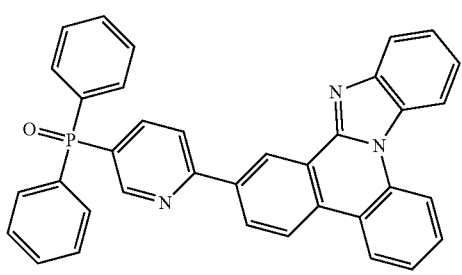
-continued
2-65
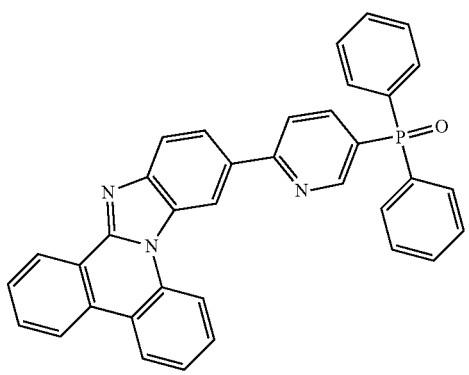
2-66
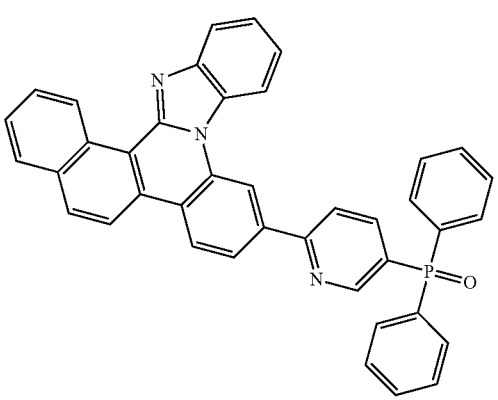
2-67
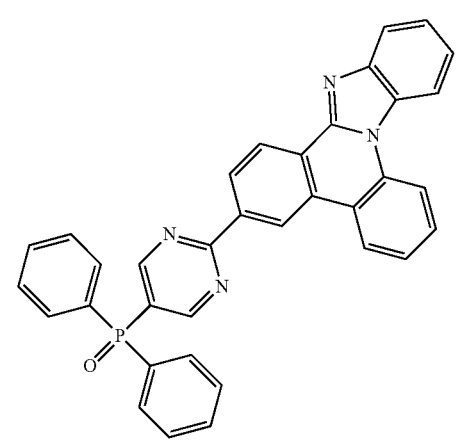

2-68
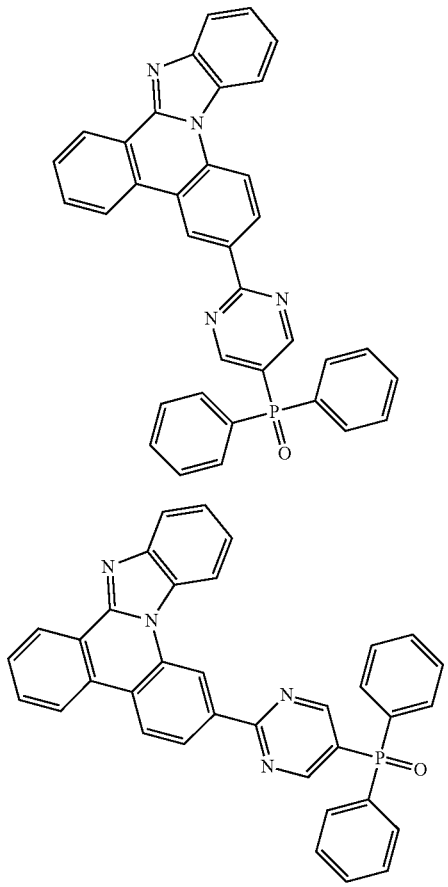
2-69
2-70
2-72
2-72
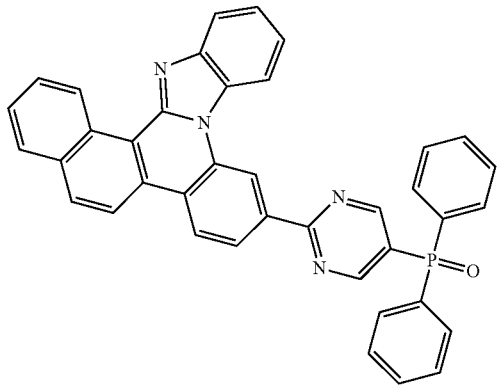
2-73
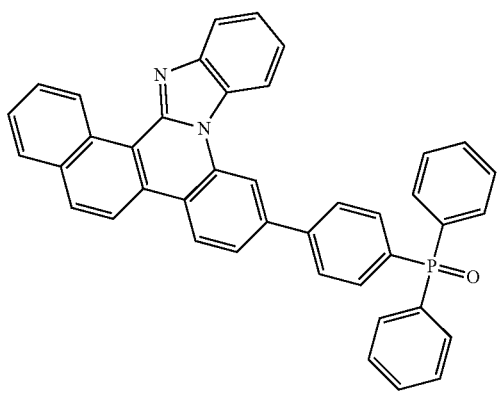
2-74
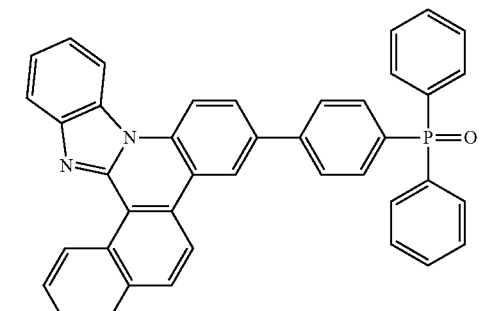
2-75
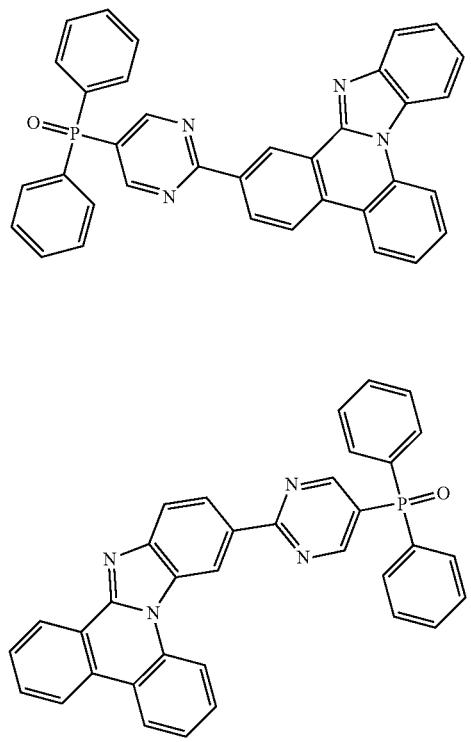

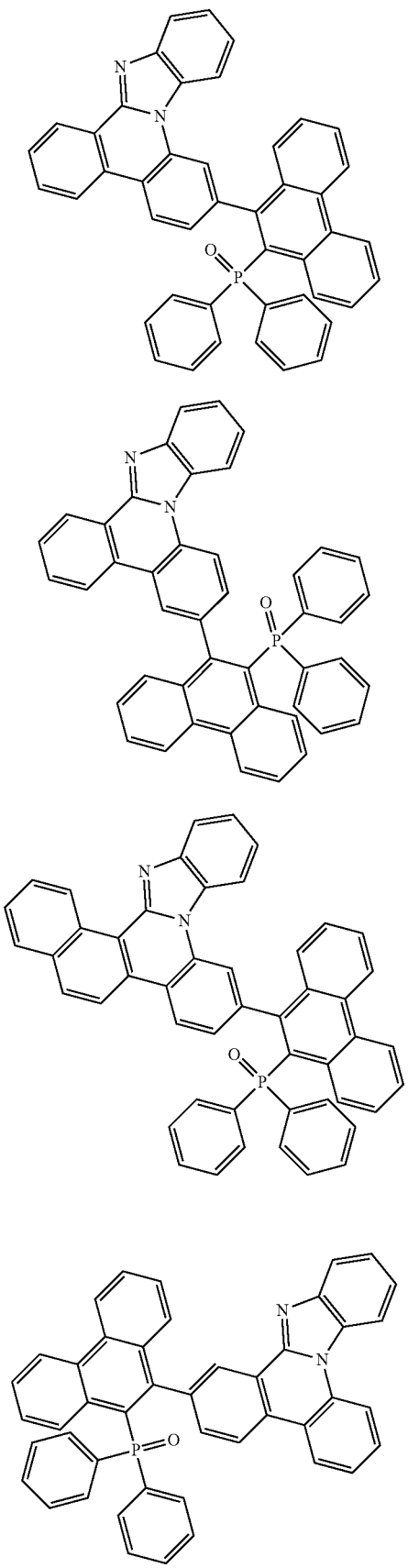
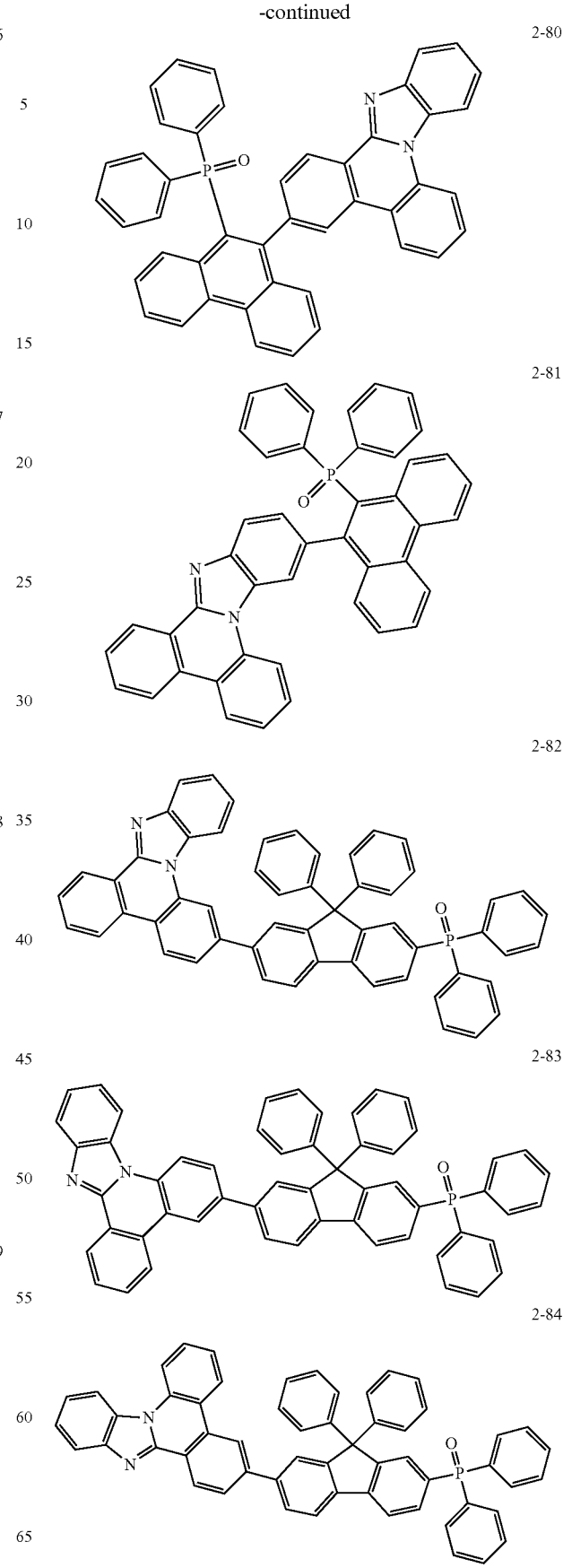

2-85
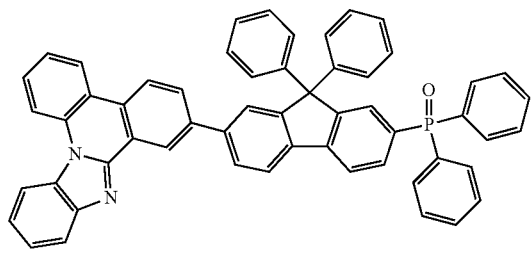
2-89
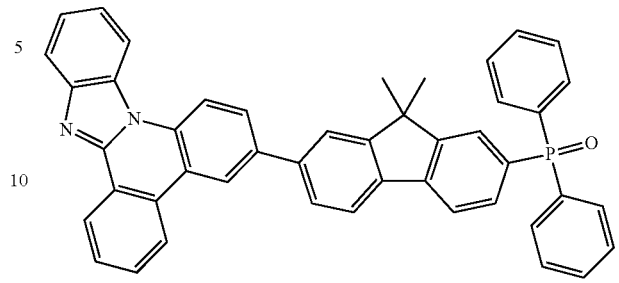
2-86
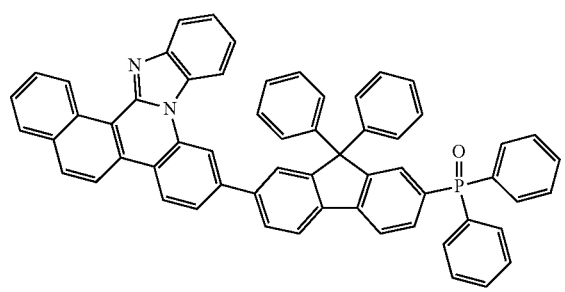
2-90
2-87
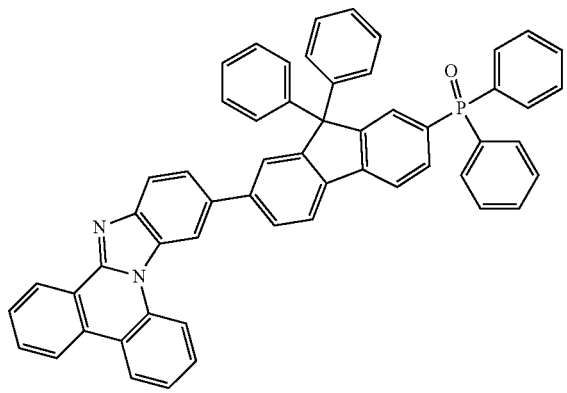
2-91
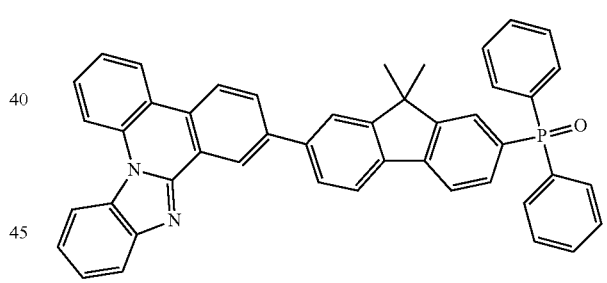
2-88
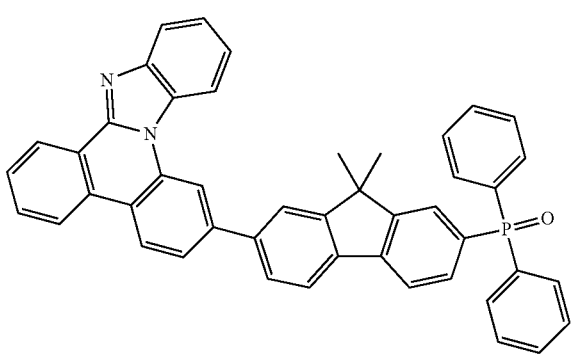
2-92

2-93

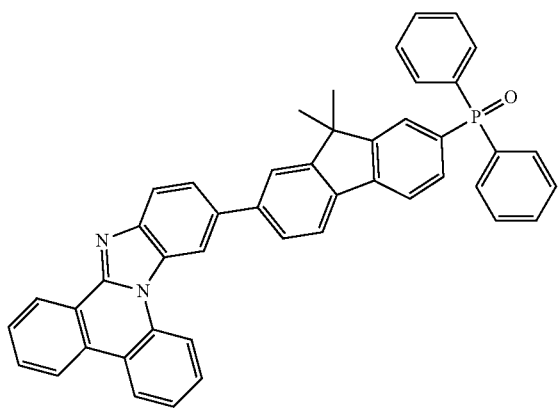

2-94

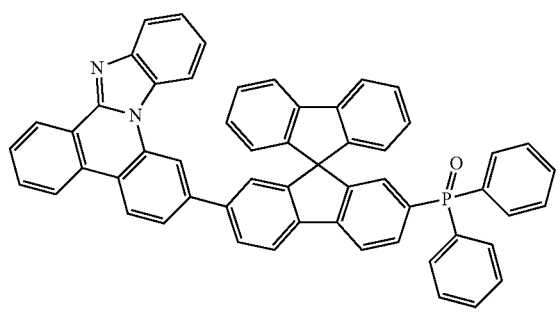

2-95

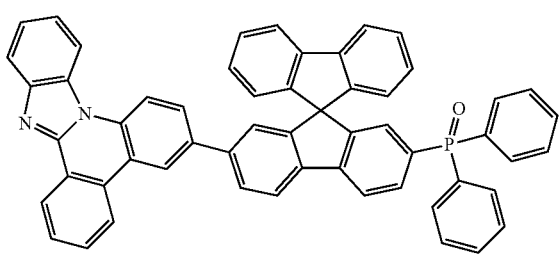

2-96

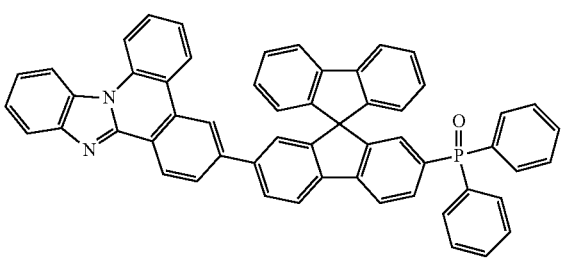

2-97

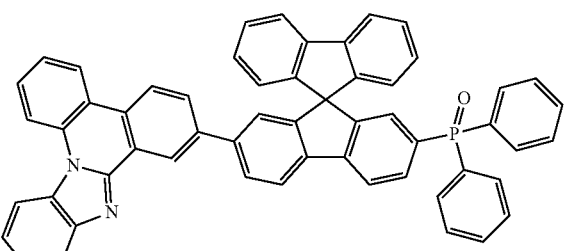

2-98

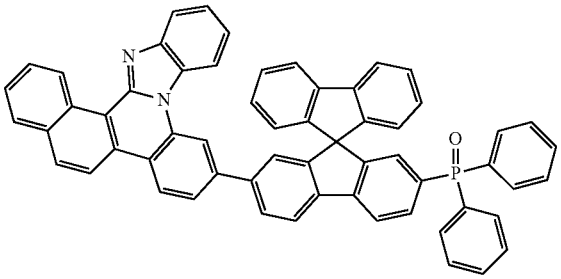

2-99

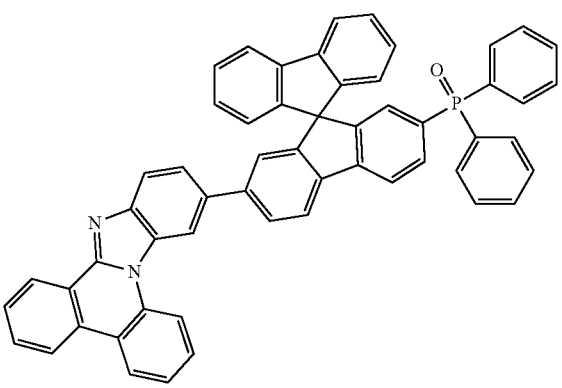

According to an exemplary embodiment of the present specification, the HOMO energy level of the compound represented by Chemical Formula 1 is less than 5.7 eV.

Since the HOMO energy level of the compound represented by Chemical Formula 1 is 5.7 eV, the compound has an energy level which is good to be used as a hole transporting layer.

The substituent of Chemical Formula 1 is in the form of a substituted or unsubstituted amine group, particularly, a monoamine, and since the substituent of the monoamine is also an aryl group and/or a heteroaryl group, the HOMO energy level of the compound is exhibited to be less than 5.7 eV.

In the present specification, the HOMO energy level may be measured by using cyclic voltammetry (CV), which is an electrochemical method, and spectroscopic methods (UV-Vis spectroscopy and photoelectron spectroscopy (PS)).

In an organic light emitting device, when Chemical Formula 1 is used as a first organic material layer and Chemical Formula 2 is used as a second organic material layer, the organic light emitting device exhibits lower voltage characteristics than the case where Chemical Formula 1 and Chemical Formula 2 are separately applied to the organic light emitting device, and exhibits characteristics, which are improved by 1.5 times to 2 times or more as compared to the existing organic light emitting devices in terms of service life.

According to an exemplary embodiment of the present specification, the compound represented by Chemical Formula 1 and the compound represented by Chemical Formula 2 have a glass transition temperature (Tg) of 110° C. or more.

It can be seen that the glass transition temperature thereof is significantly higher than that of NPB (Tg: 96° C.) which is generally used in the art. The increase in thermal stability becomes an important factor for providing a device with driving stability.

The organic material layer of the organic light emitting device of the present specification may also be composed of a mono-layer structure, but may be composed of a multi-layer structure in which two or more organic material layers are stacked. For example, the organic light emitting device of the present invention may have a structure comprising a hole injection layer, a hole transporting layer, a light emitting layer, an electron transporting layer, an electron injection layer, and the like as organic material layers. However, the structure of the organic light emitting device is not limited thereto, and may comprise a fewer number of organic material layers.

For example, the structure of the organic light emitting device of the present specification may have a structure as illustrated in FIGS. 1 and 2, but is not limited thereto.

FIG. 1 exemplifies a structure of an organic light emitting device 10 in which a first electrode 30, a light emitting layer 40, and a second electrode 50 are sequentially stacked on a substrate 20. FIG. 1 is an exemplified structure according to an exemplary embodiment of the present specification, and the structure may further comprise other organic material layers.

FIG. 2 exemplifies a structure of an organic light emitting device 11 in which a first electrode 30, a hole injection layer 60, a hole transporting layer 70, a light emitting layer 40, an electron transporting layer 80, an electron injection layer 90, and a second electrode 50 are sequentially stacked on a substrate 20. FIG. 1 is an exemplified structure according to an exemplary embodiment of the present specification, and the structure of the organic light emitting device is not limited thereto.

In an exemplary embodiment of the present specification, the organic material layer comprises a hole injection layer, a hole transporting layer, or a layer which simultaneously injects and transports holes.

In an exemplary embodiment of the present specification, the organic material layer comprises an electron blocking layer.

In an exemplary embodiment of the present specification, the organic material layer comprises an electron injection layer, an electron transporting layer, or a layer which simultaneously injects and transports electrons.

According to an exemplary embodiment of the present specification, the first organic material layer comprises a hole transporting layer, and the hole transporting layer comprises the compound represented by Chemical Formula 1.

According to an exemplary embodiment of the present specification, the first organic material layer comprises an electron blocking layer, and the electron blocking layer comprises the compound represented by Chemical Formula 1.

According to an exemplary embodiment of the present specification, the second organic material layer comprises an electron transporting layer or an electron injection layer, and the electron transporting layer or the electron injection layer comprises the compound represented by Chemical Formula 2.

According to an exemplary embodiment of the present specification, the second organic material layer comprises an electron transporting layer and an electron injection layer, and the electron transporting layer comprises the compound represented by Chemical Formula 2.

According to an exemplary embodiment of the present specification, the second organic material layer comprises an electron transporting layer and an electron injection layer, and the electron injection layer comprises the compound represented by Chemical Formula 2.

According to an exemplary embodiment of the present specification, the light emitting layer comprises a compound represented by Chemical Formula 1-A.

[Chemical Formula 1-A]

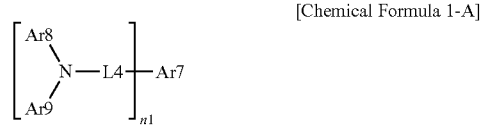

In Chemical Formula 1-A, n1 is an integer of 1 or more,

Ar7 is a substituted or unsubstituted monovalent or more benzofluorene group; a substituted or unsubstituted monovalent or more fluoranthene group; a substituted or unsubstituted monovalent or more pyrene group; or a substituted or unsubstituted monovalent or more chrysene group, L4 is a direct bond; a substituted or unsubstituted arylene group; or a substituted or unsubstituted heteroarylene group, Ar8 and Ar9 are the same as or different from each other, and are each independently a substituted or unsubstituted aryl group; a substituted or unsubstituted silyl group; a substituted or unsubstituted germanium group; a substituted or unsubstituted alkyl group; a substituted or unsubstituted arylalkyl group; or a substituted or unsubstituted heteroaryl group, or may be bonded to each other to form a substituted or unsubstituted ring, and when n1 is 2 or more, two or more structures in the parenthesis are the same as or different from each other.

According to an exemplary embodiment of the present specification, the light emitting layer comprises the compound represented by Chemical Formula 1-A as a dopant of the light emitting layer.

According to an exemplary embodiment of the present specification, L4 is a direct bond.

According to an exemplary embodiment of the present specification, n1 is 2.

In an exemplary embodiment of the present specification, Ar7 is a divalent pyrene group which is unsubstituted or substituted with deuterium, a methyl group, an ethyl group, or a tert-butyl group.

According to an exemplary embodiment of the present specification, Ar8 and Ar9 are the same as or different from each other, and are each independently a substituted or unsubstituted aryl group having 6 to 30 carbon atoms.

According to an exemplary embodiment of the present specification, Ar8 and Ar9 are the same as or different from each other, and are each independently an aryl group which is unsubstituted or substituted with a germanium group substituted with an alkyl group.

According to an exemplary embodiment of the present specification, Ar8 and Ar9 are the same as or different from each other, and are each independently an aryl group which is unsubstituted or substituted with a trimethylgermanium group.

According to an exemplary embodiment of the present specification, Ar8 and Ar9 are the same as or different from each other, and are each independently a substituted or unsubstituted phenyl group.

According to an exemplary embodiment of the present specification, Ar8 and Ar9 are a phenyl group which is unsubstituted or substituted with a trimethylgermanium group.

According to an exemplary embodiment of the present specification, Chemical Formula 1-A is represented by the following compound.

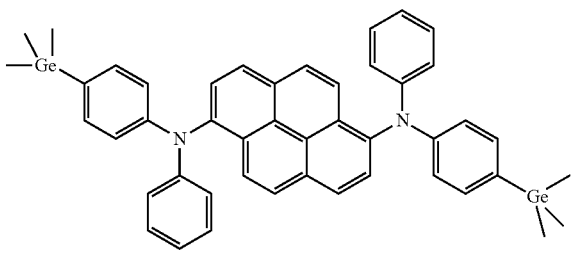

According to an exemplary embodiment of the present specification, the light emitting layer comprises a compound represented by the following Chemical Formula 2-A.

[Chemical Formula 2-A]

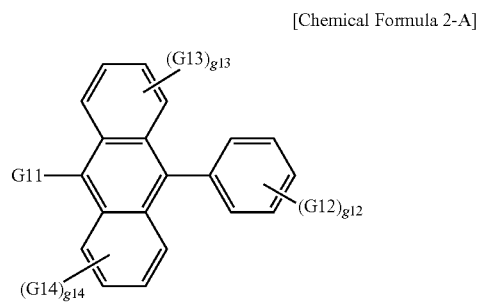

In Chemical Formula 2-A,

G11 is a 1-naphthyl group, a 2-naphthyl group, a 1-anthryl group, a 2-anthryl group, a 1-phenanthryl group, a 2-phenanthryl group, a 3-phenanthryl group, a 4-phenanthryl group, a 9-phenanthryl group, a 1-naphthacenyl group, a 2-naphthacenyl group, a 9-naphthacenyl group, a 1-pyrenyl group, a 2-pyrenyl group, a 4-pyrenyl group, a 3-methyl-2-naphthyl group, a 4-methyl-1-naphthyl group, or the following Chemical Formula

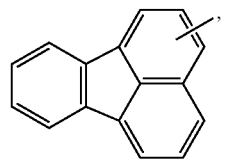

G12 is a phenyl group, a 1-naphthyl group, a 2-naphthyl group, a 1-anthryl group, a 2-anthryl group, a 9-anthryl group, a 1-phenanthryl group, a 2-phenanthryl group, a 3-phenanthryl group, a 4-phenanthryl group, a 9-phenanthryl group, a 1-naphthacenyl group, a 2-naphthacenyl group, a 9-naphthacenyl group, a 1-pyrenyl group, a 2-pyrenyl group, a 4-pyrenyl group, a 2-biphenylyl group, a 3-biphenylyl group, a 4-biphenylyl group, a p-terphenyl-4-yl group, a p-terphenyl-3-yl group, a p-terphenyl-2-yl group, an m-terphenyl-4-yl group, an m-terphenyl-3-yl group, an m-terphenyl-2-yl group, an o-tolyl group, an m-tolyl group, a p-tolyl group, a p-t-butylphenyl group, a p-(2-phenylpropyl)phenyl group, a 3-methyl-2-naphthyl group, a 4-methyl-1-naphthyl group, a 4-methyl-1-anthryl group, a 4'-methyl-biphenylyl group, a 4"-t-butyl-p-terphenyl-4-yl group, or a 3-fluoranthenyl group, G13 and G14 are the same as or different from each other, and are each independently hydrogen; a substituted or unsubstituted alkyl group; a substituted or unsubstituted alkoxy group; a substituted or unsubstituted aryl group; or a substituted or unsubstituted heteroaryl group, g12 is an integer from 1 to 5, g13 and g14 are each an integer from 1 to 4, and when g12 to g14 are each 2 or more, two or more structures in the parenthesis are the same as or different from each other.

According to an exemplary embodiment of the present specification, the light emitting layer comprises the compound represented by Chemical Formula 2-A as a host of the light emitting layer.

According to an exemplary embodiment of the present specification, G11 is a 1-naphthyl group.

According to an exemplary embodiment of the present specification, G12 is a 2-naphthyl group.

According to an exemplary embodiment of the present specification, G13 and G14 are hydrogen.

According to an exemplary embodiment of the present specification, Chemical Formula 2-A is represented by the following compound.

In another exemplary embodiment, the organic light emitting device may be an organic light emitting device having a normal type structure in which a positive electrode, an organic material layer having one or more layers, and a negative electrode are sequentially stacked on a substrate.

In still another exemplary embodiment, the organic light emitting device may be an organic light emitting device having an inverted type structure in which a negative electrode, an organic material layer having one or more layers, and a positive electrode are sequentially stacked on a substrate.

When the organic light emitting device comprises a plurality of organic material layers, the organic material layers may be formed of the same material or different materials.

For example, the organic light emitting device of the present specification may be manufactured by sequentially stacking a positive electrode, an organic material layer, and a negative electrode on a substrate. In this case, the organic light emitting device may be manufactured by depositing a metal or a metal oxide having conductivity, or an alloy thereof on a substrate to form a positive electrode, forming an organic material layer comprising a hole injection layer, a hole transporting layer, a light emitting layer, and an electron transporting layer thereon, and then depositing a material, which may be used as a negative electrode, thereon, by using a physical vapor deposition (PVD) method such as sputtering or e-beam evaporation. In addition to the method as described above, an organic light emitting device may be made by sequentially depositing a negative electrode material, an organic material layer, and a positive electrode material on a substrate.

In addition to the method as described above, an organic light emitting device may also be made by sequentially depositing a negative electrode material, an organic material layer, and a positive electrode material on a substrate (International Publication No. 2003/012890). However, the manufacturing method is not limited thereto.

As the positive electrode material, materials having a high work function are usually preferred so as to facilitate the injection of holes into an organic material layer. Specific examples of the positive electrode material which may be used in the present invention include: a metal such as vanadium, chromium, copper, zinc, and gold, or an alloy thereof; a metal oxide such as zinc oxide, indium oxide, indium tin oxide (ITO), and indium zinc oxide (IZO); a combination of a metal and an oxide, such as ZnO:Al or $SnO_2$:Sb; a conductive polymer such as poly(3-methylthiophene), poly[3,4-(ethylene-1,2-dioxy)thiophene] (PEDOT), polypyrrole, and polyaniline; and the like, but are not limited thereto.

As the negative electrode material, materials having a low work function are usually preferred so as to facilitate the injection of electrons into an organic material layer. Specific examples of the negative electrode material include: a metal such as magnesium, calcium, sodium, potassium, titanium, indium, yttrium, lithium, gadolinium, aluminum, silver, tin, and lead, or an alloy thereof; a multi-layer structured material, such as LiF/Al or $LiO_2$/Al and Mg/Ag, and the like, but are not limited thereto.

The hole injection layer is a layer which injects holes from an electrode, and a hole injection material is preferably a compound which has a capability of transporting holes and thus has an effect of injecting holes at a positive electrode and an excellent effect of injecting holes for a light emitting layer or a light emitting material, prevents excitons produced from the light emitting layer from moving to an electron injection layer or an electron injection material, and is also excellent in the ability to form a thin film. The highest occupied molecular orbital (HOMO) of the hole injection material is preferably a value between the work function of the positive electrode material and the HOMO of the neighboring organic material layer. Specific examples of the hole injection material include metal porphyrin, oligothiophene, arylamine-based organic materials, hexanitrile hexaazatriphenylene-based organic materials, quinacridone-based organic materials, perylene-based organic materials, anthraquinone, polyaniline-based and polythiophene-based conductive polymers, and the like, but are not limited thereto.

The hole transporting layer is a layer which accepts holes from a hole injection layer and transports the holes to a light emitting layer, and a hole transporting material is suitably a material having high hole mobility which may accept holes from a positive electrode or a hole injection layer and transfer the holes to a light emitting layer. Specific examples thereof include arylamine-based organic materials, conductive polymers, block copolymers having both conjugated portions and non-conjugated portions, and the like, but are not limited thereto.

The electron blocking layer is a layer which may improve the service life and efficiency of the device by preventing electrons injected from an electron injection layer from passing through a light emitting layer and entering an hole injection layer, and may be formed at an appropriate portion between a light emitting layer and a hole injection layer by using publicly-known materials, if necessary.

A light emitting material for the light emitting layer is a material which may emit light in a visible light region by accepting and combining holes and electrons from a hole transporting layer and an electron transporting layer, respectively, and is preferably a material having high quantum efficiency for fluorescence or phosphorescence. Specific examples thereof include: 8-hydroxy-quinoline aluminum complex ($Alq_3$); carbazole-based compounds; dimerized styryl compounds; BAlq; 10-hydroxybenzoquinoline-metal compounds; benzoxazole-based, benzothiazole-based and benzimidazole-based compounds; poly(p-phenylenevinylene) (PPV)-based polymers; spiro compounds; polyfluorene, lubrene, and the like, but are not limited thereto.

The light emitting layer may comprise a host material and a dopant material. Examples of the host material include a fused aromatic ring derivative, or a hetero ring-containing compound, and the like. Specifically, examples of the fused aromatic ring derivative include an anthracene derivative, a pyrene derivative, a naphthalene derivative, a pentacene derivative, a phenanthrene compound, a fluoranthene compound, and the like, and examples of the hetero ring-containing compound include a carbazole derivative, a dibenzofuran derivative, a ladder-type furan compound, a pyrimidine derivative, and the like, but the examples thereof are not limited thereto.

Examples of the dopant material include an aromatic amine derivative, a styrylamine compound, a boron complex, a fluoranthene compound, a metal complex, and the like. Specifically, the aromatic amine derivative is a fused aromatic ring derivative having a substituted or unsubstituted arylamino group, and examples thereof include a pyrene, an anthracene, a chrysene, a periflanthene, and the like, which have an arylamino group, and the styrylamine compound is a compound in which a substituted or unsubstituted arylamine is substituted with at least one arylvinyl group, and one or two or more substituents selected from the group consisting of an aryl group, a silyl group, an alkyl group, a cycloalkyl group, and an arylamino group is or are substituted or unsubstituted. Specific examples thereof include styrylamine, styryldiamine, styryltriamine, styryltetramine, and the like, but are not limited thereto. Further, examples of the metal complex include an iridium complex, a platinum complex, and the like, but are not limited thereto.

The electron transporting layer is a layer which accepts electrons from an electron injection layer and transports the electrons to a light emitting layer, and an electron transporting material is suitably a material having high electron mobility which may proficiently accept electrons from a negative electrode and transfer the electrons to a light emitting layer. Specific examples thereof include: Al complexes of 8-hydroxyquinoline; complexes including $Alq_3$; organic radical compounds; hydroxyflavone-metal complexes, and the like, but are not limited thereto. The electron transporting layer may be used with any desired cathode material, as used according to the related art. In particular, appropriate examples of the cathode material are a typical material which has a low work function, followed by an aluminum layer or a silver layer. Specific examples thereof include cesium, barium, calcium, ytterbium, and samarium, in each case followed by an aluminum layer or a silver layer.

The electron injection layer is a layer which injects electrons from an electrode, and an electron injection material is preferably a compound which has a capability of transporting electrons, has an excellent effect of injecting electrons from a negative electrode and an excellent effect of injecting electrons into a light emitting layer or a light emitting material, prevents excitons produced from the light emitting layer from moving to a hole injection layer, and is also excellent in the ability to form a thin film. Specific examples thereof include fluorenone, anthraquinodimethane, diphenoquinone, thiopyran dioxide, oxazole, oxadiazole, triazole, imidazole, perylenetetracarboxylic acid, fluorenylidene methane, anthrone, and the like, and derivatives thereof, a metal complex compound, a nitrogen-containing 5-membered ring derivative, and the like, but are not limited thereto.

Examples of the metal complex compound include 8-hydroxyquinolinato lithium, bis(8-hydroxyquinolinato) zinc, bis(8-hydroxyquinolinato) copper, bis(8-hydroxyquinolinato) manganese, tris(8-hydroxyquinolinato) aluminum, tris (2-methyl-8-hydroxyquinolinato) aluminum, tris(8-hydroxyquinolinato) gallium, bis(10-hydroxybenzo[h]

quinolinato) beryllium, bis(10-hydroxybenzo[h]quinolinato) zinc, bis(2-methyl-8-quinolinato) chlorogallium, bis(2-methyl-8-quinolinato)(o-cresolato) gallium, bis(2-methyl-8-quinolinato)(1-naphtholato) aluminum, bis(2-methyl-8-quinolinato)(2-naphtholato) gallium, and the like, but are not limited thereto.

The hole blocking layer is a layer which blocks holes from reaching a negative electrode, and may be generally formed under the same conditions as those of the hole injection layer. Specific examples thereof include an oxadiazole derivative or a triazole derivative, a phenanthroline derivative, BCP, an aluminum complex, and the like, but are not limited thereto.

The organic light emitting device according to the present specification may be a top emission type, a bottom emission type, or a dual emission type according to the materials to be used.

The structure according to an exemplary embodiment of the present specification may act even in organic electronic devices comprising organic solar cells, organic photoconductors, organic transistors, and the like, based on the principle similar to those applied to organic light emitting devices.

The organic light emitting device of the present specification may be manufactured by materials and methods known in the art, except that the first organic material layer comprises the compound represented by Chemical Formula 1, and the second organic material layer comprises the compound represented by Chemical Formula 2.

MODE FOR INVENTION

The manufacture of the organic light emitting device will be specifically described in the following Examples. However, the following Examples are provided for exemplifying the present specification, and the scope of the present specification is not limited thereby.

Experimental Example 1

A glass substrate on which a thin film of indium tin oxide (ITO) was coated to have a thickness of 1,000 Å was placed into distilled water in which a detergent was dissolved, and washed using ultrasonic waves. In this case, a product manufactured by Fischer Co., was used as the detergent, and distilled water twice filtered using a filter manufactured by Millipore Co., was used as the distilled water. After the ITO was washed for 30 minutes, ultrasonic washing was repeated twice using distilled water for 10 minutes. After the washing using distilled water was completed, ultrasonic washing was conducted using a solvent of isopropyl alcohol, acetone, and methanol, and the resultant product was dried and then transported to a plasma washing machine. Furthermore, the substrate was washed by using an oxygen plasma for 5 minutes, and then was transported to a vacuum deposition machine.

Hexanitrile hexaazatriphenylene (HAT) of the following Chemical Formula was thermally vacuum deposited to have a thickness of 500 Å on the thus prepared ITO transparent electrode, thereby forming a hole injection layer.

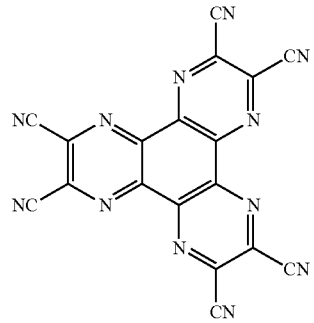

[HAT]

The following compound 4-4'-bis[N-(1-naphthyl)-N-phenylamino]biphenyl (NPB) (HT-1) (300 Å), which is a material for transporting holes, was vacuum deposited on the hole injection layer, thereby forming a hole transporting layer.

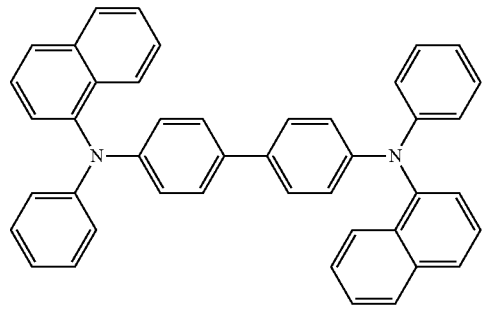

[NPB]

Subsequently, the following compound N-([1,1'-biphenyl]-4-yl)-N-(4-(11-([1,1'-biphenyl]-4-yl)-11H-benzo[a]carbazol-5-yl)phenyl)-[1,1'-biphenyl]-4-amine (100 Å) was vacuum deposited to have a film thickness of 100 Å on the hole transporting layer, thereby forming an electron blocking layer.

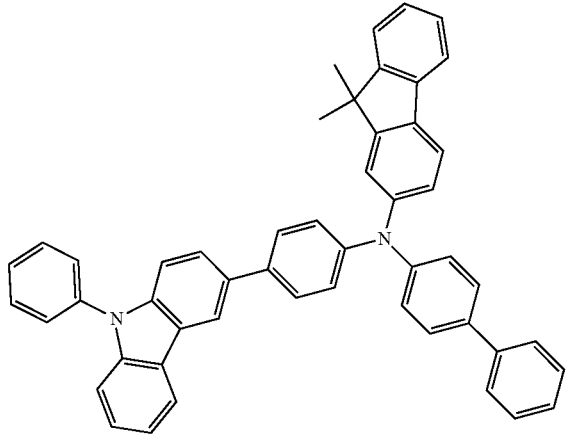

[EB-1]

Subsequently, BH and BD as described below were vacuum deposited at a weight ratio of 25:1 to have a film thickness of 300 Å on the electron blocking layer, thereby forming a light emitting layer.

[BII]

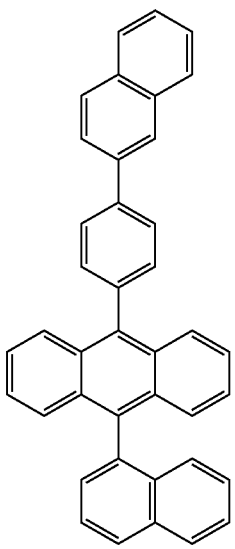

[BD]

[Et-1]

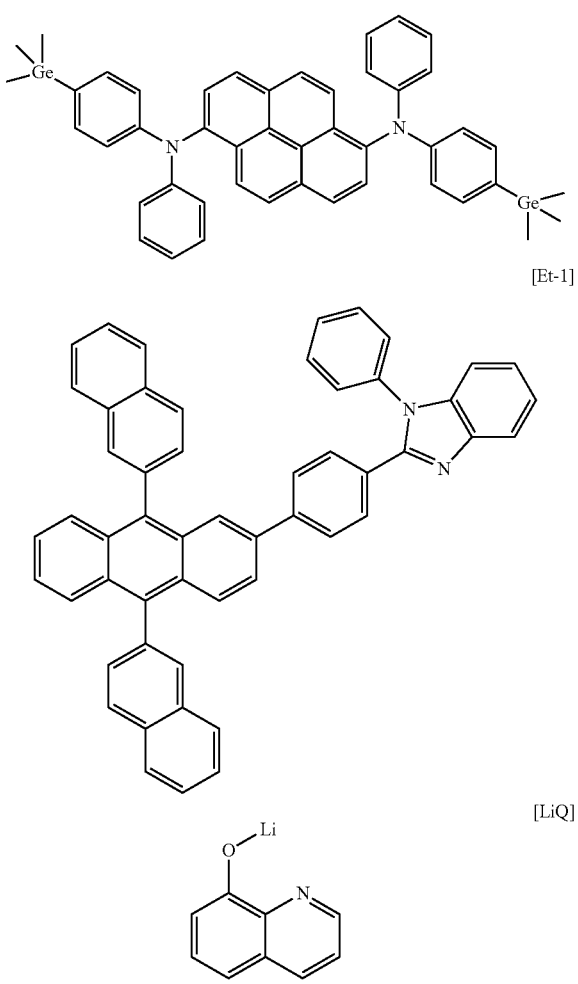

[LiQ]

The compound ET-1 and the compound LiQ (lithium quinolate) were vacuum deposited at a weight ratio of 1:1 on the light emitting layer, thereby forming an electron injection and transporting layer having a thickness of 300 Å. Lithium fluoride (LiF) and aluminum were sequentially deposited on the electron injection and transporting layer to have a thickness of 12 Å and 2,000 Å, respectively, thereby forming a negative electrode.

In the aforementioned procedure, the deposition rate of the organic material was maintained at 0.4 to 0.7 Å/sec, the deposition rates of lithium fluoride and aluminum of the negative electrode were maintained at 0.3 Å/sec and at 2 Å/sec, respectively, and the degree of vacuum during the deposition was maintained at $2 \times 10^{-7}$ to $5 \times 10^{-6}$ torr, thereby manufacturing an organic light emitting device.

Comparative Example 1-1-1

An organic light emitting device was manufactured in the same manner as in Experimental Example 1, except that Compound 1-1 was used instead of EB-1 in Experimental Example 1.

Comparative Example 1-1-2

An organic light emitting device was manufactured in the same manner as in Experimental Example 1, except that Compound 1-2 was used instead of EB-1 in Experimental Example 1.

Comparative Example 1-1-3

An organic light emitting device was manufactured in the same manner as in Experimental Example 1, except that Compound 1-3 was used instead of Compound EB-1 in Experimental Example 1.

Comparative Example 1-1-4

An organic light emitting device was manufactured in the same manner as in Experimental Example 1, except that Compound 1-4 was used instead of Compound EB-1 in Experimental Example 1.

Comparative Example 1-1-5

An organic light emitting device was manufactured in the same manner as in Experimental Example 1, except that Compound 1-5 was used instead of Compound EB-1 in Experimental Example 1.

Comparative Example 1-1-6

An organic light emitting device was manufactured in the same manner as in Experimental Example 1, except that Compound 1-6 was used instead of Compound EB-1 in Experimental Example 1.

Comparative Example 1-1-7

An organic light emitting device was manufactured in the same manner as in Experimental Example 1, except that Compound 1-14 was used instead of Compound EB-1 in Experimental Example 1.

Comparative Example 1-1-8

An organic light emitting device was manufactured in the same manner as in Experimental Example 1, except that Compound 1-17 was used instead of EB-1 in Experimental Example 1.

Comparative Example 1-1-9

An organic light emitting device was manufactured in the same manner as in Experimental Example 1, except that Compound 1-20 was used instead of Compound EB-1 in Experimental Example 1.

Comparative Example 1-1-10

An organic light emitting device was manufactured in the same manner as in Experimental Example 1, except that Compound 1-29 was used instead of Compound EB-1 in Experimental Example 1.

Comparative Example 1-1-11

An organic light emitting device was manufactured in the same manner as in Experimental Example 1, except that Compound 1-34 was used instead of Compound EB-1 in Experimental Example 1.

Comparative Example 1-1-12

An organic light emitting device was manufactured in the same manner as in Experimental Example 1, except that Compound 1-37 was used instead of Compound EB-1 in Experimental Example 1.

Comparative Example 1-1-13

An organic light emitting device was manufactured in the same manner as in Experimental Example 1, except that Compound 1-38 was used instead of Compound EB-1 in Experimental Example 1.

Comparative Example 1-1-14

An organic light emitting device was manufactured in the same manner as in Experimental Example 1, except that Compound 1-43 was used instead of Compound EB-1 in Experimental Example 1.

Comparative Example 1-1-15

An organic light emitting device was manufactured in the same manner as in Experimental Example 1, except that Compound 1-46 was used instead of Compound EB-1 in Experimental Example 1.

Comparative Example 1-1-16

An organic light emitting device was manufactured in the same manner as in Experimental Example 1, except that Compound 1-51 was used instead of Compound EB-1 in Experimental Example 1.

Comparative Example 1-1-17

An organic light emitting device was manufactured in the same manner as in Experimental Example 1, except that Compound 1-54 was used instead of Compound EB-1 in Experimental Example 1.

Comparative Example 1-1-18

An organic light emitting device was manufactured in the same manner as in Experimental Example 1, except that Compound 1-64 was used instead of Compound EB-1 in Experimental Example 1.

Comparative Example 1-1-19

An organic light emitting device was manufactured in the same manner as in Experimental Example 1, except that Compound 1-70 was used instead of Compound EB-1 in Experimental Example 1.

Comparative Example 1-1-20

An organic light emitting device was manufactured in the same manner as in Experimental Example 1, except that Compound 1-72 was used instead of Compound EB-1 in Experimental Example 1.

Comparative Example 1-1-21

An organic light emitting device was manufactured in the same manner as in Experimental Example 1, except that Compound 1-75 was used instead of Compound EB-1 in Experimental Example 1.

Comparative Example 1-1-22

An organic light emitting device was manufactured in the same manner as in Experimental Example 1, except that Compound 1-76 was used instead of Compound EB-1 in Experimental Example 1.

Comparative Example 1-1-23

An organic light emitting device was manufactured in the same manner as in Experimental Example 1, except that Compound 1-80 was used instead of Compound EB-1 in Experimental Example 1.

Comparative Example 1-1-24

An organic light emitting device was manufactured in the same manner as in Experimental Example 1, except that Compound 1-81 was used instead of Compound EB-1 in Experimental Example 1.

Comparative Example 1-1-25

An organic light emitting device was manufactured in the same manner as in Experimental Example 1, except that Compound 1-90 was used instead of Compound EB-1 in Experimental Example 1.

Comparative Example 1-1-26

An organic light emitting device was manufactured in the same manner as in Experimental Example 1, except that Compound 1-91 was used instead of Compound EB-1 in Experimental Example 1.

Comparative Example 1-1-27

An organic light emitting device was manufactured in the same manner as in Experimental Example 1, except that Compound 1-92 was used instead of Compound EB-1 in Experimental Example 1.

Comparative Example 1-1-28

An organic light emitting device was manufactured in the same manner as in Experimental Example 1, except that Compound 1-93 was used instead of Compound EB-1 in Experimental Example 1.

Comparative Example 1-2-1

An organic light emitting device was manufactured in the same manner as in Experimental Example 1, except that Compound 2-2 was used instead of Compound ET-1 in Experimental Example 1.

Comparative Example 1-2-2

An organic light emitting device was manufactured in the same manner as in Experimental Example 1, except that Compound 2-3 was used instead of Compound ET-1 in Experimental Example 1.

Comparative Example 1-2-3

An organic light emitting device was manufactured in the same manner as in Experimental Example 1, except that Compound 2-5 was used instead of Compound ET-1 in Experimental Example 1.

Comparative Example 1-2-4

An organic light emitting device was manufactured in the same manner as in Experimental Example 1, except that Compound 2-8 was used instead of Compound ET-1 in Experimental Example 1.

Comparative Example 1-2-5

An organic light emitting device was manufactured in the same manner as in Experimental Example 1, except that Compound 2-11 was used instead of Compound ET-1 in Experimental Example 1.

Comparative Example 1-2-6

An organic light emitting device was manufactured in the same manner as in Experimental Example 1, except that Compound 2-12 was used instead of Compound ET-1 in Experimental Example 1.

Comparative Example 1-2-7

An organic light emitting device was manufactured in the same manner as in Experimental Example 1, except that Compound 2-13 was used instead of Compound ET-1 in Experimental Example 1.

Comparative Example 1-2-8

An organic light emitting device was manufactured in the same manner as in Experimental Example 1, except that Compound 2-14 was used instead of Compound ET-1 in Experimental Example 1.

Comparative Example 1-2-9

An organic light emitting device was manufactured in the same manner as in Experimental Example 1, except that Compound 2-18 was used instead of Compound ET-1 in Experimental Example 1.

Comparative Example 1-2-10

An organic light emitting device was manufactured in the same manner as in Experimental Example 1, except that Compound 2-21 was used instead of Compound ET-1 in Experimental Example 1.

Comparative Example 1-2-11

An organic light emitting device was manufactured in the same manner as in Experimental Example 1, except that Compound 2-24 was used instead of Compound ET-1 in Experimental Example 1.

Comparative Example 1-2-12

An organic light emitting device was manufactured in the same manner as in Experimental Example 1, except that Compound 2-26 was used instead of Compound ET-1 in Experimental Example 1.

Comparative Example 1-2-13

An organic light emitting device was manufactured in the same manner as in Experimental Example 1, except that Compound 2-28 was used instead of Compound ET-1 in Experimental Example 1.

Comparative Example 1-2-14

An organic light emitting device was manufactured in the same manner as in Experimental Example 1, except that Compound 2-29 was used instead of Compound ET-1 in Experimental Example 1.

Comparative Example 1-2-15

An organic light emitting device was manufactured in the same manner as in Experimental Example 1, except that Compound 2-31 was used instead of Compound ET-1 in Experimental Example 1.

Comparative Example 1-2-16

An organic light emitting device was manufactured in the same manner as in Experimental Example 1, except that Compound 2-32 was used instead of Compound ET-1 in Experimental Example 1.

Comparative Example 1-2-17

An organic light emitting device was manufactured in the same manner as in Experimental Example 1, except that Compound 2-33 was used instead of Compound ET-1 in Experimental Example 1.

Comparative Example 1-2-18

An organic light emitting device was manufactured in the same manner as in Experimental Example 1, except that Compound 2-34 was used instead of Compound ET-1 in Experimental Example 1.

Comparative Example 1-2-19

An organic light emitting device was manufactured in the same manner as in Experimental Example 1, except that Compound 2-35 was used instead of Compound ET-1 in Experimental Example 1.

Comparative Example 1-2-20

An organic light emitting device was manufactured in the same manner as in Experimental Example 1, except that Compound 2-36 was used instead of Compound ET-1 in Experimental Example 1.

Comparative Example 1-2-21

An organic light emitting device was manufactured in the same manner as in Experimental Example 1, except that Compound 2-51 was used instead of Compound ET-1 in Experimental Example 1.

Comparative Example 1-2-22

An organic light emitting device was manufactured in the same manner as in Experimental Example 1, except that Compound 2-52 was used instead of Compound ET-1 in Experimental Example 1.

Comparative Example 1-2-23

An organic light emitting device was manufactured in the same manner as in Experimental Example 1, except that Compound 2-53 was used instead of Compound ET-1 in Experimental Example 1.

Comparative Example 1-2-24

An organic light emitting device was manufactured in the same manner as in Experimental Example 1, except that Compound 2-54 was used instead of Compound ET-1 in Experimental Example 1.

Experimental Example 1-1

An organic light emitting device was manufactured in the same manner as in Experimental Example 1, except that Compound 1-1 was used instead of Compound EB-1 and a compound of the following 2-8 was used instead of Compound ET-1 in Experimental Example 1.

Experimental Example 1-2

An organic light emitting device was manufactured in the same manner as in Experimental Example 1, except that Compound 1-1 was used instead of Compound EB-1 and Compound 2-13 was used instead of Compound ET-1 in Experimental Example 1.

Experimental Example 1-3

An organic light emitting device was manufactured in the same manner as in Experimental Example 1, except that Compound 1-1 was used instead of Compound EB-1 and Compound 2-29 was used instead of Compound ET-1 in Experimental Example 1.

Experimental Example 1-4

An organic light emitting device was manufactured in the same manner as in Experimental Example 1, except that Compound 1-1 was used instead of Compound EB-1 and Compound 2-36 was used instead of Compound ET-1 in Experimental Example 1.

Experimental Example 1-5

An organic light emitting device was manufactured in the same manner as in Experimental Example 1, except that Compound 1-1 was used instead of Compound EB-1 and Compound 2-53 was used instead of Compound ET-1 in Experimental Example 1.

Experimental Example 1-6

An organic light emitting device was manufactured in the same manner as in Experimental Example 1, except that Compound 1-14 was used instead of Compound EB-1 and Compound 2-8 was used instead of Compound ET-1 in Experimental Example 1.

Experimental Example 1-7

An organic light emitting device was manufactured in the same manner as in Experimental Example 1, except that Compound 1-14 was used instead of Compound EB-1 and Compound 2-13 was used instead of Compound ET-1 in Experimental Example 1.

Experimental Example 1-8

An organic light emitting device was manufactured in the same manner as in Experimental Example 1, except that Compound 1-14 was used instead of Compound EB-1 and Compound 2-29 was used instead of Compound ET-1 in Experimental Example 1.

Experimental Example 1-9

An organic light emitting device was manufactured in the same manner as in Experimental Example 1, except that Compound 1-14 was used instead of Compound EB-1 and Compound 2-36 was used instead of Compound ET-1 in Experimental Example 1.

Experimental Example 1-10

An organic light emitting device was manufactured in the same manner as in Experimental Example 1, except that Compound 1-14 was used instead of Compound EB-1 and Compound 2-53 was used instead of Compound ET-1 in Experimental Example 1.

Experimental Example 1-11

An organic light emitting device was manufactured in the same manner as in Experimental Example 1, except that Compound 1-47 was used instead of Compound EB-1 and Compound 2-8 was used instead of Compound ET-1 in Experimental Example 1.

Experimental Example 1-12

An organic light emitting device was manufactured in the same manner as in Experimental Example 1, except that Compound 1-47 was used instead of Compound EB-1 and Compound 2-13 was used instead of Compound ET-1 in Experimental Example 1.

Experimental Example 1-13

An organic light emitting device was manufactured in the same manner as in Experimental Example 1, except that Compound 1-47 was used instead of Compound EB-1 and Compound 2-29 was used instead of Compound ET-1 in Experimental Example 1.

Experimental Example 1-14

An organic light emitting device was manufactured in the same manner as in Experimental Example 1, except that Compound 1-47 was used instead of Compound EB-1 and Compound 2-36 was used instead of Compound ET-1 in Experimental Example 1.

Experimental Example 1-15

An organic light emitting device was manufactured in the same manner as in Experimental Example 1, except that Compound 1-47 was used instead of Compound EB-1 and Compound 2-53 was used instead of Compound ET-1 in Experimental Example 1.

Experimental Example 1-16

An organic light emitting device was manufactured in the same manner as in Experimental Example 1, except that Compound 1-81 was used instead of Compound EB-1 and Compound 2-8 was used instead of Compound ET-1 in Experimental Example 1.

Experimental Example 1-17

An organic light emitting device was manufactured in the same manner as in Experimental Example 1, except that Compound 1-81 was used instead of Compound EB-1 and Compound 2-13 was used instead of Compound ET-1 in Experimental Example 1.

Experimental Example 1-18

An organic light emitting device was manufactured in the same manner as in Experimental Example 1, except that Compound 1-81 was used instead of Compound EB-1 and Compound 2-29 was used instead of Compound ET-1 in Experimental Example 1.

Experimental Example 1-19

An organic light emitting device was manufactured in the same manner as in Experimental Example 1, except that Compound 1-81 was used instead of Compound EB-1 and Compound 2-36 was used instead of Compound ET-1 in Experimental Example 1.

Experimental Example 1-20

An organic light emitting device was manufactured in the same manner as in Experimental Example 1, except that Compound 1-81 was used instead of Compound EB-1 and Compound 2-53 was used instead of Compound ET-1 in Experimental Example 1.

Experimental Example 1-21

An organic light emitting device was manufactured in the same manner as in Experimental Example 1, except that Compound 1-92 was used instead of Compound EB-1 and Compound 2-8 was used instead of Compound ET-1 in Experimental Example 1.

Experimental Example 1-22

An organic light emitting device was manufactured in the same manner as in Experimental Example 1, except that Compound 1-92 was used instead of Compound EB-1 and Compound 2-13 was used instead of Compound ET-1 in Experimental Example 1.

Experimental Example 1-23

An organic light emitting device was manufactured in the same manner as in Experimental Example 1, except that Compound 1-92 was used instead of Compound EB-1 and Compound 2-29 was used instead of Compound ET-1 in Experimental Example 1.

Experimental Example 1-24

An organic light emitting device was manufactured in the same manner as in Experimental Example 1, except that Compound 1-92 was used instead of Compound EB-1 and Compound 2-36 was used instead of Compound ET-1 in Experimental Example 1.

Experimental Example 1-25

An organic light emitting device was manufactured in the same manner as in Experimental Example 1, except that Compound 1-92 was used instead of Compound EB-1 and Compound 2-53 was used instead of Compound ET-1 in Experimental Example 1.

When current was applied to the organic light emitting devices manufactured in Experimental Example 1, Comparative Examples 1-1-1 to 1-1-28, Comparative Examples 1-2-1 to 1-2-24 and Examples 1-1 to 1-25, the results are shown in Table 1.

TABLE 1

|  | ETL | EBL | Voltage (V) | Luminance (cd/m$^2$) | T95 (hr) |
|---|---|---|---|---|---|
| Experimental example 1 | ET-1 | EB-1 | 4.56 | 5.91 | 195 |
| Comparative example 1-1-1 | ET-1 | 1-1 | 4.02 | 6.19 | 235 |
| Comparative example 1-1-2 | ET-1 | 1-2 | 4.23 | 6.23 | 235 |

TABLE 1-continued

| | ETL | EBL | Voltage (V) | Luminance (cd/m$^2$) | T95 (hr) |
|---|---|---|---|---|---|
| Comparative example 1-1-3 | ET-1 | 1-3 | 4.15 | 6.18 | 240 |
| Comparative example 1-1-4 | ET-1 | 1-4 | 4.36 | 6.22 | 235 |
| Comparative example 1-1-5 | ET-1 | 1-5 | 4.07 | 6.28 | 235 |
| Comparative example 1-1-6 | ET-1 | 1-6 | 4.29 | 6.18 | 220 |
| Comparative example 1-1-7 | ET-1 | 1-14 | 4.35 | 6.23 | 245 |
| Comparative example 1-1-8 | ET-1 | 1-17 | 4.37 | 6.12 | 245 |
| Comparative example 1-1-9 | ET-1 | 1-20 | 4.26 | 6.24 | 235 |
| Comparative example 1-1-10 | ET-1 | 1-29 | 4.14 | 6.25 | 240 |
| Comparative example 1-1-11 | ET-1 | 1-34 | 4.32 | 6.26 | 235 |
| Comparative example 1-1-12 | ET-1 | 1-37 | 4.01 | 6.19 | 225 |
| Comparative example 1-1-13 | ET-1 | 1-38 | 4.28 | 6.17 | 220 |
| Comparative example 1-1-14 | ET-1 | 1-43 | 4.33 | 6.21 | 245 |
| Comparative example 1-1-15 | ET-1 | 1-46 | 4.30 | 6.24 | 240 |
| Comparative example 1-1-16 | ET-1 | 1-51 | 4.28 | 6.25 | 225 |
| Comparative example 1-1-17 | ET-1 | 1-54 | 4.14 | 6.22 | 240 |
| Comparative example 1-1-18 | ET-1 | 1-64 | 4.39 | 6.21 | 235 |
| Comparative example 1-1-19 | ET-1 | 1-70 | 4.05 | 6.23 | 235 |
| Comparative example 1-1-20 | ET-1 | 1-72 | 4.26 | 6.20 | 220 |
| Comparative example 1-1-21 | ET-1 | 1-75 | 4.34 | 6.28 | 245 |
| Comparative example 1-1-22 | ET-1 | 1-76 | 4.09 | 6.18 | 235 |
| Comparative example 1-1-23 | ET-1 | 1-80 | 4.28 | 6.23 | 220 |
| Comparative example 1-1-24 | ET-1 | 1-81 | 4.35 | 6.12 | 245 |
| Comparative example 1-1-25 | ET-1 | 1-90 | 4.34 | 6.28 | 245 |
| Comparative example 1-1-26 | ET-1 | 1-91 | 4.09 | 6.18 | 235 |
| Comparative example 1-1-27 | ET-1 | 1-92 | 4.28 | 6.23 | 220 |
| Comparative example 1-1-28 | ET-1 | 1-93 | 4.35 | 6.12 | 245 |
| Comparative example 1-2-1 | 2-2 | EB-1 | 3.74 | 4.74 | 225 |
| Comparative example 1-2-2 | 2-3 | EB-1 | 3.76 | 4.85 | 240 |
| Comparative example 1-2-3 | 2-5 | EB-1 | 3.71 | 4.86 | 235 |
| Comparative example 1-2-4 | 2-8 | EB-1 | 3.79 | 4.89 | 225 |
| Comparative example 1-2-5 | 2-11 | EB-1 | 3.77 | 4.88 | 240 |
| Comparative example 1-2-6 | 2-12 | EB-1 | 3.74 | 4.88 | 235 |
| Comparative example 1-2-7 | 2-13 | EB-1 | 3.86 | 4.73 | 225 |
| Comparative example 1-2-8 | 2-14 | EB-1 | 3.75 | 4.82 | 220 |
| Comparative example 1-2-9 | 2-18 | EB-1 | 3.71 | 4.84 | 245 |
| Comparative example 1-2-10 | 2-21 | EB-1 | 3.88 | 4.85 | 235 |
| Comparative example 1-2-11 | 2-24 | EB-1 | 3.72 | 4.88 | 220 |
| Comparative example 1-2-12 | 2-26 | EB-1 | 3.73 | 4.78 | 245 |
| Comparative example 1-2-13 | 2-28 | EB-1 | 3.74 | 4.83 | 225 |
| Comparative example 1-2-14 | 2-29 | EB-1 | 3.86 | 4.82 | 240 |
| Comparative example 1-2-15 | 2-31 | EB-1 | 3.78 | 4.88 | 235 |
| Comparative example 1-2-16 | 2-32 | EB-1 | 3.79 | 4.88 | 225 |
| Comparative example 1-2-17 | 2-33 | EB-1 | 3.74 | 4.73 | 220 |
| Comparative example 1-2-18 | 2-34 | EB-1 | 3.75 | 4.82 | 245 |
| Comparative example 1-2-19 | 2-35 | EB-1 | 3.76 | 4.84 | 225 |
| Comparative example 1-2-20 | 2-36 | EB-1 | 3.78 | 4.85 | 220 |
| Comparative example 1-2-21 | 2-51 | EB-1 | 3.89 | 4.86 | 245 |
| Comparative example 1-2-22 | 2-52 | EB-1 | 3.71 | 4.89 | 225 |
| Comparative example 1-2-23 | 2-53 | EB-1 | 3.77 | 4.87 | 240 |
| Comparative example 1-2-24 | 2-55 | EB-1 | 3.76 | 4.80 | 235 |
| Experimental example 1-1 | 2-8 | 1-1 | 3.58 | 6.96 | 320 |
| Experimental example 1-2 | 2-13 | 1-1 | 3.42 | 6.88 | 330 |
| Experimental example 1-3 | 2-29 | 1-1 | 3.53 | 6.98 | 325 |
| Experimental example 1-4 | 2-36 | 1-1 | 3.44 | 6.89 | 320 |
| Experimental example 1-5 | 2-53 | 1-1 | 3.45 | 6.92 | 315 |
| Experimental example 1-6 | 2-8 | 1-14 | 3.76 | 6.73 | 305 |
| Experimental example 1-7 | 2-13 | 1-14 | 3.70 | 6.77 | 330 |
| Experimental example 1-8 | 2-29 | 1-14 | 3.61 | 6.82 | 330 |
| Experimental example 1-9 | 2-36 | 1-14 | 3.63 | 6.80 | 325 |
| Experimental example 1-10 | 2-53 | 1-14 | 3.79 | 6.79 | 325 |
| Experimental example 1-11 | 2-8 | 1-47 | 3.78 | 6.89 | 320 |
| Experimental example 1-12 | 2-13 | 1-47 | 3.66 | 6.82 | 305 |
| Experimental example 1-13 | 2-29 | 1-47 | 3.74 | 6.73 | 320 |
| Experimental example 1-14 | 2-36 | 1-47 | 3.72 | 6.77 | 305 |
| Experimental example 1-15 | 2-53 | 1-47 | 3.60 | 6.89 | 320 |
| Experimental example 1-16 | 2-8 | 1-81 | 3.71 | 6.62 | 330 |
| Experimental example 1-17 | 2-13 | 1-81 | 3.61 | 6.83 | 345 |
| Experimental example 1-18 | 2-29 | 1-81 | 3.79 | 6.77 | 350 |
| Experimental example 1-19 | 2-36 | 1-81 | 3.67 | 6.79 | 360 |
| Experimental example 1-20 | 2-53 | 1-81 | 3.65 | 6.82 | 355 |
| Experimental example 1-21 | 2-8 | 1-92 | 3.61 | 6.83 | 350 |
| Experimental example 1-22 | 2-13 | 1-92 | 3.74 | 6.77 | 315 |
| Experimental example 1-23 | 2-29 | 1-92 | 3.68 | 6.82 | 305 |
| Experimental example 1-24 | 2-36 | 1-92 | 3.67 | 6.80 | 310 |
| Experimental example 1-25 | 2-53 | 1-92 | 3.66 | 6.89 | 315 |

In Experimental Example 1, the organic light emitting device has a structure in which materials widely used are used as the Reference, EB-1 is used as an electron blocking layer, and ET-1 is used as an electron transporting layer.

According to Table 1, Comparative Examples 1-1-1 to 1-1-28 used the compound of Chemical Formula 1 instead of EB-1 and Comparative Examples 1-2-1 to 1-2-24 used the compound of Chemical Formula 2 instead of ET-1, and as a result, basic characteristics of a device are exhibited when Chemical Formula 1 and Chemical Formula 2 are each used as a material for an organic light emitting device.

Examples 1-1 to 1-25 used the compounds of Chemical Formula 1 instead of EB-1 of Experimental Example 1 and used the compounds of Chemical Formula 2 instead of ET-1 of Experimental Example 1, and thus exhibit characteristics of a device when the compounds of Chemical Formulae 1 and 2 are simultaneously applied to one organic light emitting device.

In Examples 1-1 to 1-25, when the compound of Chemical Formula 1 was used instead of EB-1 of Experimental Example 1 and the compound of Chemical Formula 2 was used instead of ET-1 of Experimental Example 1, the voltage was the lowest.

Further, in Examples 1-16 to 1-20, when Chemical Formula 1-81 was used instead of EB-1 of Experimental Example 1 and the compounds of Chemical Formula 2 was used instead of ET-1 of Experimental Example 1, the longest service life was measured.

The light emitting efficiency of Examples 1-1 to 1-25 were measured higher than those of Comparative Examples 1-1-1 to 1-1-28 and Comparative Examples 1-2-1 to 1-2-24.

Through the results, it could be confirmed that it is possible to lower a driving voltage of an organic light emitting device according to an exemplary embodiment of the present specification, which is made by combining, as a material for an electron transporting layer disposed between the negative electrode and the light emitting layer, a compound which uses Chemical Formula 1 as a material for an electron blocking layer and has a form in which Chemical Formula 2A is linked as a substituent while having the core of Chemical Formula 2 having excellent capability in terms of electron injection, to improve the light emitting efficiency thereof, and particularly, to improve the service life characteristics by 50% or more.

Comparative Example 2-1-1

An organic light emitting device was manufactured in the same manner as in Experimental Example 1, except that Compound 1-1 was used instead of HT-1 in Experimental Example 1.

Comparative Example 2-1-2

An organic light emitting device was manufactured in the same manner as in Experimental Example 1, except that Compound 1-2 was used instead of HT-1 in Experimental Example 1.

Comparative Example 2-1-3

An organic light emitting device was manufactured in the same manner as in Experimental Example 1, except that Compound 1-3 was used instead of Compound HT-1 in Experimental Example 1.

Comparative Example 2-1-4

An organic light emitting device was manufactured in the same manner as in Experimental Example 1, except that Compound 1-4 was used instead of Compound HT-1 in Experimental Example 1.

Comparative Example 2-1-5

An organic light emitting device was manufactured in the same manner as in Experimental Example 1, except that Compound 1-5 was used instead of Compound HT-1 in Experimental Example 1.

Comparative Example 2-1-6

An organic light emitting device was manufactured in the same manner as in Experimental Example 1, except that Compound 1-6 was used instead of Compound HT-1 in Experimental Example 1.

Comparative Example 2-1-7

An organic light emitting device was manufactured in the same manner as in Experimental Example 1, except that Compound 1-14 was used instead of Compound HT-1 in Experimental Example 1.

Comparative Example 2-1-8

An organic light emitting device was manufactured in the same manner as in Experimental Example 1, except that Compound 1-17 was used instead of HT-1 in Experimental Example 1.

Comparative Example 2-1-9

An organic light emitting device was manufactured in the same manner as in Experimental Example 1, except that Compound 1-20 was used instead of Compound HT-1 in Experimental Example 1.

Comparative Example 2-1-10

An organic light emitting device was manufactured in the same manner as in Experimental Example 1, except that Compound 1-29 was used instead of Compound HT-1 in Experimental Example 1.

Comparative Example 2-1-11

An organic light emitting device was manufactured in the same manner as in Experimental Example 1, except that Compound 1-34 was used instead of Compound HT-1 in Experimental Example 1.

Comparative Example 2-1-12

An organic light emitting device was manufactured in the same manner as in Experimental Example 1, except that Compound 1-37 was used instead of Compound HT-1 in Experimental Example 1.

Comparative Example 2-1-13

An organic light emitting device was manufactured in the same manner as in Experimental Example 1, except that Compound 1-38 was used instead of Compound HT-1 in Experimental Example 1.

Comparative Example 2-1-14

An organic light emitting device was manufactured in the same manner as in Experimental Example 1, except that Compound 1-43 was used instead of Compound HT-1 in Experimental Example 1.

Comparative Example 2-1-15

An organic light emitting device was manufactured in the same manner as in Experimental Example 1, except that Compound 1-46 was used instead of Compound HT-1 in Experimental Example 1.

Comparative Example 2-1-16

An organic light emitting device was manufactured in the same manner as in Experimental Example 1, except that Compound 1-51 was used instead of Compound HT-1 in Experimental Example 1.

Comparative Example 2-1-17

An organic light emitting device was manufactured in the same manner as in Experimental Example 1, except that Compound 1-54 was used instead of Compound HT-1 in Experimental Example 1.

Comparative Example 2-1-18

An organic light emitting device was manufactured in the same manner as in Experimental Example 1, except that Compound 1-64 was used instead of Compound HT-1 in Experimental Example 1.

Comparative Example 2-1-19

An organic light emitting device was manufactured in the same manner as in Experimental Example 1, except that Compound 1-70 was used instead of Compound HT-1 in Experimental Example 1.

Comparative Example 2-1-20

An organic light emitting device was manufactured in the same manner as in Experimental Example 1, except that Compound 1-72 was used instead of Compound HT-1 in Experimental Example 1.

Comparative Example 2-1-21

An organic light emitting device was manufactured in the same manner as in Experimental Example 1, except that Compound 1-75 was used instead of Compound HT-1 in Experimental Example 1.

Comparative Example 2-1-22

An organic light emitting device was manufactured in the same manner as in Experimental Example 1, except that Compound 1-76 was used instead of Compound HT-1 in Experimental Example 1.

Comparative Example 2-1-23

An organic light emitting device was manufactured in the same manner as in Experimental Example 1, except that Compound 1-80 was used instead of Compound HT-1 in Experimental Example 1.

Comparative Example 2-1-24

An organic light emitting device was manufactured in the same manner as in Experimental Example 1, except that Compound 1-81 was used instead of Compound HT-1 in Experimental Example 1.

Comparative Example 2-2-1

An organic light emitting device was manufactured in the same manner as in Experimental Example 1, except that Compound 2-2 was used instead of Compound ET-1 in Experimental Example 1.

Comparative Example 2-2-2

An organic light emitting device was manufactured in the same manner as in Experimental Example 1, except that Compound 2-3 was used instead of Compound ET-1 in Experimental Example 1.

Comparative Example 2-2-3

An organic light emitting device was manufactured in the same manner as in Experimental Example 1, except that Compound 2-5 was used instead of Compound ET-1 in Experimental Example 1.

Comparative Example 2-2-4

An organic light emitting device was manufactured in the same manner as in Experimental Example 1, except that Compound 2-8 was used instead of Compound ET-1 in Experimental Example 1.

Comparative Example 2-2-5

An organic light emitting device was manufactured in the same manner as in Experimental Example 1, except that Compound 2-11 was used instead of Compound ET-1 in Experimental Example 1.

Comparative Example 2-2-6

An organic light emitting device was manufactured in the same manner as in Experimental Example 1, except that Compound 2-12 was used instead of Compound ET-1 in Experimental Example 1.

Comparative Example 2-2-7

An organic light emitting device was manufactured in the same manner as in Experimental Example 1, except that Compound 2-13 was used instead of Compound ET-1 in Experimental Example 1.

Comparative Example 2-2-8

An organic light emitting device was manufactured in the same manner as in Experimental Example 1, except that Compound 2-14 was used instead of Compound ET-1 in Experimental Example 1.

Comparative Example 2-2-9

An organic light emitting device was manufactured in the same manner as in Experimental Example 1, except that Compound 2-18 was used instead of Compound ET-1 in Experimental Example 1.

Comparative Example 2-2-10

An organic light emitting device was manufactured in the same manner as in Experimental Example 1, except that Compound 2-21 was used instead of Compound ET-1 in Experimental Example 1.

Comparative Example 2-2-11

An organic light emitting device was manufactured in the same manner as in Experimental Example 1, except that Compound 2-24 was used instead of Compound ET-1 in Experimental Example 1.

Comparative Example 2-2-12

An organic light emitting device was manufactured in the same manner as in Experimental Example 1, except that Compound 2-26 was used instead of Compound ET-1 in Experimental Example 1.

Comparative Example 2-2-13

An organic light emitting device was manufactured in the same manner as in Experimental Example 1, except that Compound 2-28 was used instead of Compound ET-1 in Experimental Example 1.

Comparative Example 2-2-14

An organic light emitting device was manufactured in the same manner as in Experimental Example 1, except that Compound 2-29 was used instead of Compound ET-1 in Experimental Example 1.

Comparative Example 2-2-15

An organic light emitting device was manufactured in the same manner as in Experimental Example 1, except that Compound 2-31 was used instead of Compound ET-1 in Experimental Example 1.

Comparative Example 2-2-16

An organic light emitting device was manufactured in the same manner as in Experimental Example 1, except that Compound 2-32 was used instead of Compound ET-1 in Experimental Example 1.

Comparative Example 2-2-17

An organic light emitting device was manufactured in the same manner as in Experimental Example 1, except that Compound 2-33 was used instead of Compound ET-1 in Experimental Example 1.

Comparative Example 2-2-18

An organic light emitting device was manufactured in the same manner as in Experimental Example 1, except that Compound 2-34 was used instead of Compound ET-1 in Experimental Example 1.

Comparative Example 2-2-19

An organic light emitting device was manufactured in the same manner as in Experimental Example 1, except that Compound 2-35 was used instead of Compound ET-1 in Experimental Example 1.

Comparative Example 2-2-20

An organic light emitting device was manufactured in the same manner as in Experimental Example 1, except that Compound 2-36 was used instead of Compound ET-1 in Experimental Example 1.

Comparative Example 2-2-21

An organic light emitting device was manufactured in the same manner as in Experimental Example 1, except that Compound 2-51 was used instead of Compound ET-1 in Experimental Example 1.

Comparative Example 2-2-22

An organic light emitting device was manufactured in the same manner as in Experimental Example 1-1, except that Compound 2-52 was used instead of Compound ET-1 in Experimental Example 1-1.

Comparative Example 2-2-23

An organic light emitting device was manufactured in the same manner as in Experimental Example 1, except that Compound 2-53 was used instead of Compound ET-1 in Experimental Example 1.

Comparative Example 2-2-24

An organic light emitting device was manufactured in the same manner as in Experimental Example 1, except that Compound 2-55 was used instead of Compound ET-1 in Experimental Example 1.

Experimental Example 2-1

An organic light emitting device was manufactured in the same manner as in Experimental Example 1, except that Compound 1-1 was used instead of Compound HT-1 and Compound 2-8 was used instead of Compound ET-1 in Experimental Example 1.

Experimental Example 2-2

An organic light emitting device was manufactured in the same manner as in Experimental Example 1, except that Compound 1-1 was used instead of Compound HT-1 and Compound 2-13 was used instead of Compound ET-1 in Experimental Example 1.

Experimental Example 2-3

An organic light emitting device was manufactured in the same manner as in Experimental Example 1, except that Compound 1-1 was used instead of Compound HT-1 and Compound 2-33 was used instead of Compound ET-1 in Experimental Example 1.

Experimental Example 2-4

An organic light emitting device was manufactured in the same manner as in Experimental Example 1, except that Compound 1-1 was used instead of Compound HT-1 and Compound 2-35 was used instead of Compound ET-1 in Experimental Example 1.

Experimental Example 2-5

An organic light emitting device was manufactured in the same manner as in Experimental Example 1, except that Compound 1-1 was used instead of Compound HT-1 and Compound 2-53 was used instead of Compound ET-1 in Experimental Example 1.

Experimental Example 2-6

An organic light emitting device was manufactured in the same manner as in Experimental Example 1, except that Compound 1-6 was used instead of Compound HT-1 and Compound 2-8 was used instead of Compound ET-1 in Experimental Example 1.

Experimental Example 2-7

An organic light emitting device was manufactured in the same manner as in Experimental Example 1, except that Compound 1-6 was used instead of Compound HT-1 and Compound 2-13 was used instead of Compound ET-1 in Experimental Example 1.

Experimental Example 2-8

An organic light emitting device was manufactured in the same manner as in Experimental Example 1, except that Compound 1-6 was used instead of Compound HT-1 and Compound 2-33 was used instead of Compound ET-1 in Experimental Example 1.

Experimental Example 2-9

An organic light emitting device was manufactured in the same manner as in Experimental Example 1, except that Compound 1-6 was used instead of Compound HT-1 and Compound 2-35 was used instead of Compound ET-1 in Experimental Example 1.

Experimental Example 2-10

An organic light emitting device was manufactured in the same manner as in Experimental Example 1, except that Compound 1-6 was used instead of Compound HT-1 and Compound 2-53 was used instead of Compound ET-1 in Experimental Example 1.

Experimental Example 2-11

An organic light emitting device was manufactured in the same manner as in Experimental Example 1, except that Compound 1-29 was used instead of Compound HT-1 and Compound 2-8 was used instead of Compound ET-1 in Experimental Example 1.

Experimental Example 2-12

An organic light emitting device was manufactured in the same manner as in Experimental Example 1, except that Compound 1-29 was used instead of Compound HT-1 and Compound 2-13 was used instead of Compound ET-1 in Experimental Example 1.

Experimental Example 2-13

An organic light emitting device was manufactured in the same manner as in Experimental Example 1, except that Compound 1-29 was used instead of Compound HT-1 and Compound 2-33 was used instead of Compound ET-1 in Experimental Example 1.

Experimental Example 2-14

An organic light emitting device was manufactured in the same manner as in Experimental Example 1, except that Compound 1-29 was used instead of Compound HT-1 and Compound 2-35 was used instead of Compound ET-1 in Experimental Example 1.

Experimental Example 2-15

An organic light emitting device was manufactured in the same manner as in Experimental Example 1, except that Compound 1-29 was used instead of Compound HT-1 and Compound 2-53 was used instead of Compound ET-1 in Experimental Example 1.

Experimental Example 2-16

An organic light emitting device was manufactured in the same manner as in Experimental Example 1, except that Compound 1-75 was used instead of Compound HT-1 and Compound 2-8 was used instead of Compound ET-1 in Experimental Example 1.

Experimental Example 2-17

An organic light emitting device was manufactured in the same manner as in Experimental Example 1, except that Compound 1-75 was used instead of Compound HT-1 and Compound 2-13 was used instead of Compound ET-1 in Experimental Example 1.

Experimental Example 2-18

An organic light emitting device was manufactured in the same manner as in Experimental Example 1, except that Compound 1-75 was used instead of Compound HT-1 and Compound 2-33 was used instead of Compound ET-1 in Experimental Example 1.

Experimental Example 2-19

An organic light emitting device was manufactured in the same manner as in Experimental Example 1, except that Compound 1-75 was used instead of Compound HT-1 and Compound 2-35 was used instead of Compound ET-1 in Experimental Example 1.

Experimental Example 2-20

An organic light emitting device was manufactured in the same manner as in Experimental Example 1, except that Compound 1-75 was used instead of Compound HT-1 and Compound 2-53 was used instead of Compound ET-1 in Experimental Example 1.

Experimental Example 2-21

An organic light emitting device was manufactured in the same manner as in Experimental Example 1, except that Compound 1-78 was used instead of Compound HT-1 and Compound 2-8 was used instead of Compound ET-1 in Experimental Example 1.

Experimental Example 2-22

An organic light emitting device was manufactured in the same manner as in Experimental Example 1, except that Compound 1-78 was used instead of Compound HT-1 and Compound 2-13 was used instead of Compound ET-1 in Experimental Example 1.

Experimental Example 2-23

An organic light emitting device was manufactured in the same manner as in Experimental Example 1, except that Compound 1-78 was used instead of Compound HT-1 and Compound 2-33 was used instead of Compound ET-1 in Experimental Example 1.

Experimental Example 2-24

An organic light emitting device was manufactured in the same manner as in Experimental Example 1, except that Compound 1-78 was used instead of Compound HT-1 and Compound 2-35 was used instead of Compound ET-1 in Experimental Example 1.

Experimental Example 2-25

An organic light emitting device was manufactured in the same manner as in Experimental Example 1, except that Compound 1-78 was used instead of Compound HT-1 and Compound 2-53 was used instead of Compound ET-1 in Experimental Example 1.

When current was applied to the organic light emitting devices manufactured in Comparative Examples 2-1-1 to 2-1-24, Comparative Examples 2-2-1 to 2-2-24, and Examples 2-1 to 2-25, the results are shown in Table 2.

TABLE 2

| | ETL | HTL | Voltage (V) | Luminance (cd/m$^2$) | T95 (hr) |
|---|---|---|---|---|---|
| Comparative example 2-1-1 | ET-1 | 1-1 | 3.72 | 4.89 | 235 |
| Comparative example 2-1-2 | ET-1 | 1-2 | 3.73 | 4.83 | 235 |
| Comparative example 2-1-3 | ET-1 | 1-3 | 3.75 | 4.88 | 240 |
| Comparative example 2-1-4 | ET-1 | 1-4 | 3.76 | 4.82 | 235 |
| Comparative example 2-1-5 | ET-1 | 1-5 | 3.87 | 4.78 | 235 |
| Comparative example 2-1-6 | ET-1 | 1-6 | 3.79 | 4.88 | 220 |
| Comparative example 2-1-7 | ET-1 | 1-14 | 3.85 | 4.73 | 245 |
| Comparative example 2-1-8 | ET-1 | 1-17 | 3.77 | 4.82 | 245 |
| Comparative example 2-1-9 | ET-1 | 1-20 | 3.86 | 4.84 | 235 |
| Comparative example 2-1-10 | ET-1 | 1-29 | 3.74 | 4.85 | 240 |
| Comparative example 2-1-11 | ET-1 | 1-34 | 3.72 | 4.86 | 235 |
| Comparative example 2-1-12 | ET-1 | 1-37 | 3.71 | 4.79 | 225 |
| Comparative example 2-1-13 | ET-1 | 1-38 | 3.88 | 4.87 | 220 |
| Comparative example 2-1-14 | ET-1 | 1-43 | 3.73 | 4.81 | 245 |
| Comparative example 2-1-15 | ET-1 | 1-46 | 3.80 | 4.84 | 240 |
| Comparative example 2-1-16 | ET-1 | 1-51 | 3.78 | 4.85 | 225 |
| Comparative example 2-1-17 | ET-1 | 1-54 | 3.74 | 4.82 | 240 |
| Comparative example 2-1-18 | ET-1 | 1-64 | 3.79 | 4.81 | 235 |
| Comparative example 2-1-19 | ET-1 | 1-70 | 3.75 | 4.83 | 235 |
| Comparative example 2-1-20 | ET-1 | 1-72 | 3.86 | 4.70 | 220 |
| Comparative example 2-1-21 | ET-1 | 1-75 | 3.74 | 4.88 | 245 |
| Comparative example 2-1-22 | ET-1 | 1-76 | 3.79 | 4.88 | 235 |
| Comparative example 2-1-23 | ET-1 | 1-80 | 3.88 | 4.83 | 220 |
| Comparative example 2-1-24 | ET-1 | 1-81 | 3.75 | 4.82 | 245 |
| Comparative example 2-2-1 | 2-2 | HT-1 | 3.74 | 4.74 | 225 |
| Comparative example 2-2-2 | 2-3 | HT-1 | 3.76 | 4.85 | 240 |
| Comparative example 2-2-3 | 2-5 | HT-1 | 3.71 | 4.86 | 235 |
| Comparative example 2-2-4 | 2-8 | HT-1 | 3.79 | 4.89 | 225 |
| Comparative example 2-2-5 | 2-11 | HT-1 | 3.77 | 4.88 | 240 |
| Comparative example 2-2-6 | 2-12 | HT-1 | 3.74 | 4.88 | 235 |
| Comparative example 2-2-7 | 2-13 | HT-1 | 3.86 | 4.73 | 225 |
| Comparative example 2-2-8 | 2-14 | HT-1 | 3.75 | 4.82 | 220 |
| Comparative example 2-2-9 | 2-18 | HT-1 | 3.71 | 4.84 | 245 |
| Comparative example 2-2-10 | 2-21 | HT-1 | 3.88 | 4.85 | 235 |
| Comparative example 2-2-11 | 2-24 | HT-1 | 3.72 | 4.88 | 220 |
| Comparative example 2-2-12 | 2-26 | HT-1 | 3.73 | 4.78 | 245 |
| Comparative example 2-2-13 | 2-28 | HT-1 | 3.74 | 4.83 | 225 |
| Comparative example 2-2-14 | 2-29 | HT-1 | 3.86 | 4.82 | 240 |

TABLE 2-continued

| | ETL | HTL | Voltage (V) | Luminance (cd/m$^2$) | T95 (hr) |
|---|---|---|---|---|---|
| Comparative example 2-2-15 | 2-31 | HT-1 | 3.78 | 4.88 | 235 |
| Comparative example 2-2-16 | 2-32 | HT-1 | 3.79 | 4.88 | 225 |
| Comparative example 2-2-17 | 2-33 | HT-1 | 3.74 | 4.73 | 220 |
| Comparative example 2-2-18 | 2-34 | HT-1 | 3.75 | 4.82 | 245 |
| Comparative example 2-2-19 | 2-35 | HT-1 | 3.76 | 4.84 | 225 |
| Comparative example 2-2-20 | 2-36 | HT-1 | 3.78 | 4.85 | 220 |
| Comparative example 2-2-21 | 2-51 | HT-1 | 3.89 | 4.86 | 245 |
| Comparative example 2-2-22 | 2-52 | HT-1 | 3.71 | 4.89 | 225 |
| Comparative example 2-2-23 | 2-53 | HT-1 | 3.77 | 4.87 | 240 |
| Comparative example 2-2-24 | 2-55 | HT-1 | 3.76 | 4.80 | 235 |
| Experimental example 2-1 | 2-8 | 1-1 | 3.44 | 4.84 | 290 |
| Experimental example 2-2 | 2-13 | 1-1 | 3.46 | 5.20 | 295 |
| Experimental example 2-3 | 2-33 | 1-1 | 3.47 | 5.24 | 285 |
| Experimental example 2-4 | 2-35 | 1-1 | 3.42 | 5.25 | 295 |
| Experimental example 2-5 | 2-53 | 1-1 | 3.48 | 5.26 | 290 |
| Experimental example 2-6 | 2-13 | 1-6 | 3.34 | 5.28 | 310 |
| Experimental example 2-7 | 2-33 | 1-6 | 3.36 | 5.28 | 325 |
| Experimental example 2-8 | 2-35 | 1-6 | 3.37 | 5.29 | 320 |
| Experimental example 2-9 | 2-53 | 1-6 | 3.32 | 5.22 | 315 |
| Experimental example 2-10 | 2-13 | 1-6 | 3.38 | 5.23 | 305 |
| Experimental example 2-11 | 2-13 | 1-29 | 3.50 | 5.27 | 320 |
| Experimental example 2-12 | 2-33 | 1-29 | 3.51 | 5.22 | 330 |
| Experimental example 2-13 | 2-35 | 1-29 | 3.53 | 5.20 | 325 |
| Experimental example 2-14 | 2-53 | 1-29 | 3.49 | 5.29 | 325 |
| Experimental example 2-15 | 2-13 | 1-29 | 3.48 | 5.29 | 320 |
| Experimental example 2-16 | 2-13 | 1-75 | 3.46 | 5.22 | 305 |
| Experimental example 2-17 | 2-33 | 1-75 | 3.44 | 5.23 | 290 |
| Experimental example 2-18 | 2-35 | 1-75 | 3.42 | 5.27 | 285 |
| Experimental example 2-19 | 2-53 | 1-75 | 3.40 | 5.29 | 290 |
| Experimental example 2-20 | 2-13 | 1-75 | 3.41 | 5.22 | 280 |
| Experimental example 2-21 | 2-13 | 1-78 | 3.41 | 5.23 | 295 |
| Experimental example 2-22 | 2-33 | 1-78 | 3.49 | 5.27 | 280 |
| Experimental example 2-23 | 2-35 | 1-78 | 3.47 | 5.29 | 280 |
| Experimental example 2-24 | 2-53 | 1-78 | 3.45 | 5.22 | 285 |
| Experimental example 2-25 | 2-13 | 1-78 | 3.41 | 5.23 | 280 |

In Experimental Example 1, the organic light emitting device has a structure in which materials widely used are used as the Reference, HT-1 is used as a hole transporting layer, and ET-1 is used as an electron transporting layer.

Comparative Examples 2-1-1 to 2-1-24 used the compound of Chemical Formula 1 instead of HT-1 and Comparative Examples 2-2-1 to 2-2-24 used the compound of Chemical Formula 2 instead of ET-1, and as a result, basic characteristics of a device are exhibited when Chemical Formula 1 and Chemical Formula 2 are each used as a material for an organic light emitting device.

Examples 2-1 to 2-25 used the compounds of Chemical Formula 1 instead of HT-1 of Experimental Example 1 and used the compounds of Chemical Formula 2 instead of ET-1 of Experimental Example 1, and thus exhibit characteristics of a device when the compounds of Chemical Formulae 1 and 2 are simultaneously applied to one organic light emitting device.

In Examples 2-6 to 2-10, when Compound 1-6 was used instead of HT-1 of Experimental Example 1 and the compound of Chemical Formula 2 was used instead of ET-1 of Experimental Example 1, the voltage was reduced by 10% or more.

As in the results in Experimental Example 1, it could be seen that Compound 1-6 is excellent in terms of not only the electron blocking function, but also the hole transporting function when combined with the compound of Chemical Formula 2 as an electron transporting material.

Further, Examples 2-1 to 2-25 exhibited characteristics in which the light emitting efficiency and the service life were improved by 10% and about 25% to 30%, respectively, as compared to those of Comparative Examples 2-1-1 to 2-1-24 and Comparative Examples 2-2-1 to 2-2-24.

Through the results, it can be confirmed that it is possible to lower a driving voltage of an organic light emitting device according to an exemplary embodiment of the present specification, which is made by combining, as a material for an electron transporting layer disposed between the negative electrode and the light emitting layer, a compound which uses Chemical Formula 1 as a material for a hole transporting layer and has a form in which Chemical Formula 2A is linked as a substituent while having the core of Chemical Formula 2 having excellent capability in terms of electron injection, and to improve the light emitting efficiency and service life characteristics thereof.

EXPLANATION OF REFERENCE NUMERALS AND SYMBOLS

10, 11: Organic light emitting device
20: Substrate
30: First electrode
40: Light emitting layer
50: Second electrode
60: Hole injection layer
70: Hole transporting layer

The invention claimed is:

1. An organic light emitting device comprising:
   a positive electrode;
   a negative electrode disposed to face the positive electrode;
   a light emitting layer disposed between the positive electrode and the negative electrode;
   a first organic material layer disposed between the positive electrode and the light emitting layer; and
   a second organic material layer disposed between the negative electrode and the light emitting layer,
   wherein the first organic material layer comprises a compound represented by the following Chemical Formula 1, the second organic material layer comprises a compound represented by the following Chemical Formula 2, and the HOMO energy level of the compound represented by Chemical Formula 1 is less than 5.7 eV:

[Chemical Formula 1]

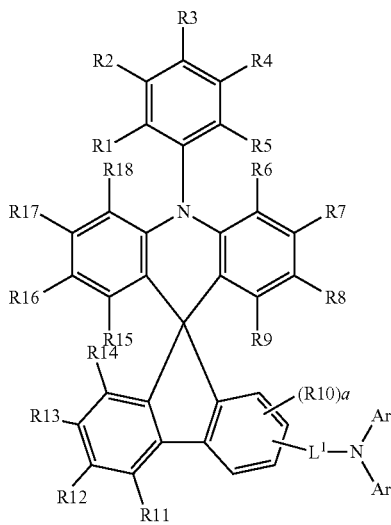

[Chemical Formula 2]

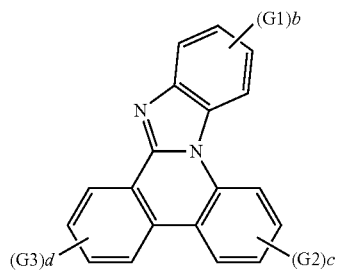

in Chemical Formulae 1 and 2,

L1 is a direct bond; or a substituted or unsubstituted arylene group,

Ar1 and Ar2 are the same as or different from each other, and are each independently a substituted or unsubstituted aryl group; or a substituted or unsubstituted heteroaryl group, R1 to R18 are the same as or different from each other, and are each independently hydrogen; deuterium; a nitrile group; a nitro group; a hydroxy group; a carbonyl group; an ester group; an imide group; an amide group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted amine group; a substituted or unsubstituted arylphosphine group; a substituted or unsubstituted phosphine oxide group; a substituted or unsubstituted aryl group; or a substituted or unsubstituted heteroaryl group, or R1 and R18 are optionally linked to each other to form a ring, a is an integer from 1 to 3, and when a is 2 or more, two or more R10's are the same as or different from each other, at least one of G1 to G3 is represented by the following Chemical Formula 2A and the others are the same as or different from each other, and are each independently hydrogen; deuterium; a nitrile group; a nitro group; a hydroxy group; a carbonyl group; an ester group; an imide group; an amide group; a substituted or unsubstituted alkyl group; a substituted or unsubstituted cycloalkyl group; a substituted or unsubstituted alkoxy group; a substituted or unsubstituted aryloxy group; a substituted or unsubstituted alkylthioxy group; a substituted or unsubstituted arylthioxy group; a substituted or unsubstituted alkylsulfoxy group; a substituted or unsubstituted arylsulfoxy group; a substituted or unsubstituted alkenyl group; a substituted or unsubstituted silyl group; a substituted or unsubstituted boron group; a substituted or unsubstituted amine group; a substituted or unsubstituted arylphosphine group; a substituted or unsubstituted phosphine oxide group; a substituted or unsubstituted aryl group; or a substituted or unsubstituted heteroaryl group, or adjacent groups are optionally linked to each other to form a substituted or unsubstituted ring, b to d are each an integer from 1 to 4, when b to d are each 2 or more, two or more structures in the parenthesis are the same as or different from each other,

[Chemical Formula 2A]

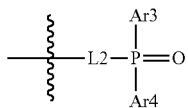

in Chemical Formula 2A,

L2 is a direct bond; or a substituted or unsubstituted arylene group; or a substituted or unsubstituted heteroarylene group, Ar3 and Ar4 are the same as or different from each other, and are each independently a substituted or unsubstituted aryl group; or a substituted or unsubstituted heteroaryl group, and

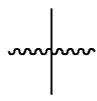

is a moiety linked to Chemical Formula 2.

2. The organic light emitting device of claim 1, wherein Chemical Formula 1 is represented by the following Chemical Formula 1-1:

[Chemical Formula 1-1]

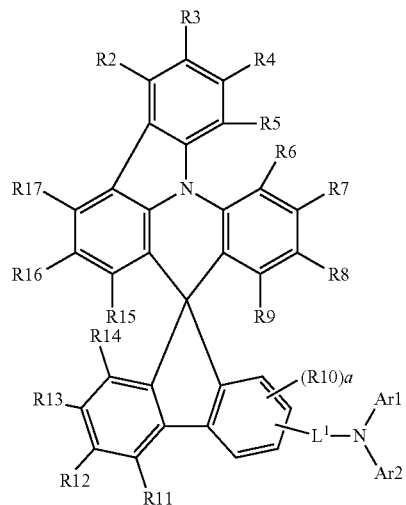

in Chemical Formula 1-1, the definitions of L1, Ar1, Ar2, R2 to R17 and a are the same as those in Chemical Formula 1.

3. The organic light emitting device of claim 1, wherein L1 is a direct bond; a substituted or unsubstituted phenylene group; or a substituted or unsubstituted biphenylylene group.

4. The organic light emitting device of claim 1, wherein Ar1 and Ar2 are the same as or different from each other, and are each independently a substituted or unsubstituted phenyl group; a substituted or unsubstituted biphenyl group; a substituted or unsubstituted naphthyl group; a substituted or unsubstituted fluorenyl group; a substituted or unsubstituted phenanthrenyl group; a substituted or unsubstituted terphenyl group; a substituted or unsubstituted dibenzothiophene group; a substituted or unsubstituted dibenzofuranyl group; or a substituted or unsubstituted carbazolyl group.

5. The organic light emitting device of claim 1, wherein Chemical Formula 2 is any one of the following Chemical Formulae 2-1 to 2-3:

[Chemical Formula 2-1]

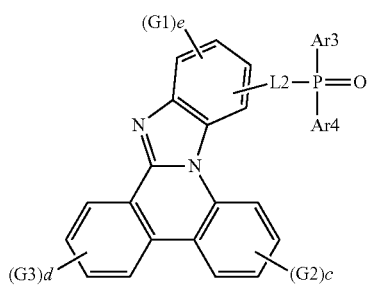

[Chemical Formula 2-2]

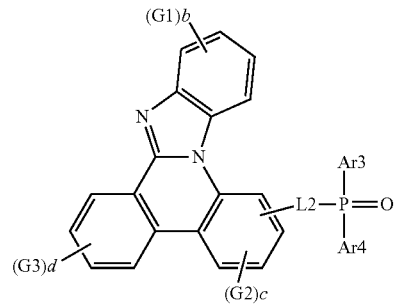

[Chemical Formula 2-3]

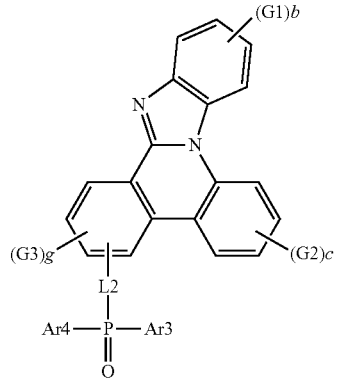

in Chemical Formulae 2-1 to 2-3, the definitions of G1 to G3, b, c and d are the same as those in Chemical Formula 2, the definitions of L2, Ar3 and Ar4 are the same as those in Chemical Formula 2A, e, f and g are each an integer from 1 to 3, and when e, f and g are each 2 or more, two or more structures in the parenthesis are the same as or different from each other.

6. The organic light emitting device of claim 1, wherein L2 is a direct bond; a substituted or unsubstituted phenylene group; a substituted or unsubstituted naphthylene group; a substituted or unsubstituted pyridylene group; or a substituted or unsubstituted pyrimidylene group.

7. The organic light emitting device of claim 1, wherein Ar3 and Ar4 are the same as or different from each other, and are each independently a substituted or unsubstituted phenyl group.

8. The organic light emitting device of claim 1, wherein Chemical Formula 1 is represented by any one of the following structural formulae:
1-1
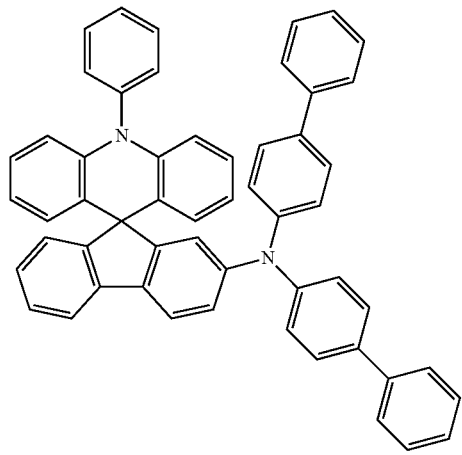
1-2
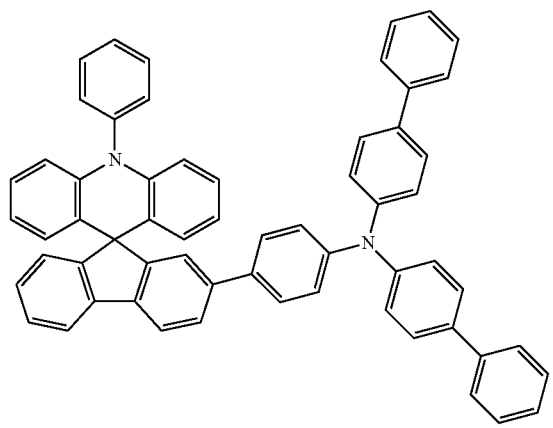
1-3
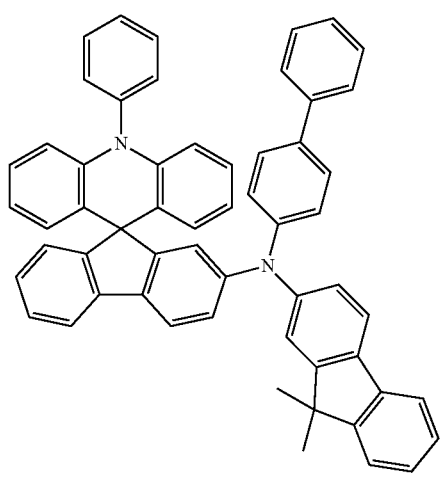
1-4
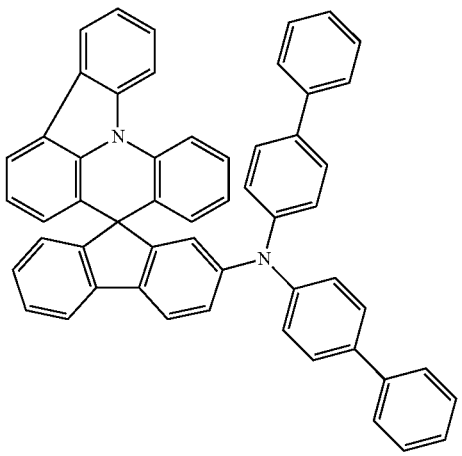
1-5
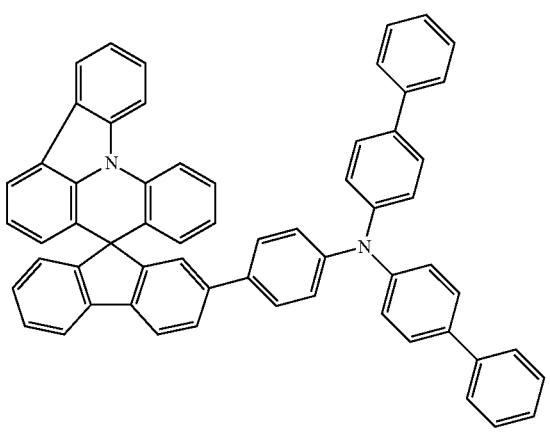
1-6
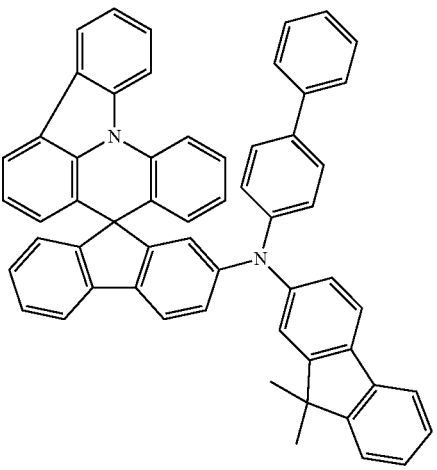

1-7
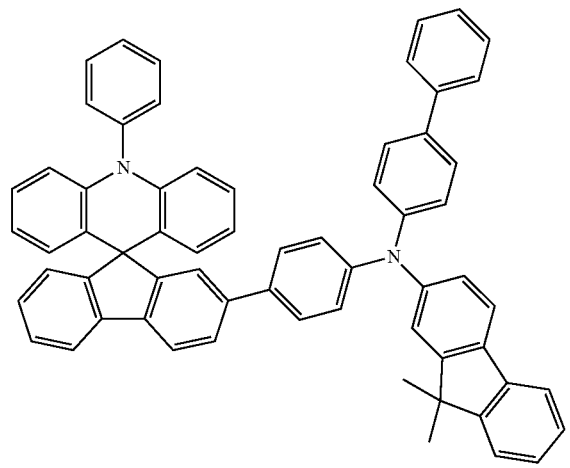
1-8
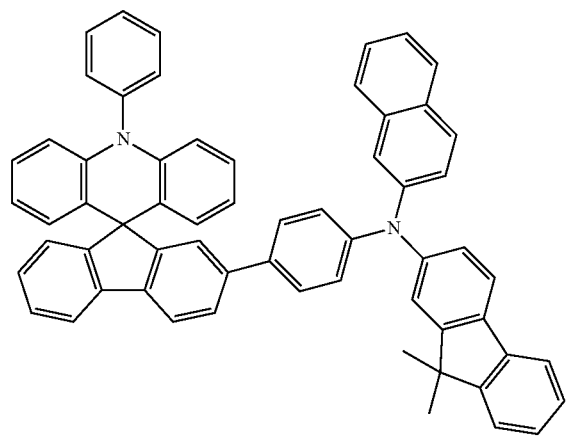
1-9
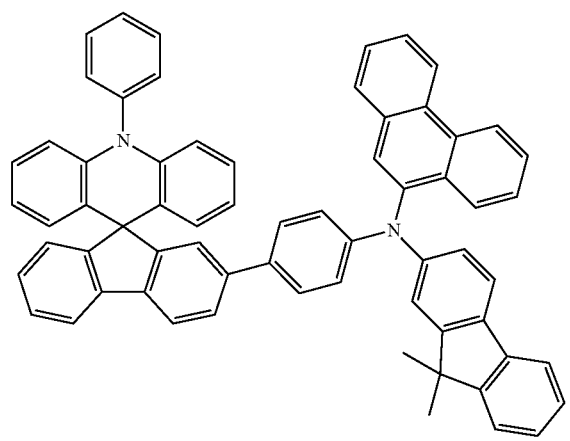
1-10
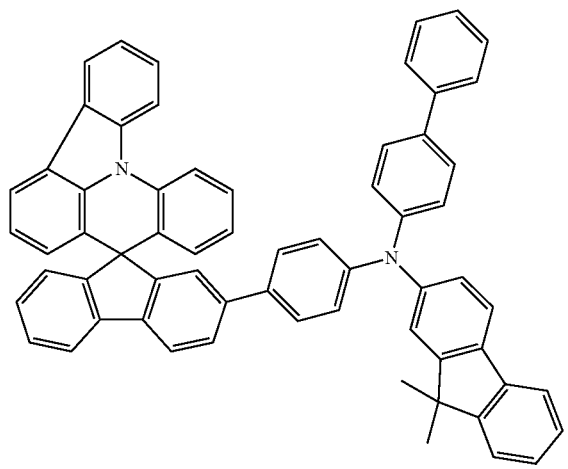
1-12
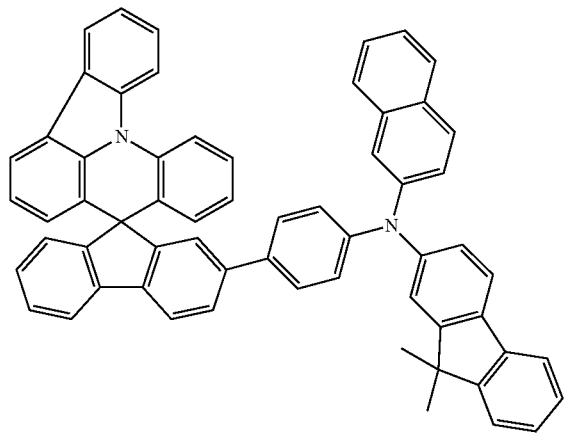
1-13
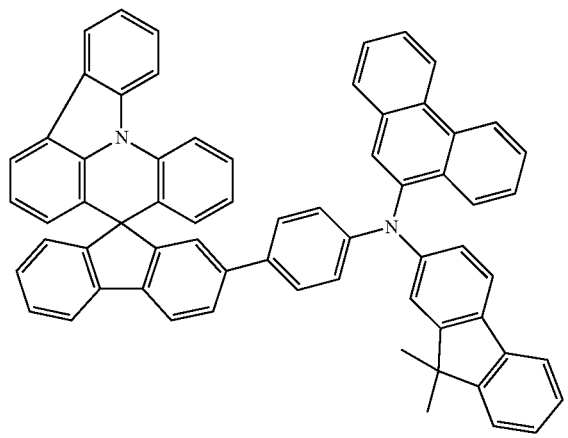

-continued
1-14
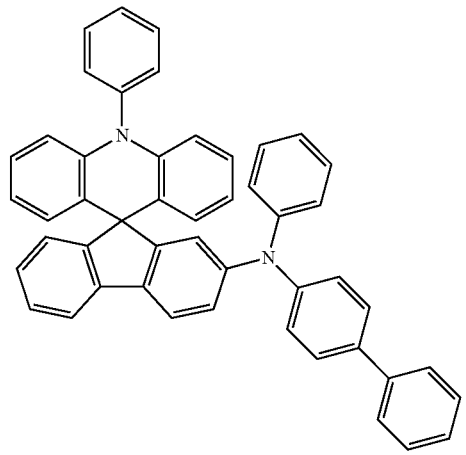
1-15
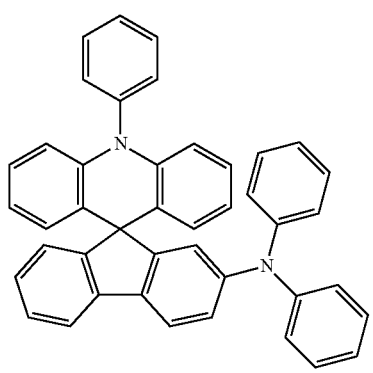
1-16
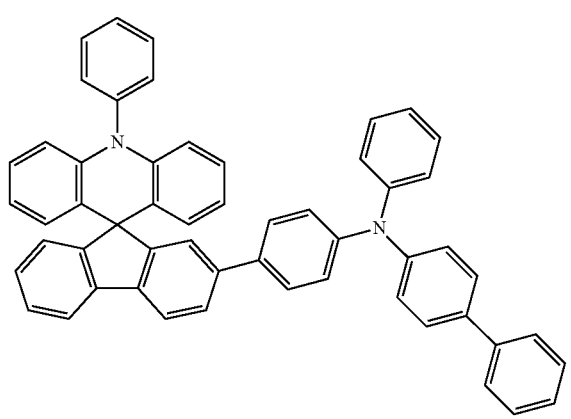
-continued
1-17
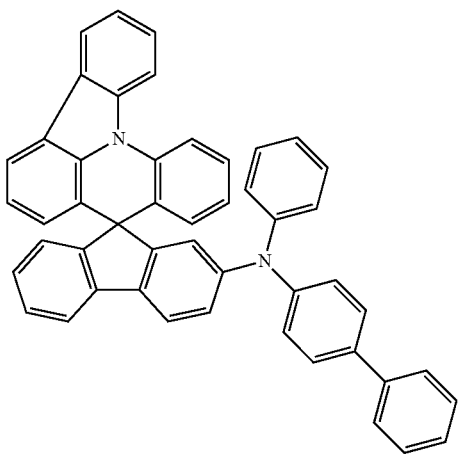
1-18
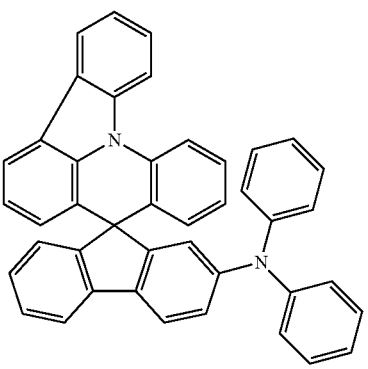
1-19
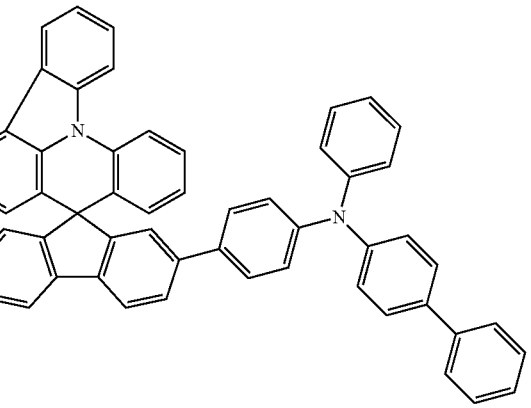
1-20
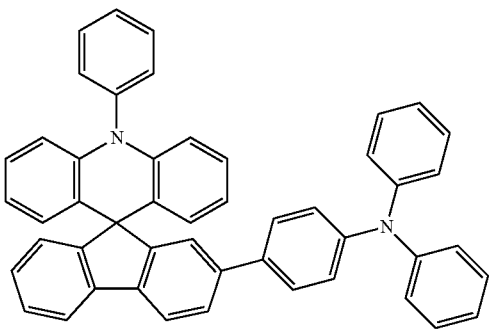

1-21
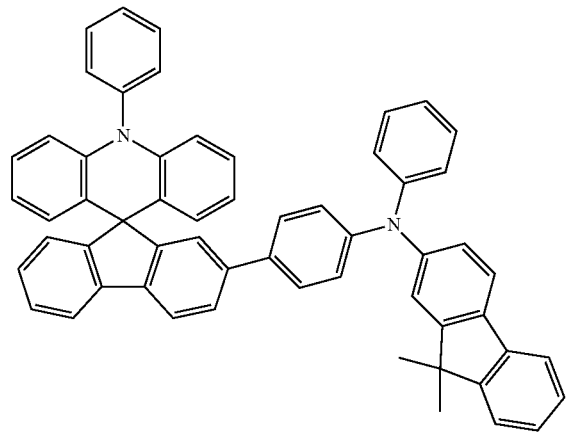
1-22
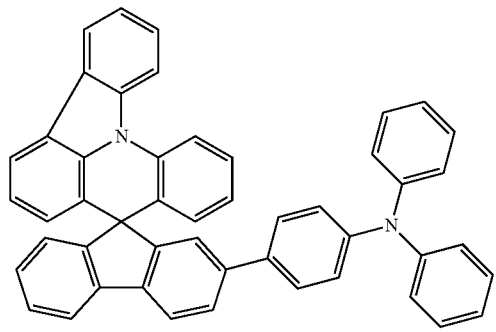
1-23
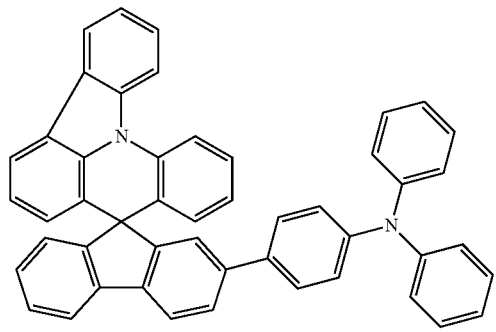
1-24
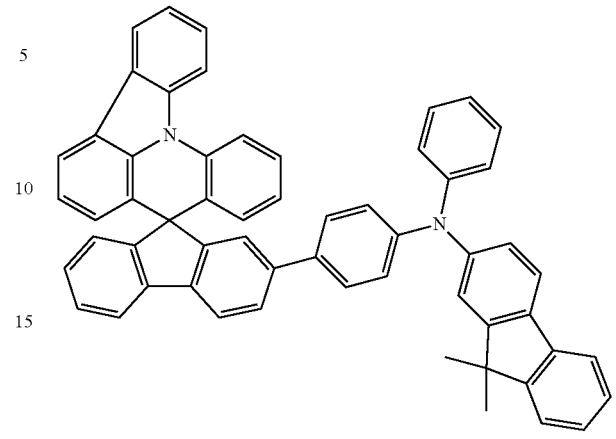
1-25
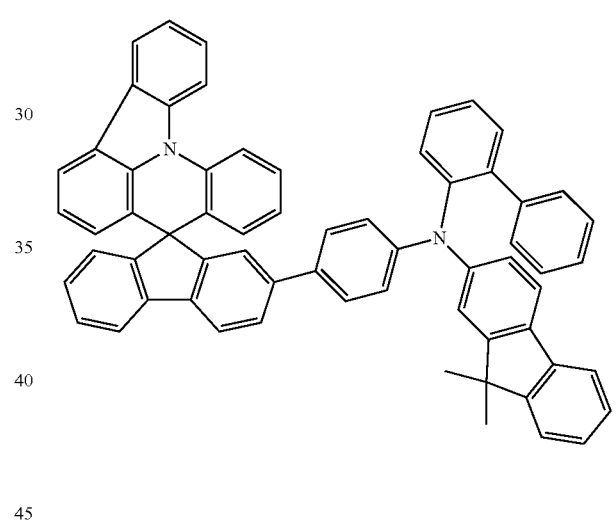
1-26
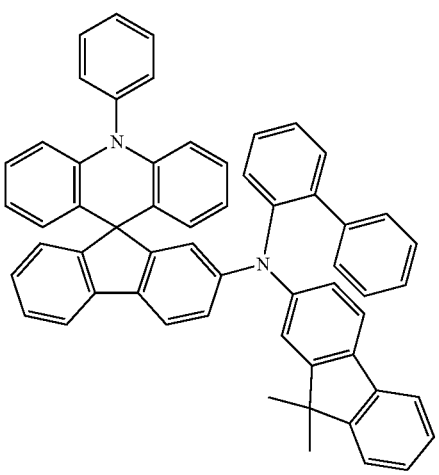

1-27
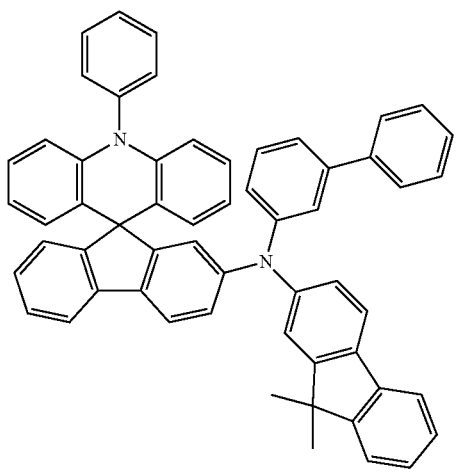
1-28
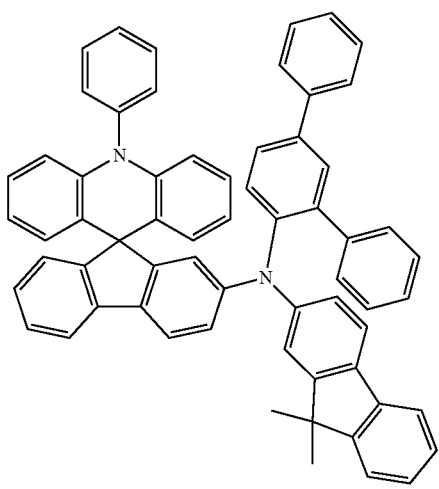
1-29
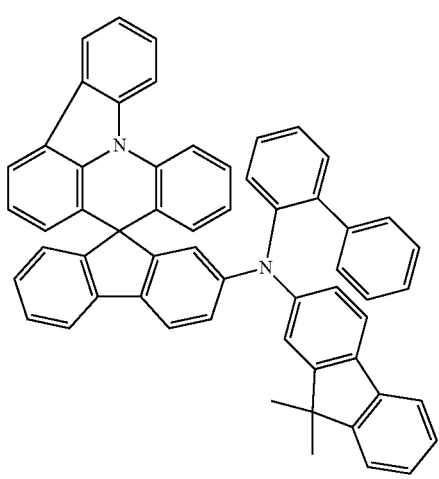
1-30
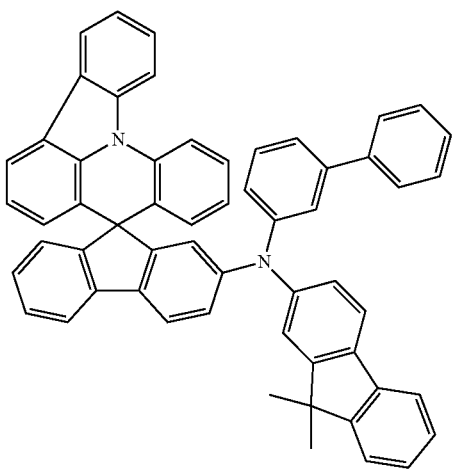
1-31
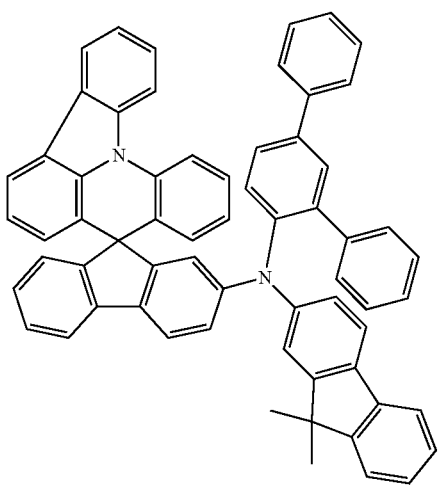
1-32
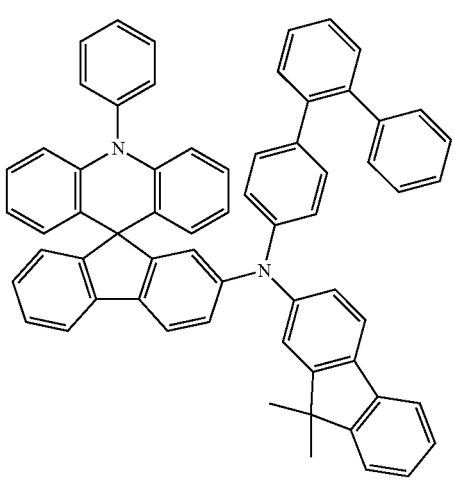

1-33
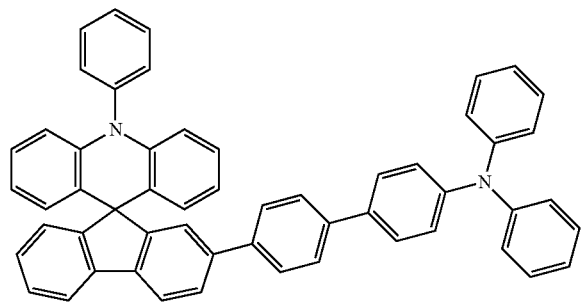
1-34
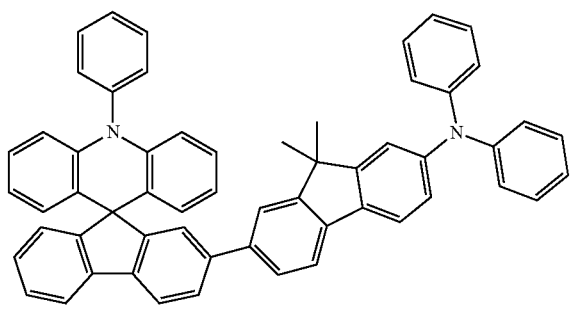
1-35
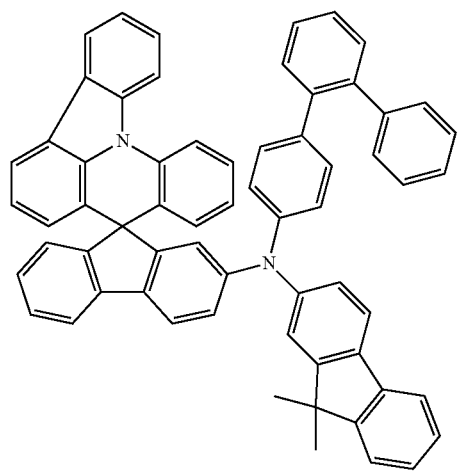
1-36
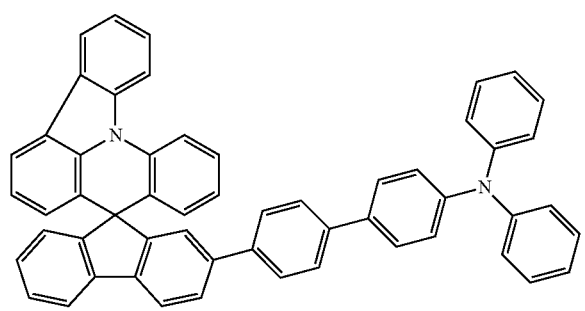
1-37
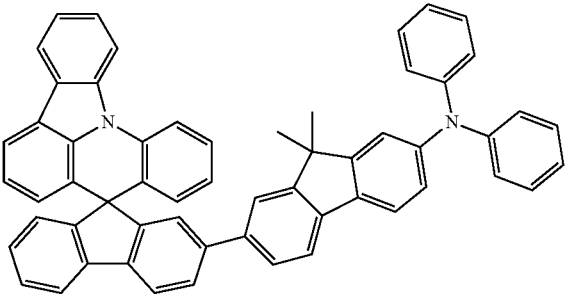
1-38
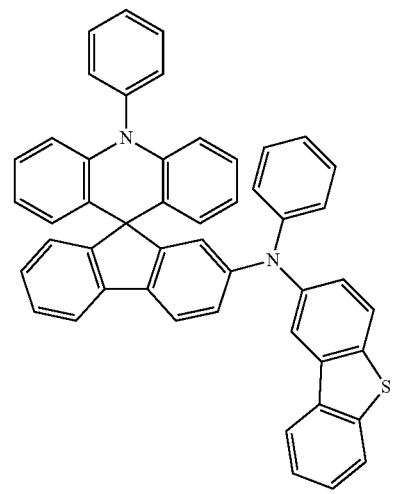
1-39
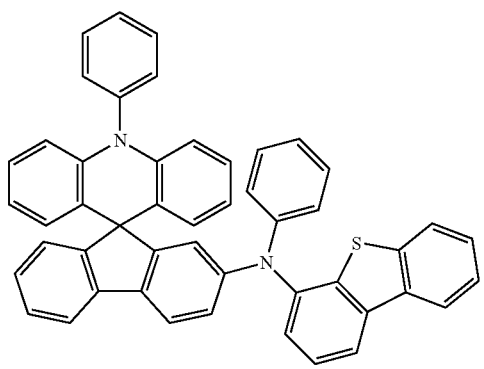

1-40
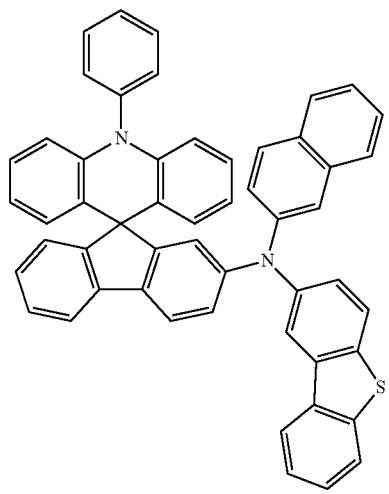
1-43
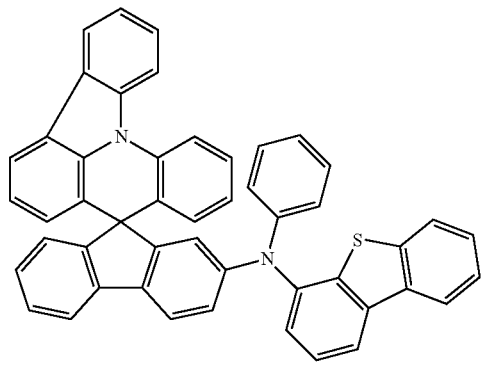
1-41
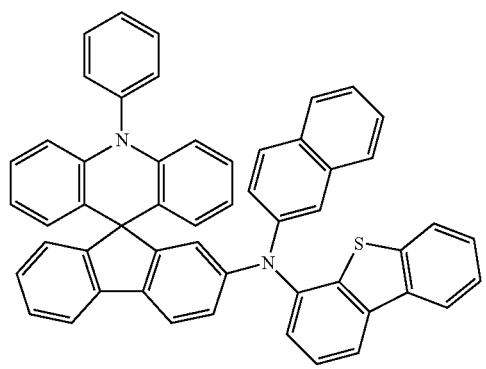
1-44
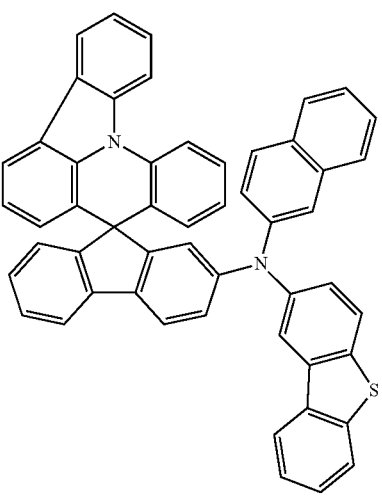
1-42
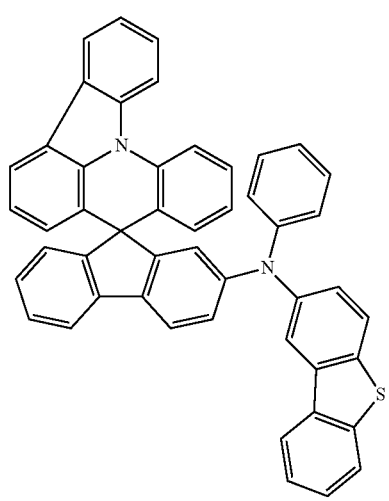
1-45
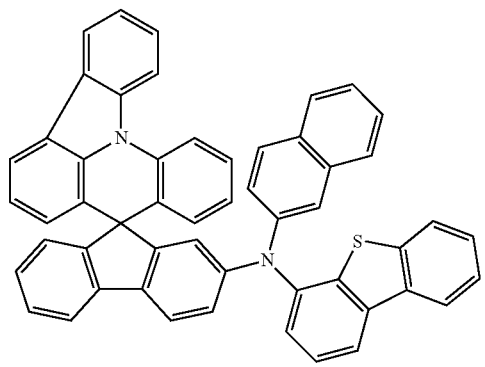

1-46
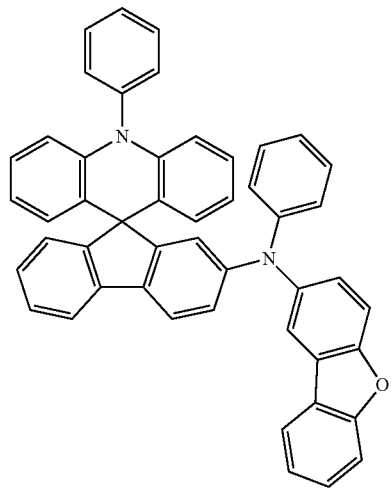
1-47
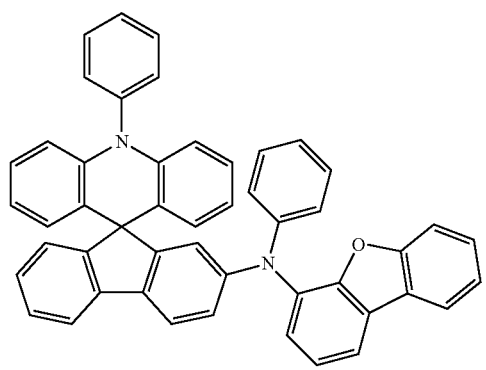
1-48
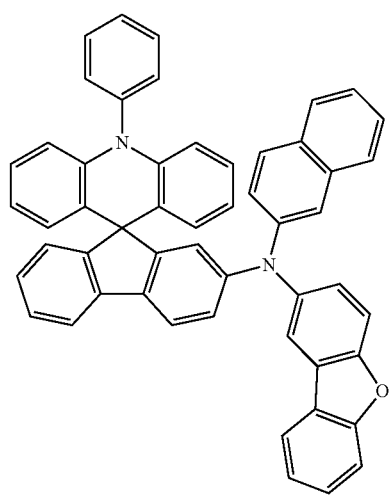
1-49
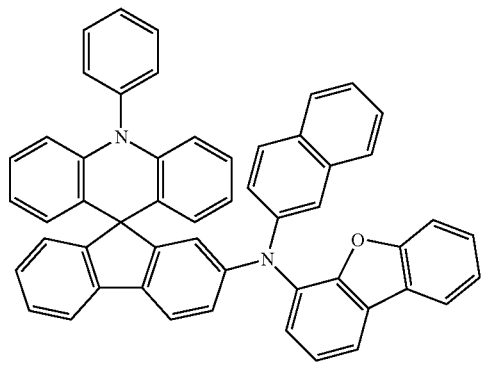
1-50
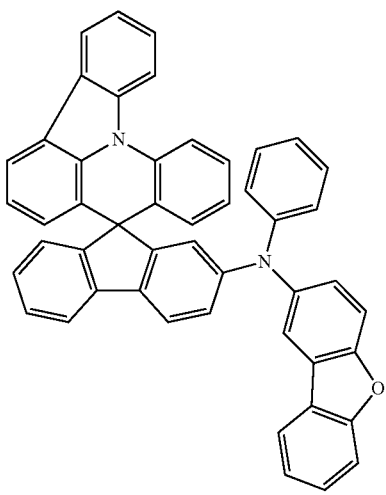
1-51
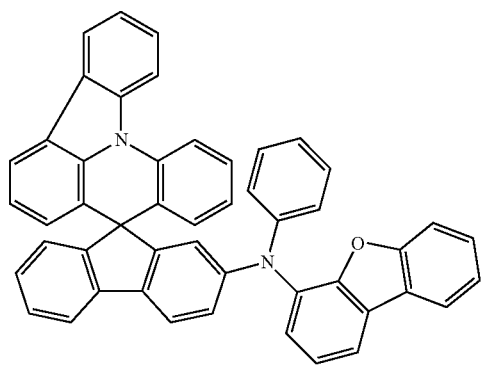

1-52
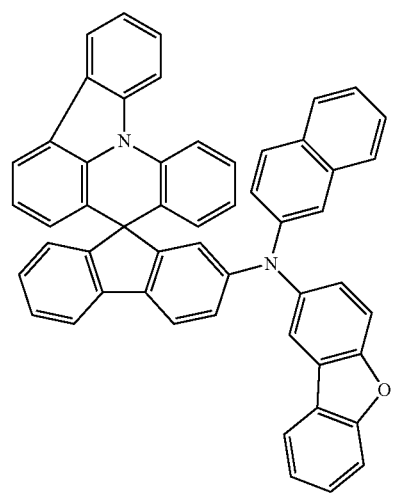
1-53
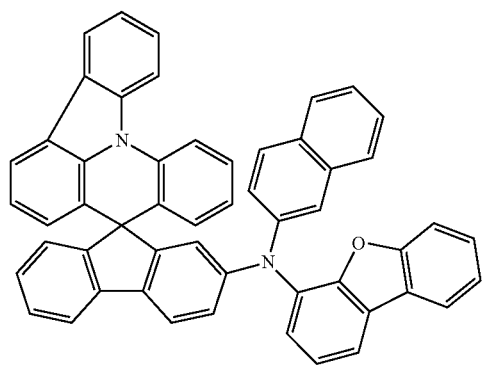
1-54
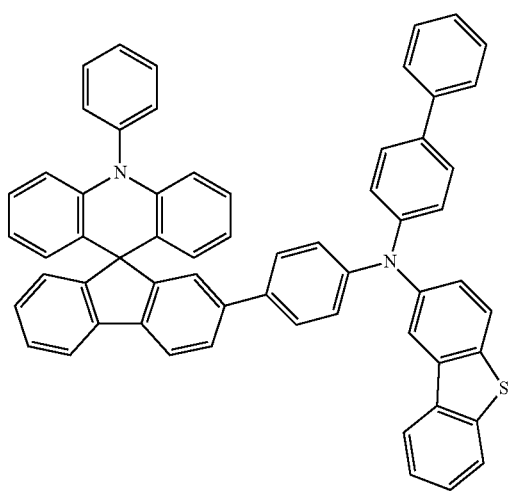
1-55
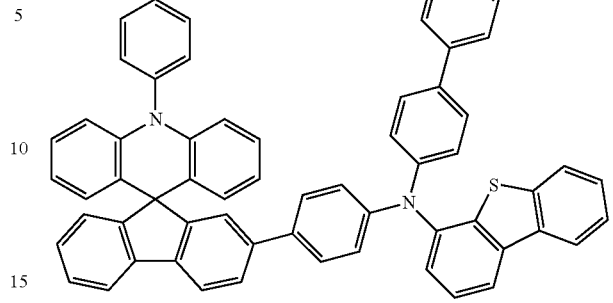
1-56
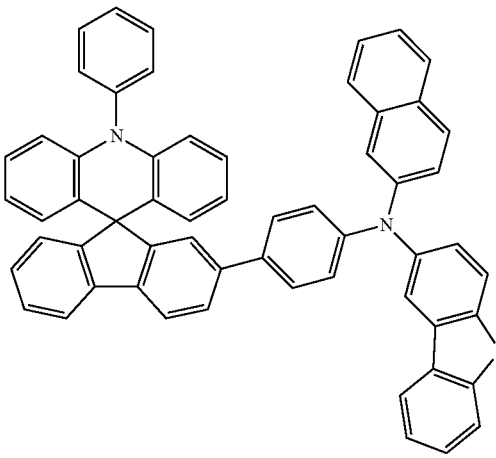
1-57
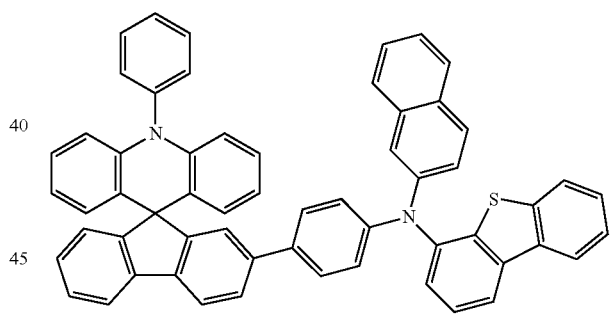
1-58
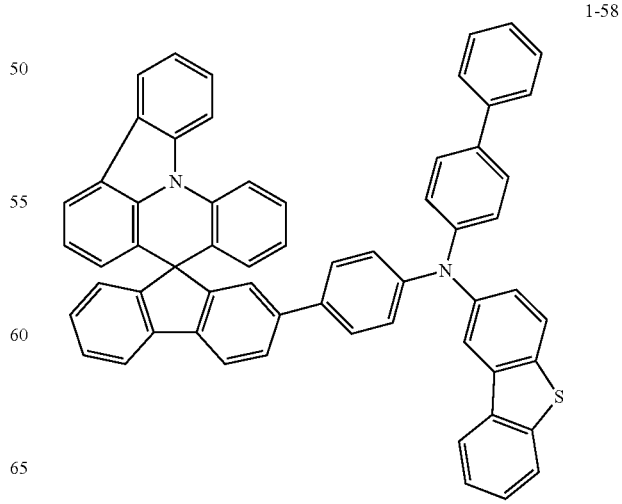

-continued
1-59
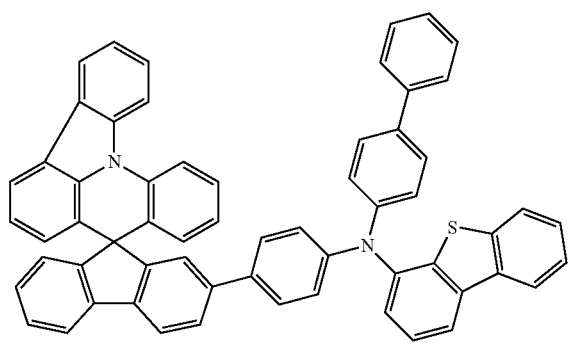
1-60
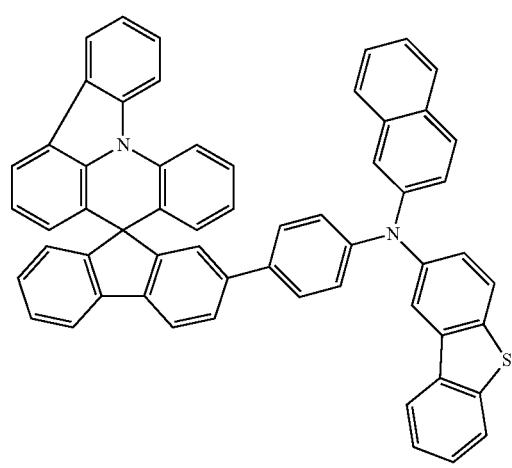
1-61
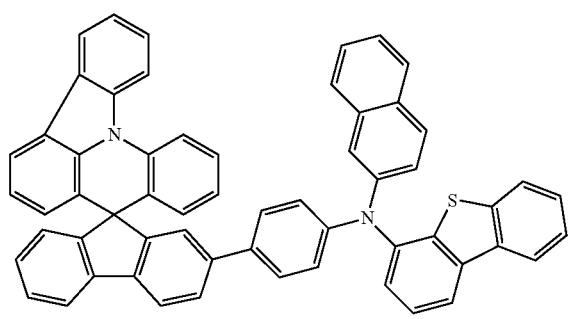
-continued
1-62
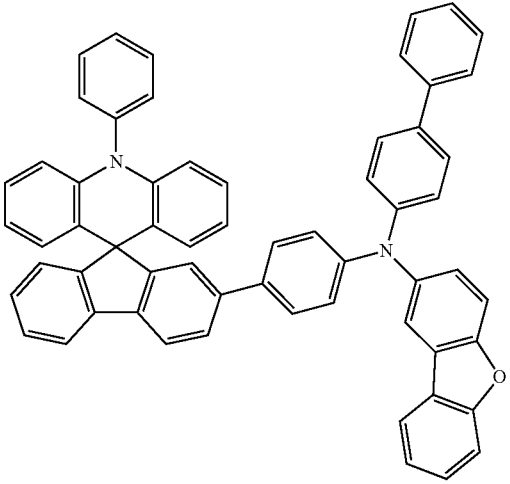
1-63
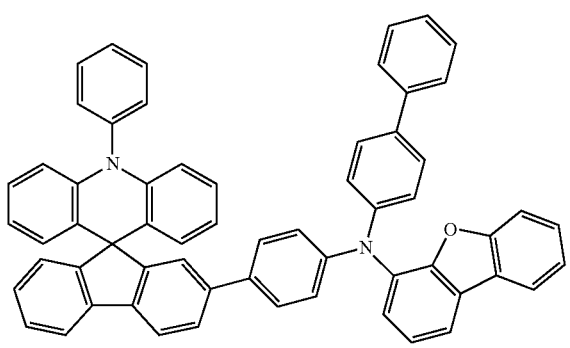
1-64
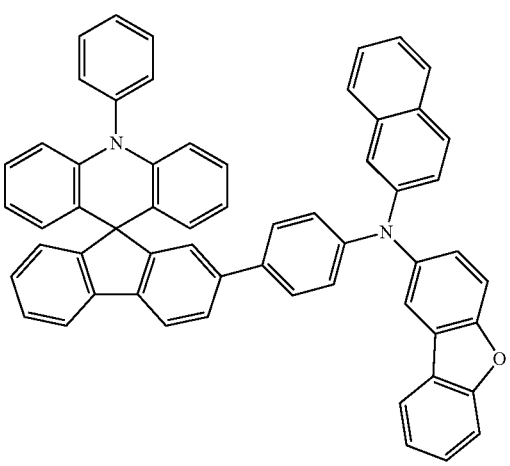

-continued
1-65
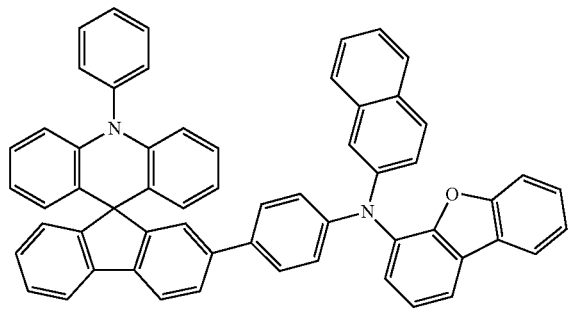
1-66
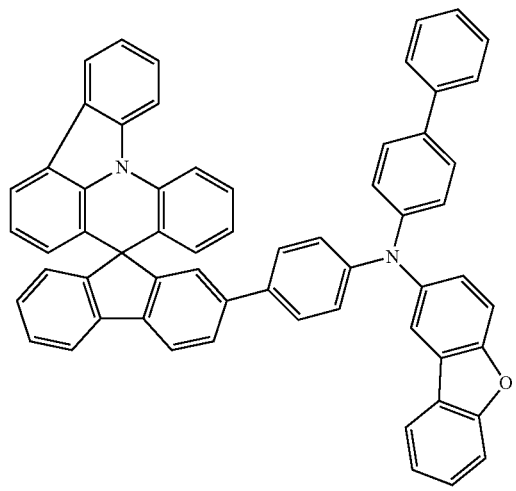
1-67
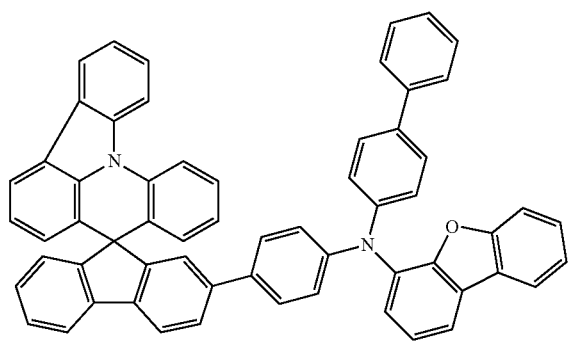
-continued
1-68
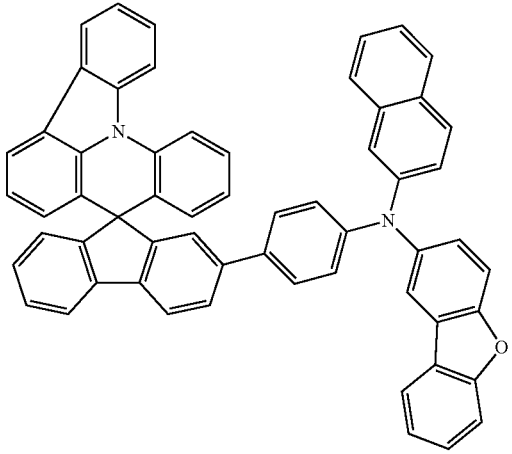
1-69
1-70
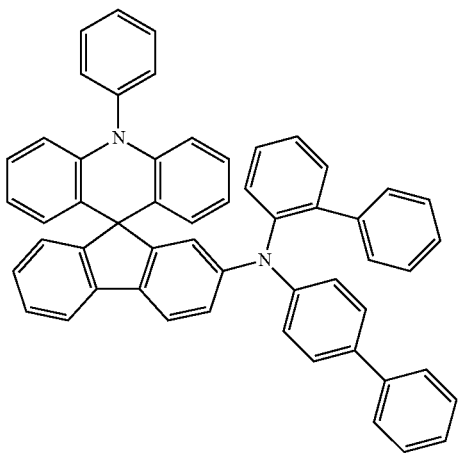

1-71
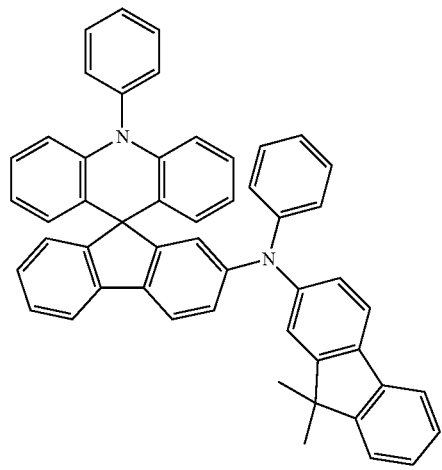
1-72
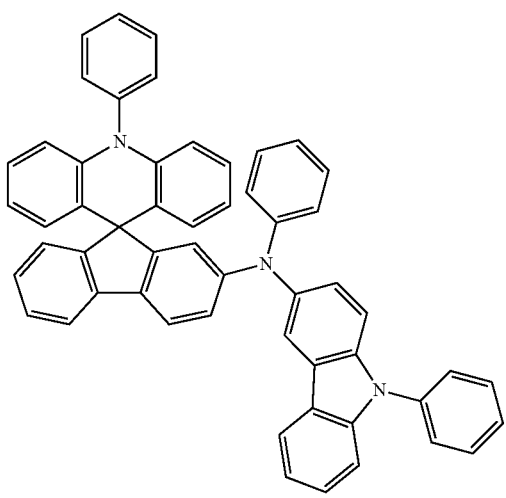
1-73
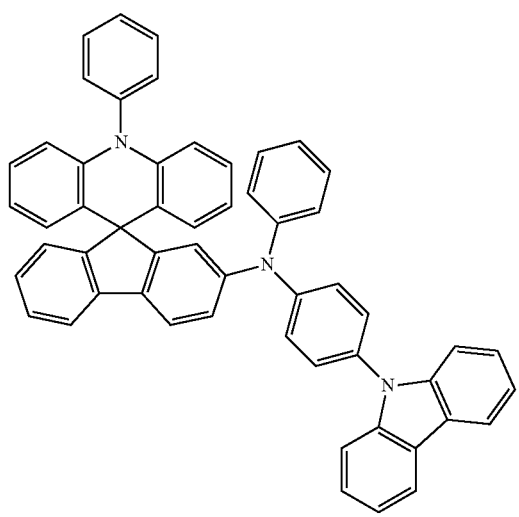
1-74
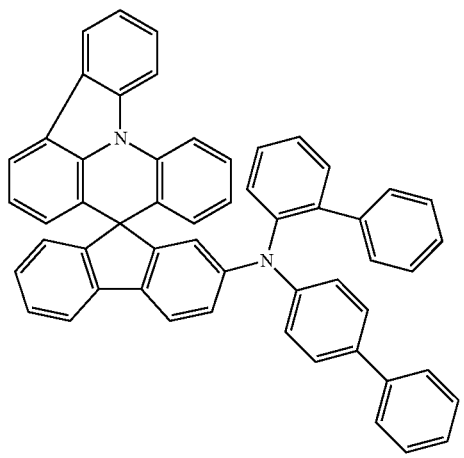
1-75
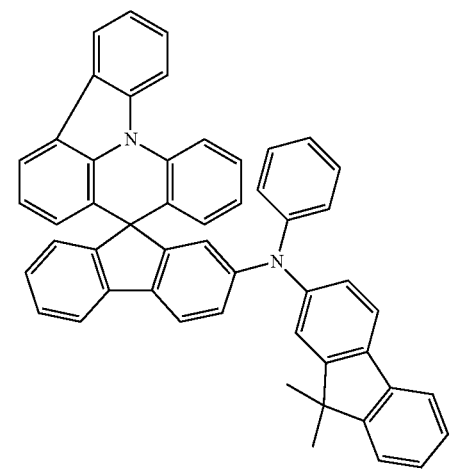
1-76
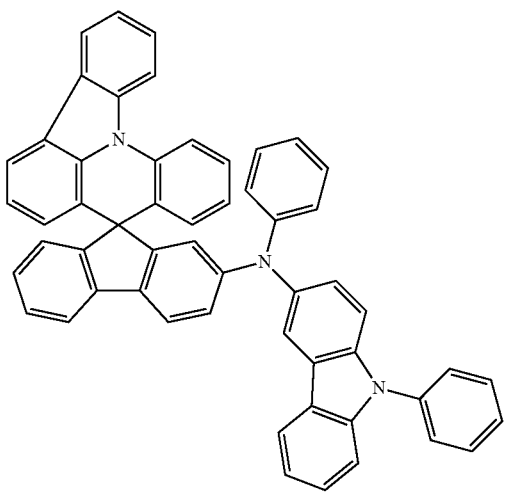

1-77
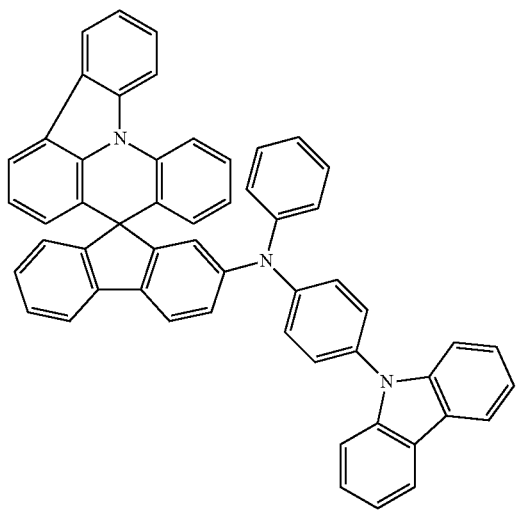
1-78
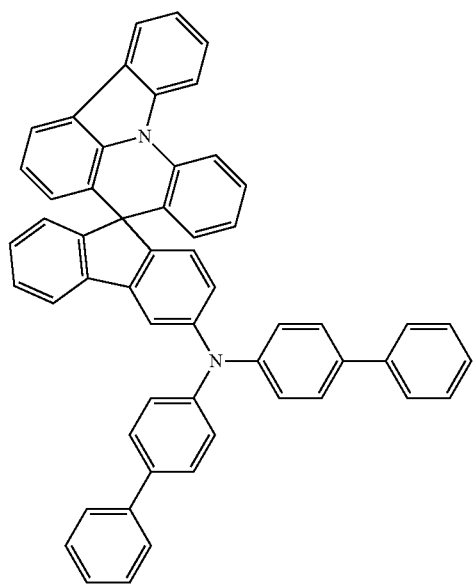
1-79
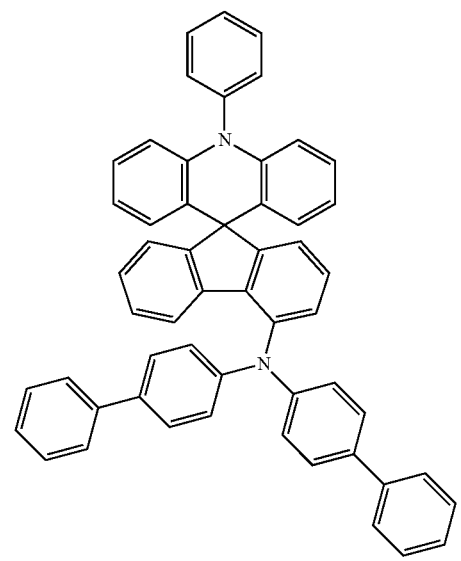
1-80
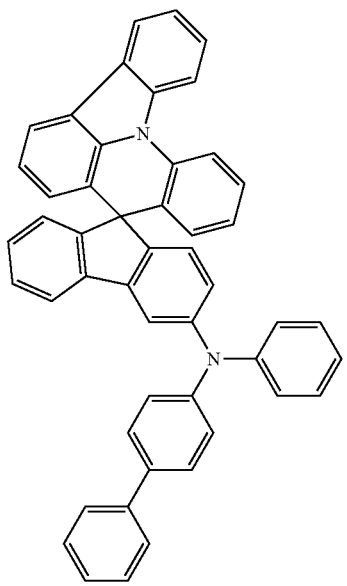
1-81
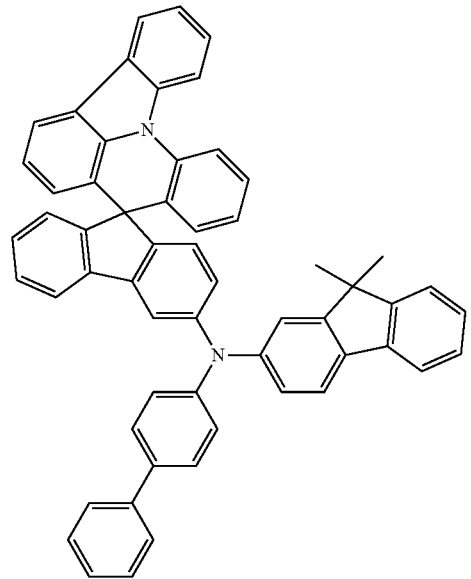

1-82
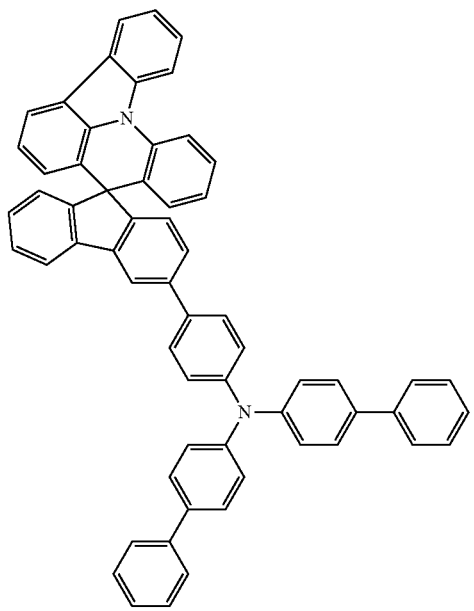
1-84
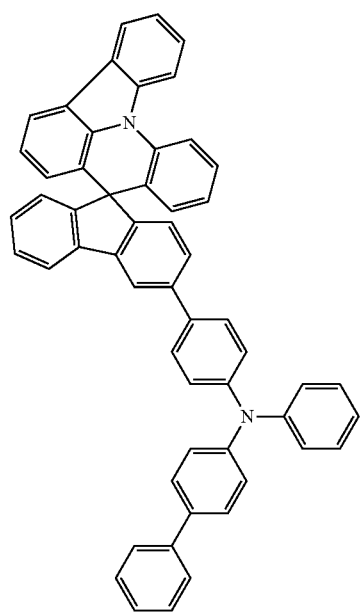
1-83
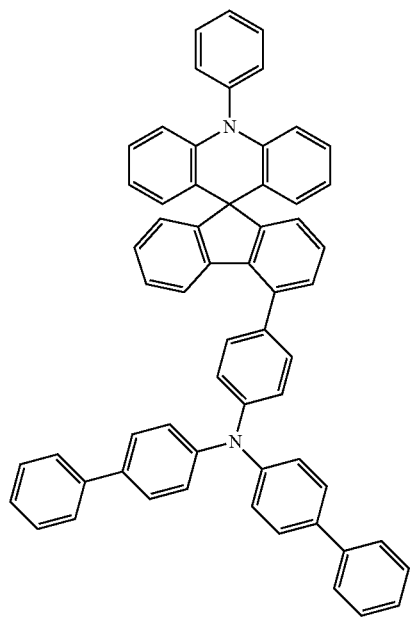
1-85
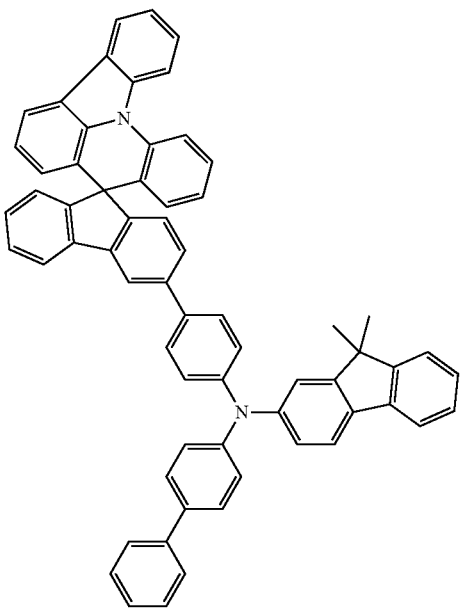

1-86
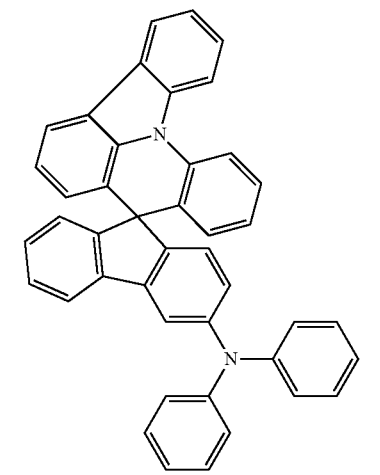
1-87
1-88
1-89
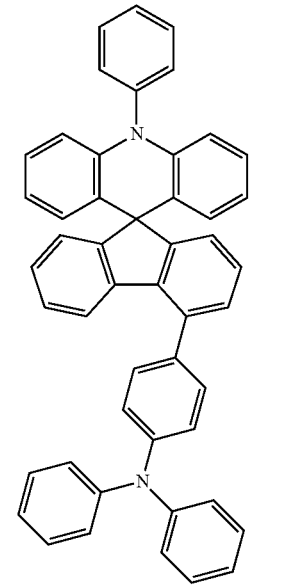
1-90
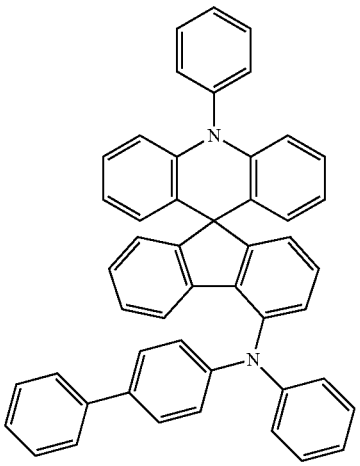
1-91
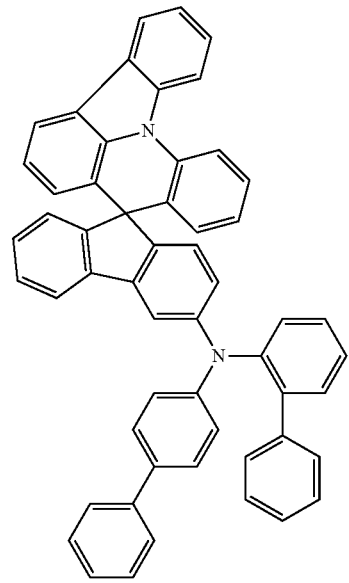

1-92
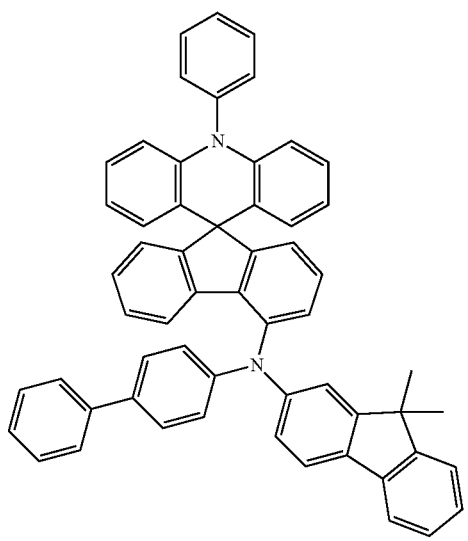
1-93
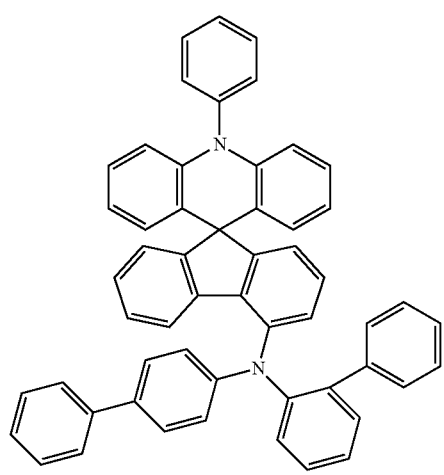
1-94
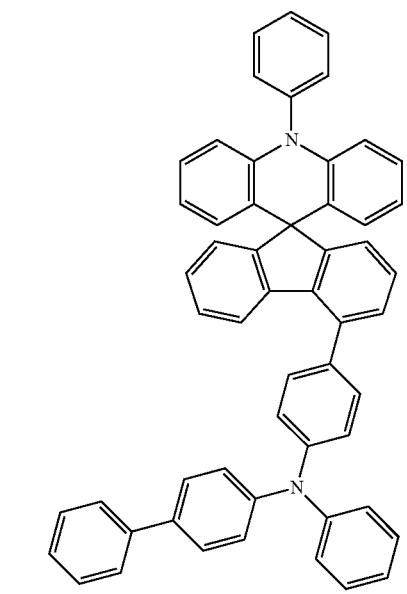
1-95
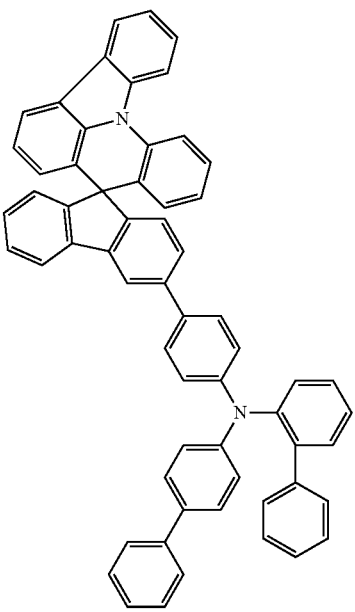
1-96
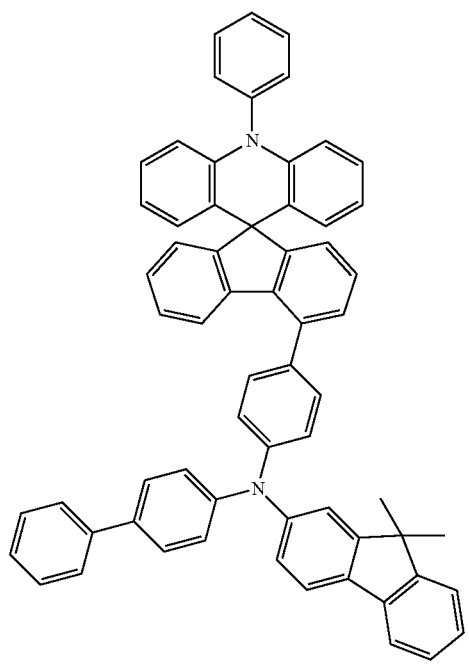

1-97
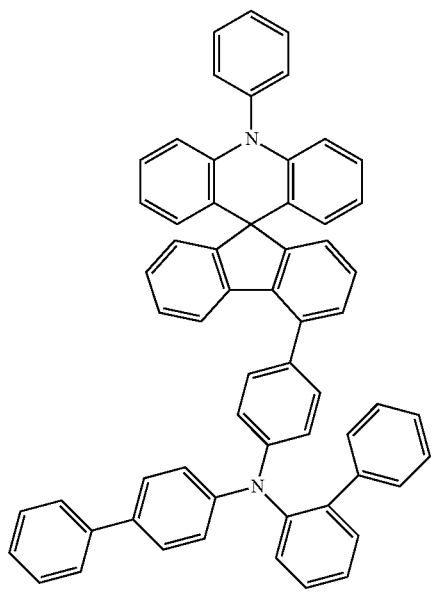
1-98
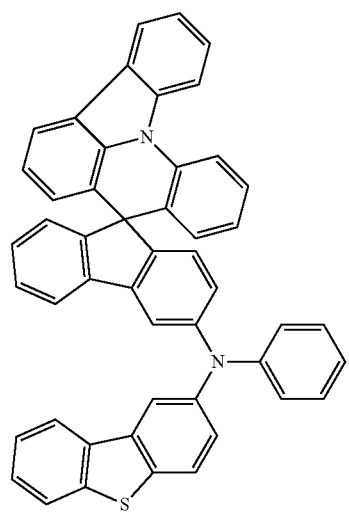
1-99
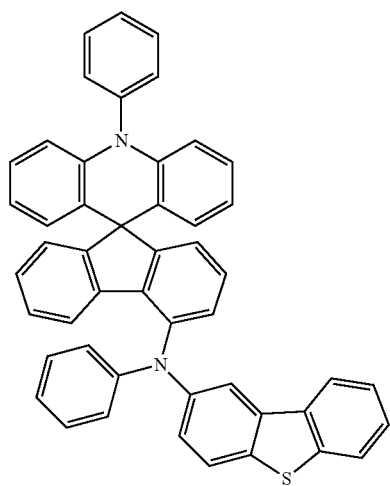
1-100
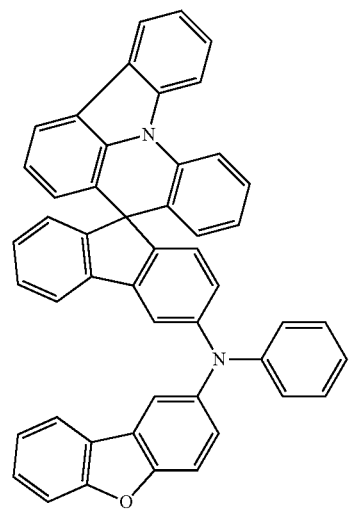
1-101
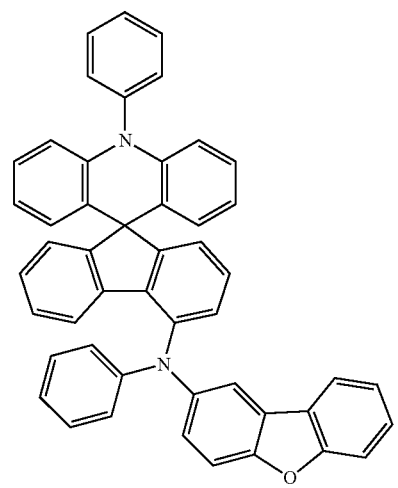
1-102
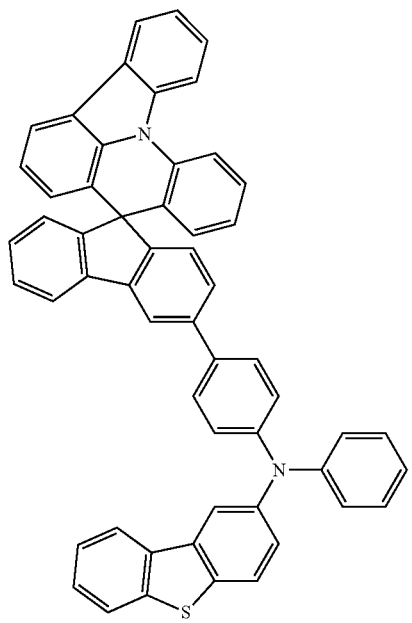

189
-continued
1-103
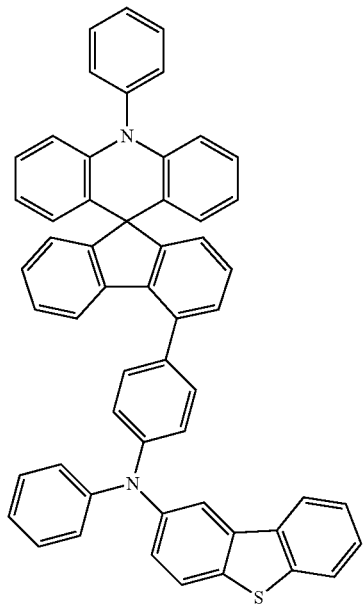
1-104
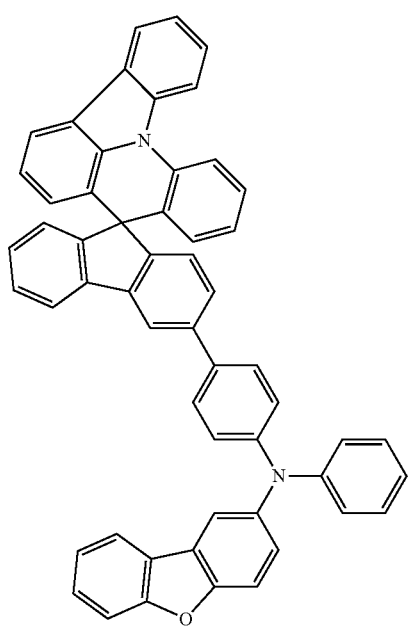
190
-continued
1-105
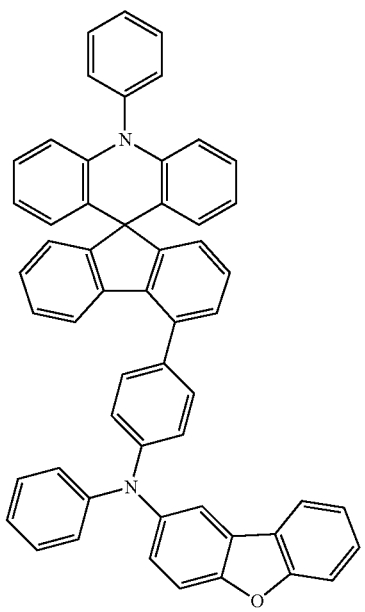
1-106
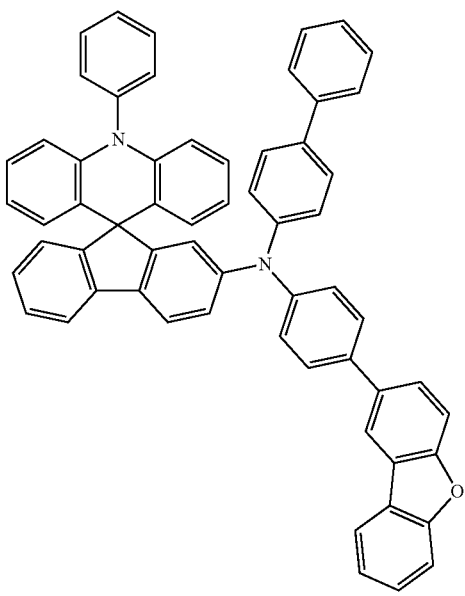

1-107
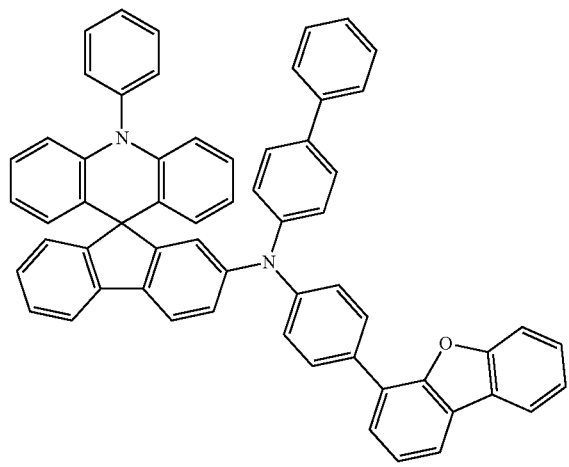
1-108
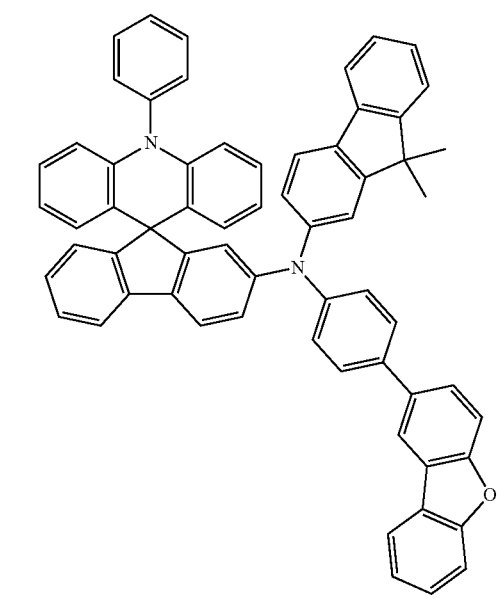
1-109
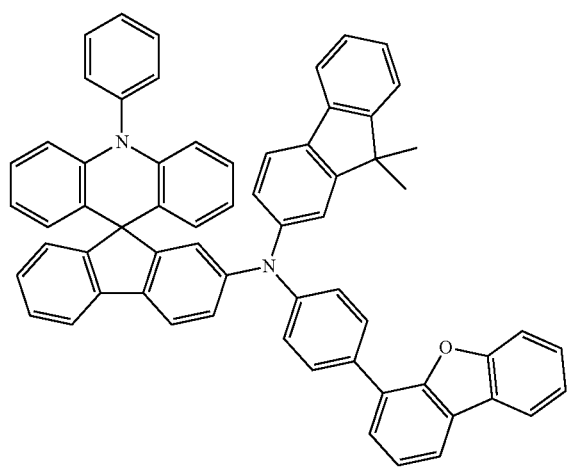
1-110
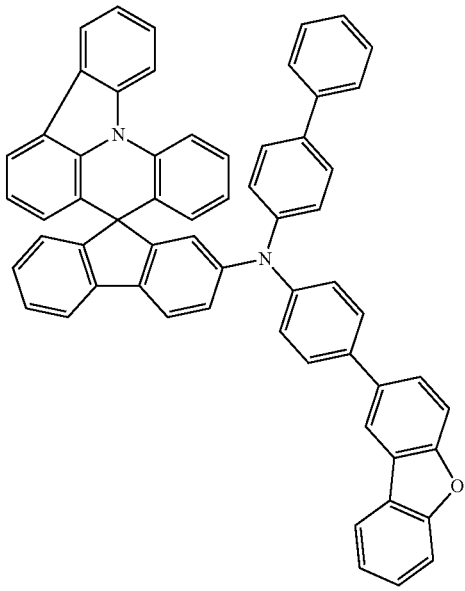
1-111
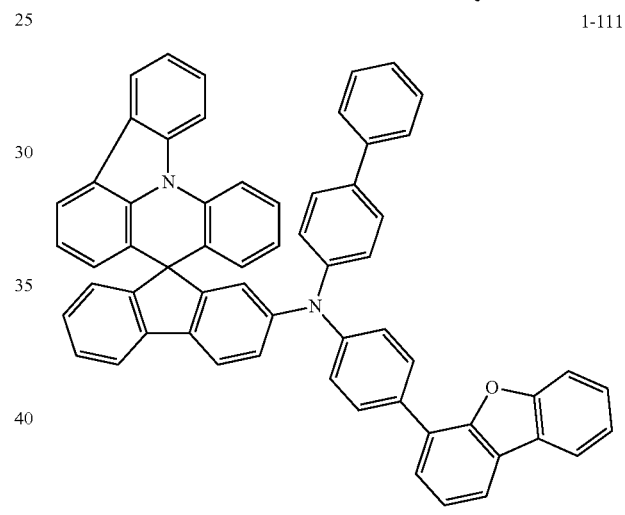
1-112
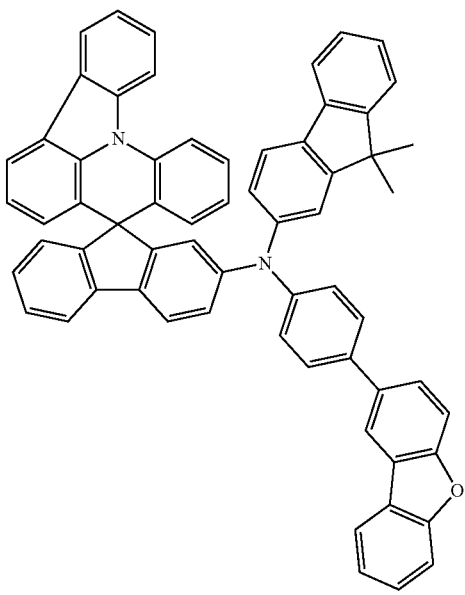

1-113
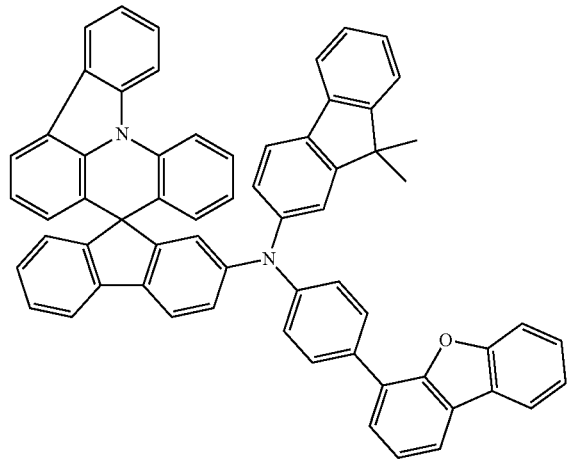
1-114
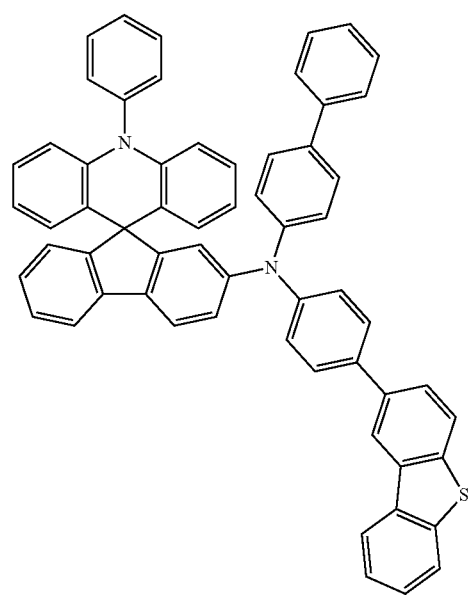
1-115
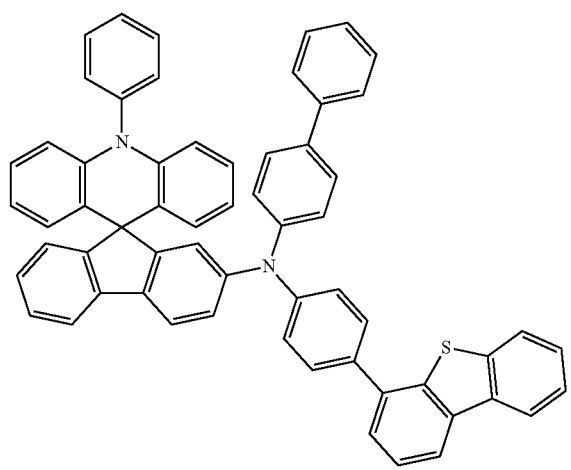
1-116
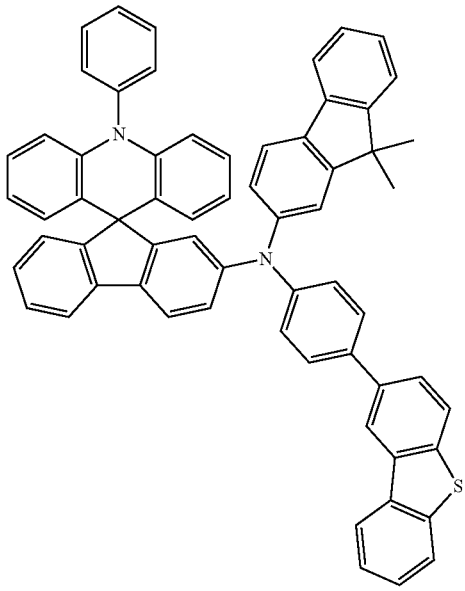
1-117
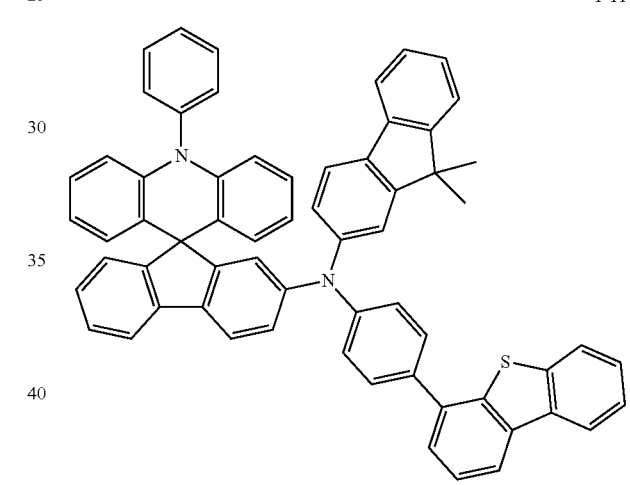
1-118
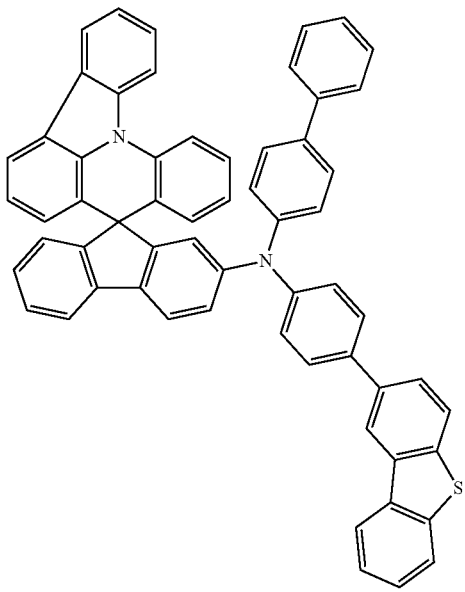

-continued
1-119
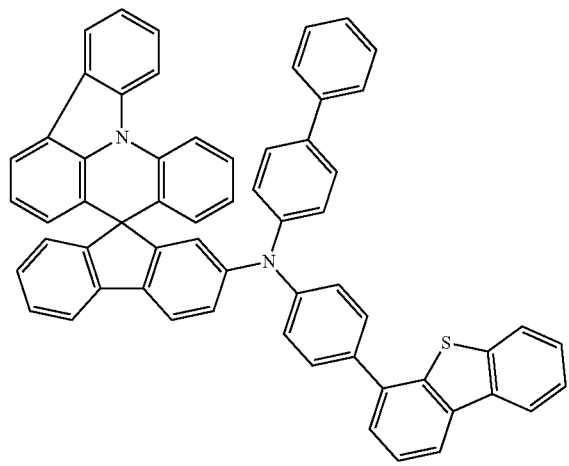
1-120
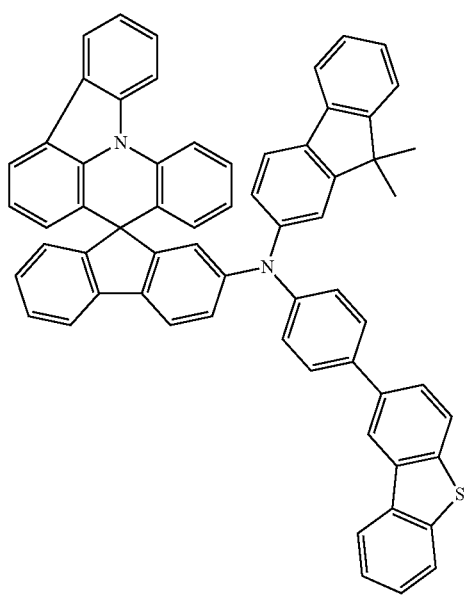
1-121
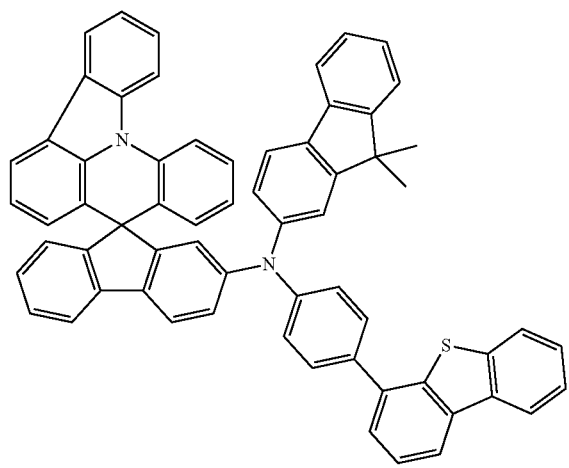
-continued
1-122
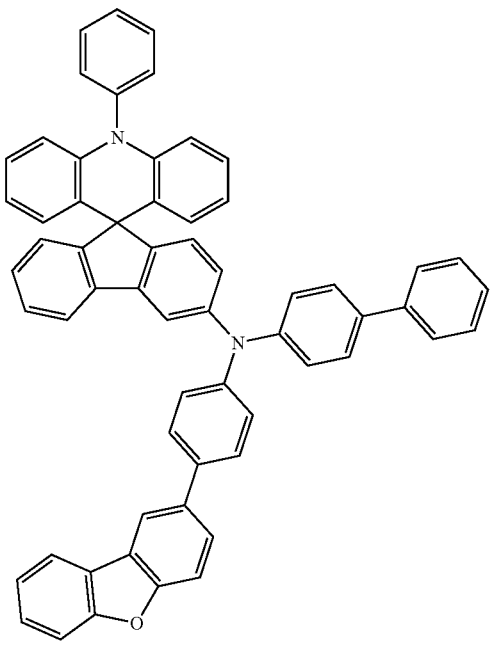
1-123
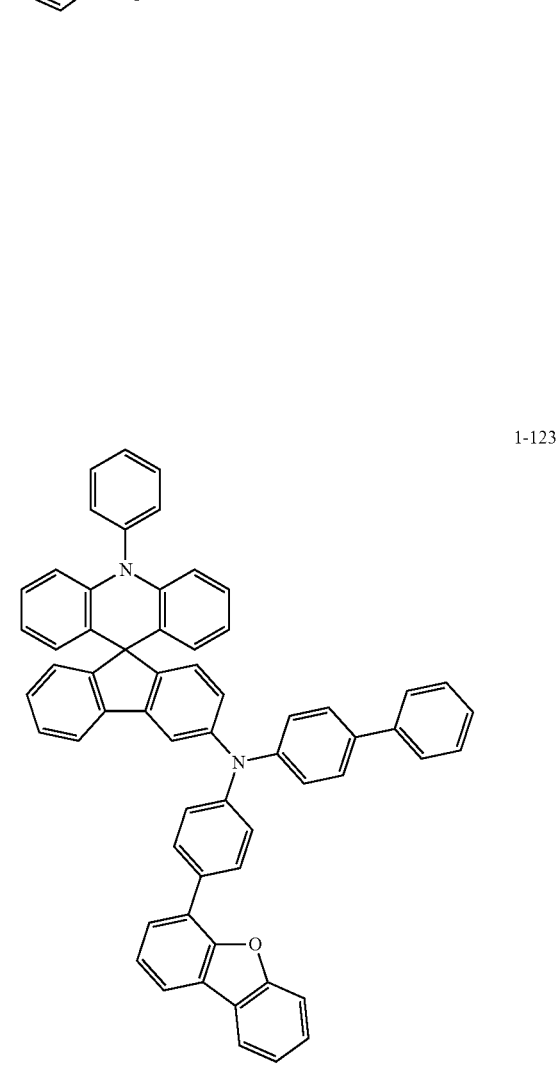

1-124
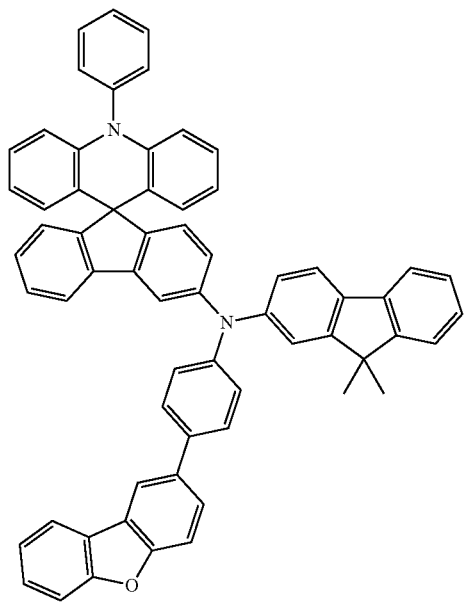
1-125
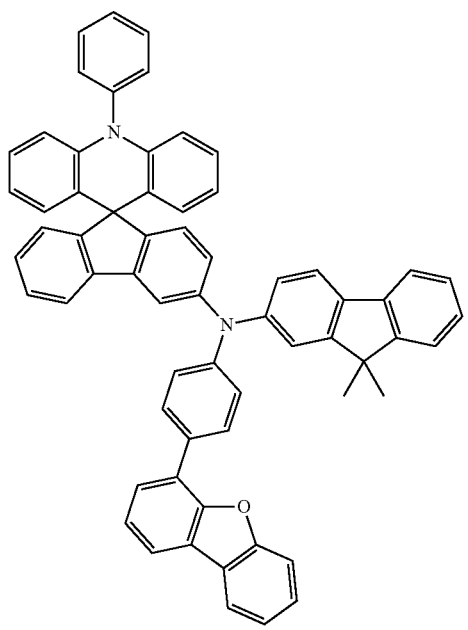
1-126
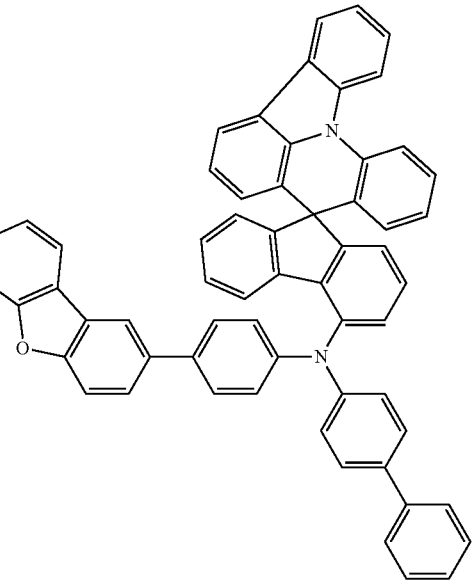
1-127
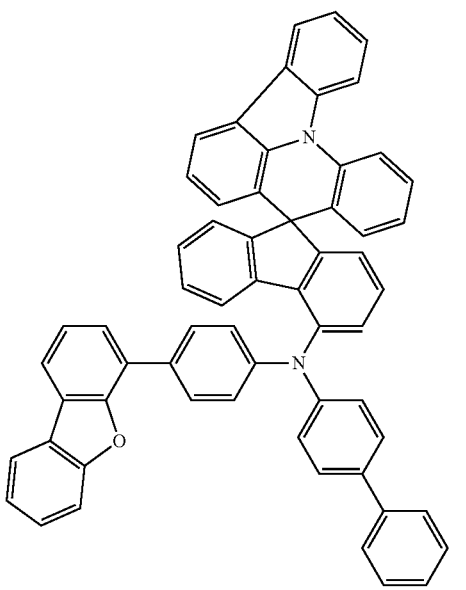

1-128
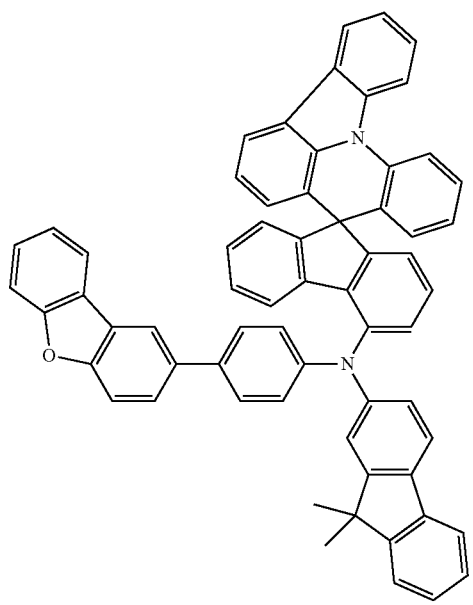
1-130
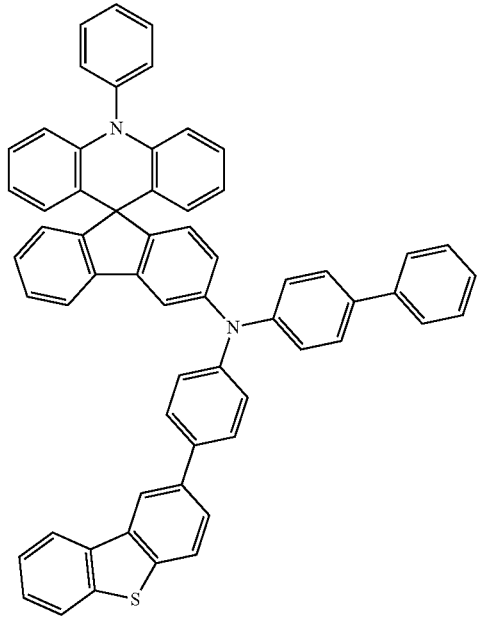
1-129
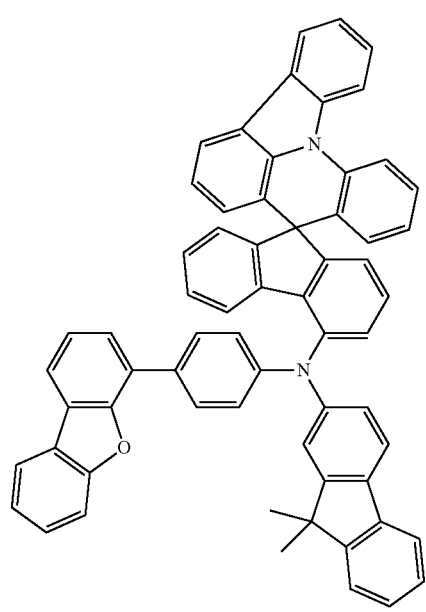
1-131
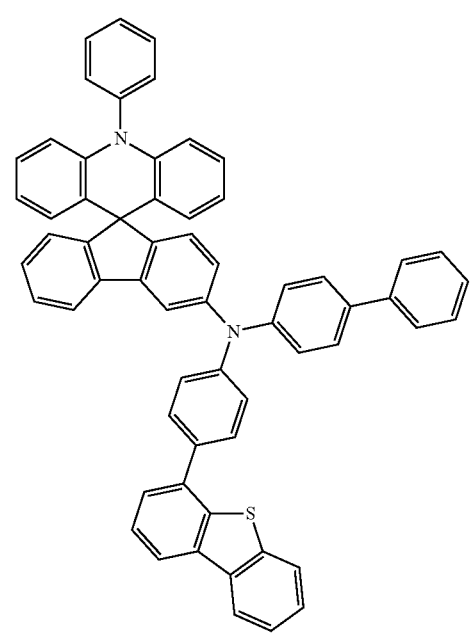

201
-continued
1-132
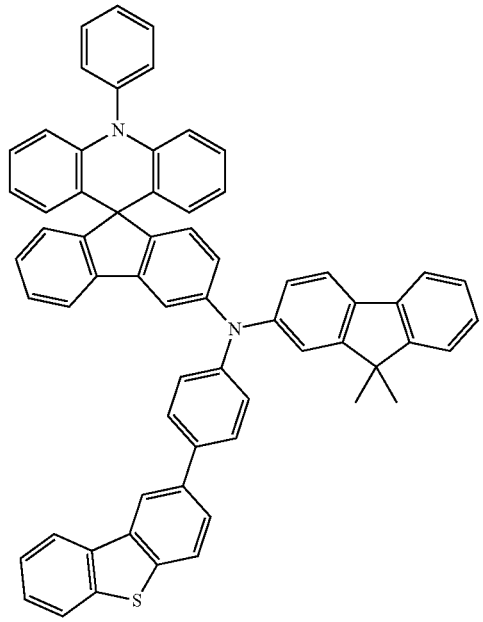
1-133
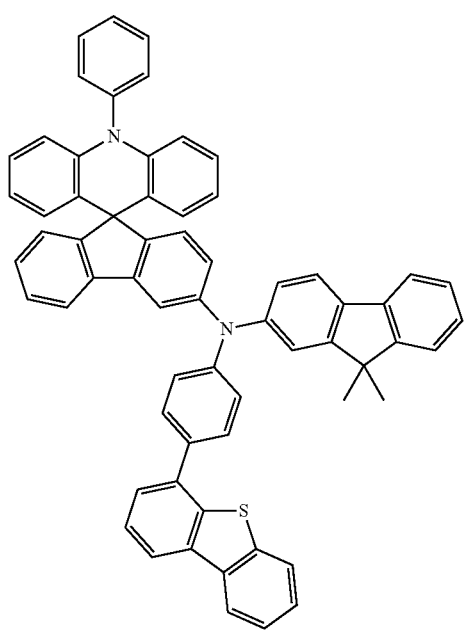
202
-continued
1-134
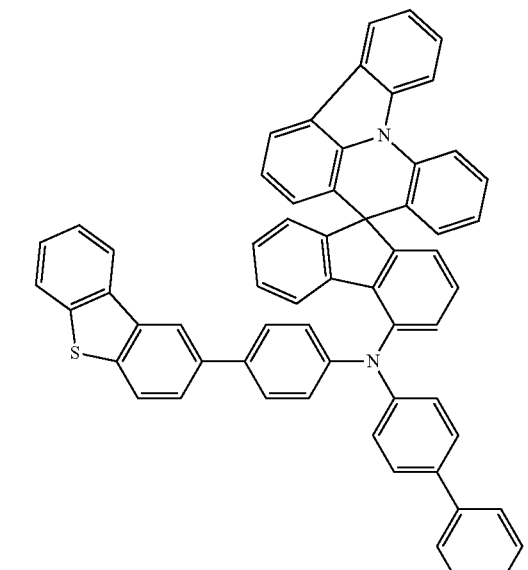
1-135
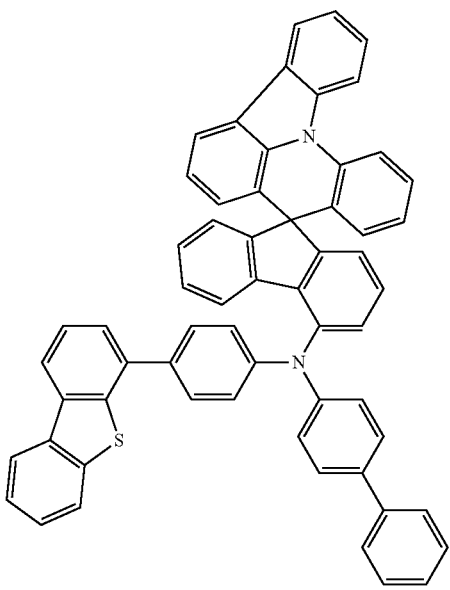

1-136
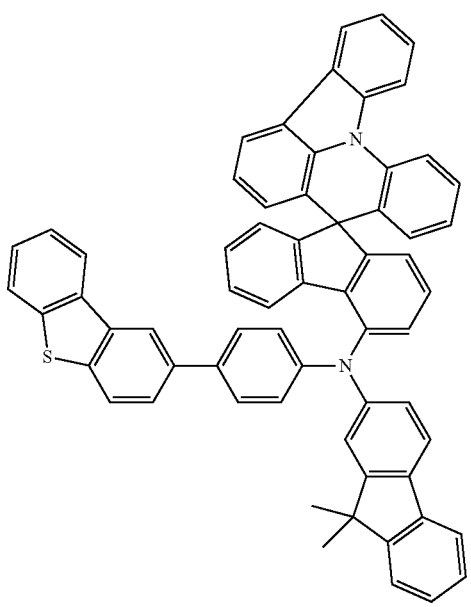
1-138
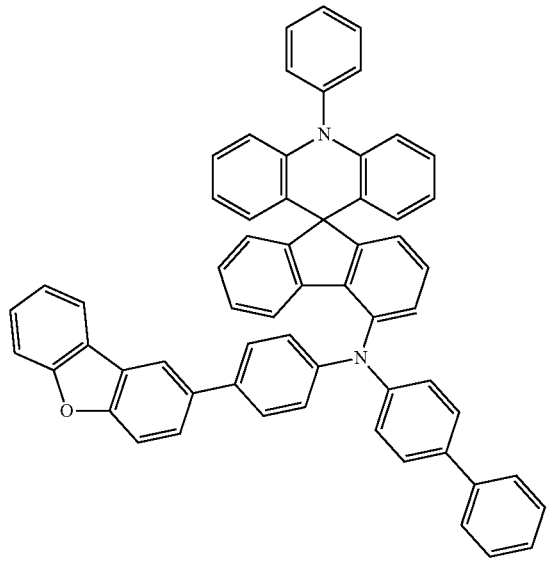
1-137
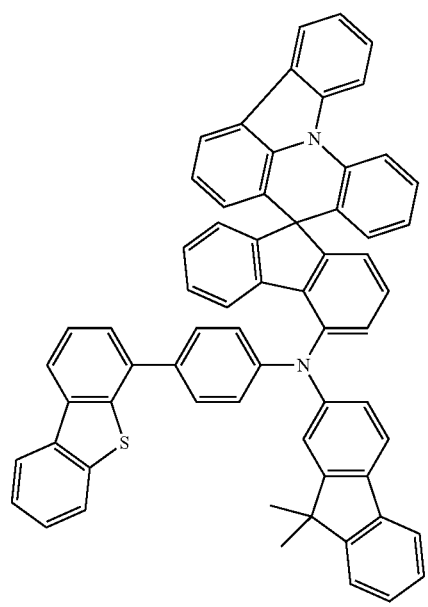
1-139
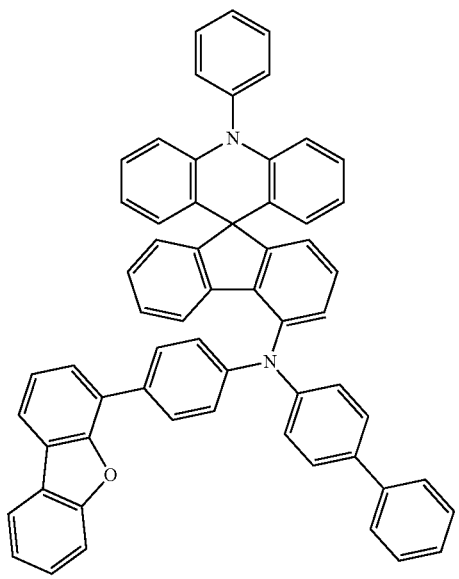

1-140
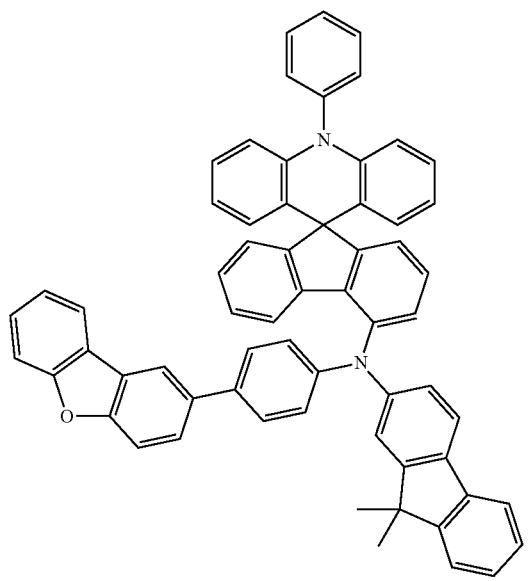
1-142
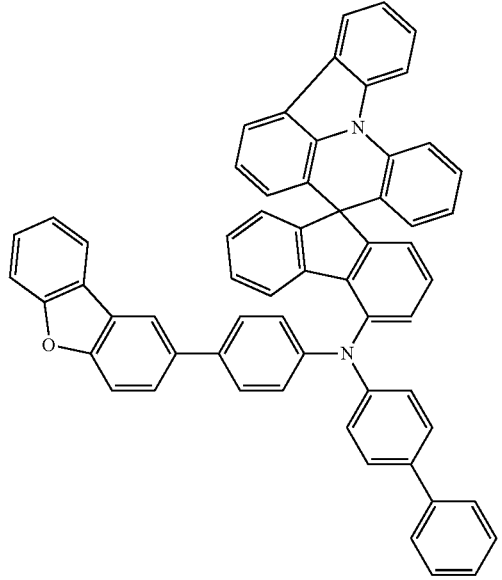
1-141
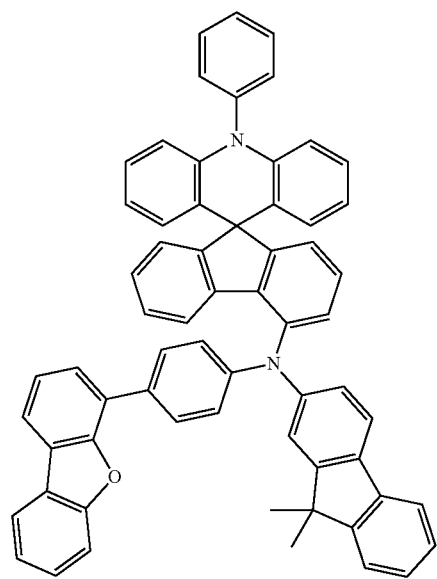
1-143

1-144
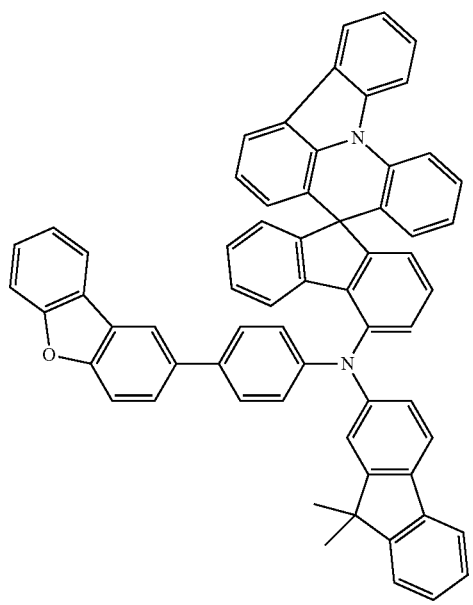
1-146
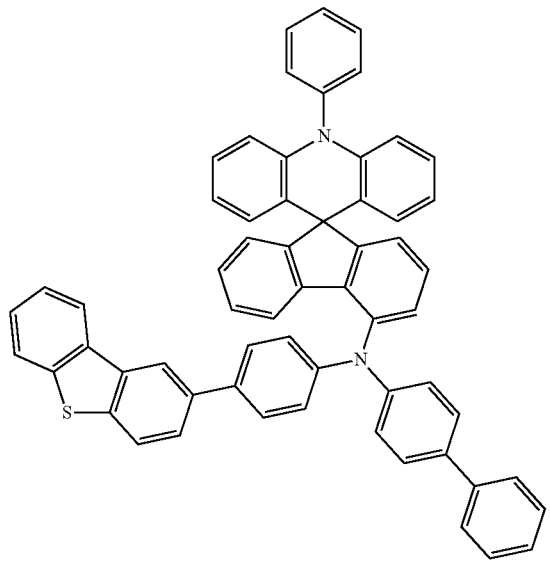
1-145
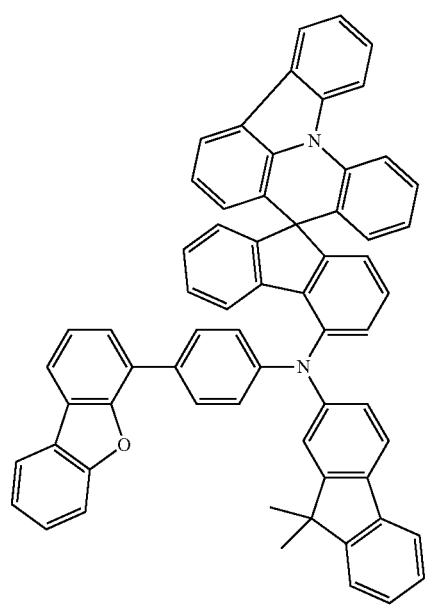
1-147
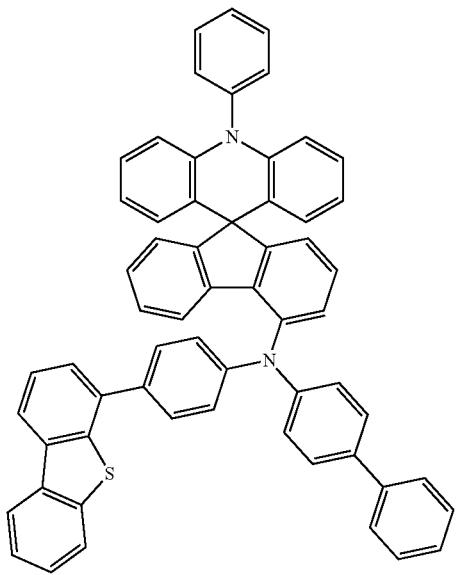

1-148
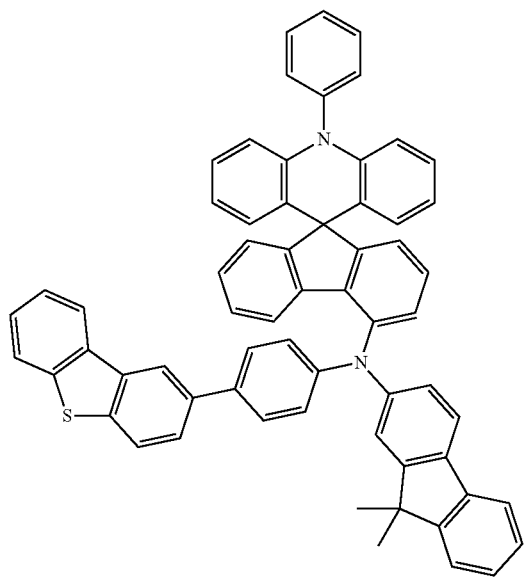
1-150
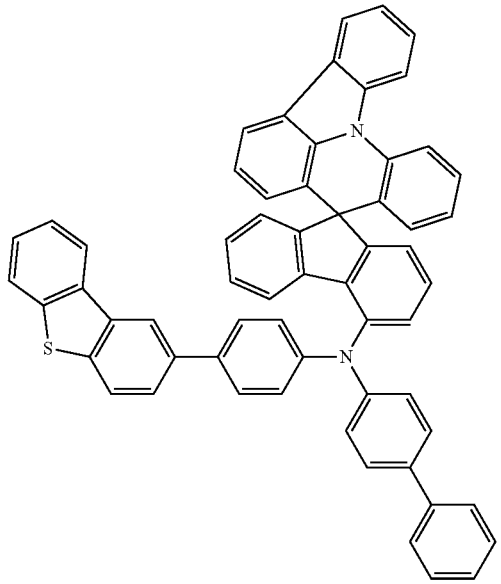
1-149
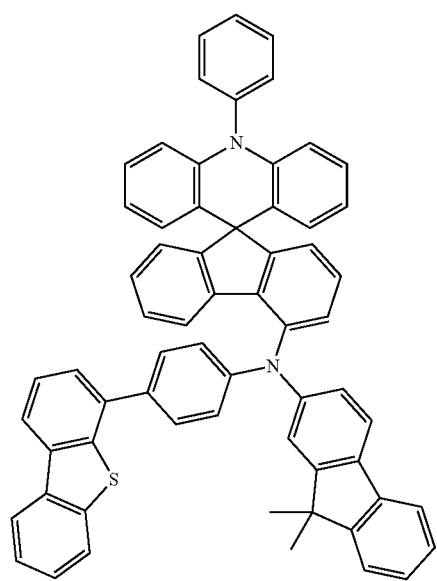
1-151
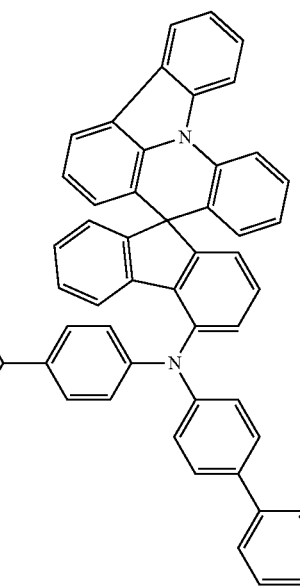

1-152
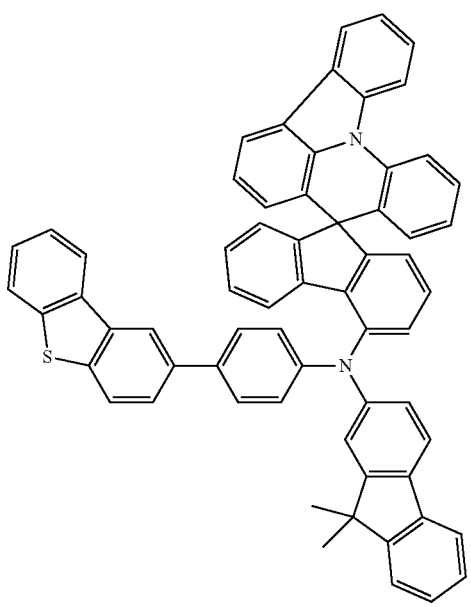
1-153
1-154
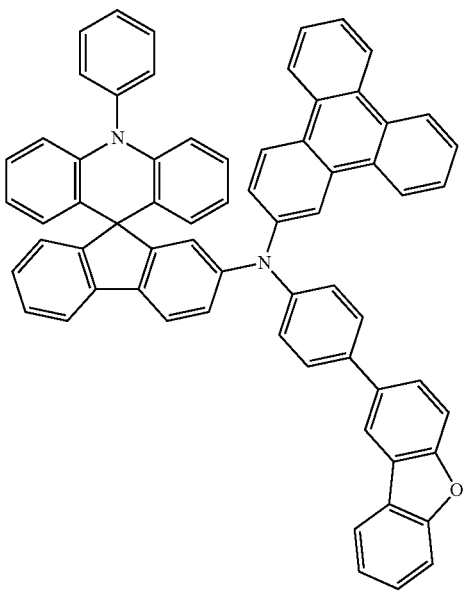
1-155
1-156
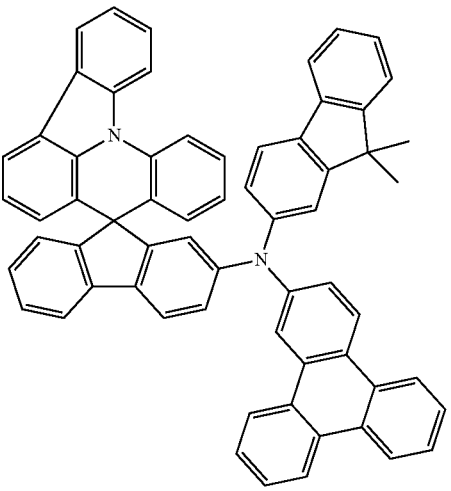

1-157
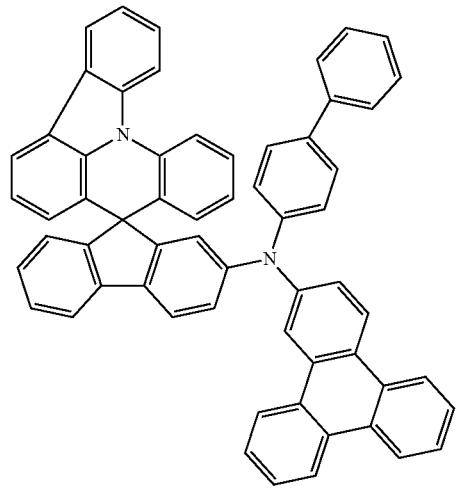
1-158
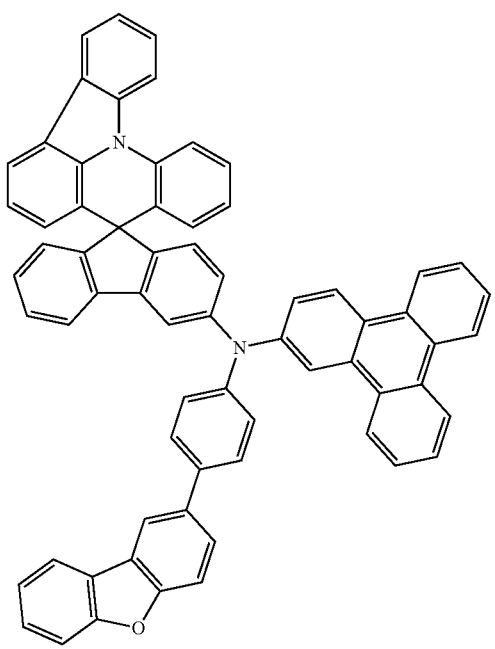
1-159
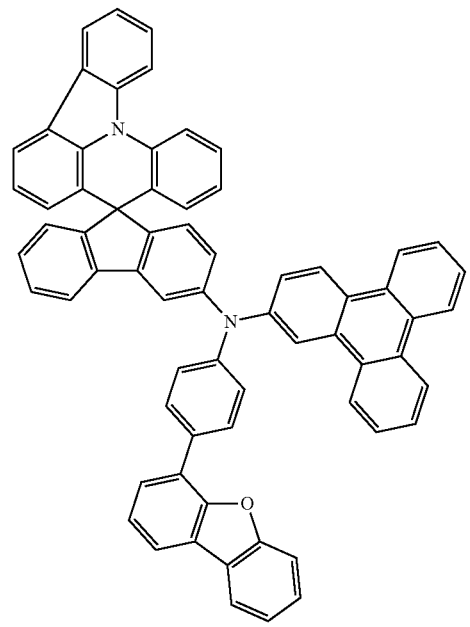
1-160
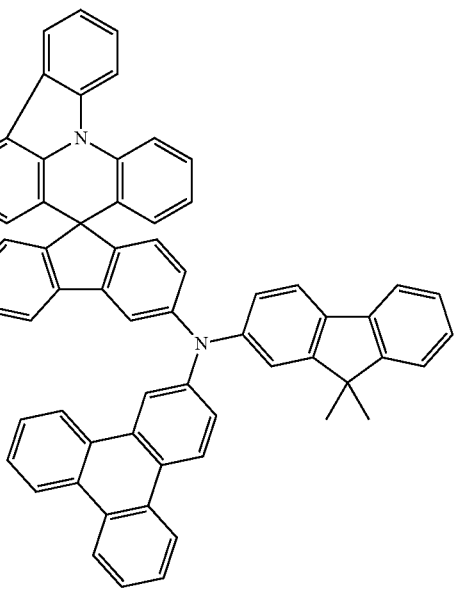

215
-continued
1-161
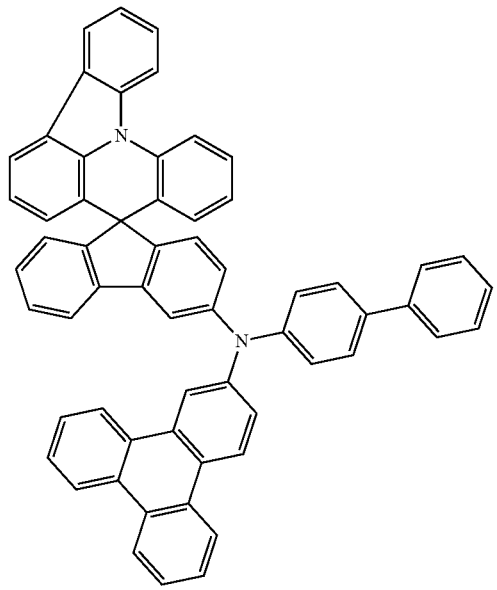
1-162
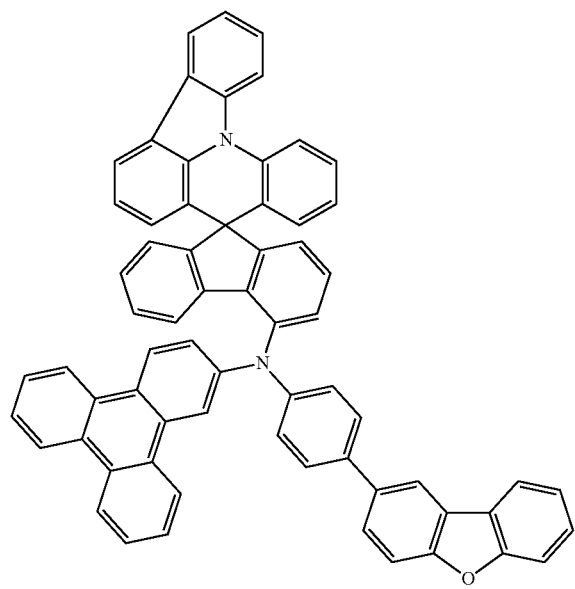
216
-continued
1-163
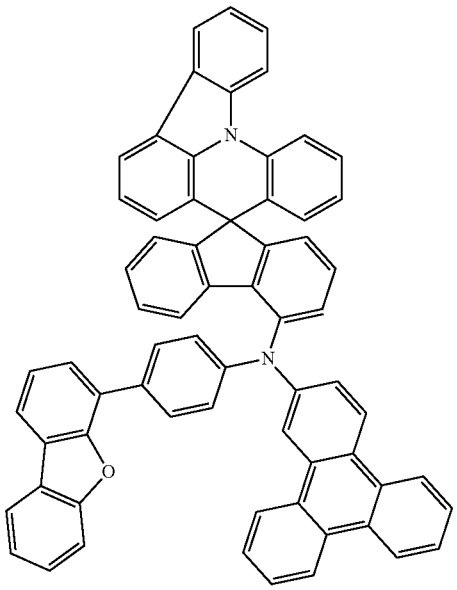
1-164
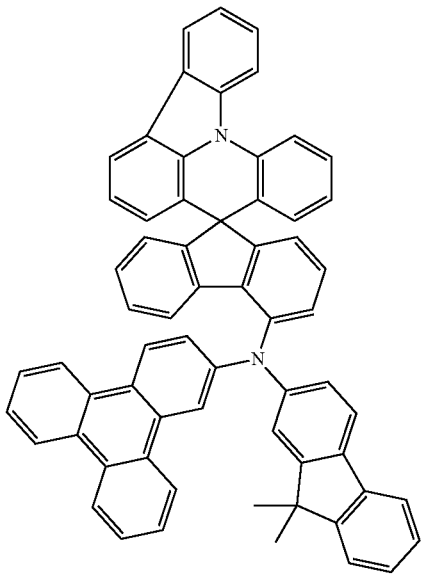

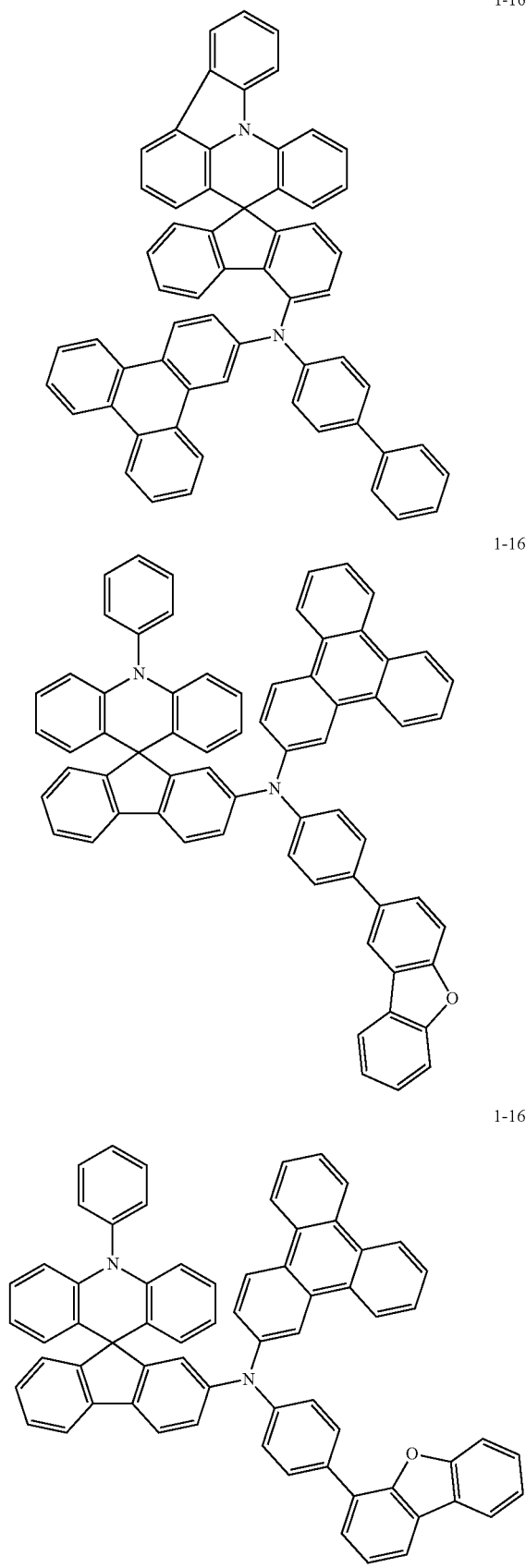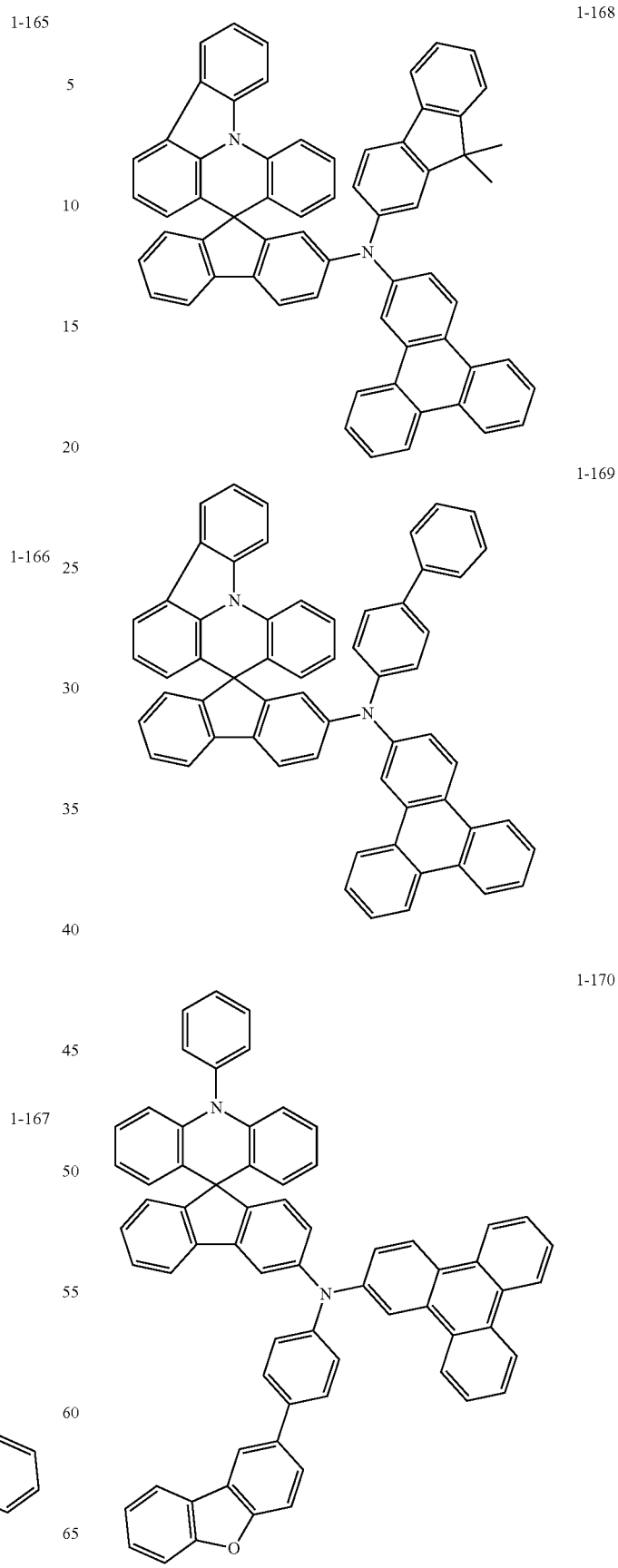

219
-continued
1-171
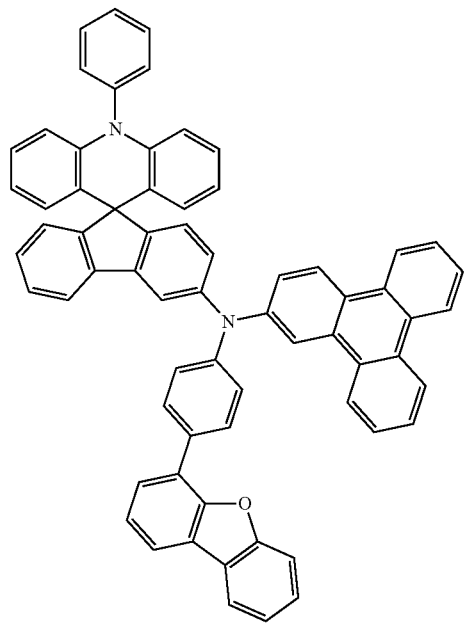
220
-continued
1-173
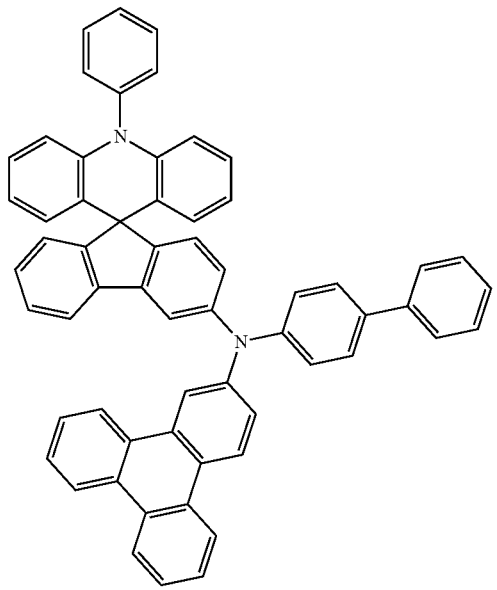
1-172
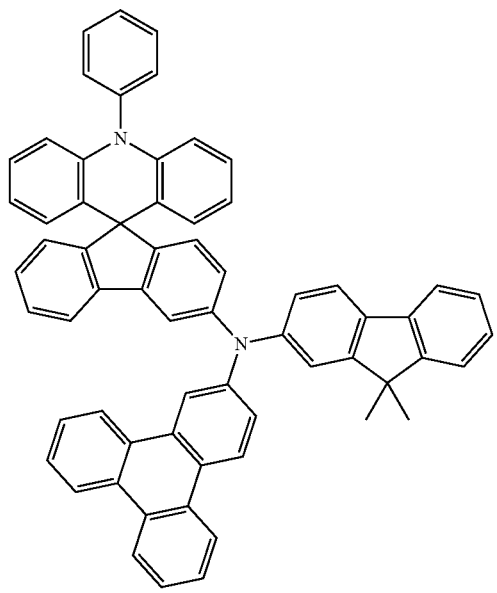
1-174
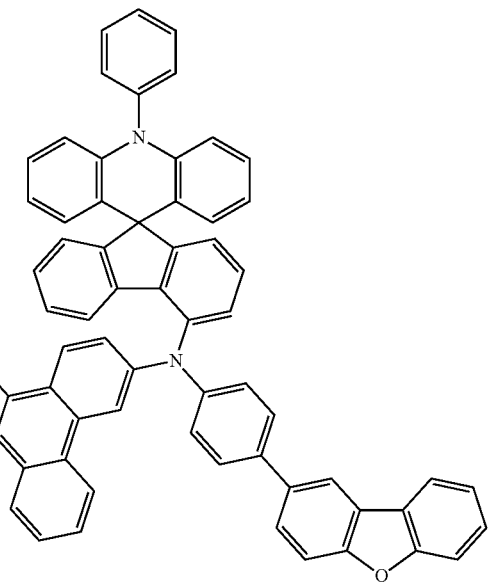

1-175
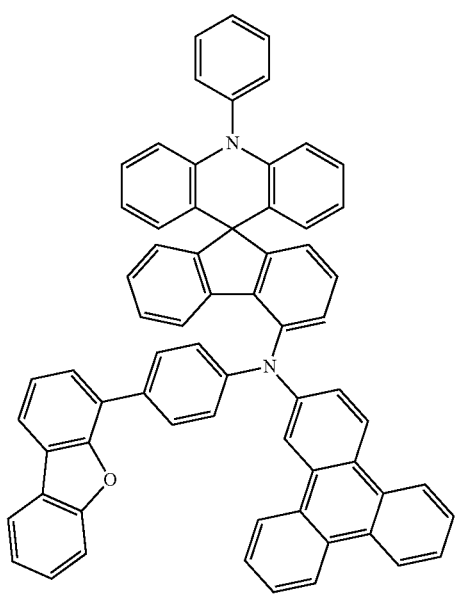
1-176
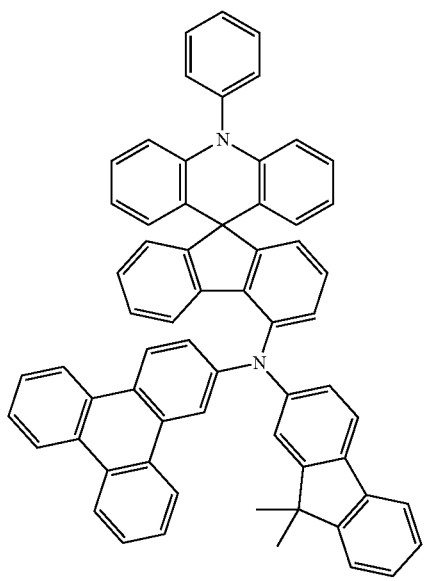
1-177
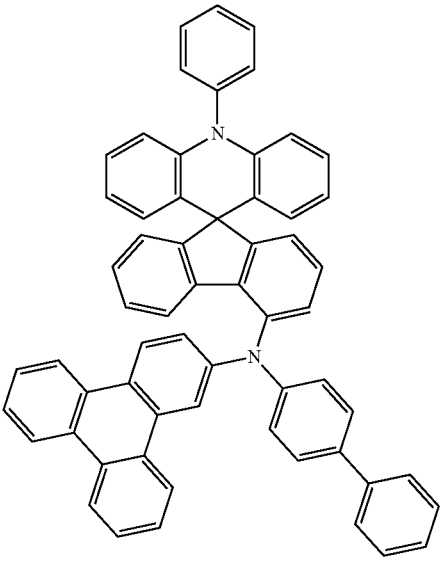
1-178
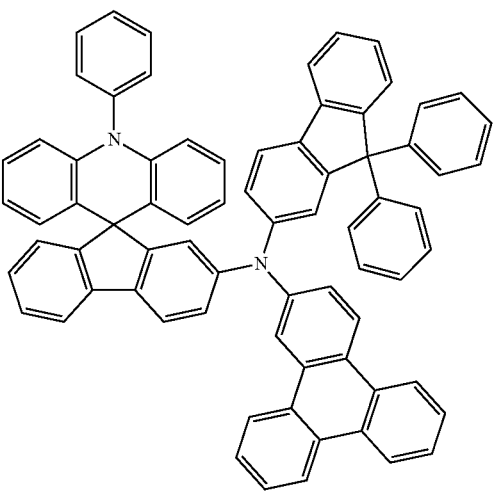
1-179
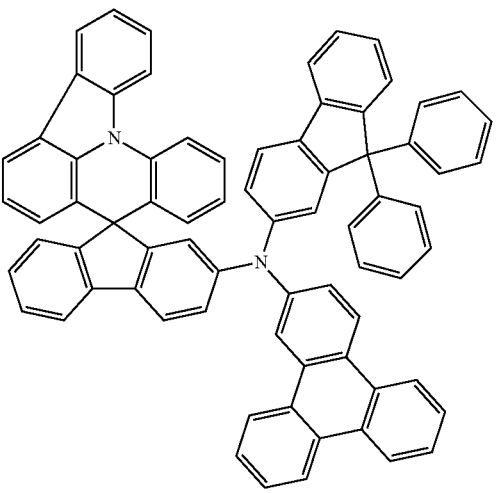

-continued
1-180
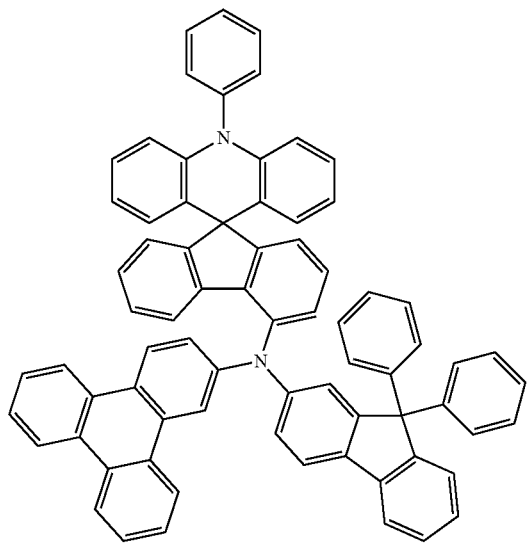
1-181
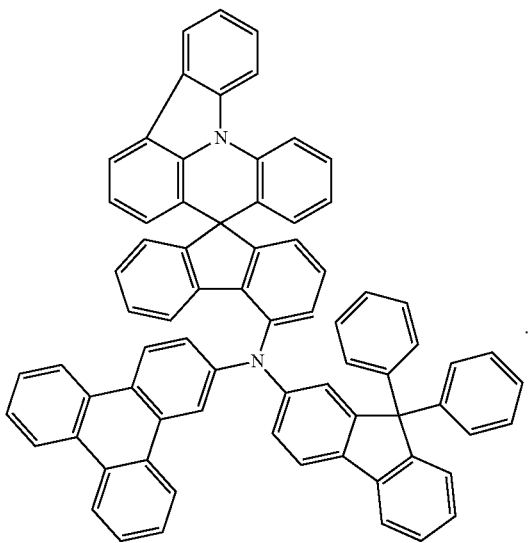
9. The organic light emitting device of claim 1, wherein Chemical Formula 2 is any one of the following structural formulae:
2-1
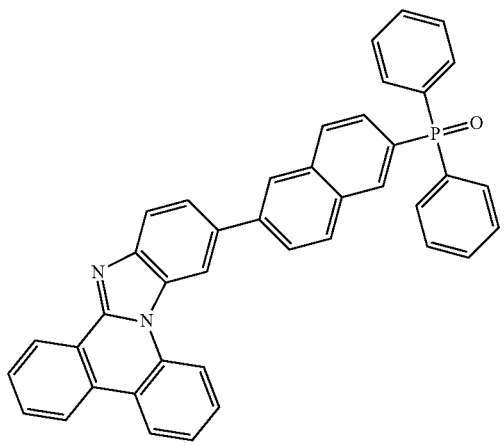
2-2
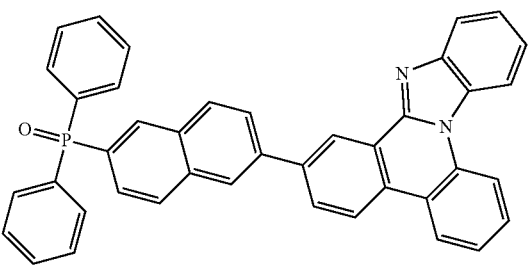
2-3
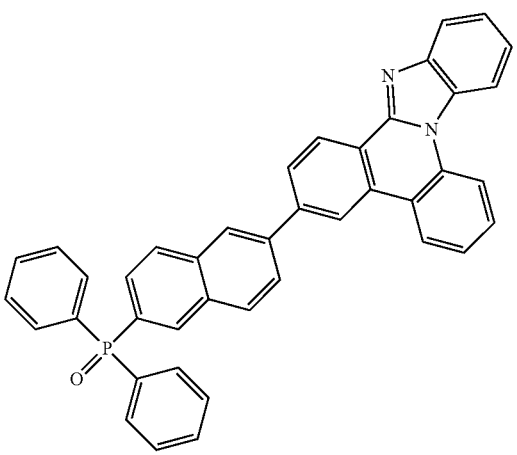

2-4
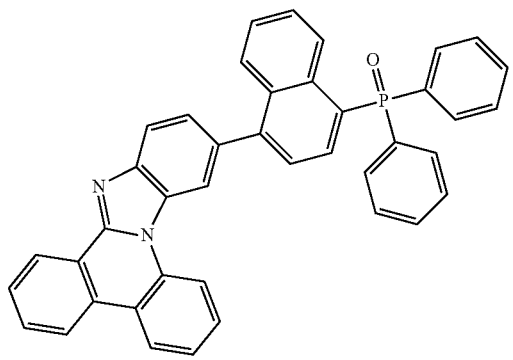
2-5
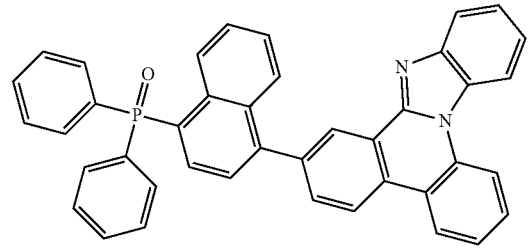
2-6
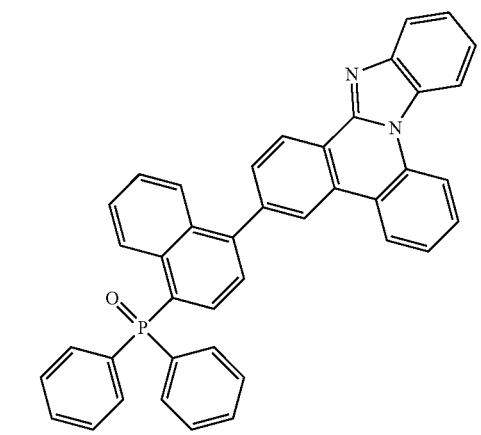
2-7
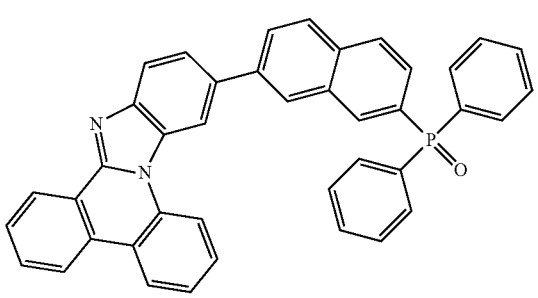
2-8
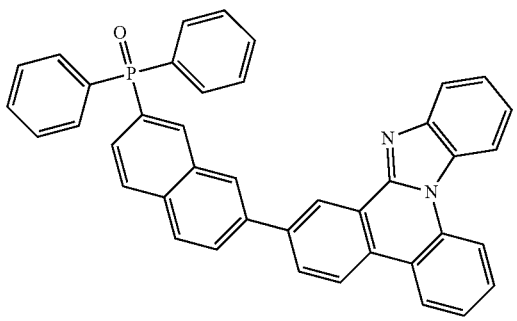
2-9
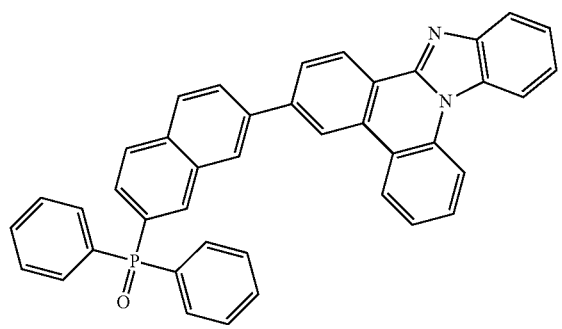
2-10
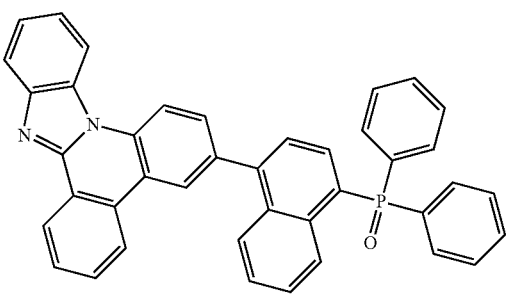
2-11
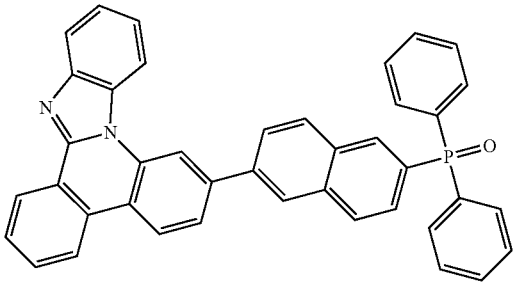
2-12
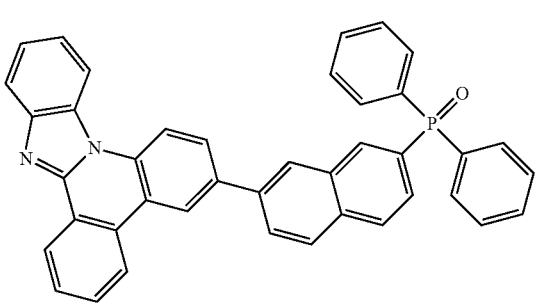

2-13
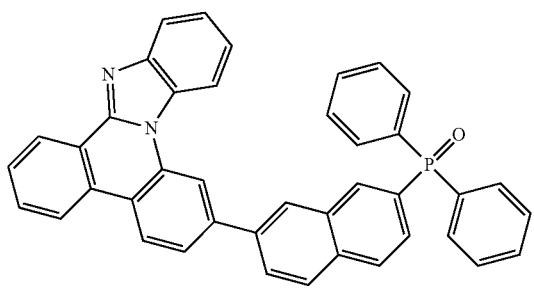
2-14
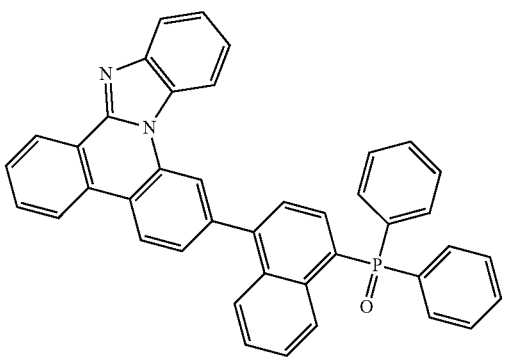
2-15
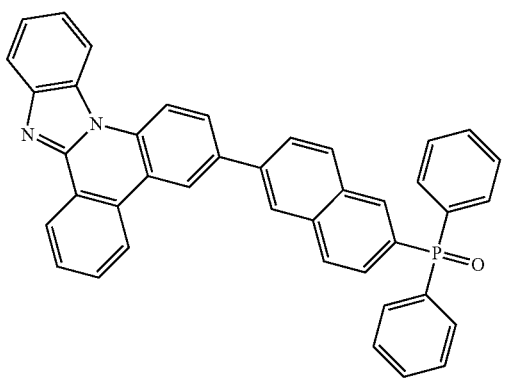
2-16
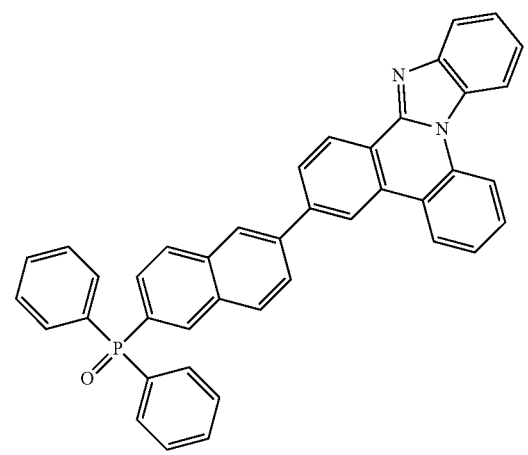
2-17
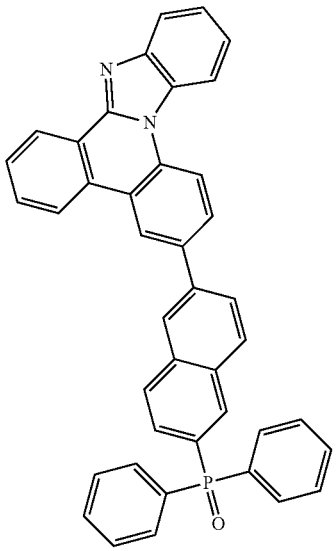
2-18
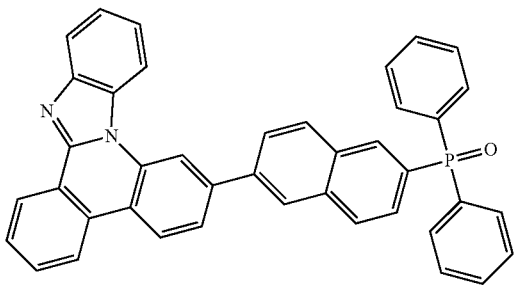
2-19
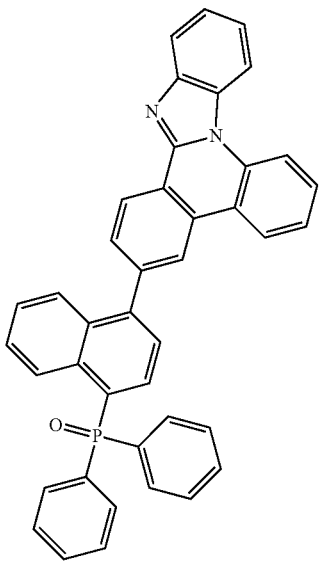

2-20
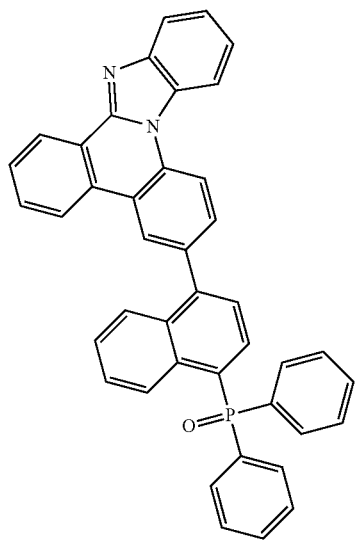
2-23
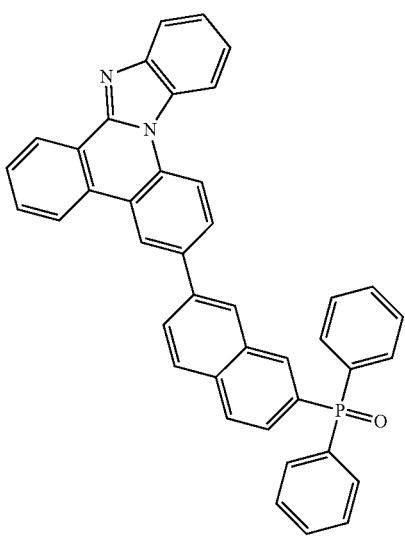
2-21
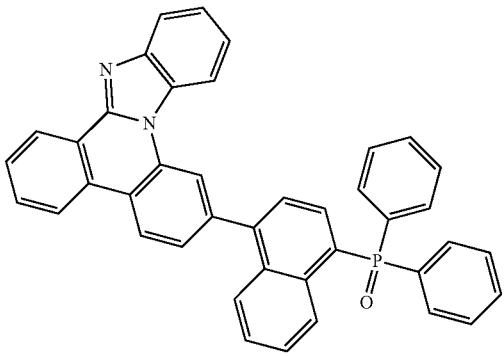
2-24
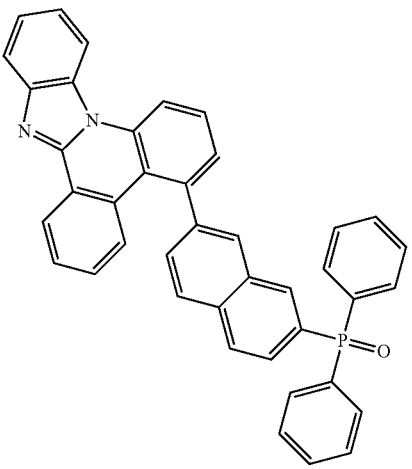
2-22
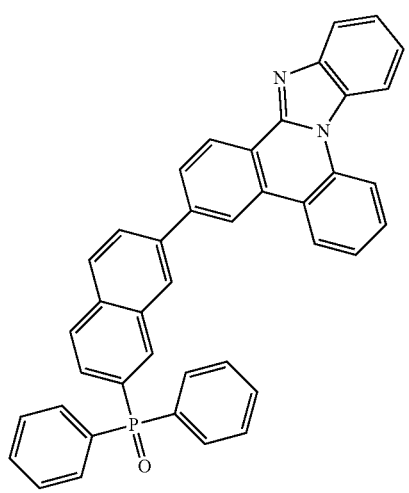
2-25
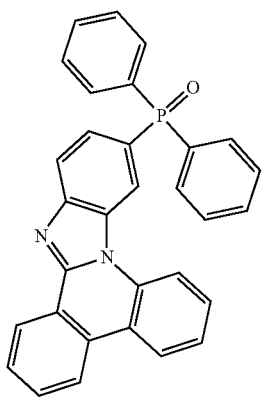

-continued
2-26
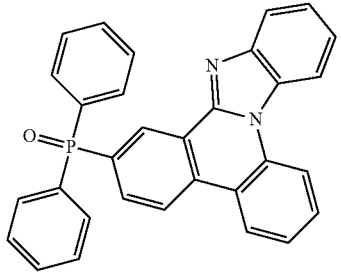
2-27
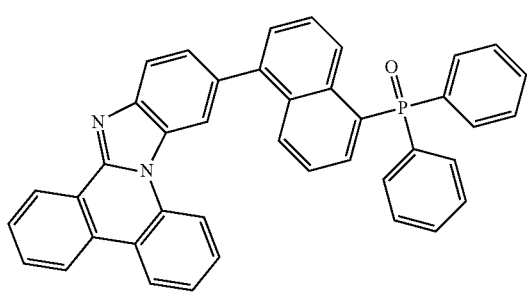
2-28
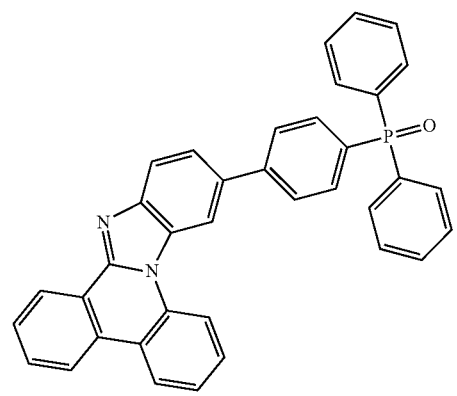
2-29
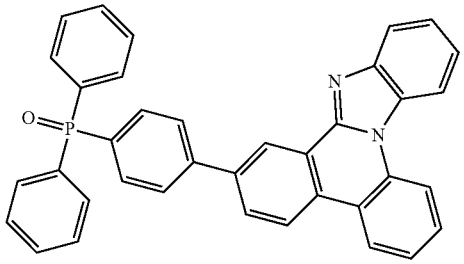
2-30
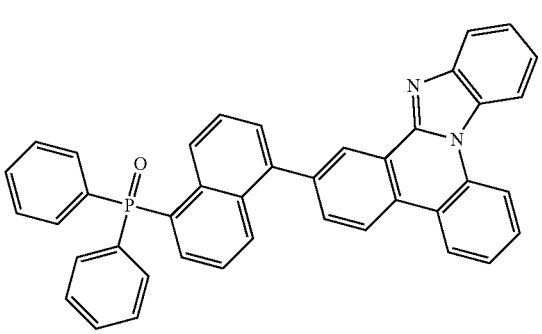
-continued
2-31
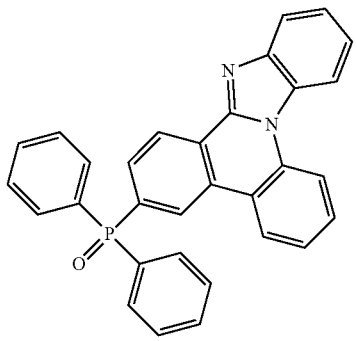
2-32
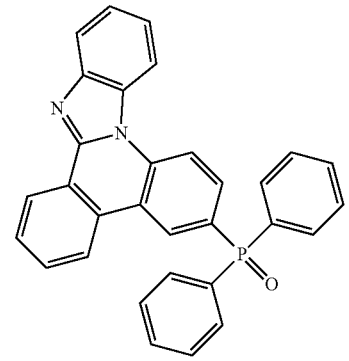
2-33
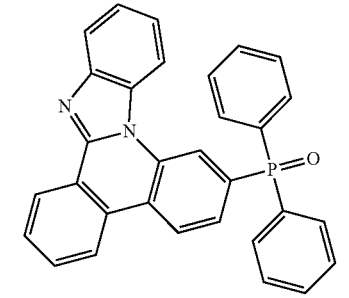
2-34
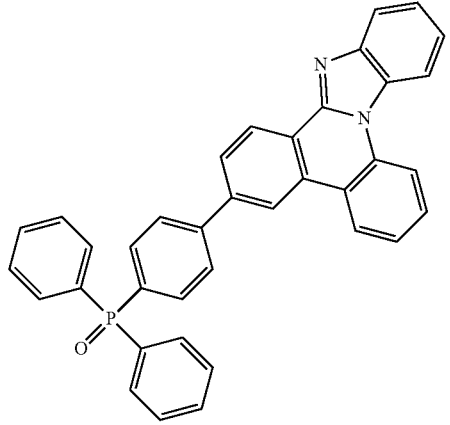

2-35
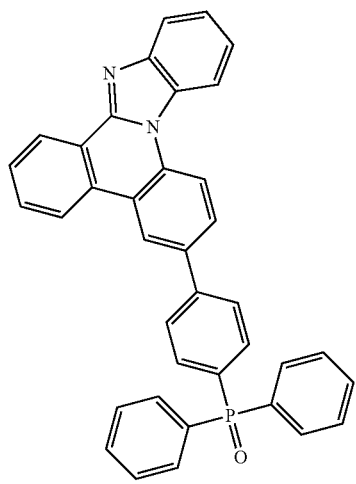
2-38
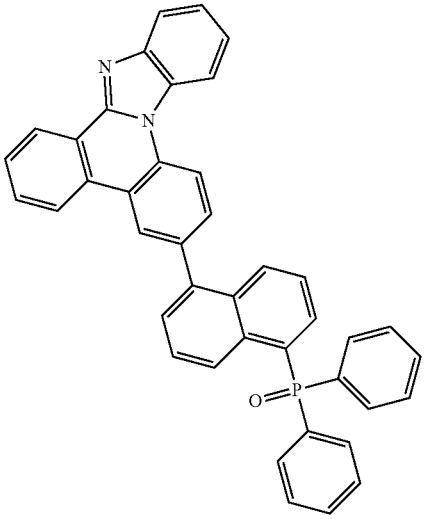
2-36
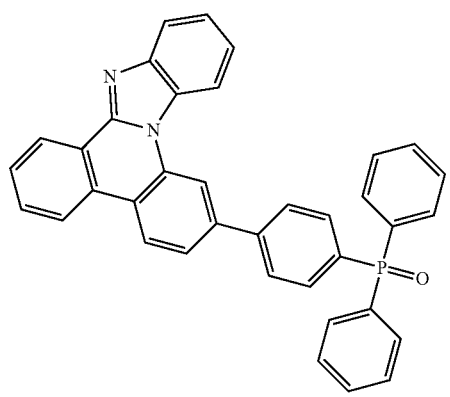
2-39
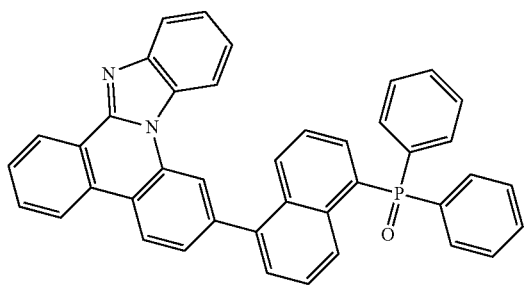
2-37
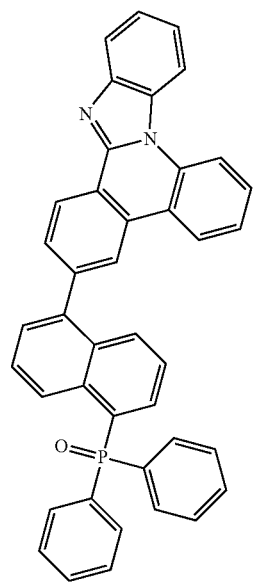
2-40
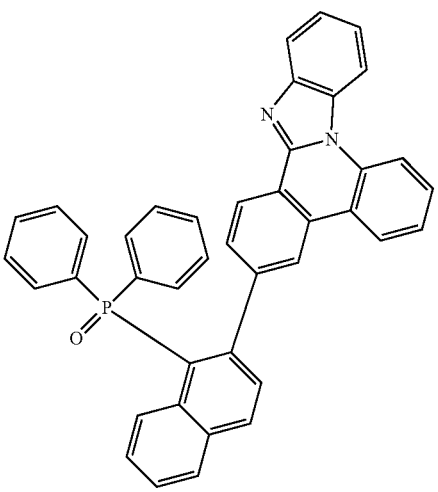

2-41
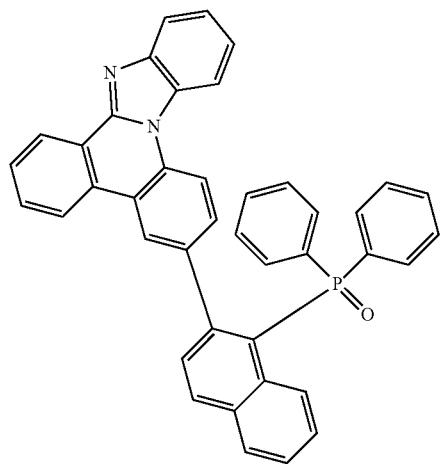
2-42
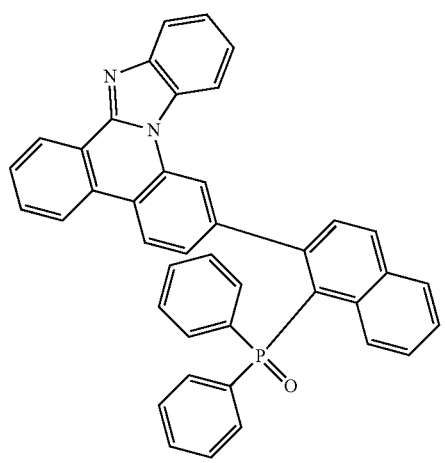
2-43
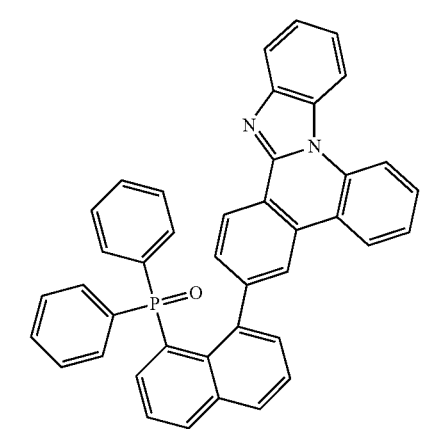
2-44
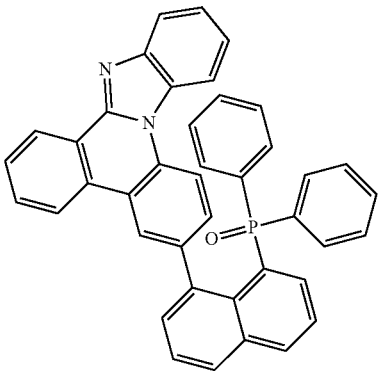
2-45
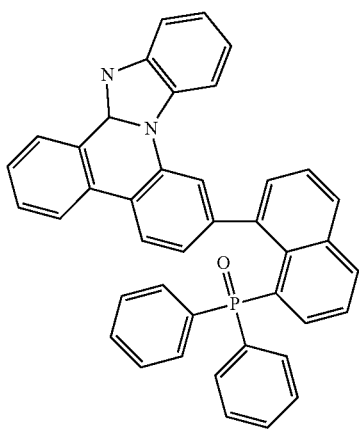
2-46
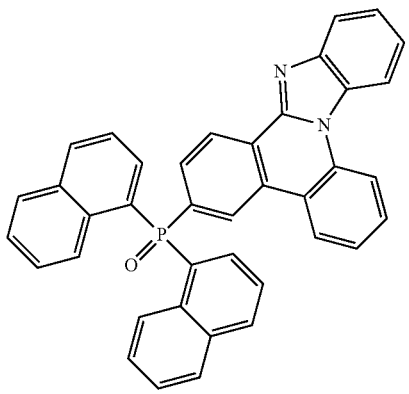
2-47
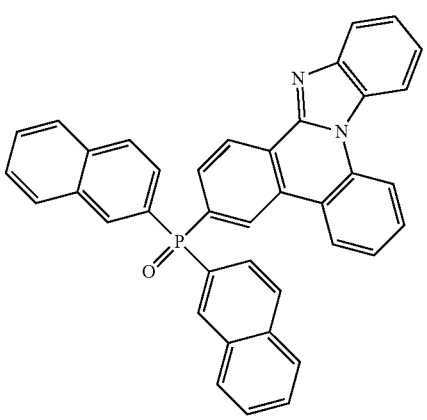

2-48
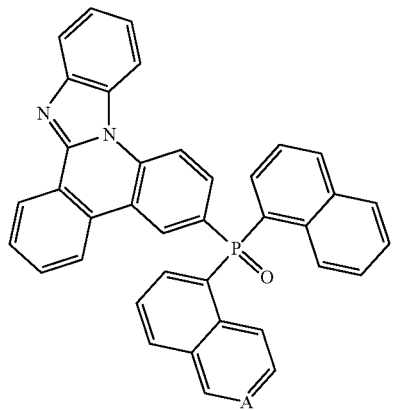
2-49
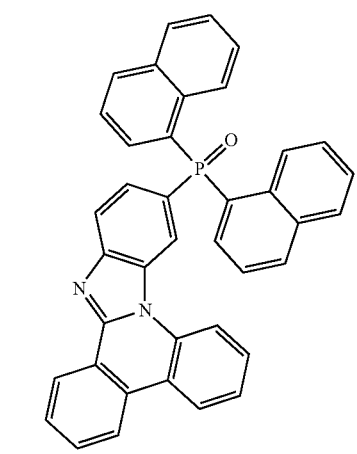
2-50
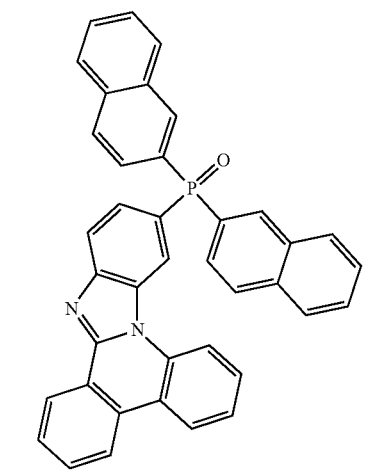
2-51
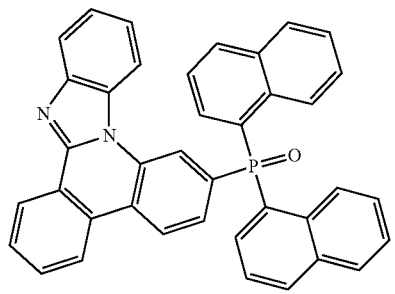
2-52
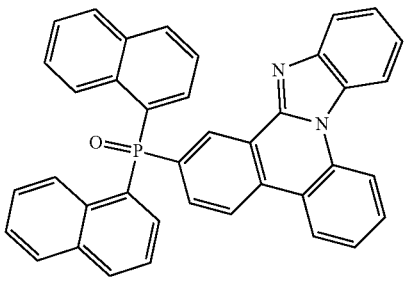
2-53
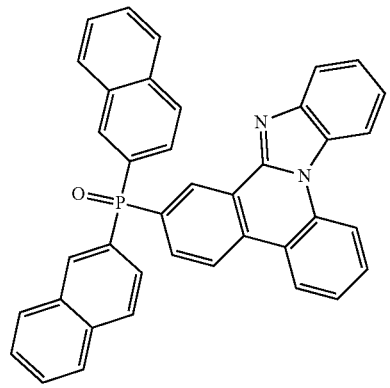
2-54
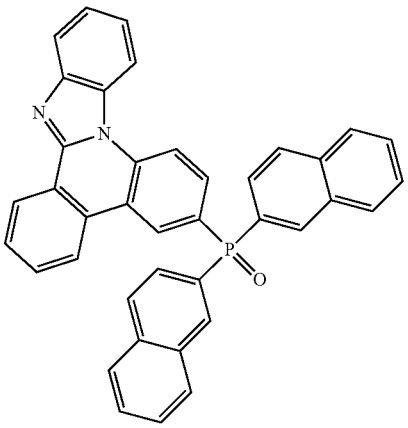
2-55
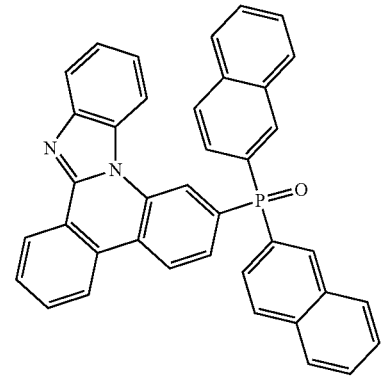

2-56
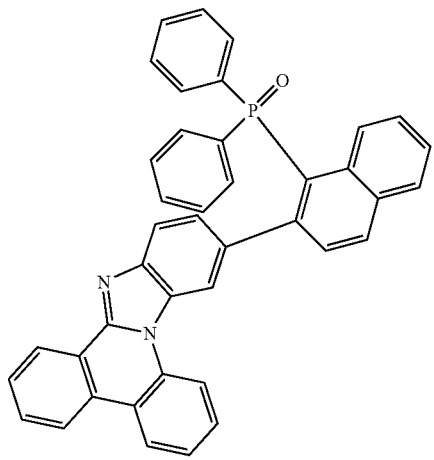
2-57
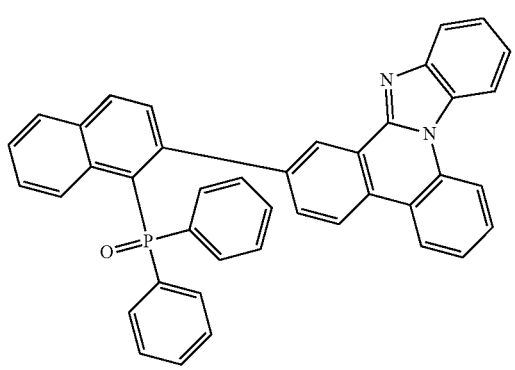
2-59
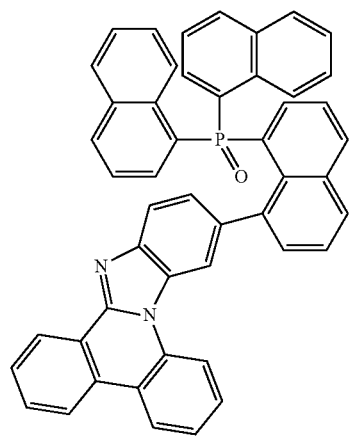
2-60
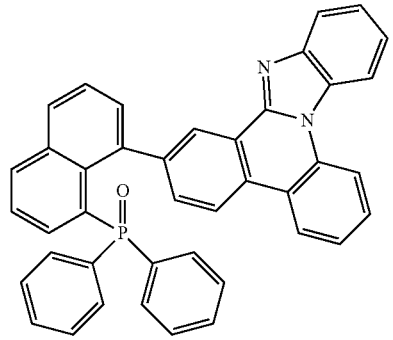
2-61
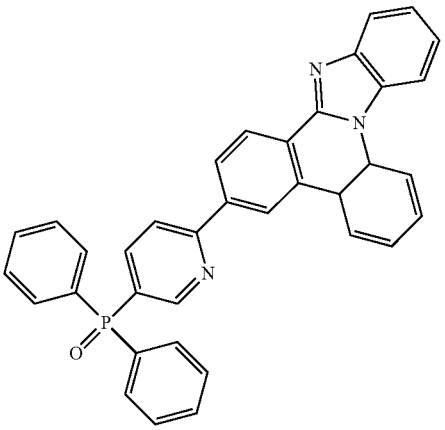
2-62
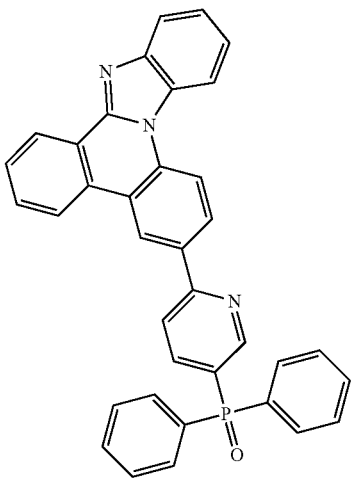
2-63
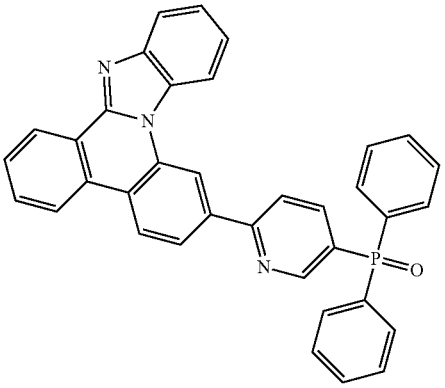
2-64
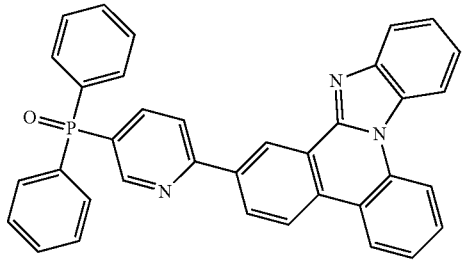

2-65
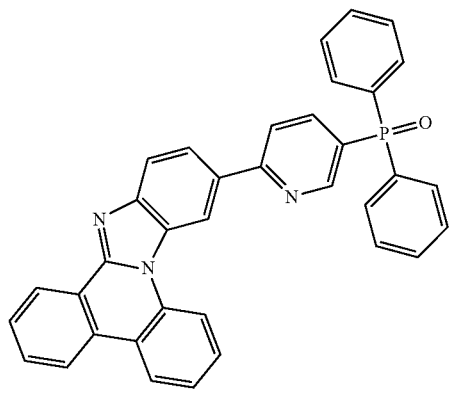
2-66
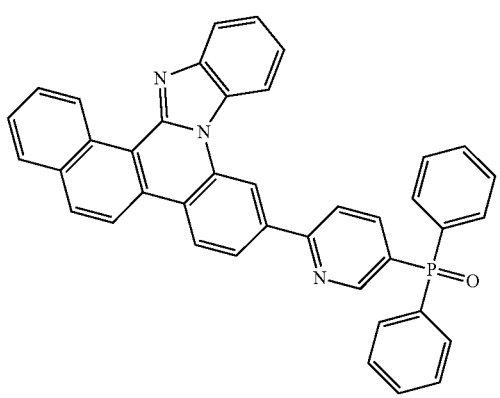
2-67
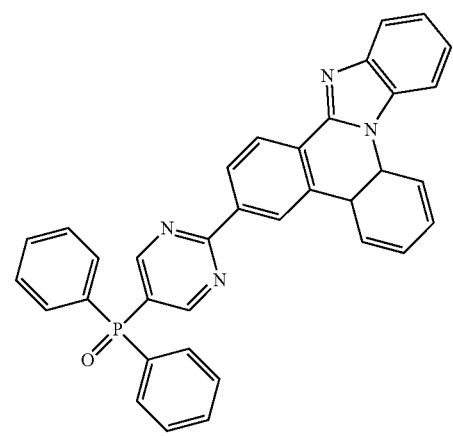
2-68
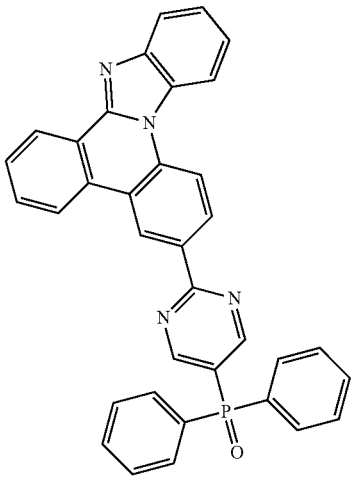
2-69
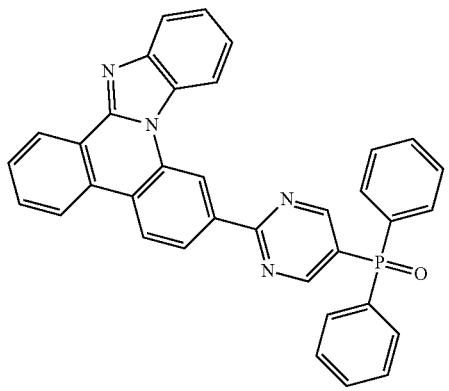
2-70
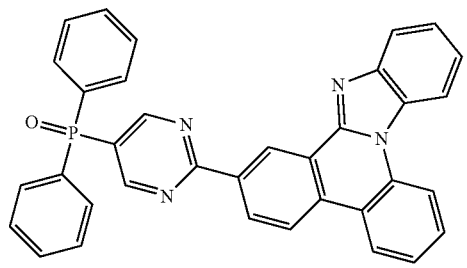
2-71
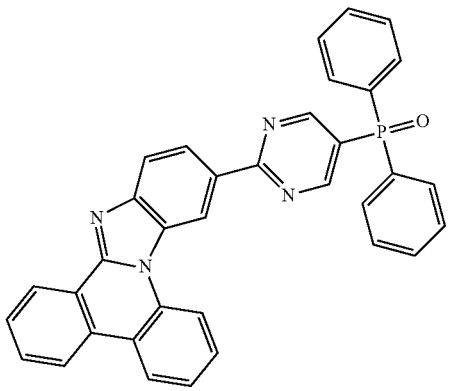

2-72
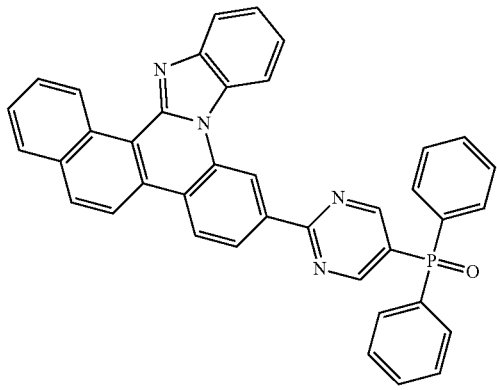
2-73
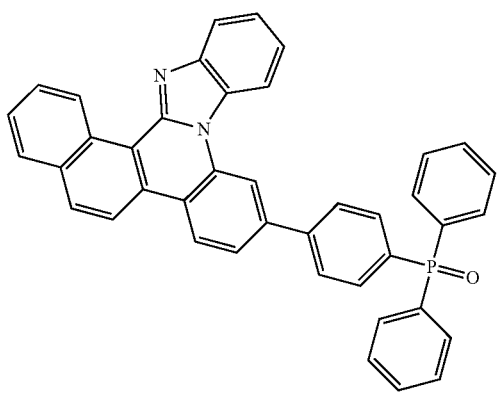
2-74
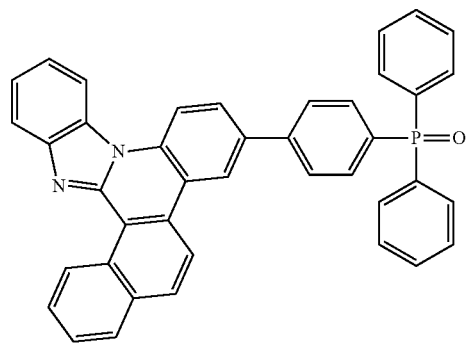
2-75
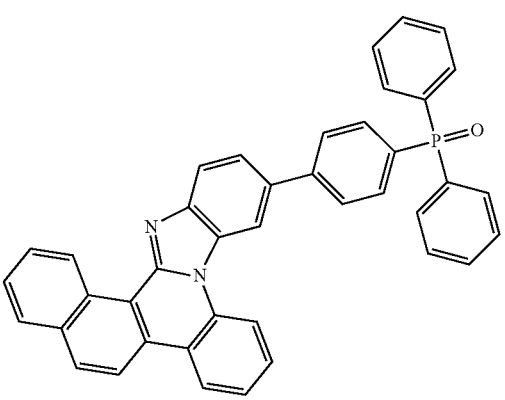
2-76
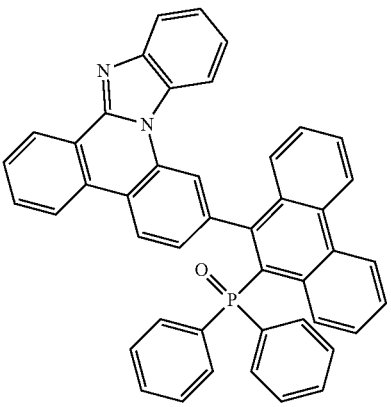
2-77
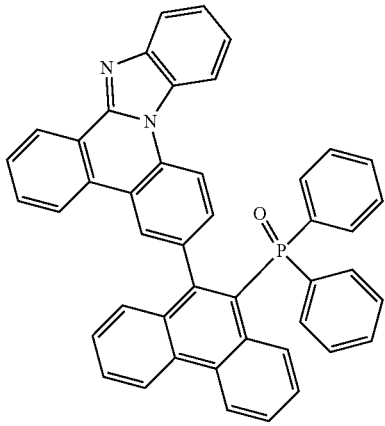
2-78
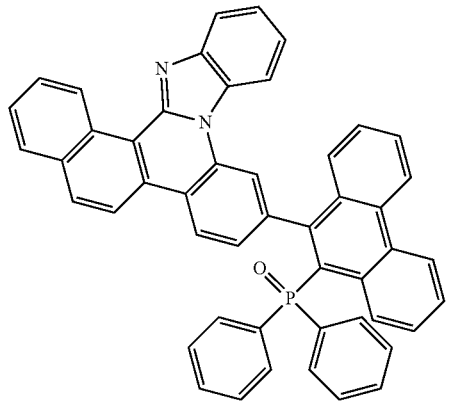
2-79
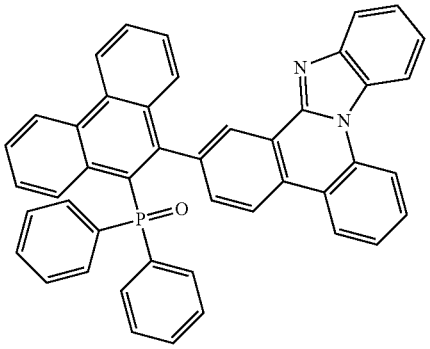

2-80
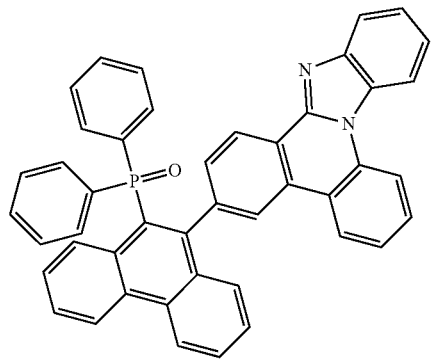
2-84
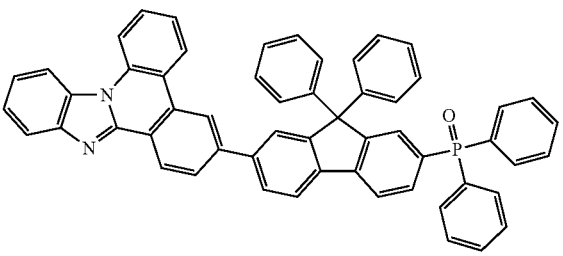
2-81
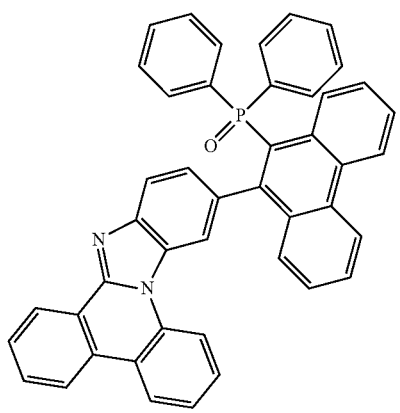
2-85
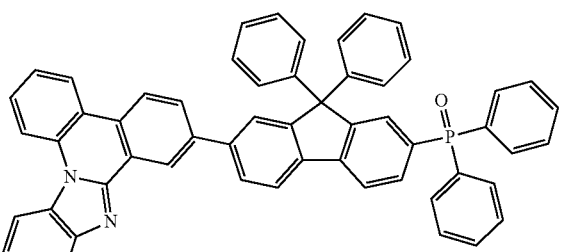
2-86
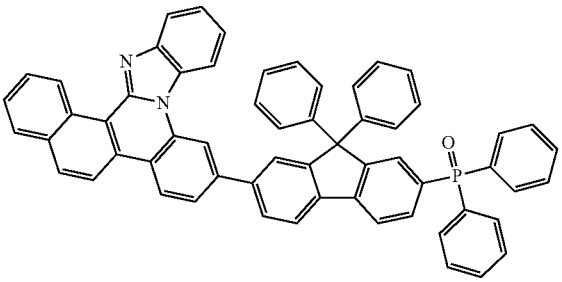
2-82
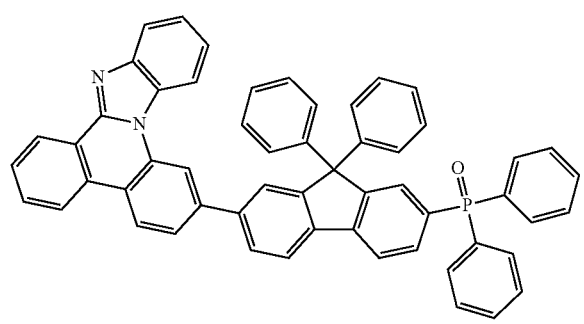
2-87
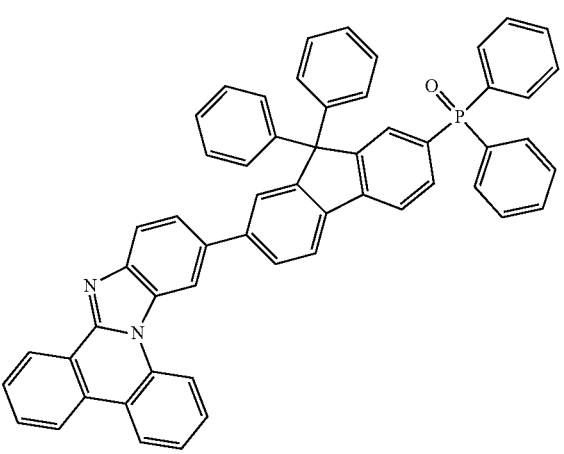
2-83
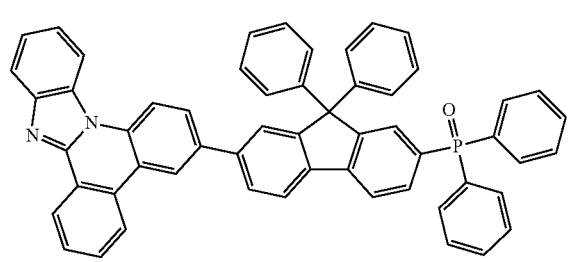

-continued
2-88
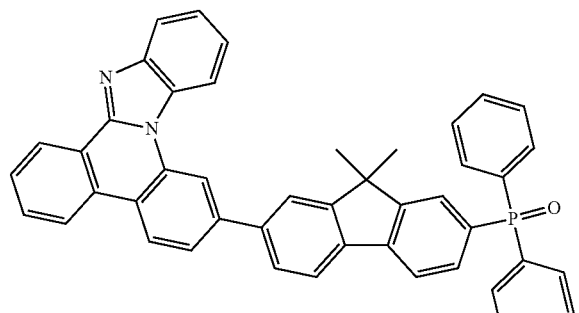
2-89
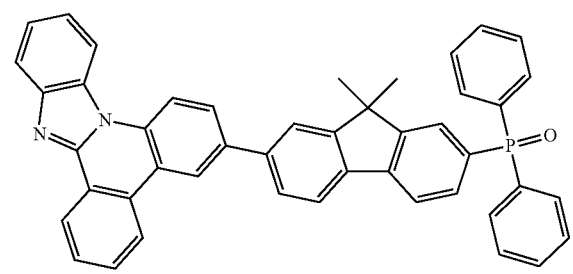
2-90
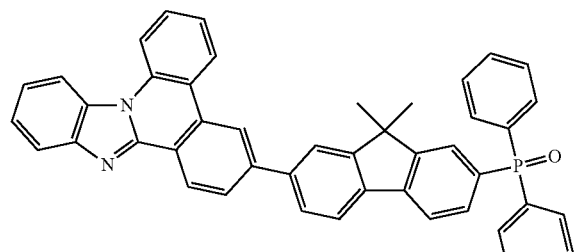
2-91
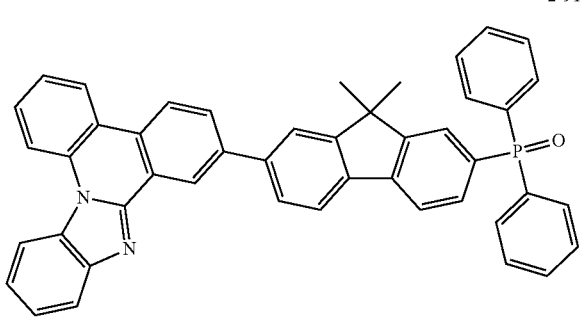
2-92
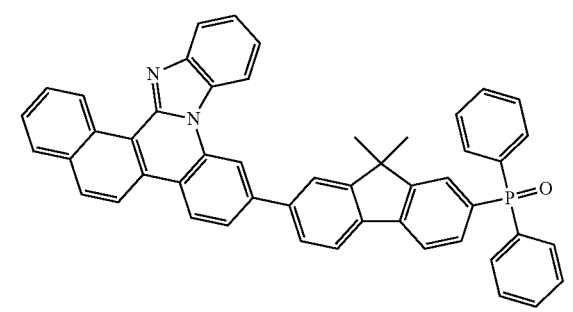
-continued
2-93
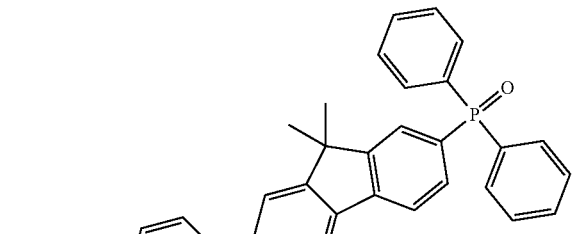
2-94
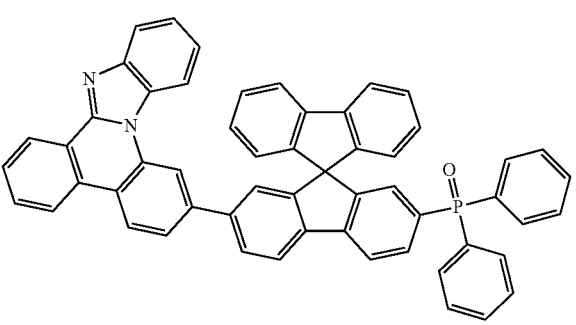
2-95
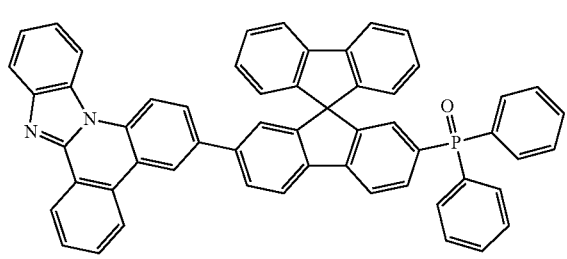
2-96

2-97

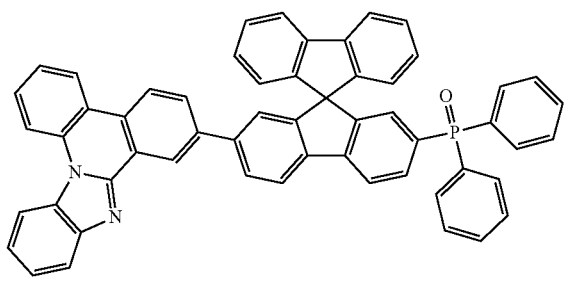

2-98

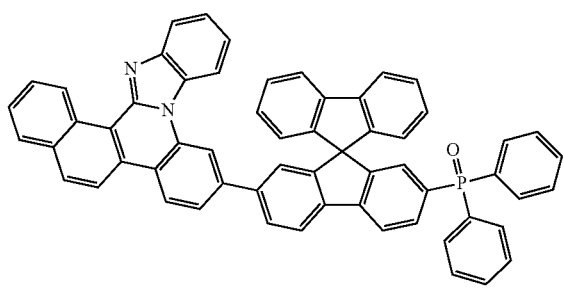

2-99

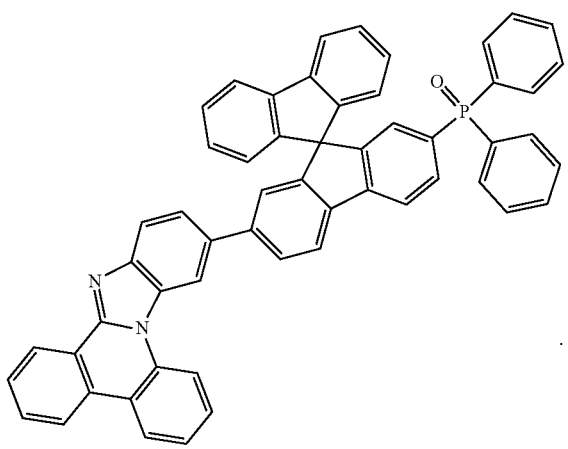

10. The organic light emitting device of claim 1, wherein the compound represented by Chemical Formula 1 and the compound represented by Chemical Formula 2 have a glass transition temperature (Tg) of 110° C. or more.

11. The organic light emitting device of claim 1, wherein the first organic material layer comprises a hole transporting layer, and the hole transporting layer comprises the compound represented by Chemical Formula 1.

12. The organic light emitting device of claim 1, wherein the first organic material layer comprises an electron blocking layer, and the electron blocking layer comprises the compound represented by Chemical Formula 1.

13. The organic light emitting device of claim 1, wherein the second organic material layer comprises an electron transporting layer or an electron injection layer, and the electron transporting layer or the electron injection layer comprises the compound represented by Chemical Formula 2.

14. The organic light emitting device of claim 1, wherein the second organic material layer comprises an electron transporting layer and an electron injection layer, and the electron transporting layer comprises the compound represented by Chemical Formula 2.

15. The organic light emitting device of claim 1, wherein the second organic material layer comprises an electron transporting layer and an electron injection layer, and the electron injection layer comprises the compound represented by Chemical Formula 2.

16. The organic light emitting device of claim 1, wherein the light emitting layer comprises a compound represented by the following Chemical Formula 1-A:

[Chemical Formula 1-A]

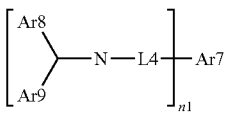

in Chemical Formula 1-A,
n1 is an integer of 1 or more,
Ar7 is a substituted or unsubstituted monovalent or more benzofluorene group; a substituted or unsubstituted monovalent or more fluoranthene group; a substituted or unsubstituted monovalent or more pyrene group; or a substituted or unsubstituted monovalent or more chrysene group,
L4 is a direct bond; a substituted or unsubstituted arylene group; or a substituted or unsubstituted heteroarylene group,
Ar8 and Ar9 are the same as or different from each other, and are each independently a substituted or unsubstituted aryl group; a substituted or unsubstituted silyl group; a substituted or unsubstituted germanium group; a substituted or unsubstituted alkyl group; a substituted or unsubstituted arylalkyl group; or a substituted or unsubstituted heteroaryl group, or are optionally bonded to each other to form a substituted or unsubstituted ring, and
when n1 is 2 or more, two or more structures in the parenthesis are the same as or different from each other.

17. The organic light emitting device of claim 16, wherein L4 is a direct bond, Ar7 is a divalent pyrene group, Ar8 and Ar9 are the same as or different from each other, and are each independently an aryl group which is unsubstituted or substituted with a germanium group substituted with an alkyl group, and n1 is 2.

18. The organic light emitting device of claim 1, wherein the light emitting layer comprises a compound represented by the following Chemical Formula 2-A:

[Chemical Formula 2-A]

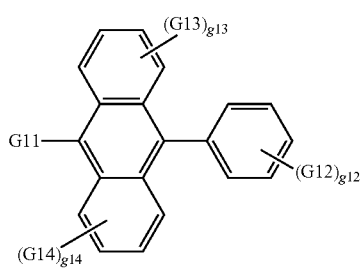

in Chemical Formula 2-A,
G11 is a 1-naphthyl group, a 2-naphthyl group, a 1-anthryl group, a 2-anthryl group, a 1-phenanthryl group, a 2-phenanthryl group, a 3-phenanthryl group, a 4-phenanthryl group, a 9-phenanthryl group, a 1-naphthacenyl group, a 2-naphthacenyl group, a 9-naphthacenyl group, a 1-pyrenyl group, a 2-pyrenyl group, a 4-pyrenyl group, a 3-methyl-2-naphthyl group, a 4-methyl-1-naphthyl group, or the following Chemical Formula

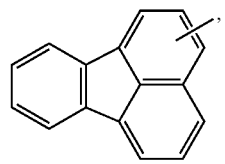

G12 is a phenyl group, a 1-naphthyl group, a 2-naphthyl group, a 1-anthryl group, a 2-anthryl group, a 9-anthryl group, a 1-phenanthryl group, a 2-phenanthryl group, a 3-phenanthryl group, a 4-phenanthryl group, a 9-phenanthryl group, a 1-naphthacenyl group, a 2-naphthacenyl group, a 9-naphthacenyl group, a 1-pyrenyl group, a 2-pyrenyl group, a 4-pyrenyl group, a 2-biphenylyl group, a 3-biphenylyl group, a 4-biphenylyl group, a p-terphenyl-4-yl group, a p-terphenyl-3-yl group, a p-terphenyl-2-yl group, an m-terphenyl-4-yl group, an m-terphenyl-3-yl group, an m-terphenyl-2-yl group, an o-tolyl group, a m-tolyl group, a p-tolyl group, a p-t-butylphenyl group, a p-(2-phenylpropyl) phenyl group, a 3-methyl-2-naphthyl group, a 4-methyl-1-naphthyl group, a 4-methyl-1-anthryl group, a 4'-methylbiphenylyl group, a 4"-t-butyl-p-terphenyl-4-yl group, or a 3-fluoranthenyl group, G13 and G14 are the same as or different from each other, and are each independently hydrogen; a substituted or unsubstituted alkyl group; a substituted or unsubstituted alkoxy group; a substituted or unsubstituted aryl group; or a substituted or unsubstituted heteroaryl group, g12 is an integer from 1 to 5, g13 and g14 are each an integer from 1 to 4, and when g12 to g14 are each 2 or more, two or more structures in the parenthesis are the same as or different from each other.

19. The organic light emitting device of claim 18, wherein G11 is a 1-naphthyl group, and G12 is a 2-naphthyl group.

\* \* \* \* \*